(12) United States Patent
Otsu et al.

(10) Patent No.: US 11,282,783 B2
(45) Date of Patent: Mar. 22, 2022

(54) THREE-DIMENSIONAL MEMORY DEVICE WITH VIA STRUCTURES SURROUNDED BY PERFORATED DIELECTRIC MOAT STRUCTURE AND METHODS OF MAKING THE SAME

(71) Applicant: SANDISK TECHNOLOGIES LLC, Addison, TX (US)

(72) Inventors: Yoshitaka Otsu, Yokkaichi (JP); Masanori Terahara, Yokkaichi (JP); Junpei Kanazawa, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/809,861

(22) Filed: Mar. 5, 2020

(65) Prior Publication Data
US 2021/0210424 A1   Jul. 8, 2021

Related U.S. Application Data

(63) Continuation-in-part of application No. 16/735,854, filed on Jan. 7, 2020.

(51) Int. Cl.
*H01L 23/52* (2006.01)
*H01L 23/522* (2006.01)
(Continued)

(52) U.S. Cl.
CPC ...... *H01L 23/5226* (2013.01); *H01L 23/5283* (2013.01); *H01L 27/0886* (2013.01);
(Continued)

(58) Field of Classification Search
CPC ........... H01L 27/11582; H01L 2924/00; H01L 27/11556; H01L 27/11573; H01L 27/11565
See application file for complete search history.

(56) References Cited

U.S. PATENT DOCUMENTS 5,915,167 A   6/1999 Leedy
9,806,093 B2  10/2017 Toyama et al.
(Continued)

FOREIGN PATENT DOCUMENTS

WO   WO2019-160593 A1   8/2019

OTHER PUBLICATIONS

Notification of Transmittal of the International Search Report and Written Opinion of the International Search Authority for International Patent Application No. PCT/US2020/035784, dated Oct. 14, 2020, 13 pages.
(Continued)

*Primary Examiner* — Tony Tran
(74) *Attorney, Agent, or Firm* — The Marbury Law Group PLLC

(57) ABSTRACT

A three-dimensional memory device includes an alternating stack of insulating layers and electrically conductive layers located over a substrate, memory stack structures vertically extending through the alternating stack, a perforated dielectric moat structure vertically extending through the alternating stack, and an interconnection via structure laterally surrounded by the perforated dielectric moat structure and vertically extending through each insulating layer within the alternating stack. Each of the memory stack structures includes a vertical semiconductor channel and a vertical stack of memory elements located at levels of the electrically conductive layers. The perforated dielectric moat structure includes a plurality of lateral openings at each level of the insulating layers, and does not include any opening at levels of the electrically conductive layers. An interconnection via structure can be laterally surrounded by the perforated dielectric moat structure, and can vertically extend through each insulating layer within the alternating stack.

19 Claims, 85 Drawing Sheets

(51) Int. Cl.
  *H01L 27/11582* (2017.01)
  *H01L 27/1157* (2017.01)
  *H01L 27/11565* (2017.01)
  *H01L 27/11556* (2017.01)
  *H01L 29/66* (2006.01)
  *H01L 27/11519* (2017.01)
  *H01L 23/528* (2006.01)
  *H01L 27/088* (2006.01)
  *H01L 29/78* (2006.01)
  *H01L 27/11524* (2017.01)

(52) U.S. Cl.
  CPC .... *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01); *H01L 29/66795* (2013.01); *H01L 29/785* (2013.01)

(56) References Cited

U.S. PATENT DOCUMENTS

| | | | |
|---|---|---|---|
| 9,818,693 | B2 | 11/2017 | Toyama et al. |
| 9,818,759 | B2 | 11/2017 | Kai et al. |
| 9,978,766 | B1 | 5/2018 | Hosoda et al. |
| 10,014,316 | B2 | 7/2018 | Yu et al. |
| 10,038,006 | B2 | 7/2018 | Furihata et al. |
| 10,249,640 | B2 | 4/2019 | Yu et al. |
| 10,256,245 | B2 | 4/2019 | Ariyoshi |
| 10,304,852 | B1 | 5/2019 | Cui et al. |
| 10,381,371 | B2 | 8/2019 | Ogawa et al. |
| 2017/0179026 | A1 | 6/2017 | Toyama et al. |
| 2017/0179151 | A1 | 6/2017 | Kai et al. |
| 2017/0179152 | A1 | 6/2017 | Toyama et al. |
| 2017/0179153 | A1 | 6/2017 | Ogawa et al. |
| 2017/0179154 | A1 | 6/2017 | Furihata et al. |
| 2017/0358593 | A1 | 12/2017 | Yu et al. |
| 2018/0108671 | A1 | 4/2018 | Yu et al. |
| 2018/0130812 | A1 | 5/2018 | Hosoda et al. |
| 2018/0261613 | A1 | 9/2018 | Ariyoshi |
| 2019/0164809 | A1 | 5/2019 | Meyer et al. |
| 2019/0252396 | A1 | 8/2019 | Mushiga et al. |
| 2019/0252403 | A1 | 8/2019 | Kaminaga et al. |
| 2019/0252404 | A1 | 8/2019 | Kaminaga |
| 2019/0371800 | A1 | 12/2019 | Nishikawa et al. |
| 2020/0035694 | A1 | 1/2020 | Kaminaga |

OTHER PUBLICATIONS

U.S. Appl. No. 16/251,863, filed Jan. 18, 2019, SanDisk Technologies LLC.
U.S. Appl. No. 16/276,952, filed Feb. 15, 2019, SanDisk Technologies LLC.
U.S. Appl. No. 16/276,996, filed Feb. 15, 2019, SanDisk Technologies LLC.
U.S. Appl. No. 16/284,240, filed Feb. 25, 2019, SanDisk Technologies LLC.
U.S. Appl. No. 16/353,048, filed Mar. 14, 2019, SanDisk Technologies LLC.
U.S. Appl. No. 16/362,988, filed Mar. 25, 2019, SanDisk Technologies LLC.
U.S. Appl. No. 16/368,007, filed Mar. 18, 2019, SanDisk Technologies LLC.
U.S. Appl. No. 16/404,844, filed May 7, 2019, SanDisk Technologies LLC.
U.S. Appl. No. 16/404,961, filed May 7, 2019, SanDisk Technologies LLC.
U.S. Appl. No. 16/444,125, filed Mar. 18, 2019, SanDisk Technologies LLC.
U.S. Appl. No. 16/444,186, filed Jun. 18, 2019, SanDisk Technologies LLC.
U.S. Appl. No. 16/547,971, filed Aug. 22, 2019, SanDisk Technologies LLC.
U.S. Appl. No. 16/671,561, filed Nov. 1, 2019, SanDisk Technologies LLC.
U.S. Appl. No. 16/675,459, filed Nov. 6, 2019, SanDisk Technologies LLC.

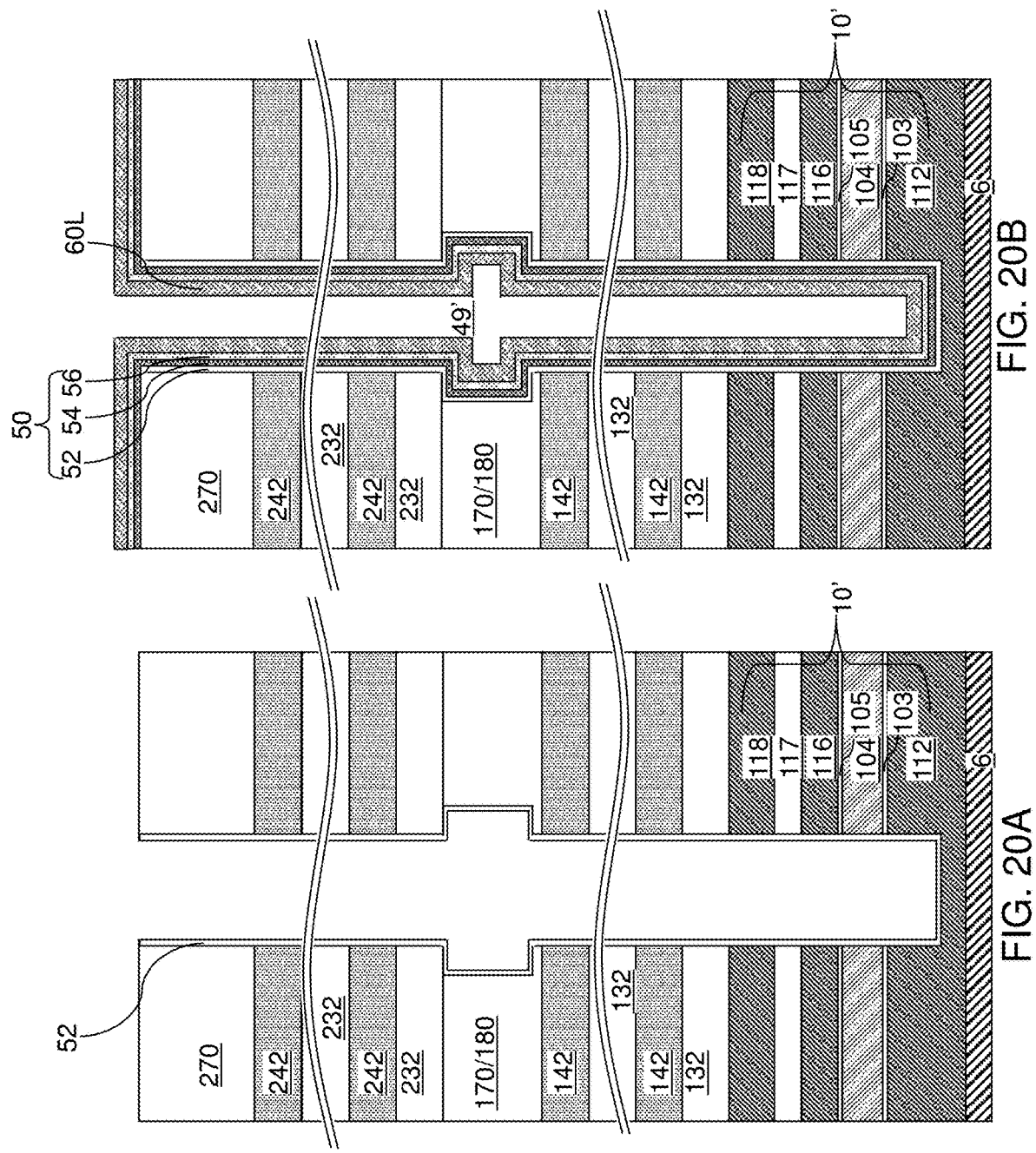

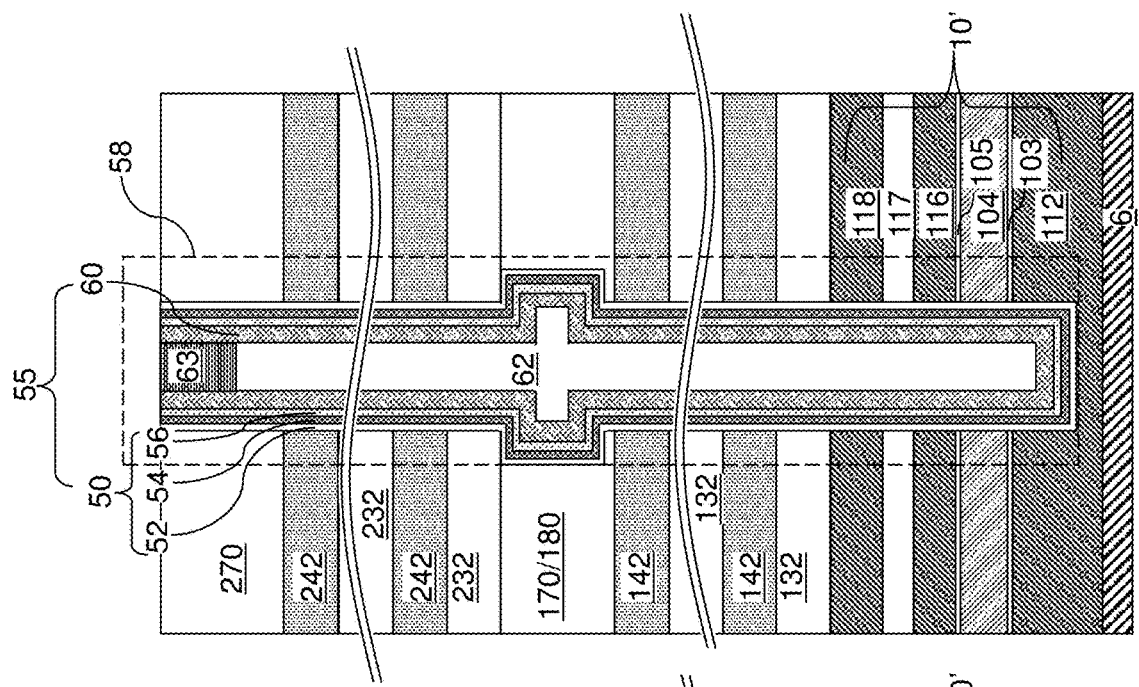
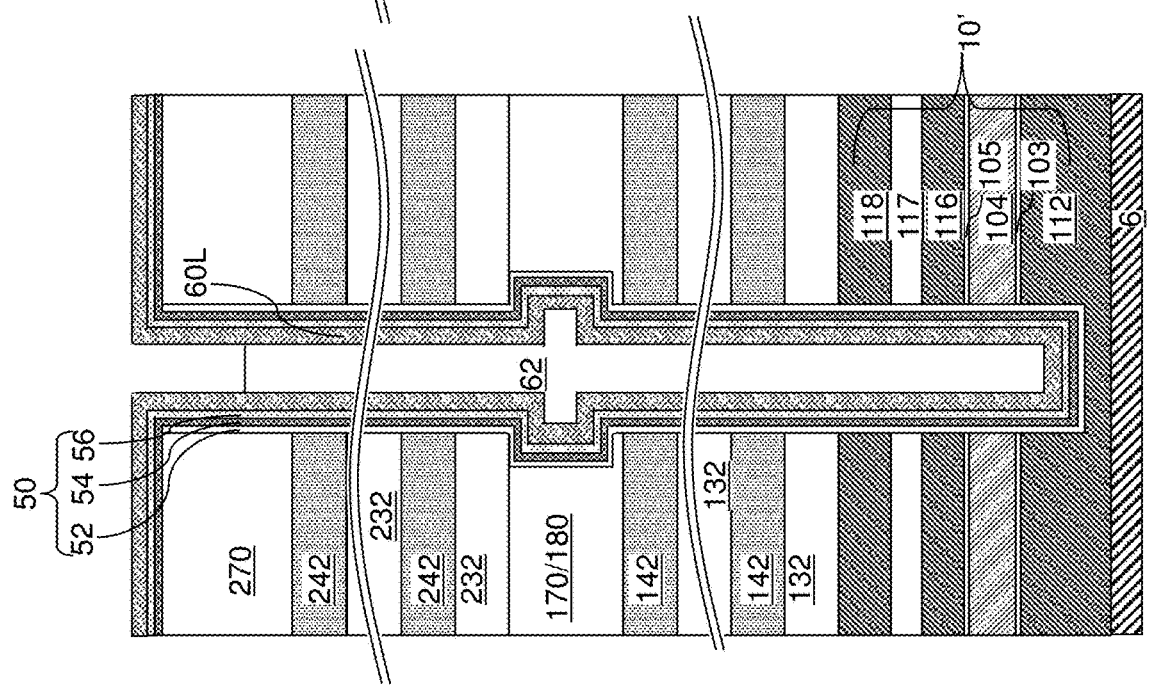

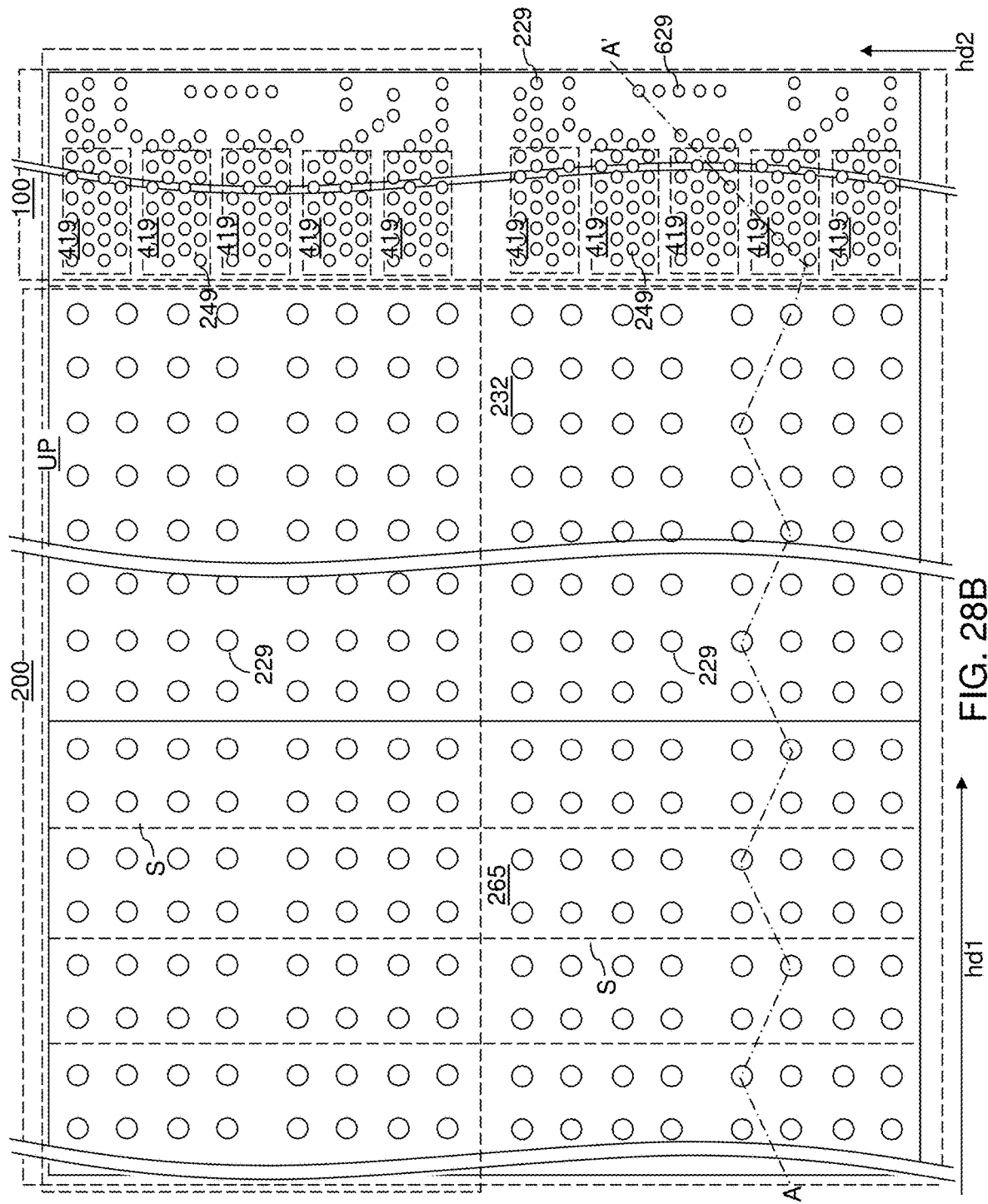

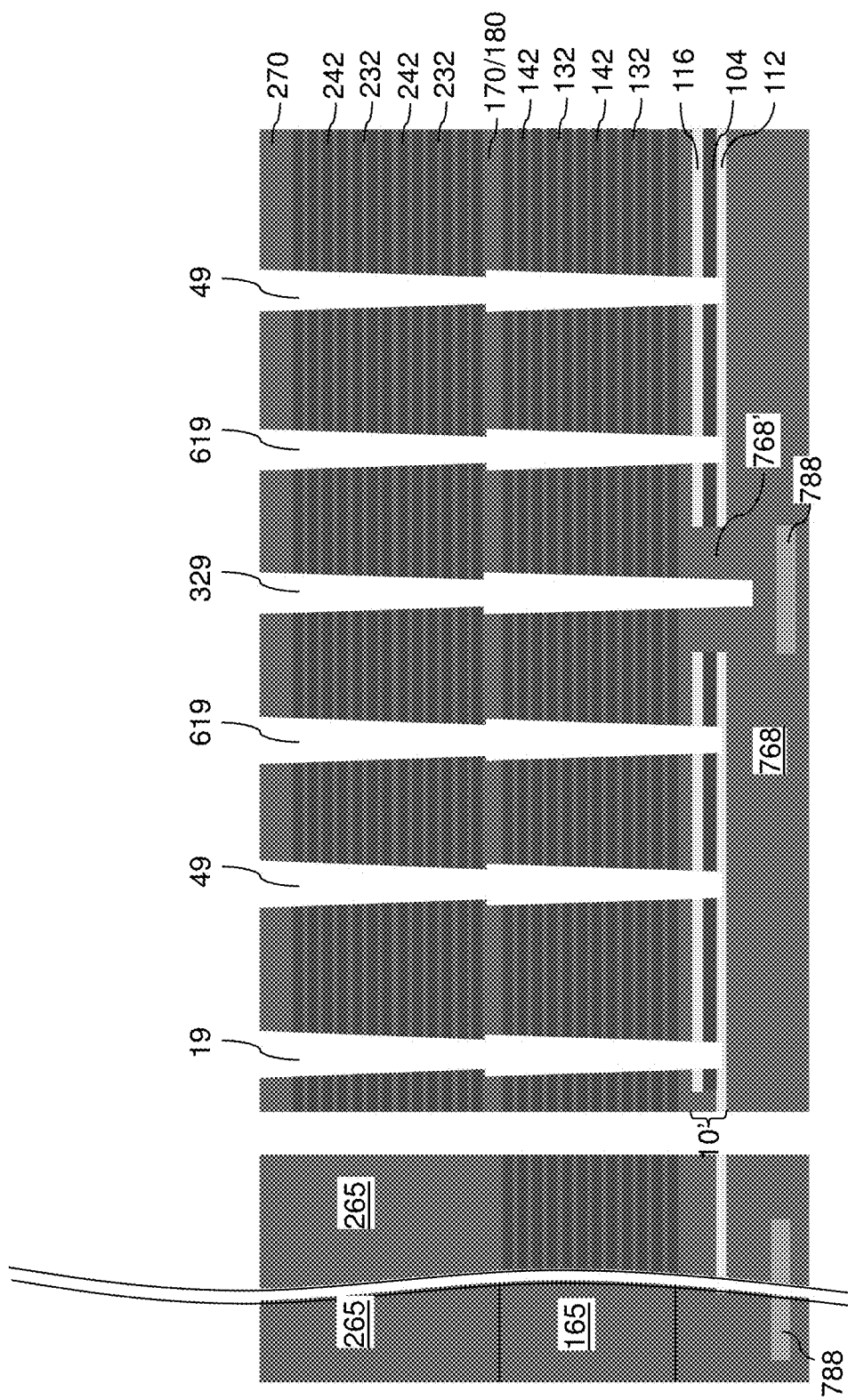

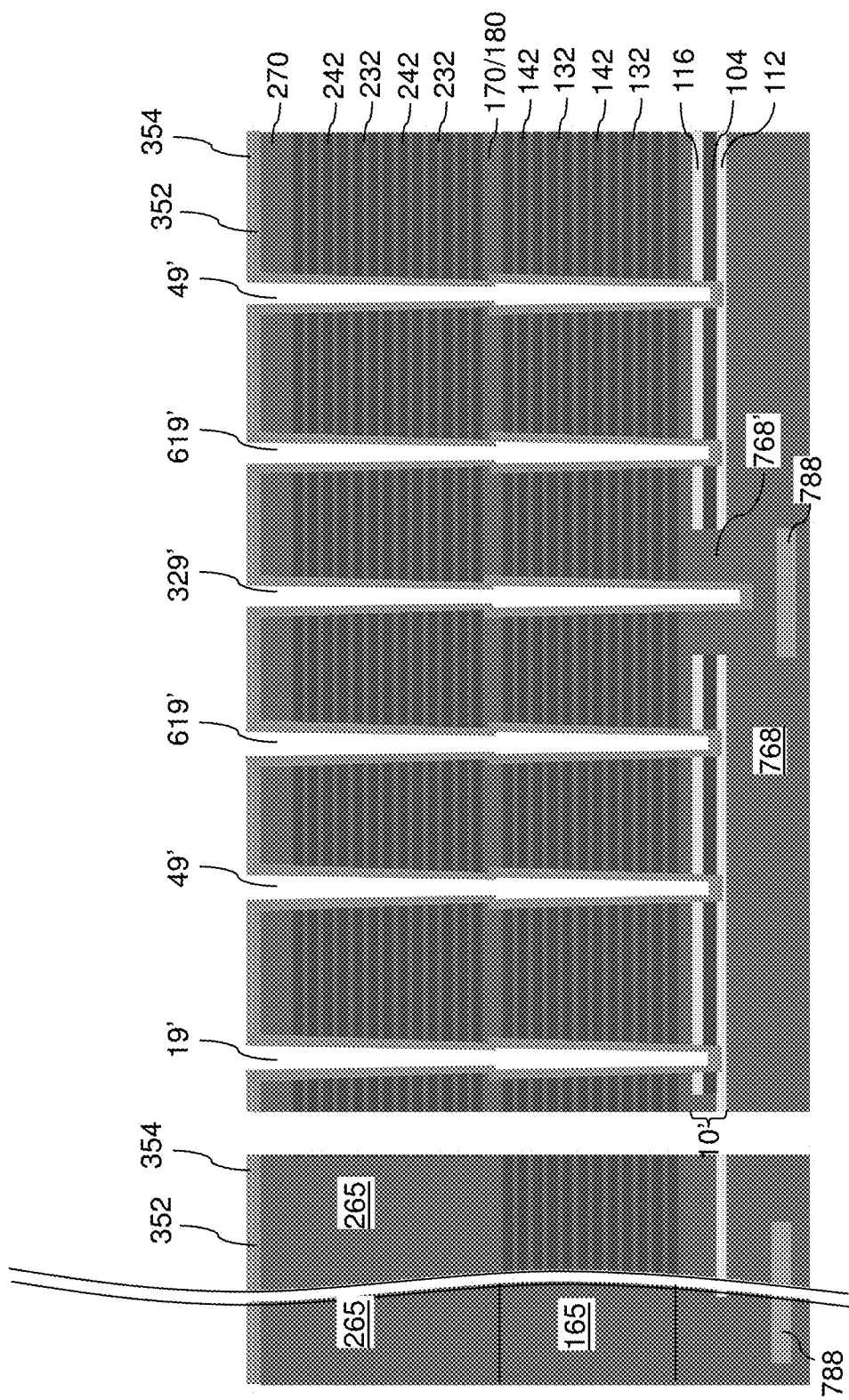

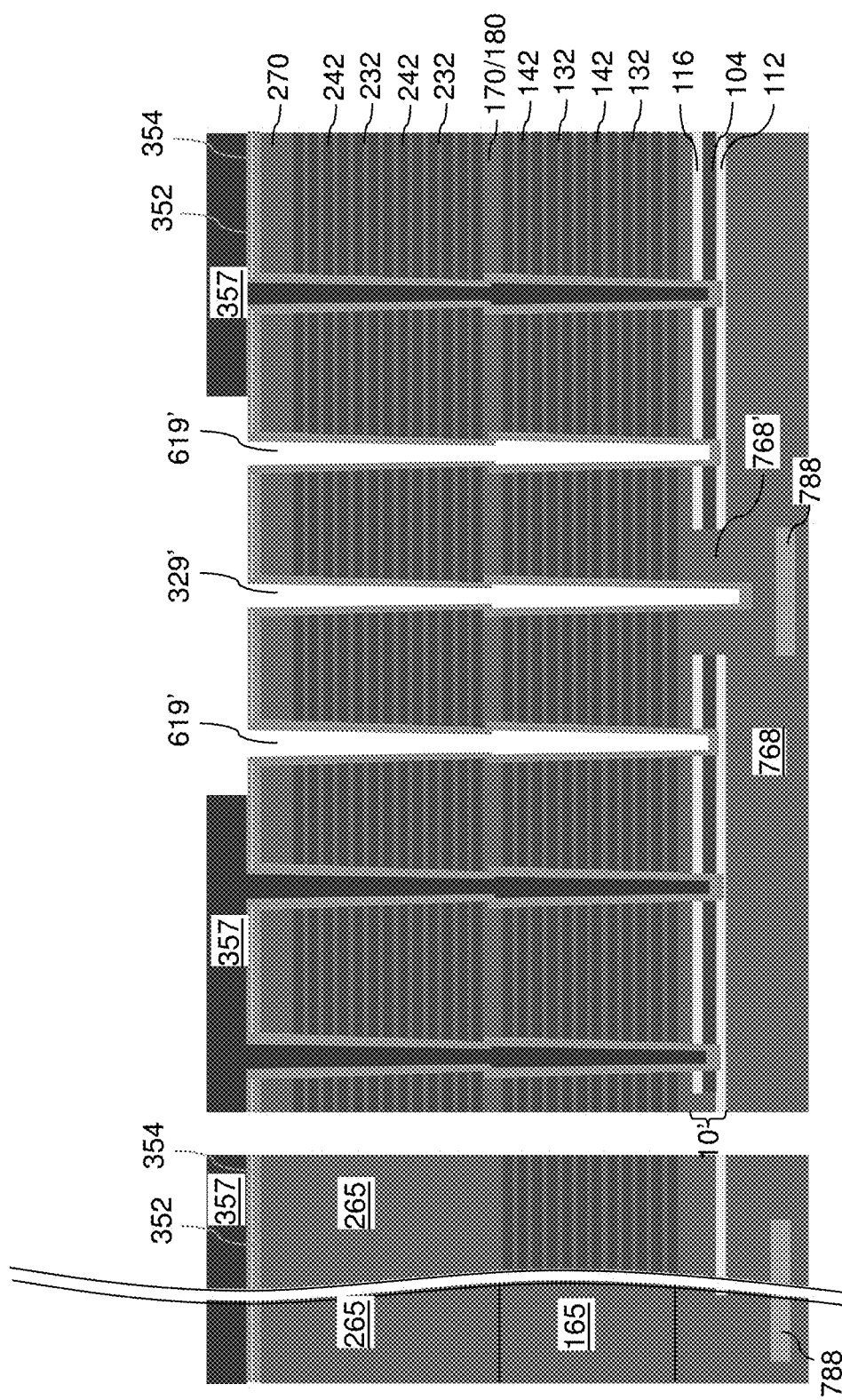

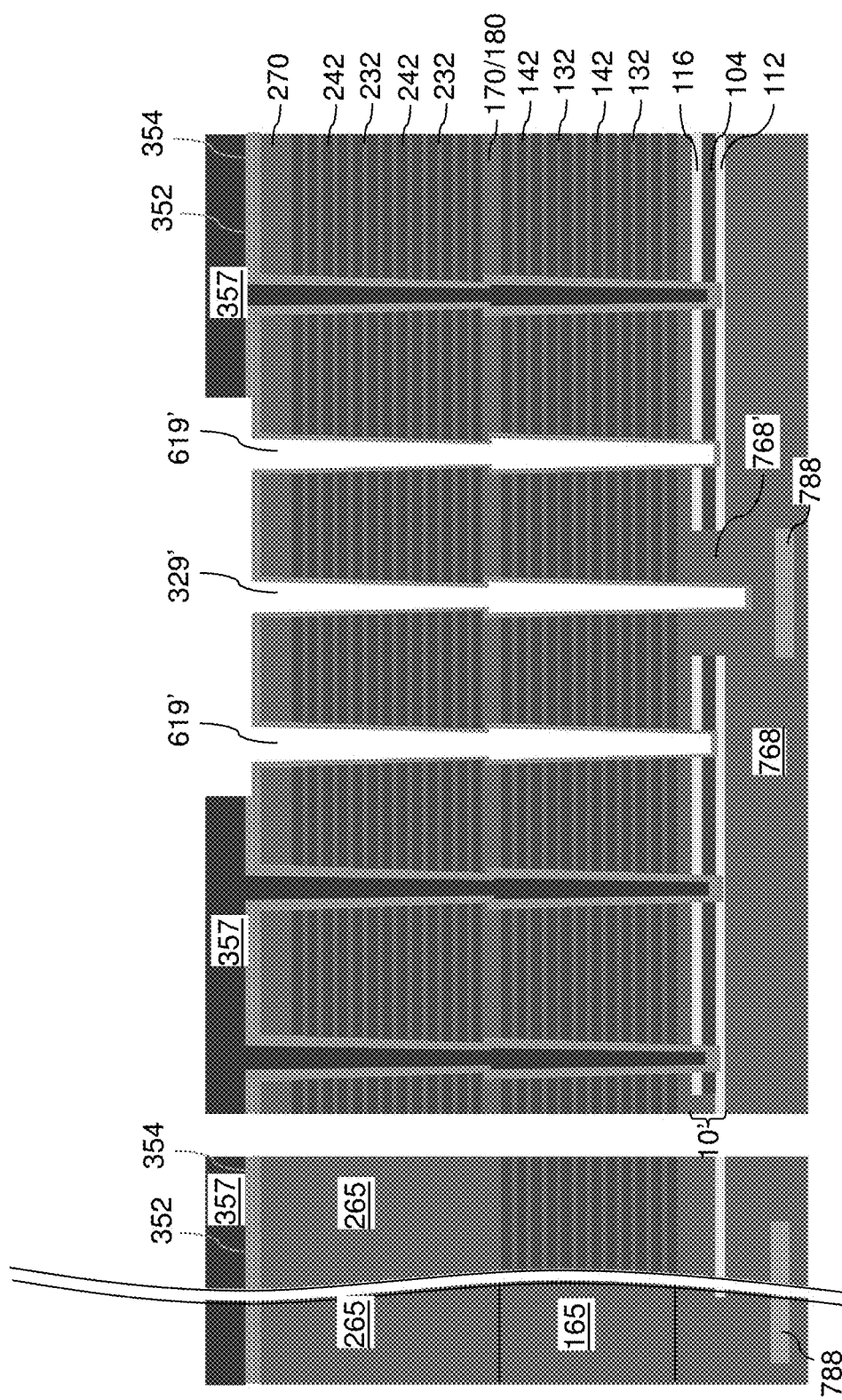

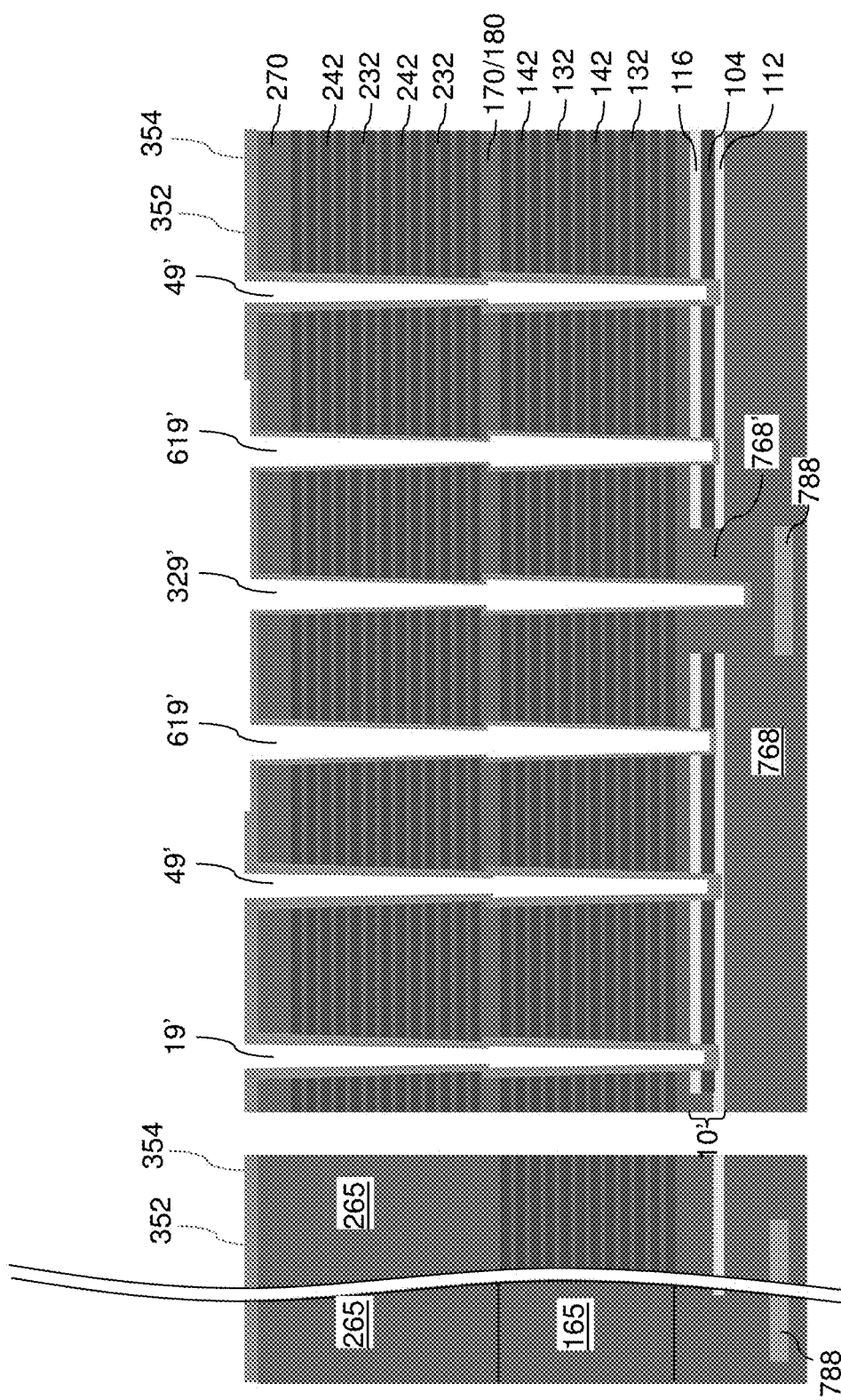

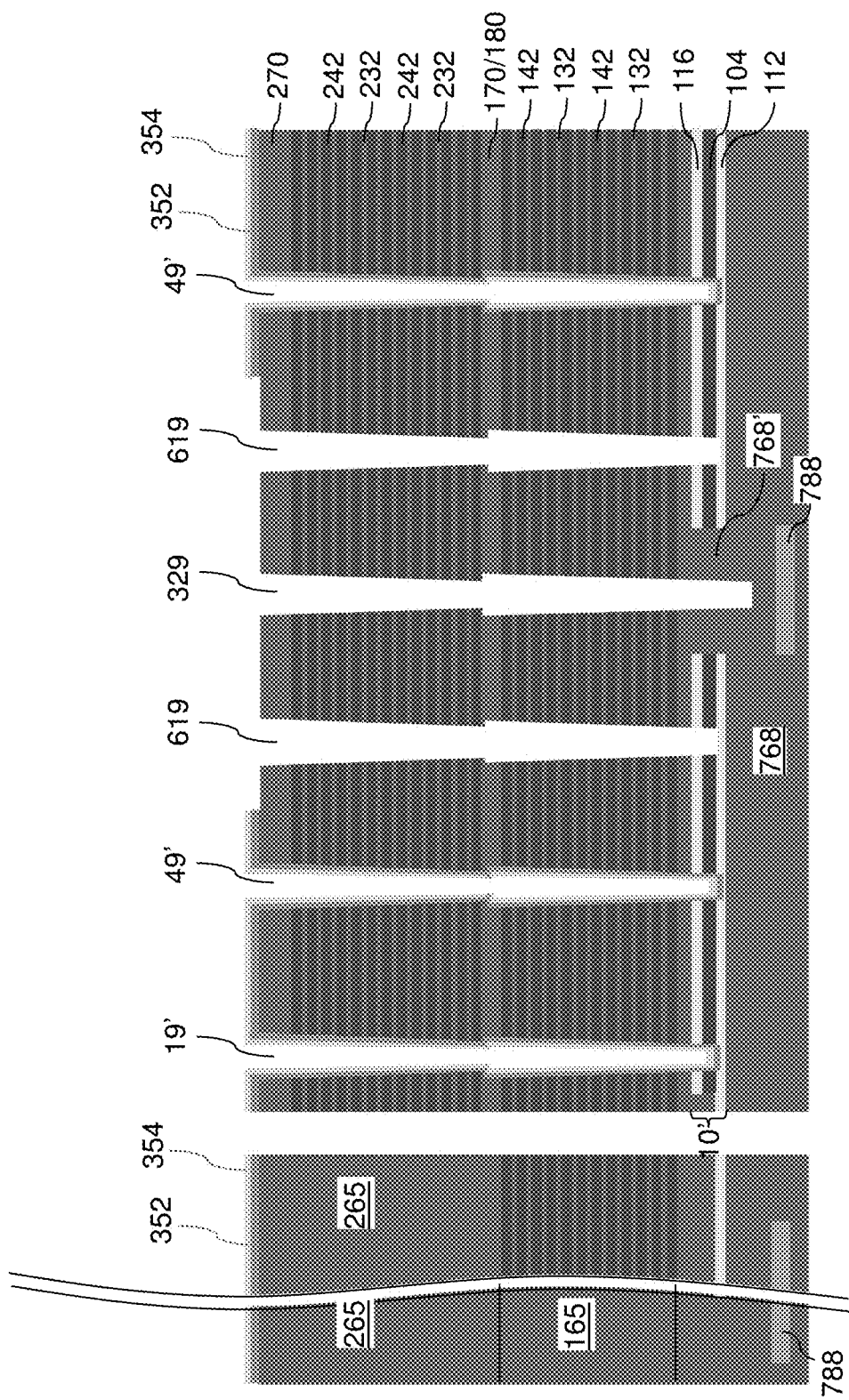

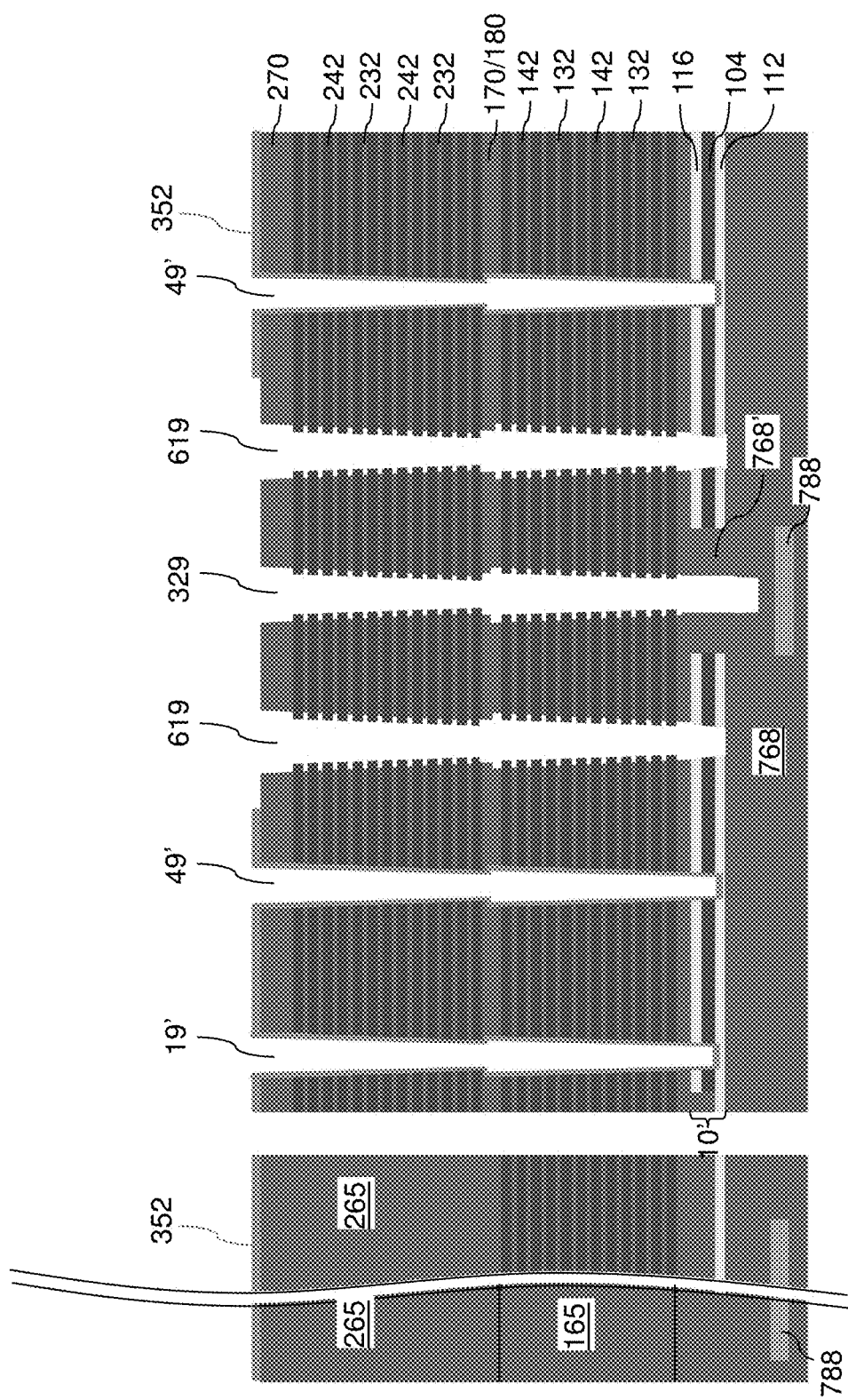

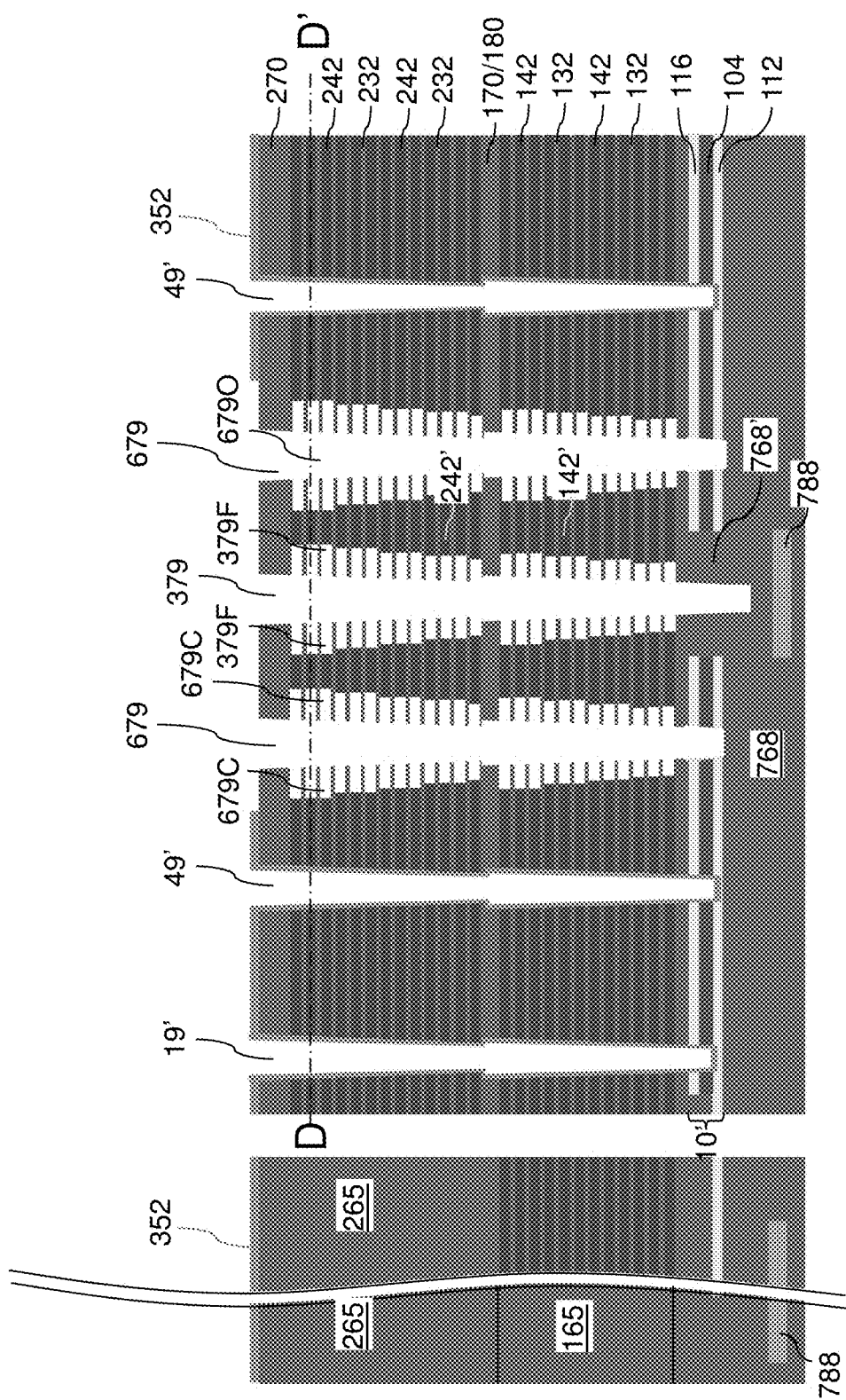

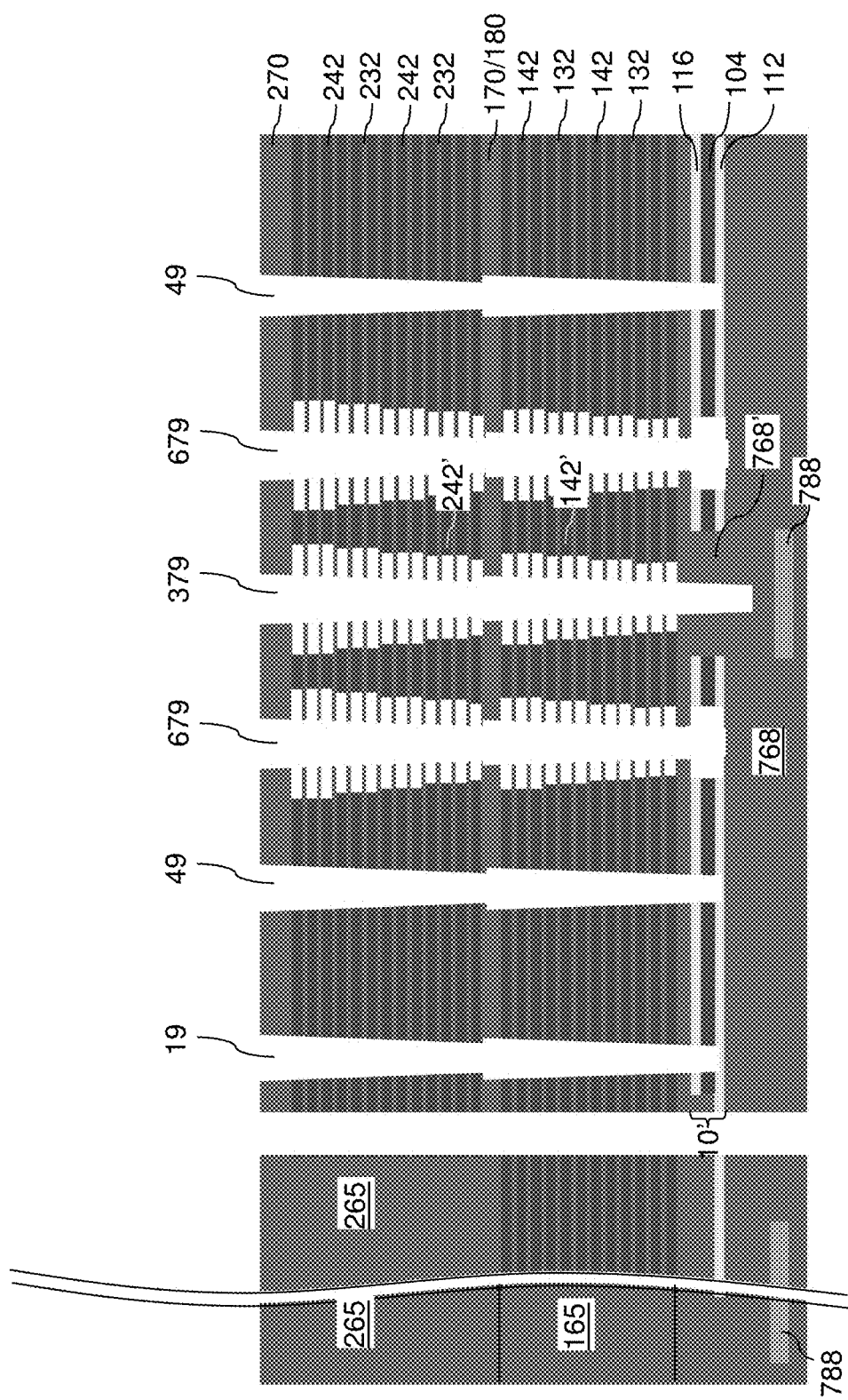

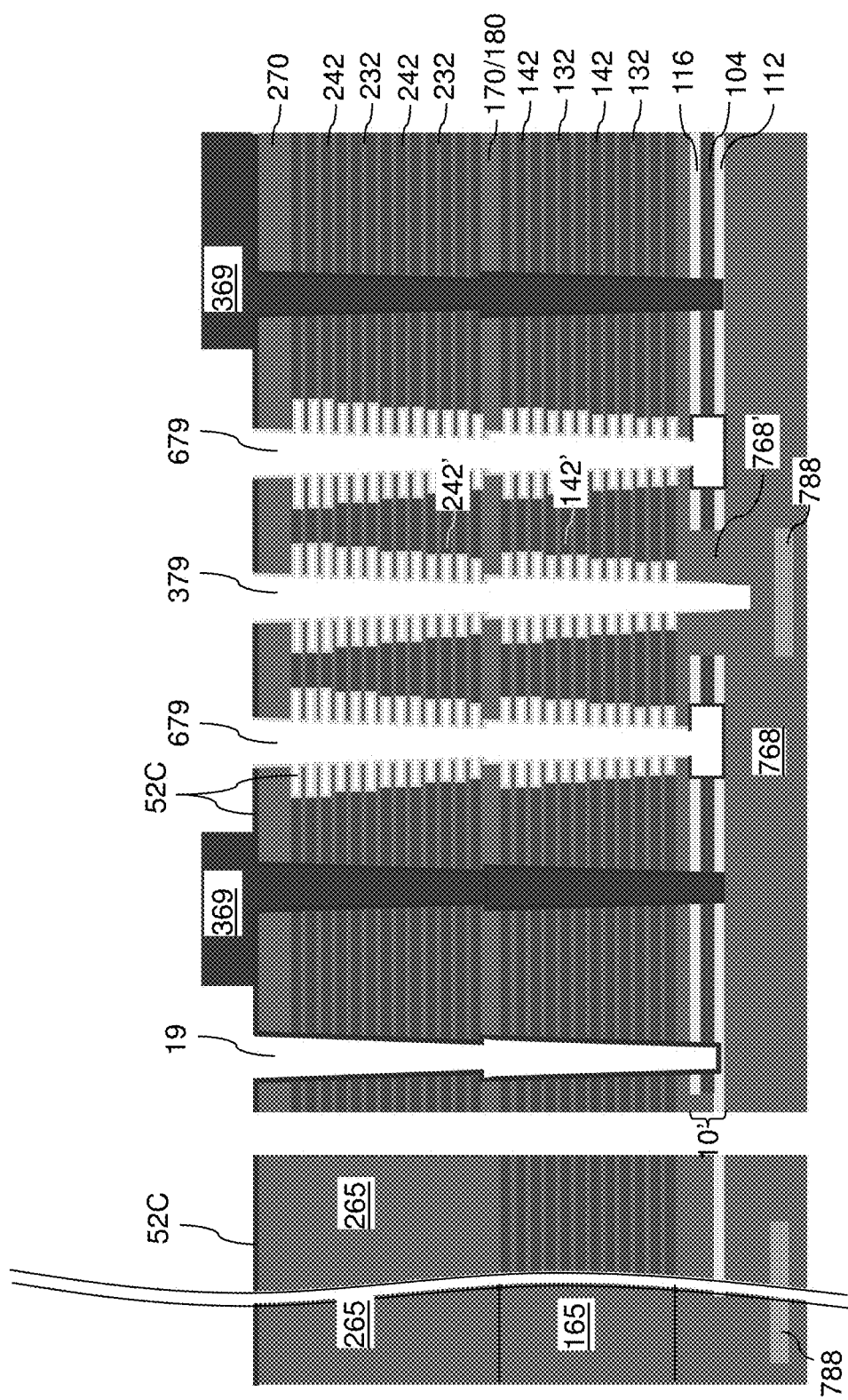

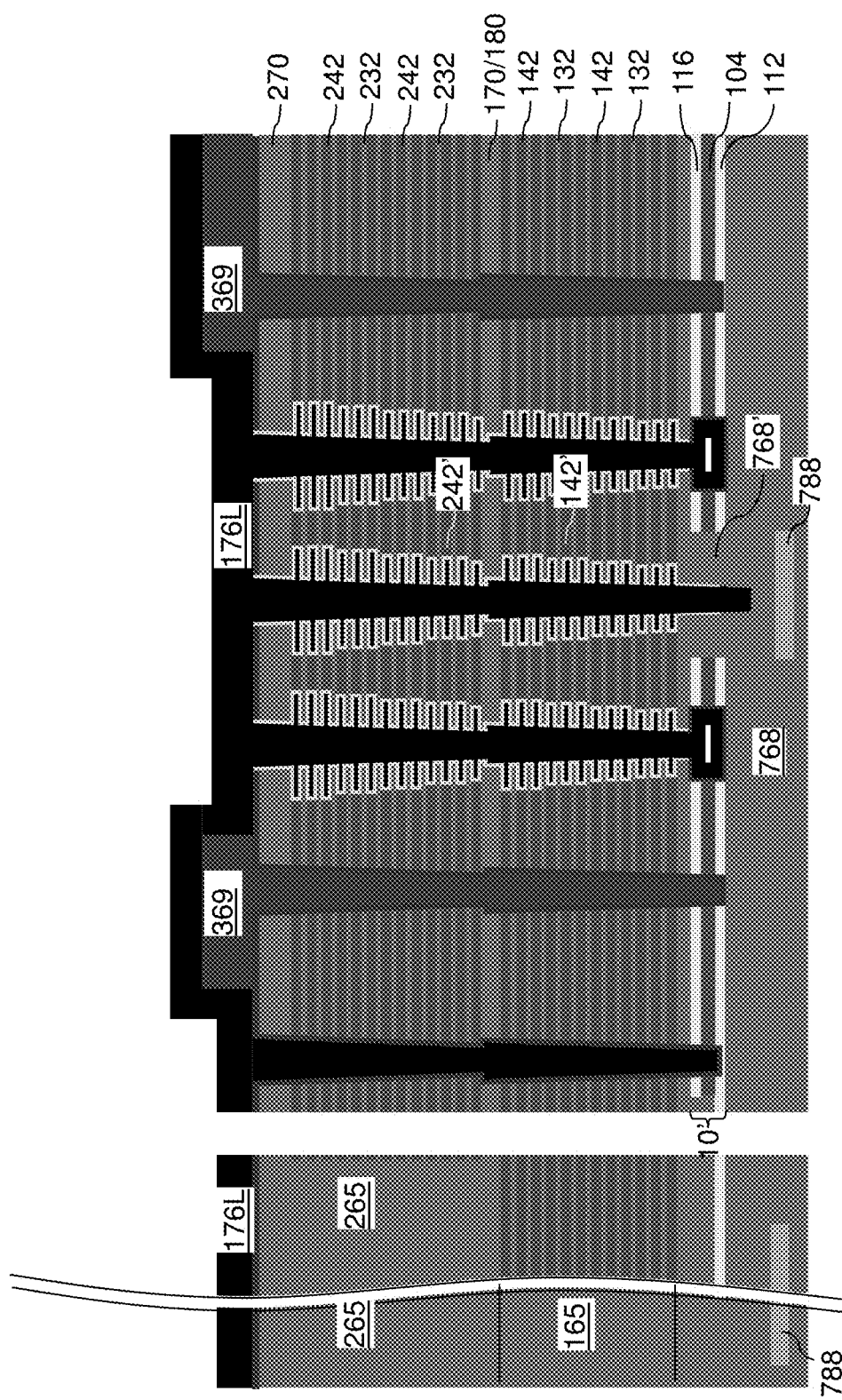

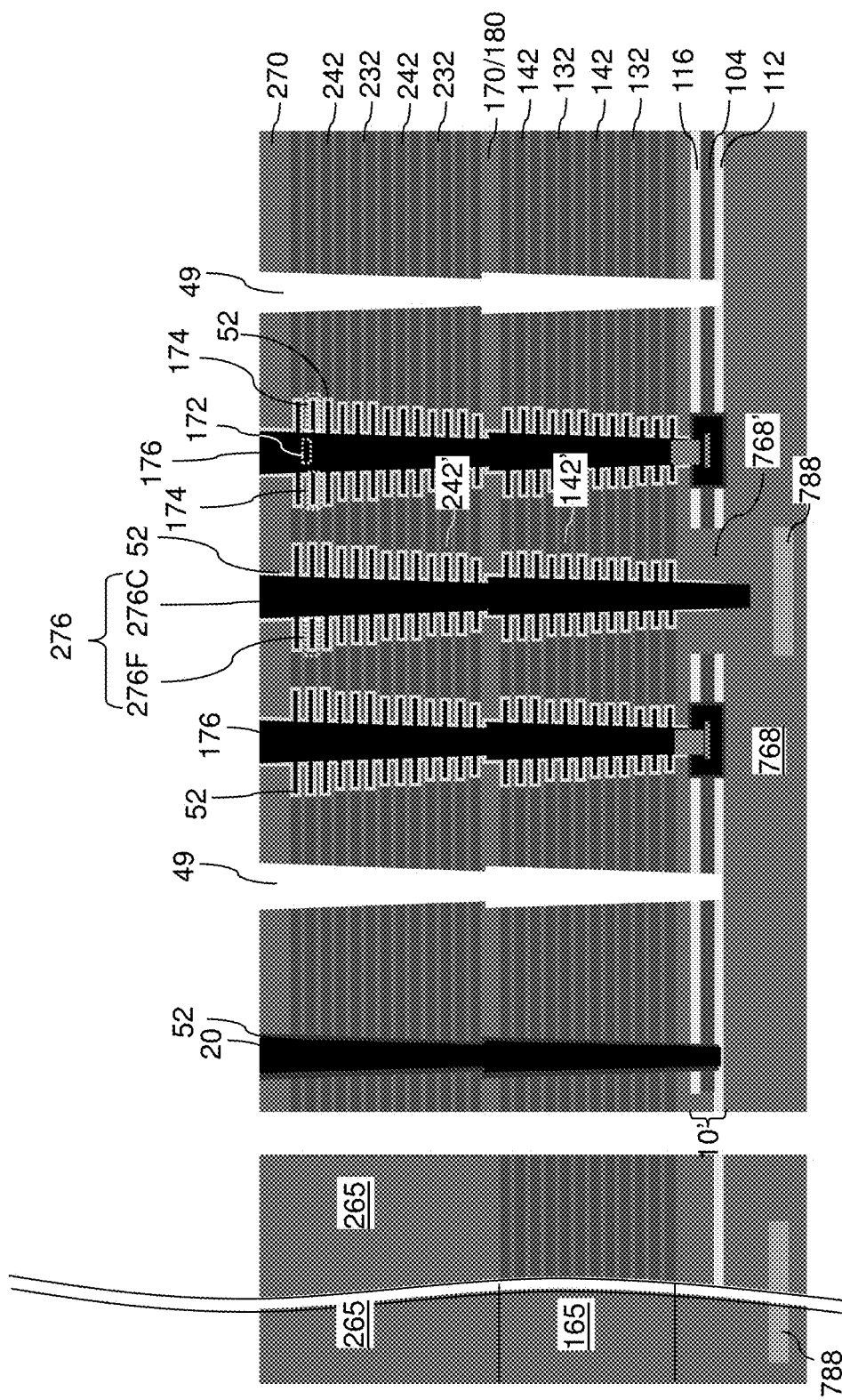

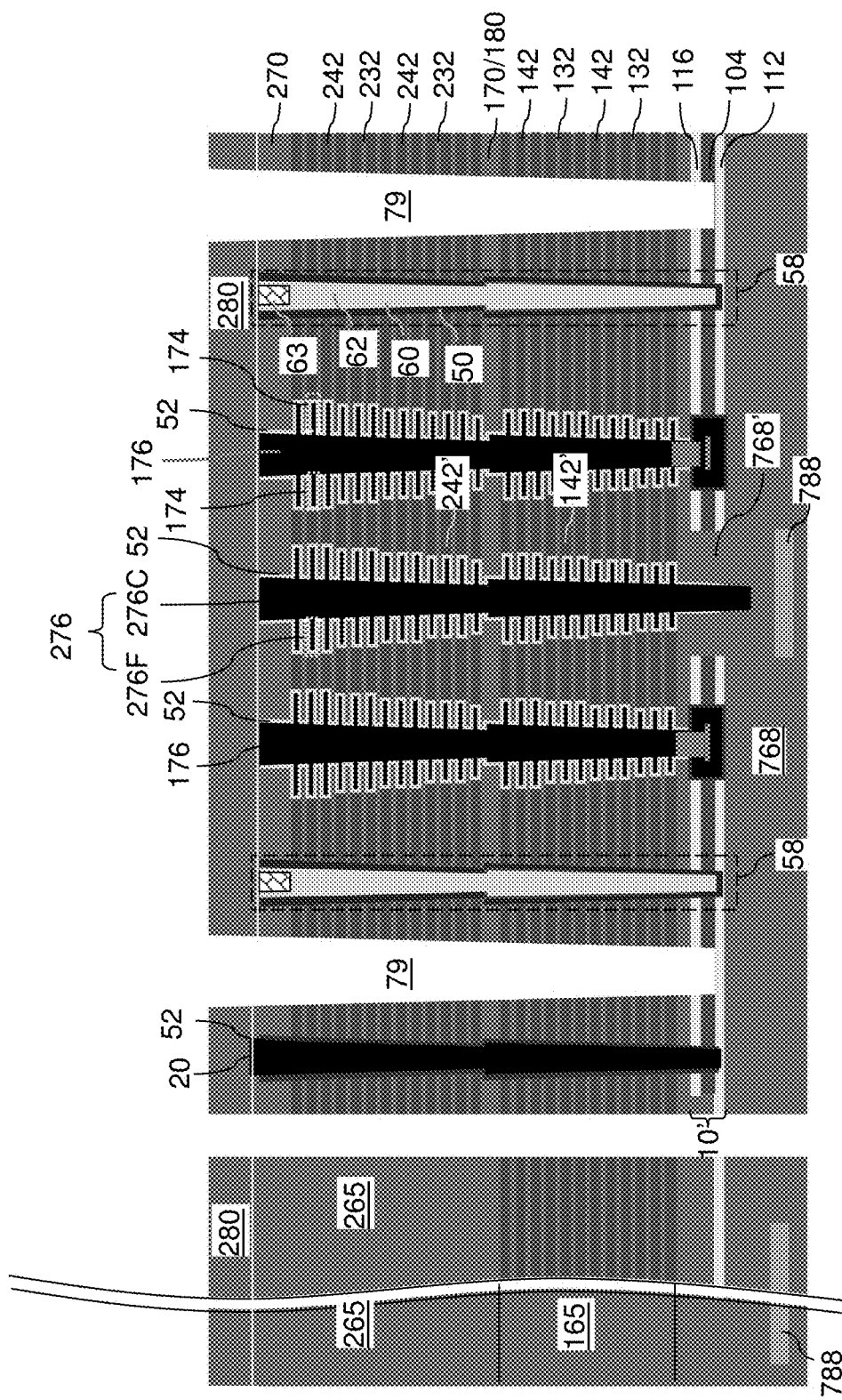

THREE-DIMENSIONAL MEMORY DEVICE WITH VIA STRUCTURES SURROUNDED BY PERFORATED DIELECTRIC MOAT STRUCTURE AND METHODS OF MAKING THE SAME

RELATED APPLICATIONS

The present application is a continuation-in-part application of U.S. application Ser. No. 16/735,854 filed on Jan. 7, 2020, the entire content of which is incorporated herein by reference.

FIELD

The present disclosure relates generally to the field of semiconductor devices and specifically to a three-dimensional memory device containing via structures surrounded by a perforated dielectric moat structure and methods of making the same.

BACKGROUND

Three-dimensional memory devices may include memory stack structures. The memory stack structures overlie a substrate and extend through an alternating stack of insulating layers and electrically conductive layers. The memory stack structures include vertical stacks of memory elements provided at levels of the electrically conductive layers. Peripheral devices may be provided on the substrate underneath the alternating stack and the memory stack structures.

SUMMARY

According to an aspect of the present disclosure, a three-dimensional memory device is provided, which comprises: an alternating stack of insulating layers and electrically conductive layers located over a substrate; memory stack structures vertically extending through the alternating stack, wherein each of the memory stack structures comprises a vertical semiconductor channel and a vertical stack of memory elements located at levels of the electrically conductive layers; a perforated dielectric moat structure vertically extending through the alternating stack and including a plurality of lateral openings at each level of the insulating layers and not including any opening at levels of the electrically conductive layers; and an interconnection via structure laterally surrounded by the perforated dielectric moat structure and vertically extending through each insulating layer within the alternating stack and contacting a top surface of an underlying metal interconnect structure.

According to another aspect of the present disclosure, a method for forming a three-dimensional memory device is provided, which comprises: forming an alternating stack of insulating layers and sacrificial material layers over a substrate, wherein the sacrificial material layers comprise a dielectric material; forming a row of moat region openings through the alternating stack, wherein the row of moat region openings is arranged in a pattern that surrounds an area within the alternating stack; forming at least one connection-via-region opening through the alternating stack within the area that is surrounded by the row of moat region openings; forming a moat trench by laterally expanding each moat region opening within the row of moat region openings until the moat region openings merge at levels of the sacrificial material layers; forming a perforated dielectric moat structure vertically extending through the alternating stack by filling the moat trench with a dielectric fill material; forming a finned dielectric pillar structure by filling the at least one connection-via-region opening with the dielectric fill material; forming memory stack structures through the alternating stack; and forming an interconnection via structure that vertically extends through the finned dielectric pillar structure, wherein remaining portions of the finned dielectric pillar structure comprise a vertical stack of dielectric material fins that laterally surround and contact the interconnection via structure.

According to an aspect of the present disclosure, a three-dimensional memory device is provided, which comprises: an alternating stack of insulating layers and electrically conductive layers located over a substrate; memory stack structures vertically extending through the alternating stack, wherein each of the memory stack structures comprises a vertical semiconductor channel and a vertical stack of memory elements located at levels of the electrically conductive layers; a perforated dielectric moat structure vertically extending through the alternating stack and including a plurality of lateral openings at each level of the insulating layers and not including any opening at levels of the electrically conductive layers; and an interconnection via structure laterally surrounded by the perforated dielectric moat structure and vertically extending through each insulating layer within the alternating stack.

According to another aspect of the present disclosure, a method for forming a three-dimensional memory device is provided, which comprises: forming an alternating stack of insulating layers and sacrificial material layers over a substrate, wherein the sacrificial material layers comprise a dielectric material; forming a row of moat region openings through the alternating stack, wherein the row of moat region openings is arranged in a pattern that surrounds an area within the alternating stack; forming a moat trench by laterally expanding each moat region opening within the row of moat region openings at levels of the sacrificial material layers, wherein the moat trench comprises a continuously extending volume that laterally surrounds a patterned portion of a respective sacrificial material layer at each level of the sacrificial material layers; forming a perforated dielectric moat structure vertically extending through the alternating stack by filling the moat trench with a dielectric fill material; and forming memory stack structures through the alternating stack, wherein each of the memory stack structures comprises a vertical semiconductor channel and a vertical stack of memory elements located at levels of the electrically conductive layers.

BRIEF DESCRIPTION OF THE DRAWINGS

FIGS. 20A-20D illustrate sequential vertical cross-sectional views of a memory opening during formation of a memory opening fill structure according to the first embodiment of the present disclosure.

FIG. 28B is a horizontal cross-sectional view of the second exemplary structure of FIG. 28A at a level of one of the insulating layers along plane B-B' in FIG. 28A.

FIG. 29D is a vertical cross-sectional view of the second exemplary structure along the hinged vertical plane D-D' of FIG. 29C.

FIG. 29E is a vertical cross-sectional view of the second exemplary structure of FIGS. 29A-29D along a vertical plane that extends across a staircase region.

FIG. 30A is a vertical cross-sectional view of a memory region of the second exemplary structure after formation of a conformal etch mask material layer and a conformal cover material layer according to the second embodiment of the present disclosure.

FIG. 30B is a vertical cross-sectional view of a staircase region of the second exemplary structure of FIG. 30A.

FIG. 31A is a vertical cross-sectional view of a region of the second exemplary structure after formation of a patterned photoresist layer according to the second embodiment of the present disclosure.

FIG. 31B is a vertical cross-sectional view of a staircase region of the second exemplary structure of FIG. 31A.

FIG. 32A is a vertical cross-sectional view of a region of the second exemplary structure after removal of unmasked portions of the conformal cover material layer according to the second embodiment of the present disclosure.

FIG. 32B is a vertical cross-sectional view of a staircase region of the second exemplary structure of FIG. 32A.

FIG. 33A is a vertical cross-sectional view of a region of the second exemplary structure after removal of the patterned photoresist layer according to the second embodiment of the present disclosure.

FIG. 33B is a vertical cross-sectional view of a staircase region of the second exemplary structure of FIG. 33A.

FIG. 34A is a vertical cross-sectional view of a region of the second exemplary structure after removal of unmasked portions of the conformal etch mask material layer according to the second embodiment of the present disclosure.

FIG. 34B is a vertical cross-sectional view of a staircase region of the second exemplary structure of FIG. 34A.

FIG. 35A is a vertical cross-sectional view of a region of the second exemplary structure after removal of remaining portions of the conformal cover material layer according to the second embodiment of the present disclosure.

FIG. 35B is a vertical cross-sectional view of a staircase region of the second exemplary structure of FIG. 35A.

FIG. 36A is a vertical cross-sectional view of a region of the second exemplary structure after formation of lateral recess cavities around each opening that is not masked by the conformal etch mask material layer according to the second embodiment of the present disclosure.

FIG. 36B is a vertical cross-sectional view of a staircase region of the second exemplary structure of FIG. 36A.

FIG. 37A is a vertical cross-sectional view of a region of the second exemplary structure after removal of the conformal etch mask material layer according to the second embodiment of the present disclosure.

FIG. 37B is a vertical cross-sectional view of a staircase region of the second exemplary structure of FIG. 37A.

FIG. 38A is a vertical cross-sectional view of a region of the second exemplary structure after formation of a patterned sacrificial fill material layer according to the second embodiment of the present disclosure.

FIG. 38B is a vertical cross-sectional view of a staircase region of the second exemplary structure of FIG. 38A.

FIG. 39A is a vertical cross-sectional view of a region of the second exemplary structure after depositing a dielectric fill material according to the second embodiment of the present disclosure.

FIG. 39B is a vertical cross-sectional view of a staircase region of the second exemplary structure of FIG. 39A.

FIG. 40A is a vertical cross-sectional view of a region of the second exemplary structure after planarization of the dielectric fill material and removal of the patterned sacrificial fill material layer according to the second embodiment of the present disclosure.

FIG. 40B is a vertical cross-sectional view of a staircase region of the second exemplary structure of FIG. 40A.

FIG. 44A is a vertical cross-sectional view of a region of the second exemplary structure after formation of a contact-level dielectric layer and backside trenches according to the second embodiment of the present disclosure.

FIG. 44B is a vertical cross-sectional view of a staircase region of the second exemplary structure of FIG. 44A.

DETAILED DESCRIPTION

Figure 1A:
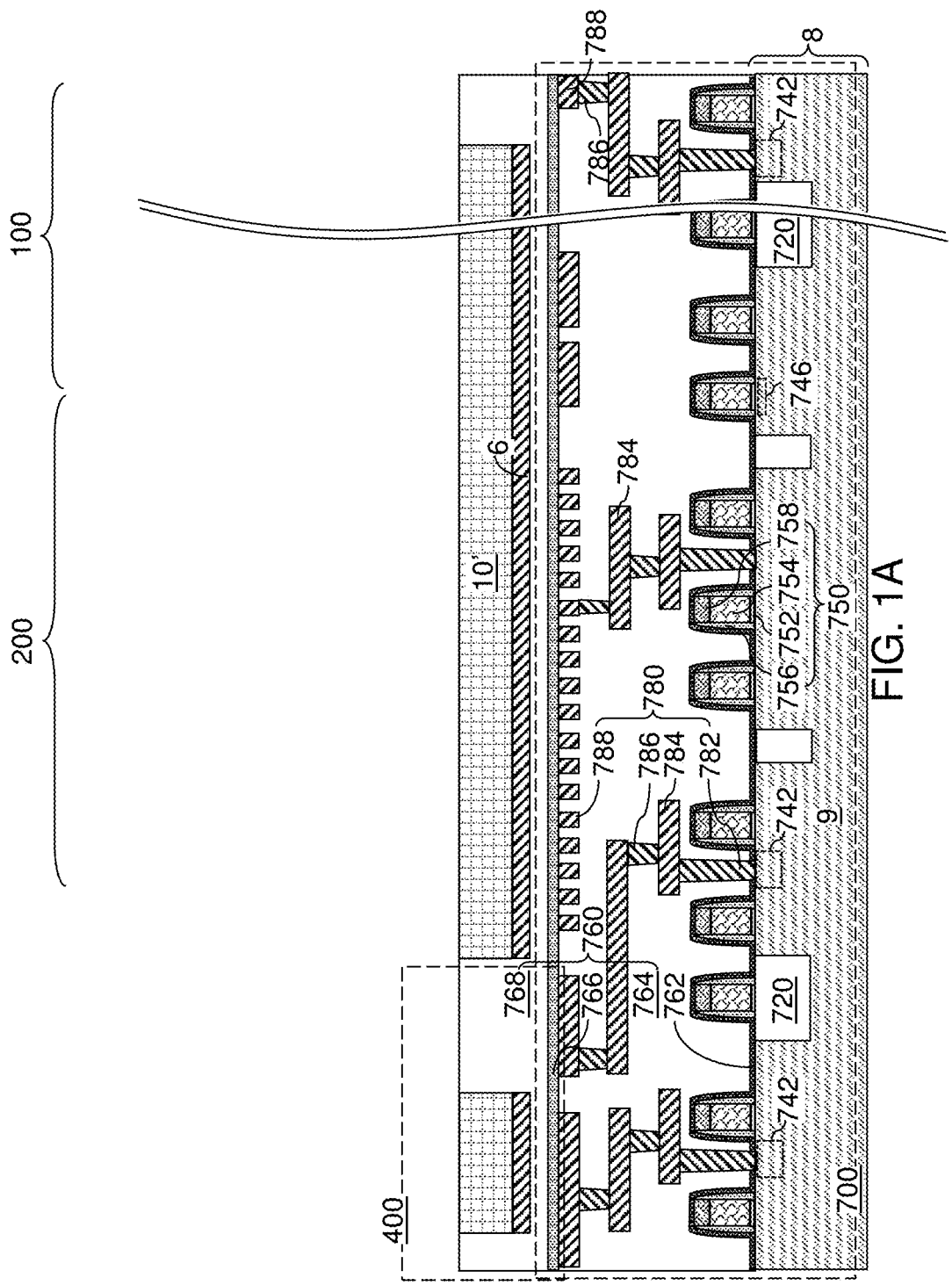
FIG. 1A is a vertical cross-sectional view of an exemplary structure after formation of semiconductor devices, lower level dielectric layers, lower metal interconnect structures, and in-process source level material layers on a semiconductor substrate according to a first embodiment of the present disclosure.

The embodiments of the present disclosure provide a three-dimensional memory device containing conductive via structures extending through a stack of dielectric materials and surrounded by a perforated dielectric moat structure and methods of making the same, the various embodiments of which are described herein in detail. The insulating layers of the stack extend through perforations in the perforated dielectric moat structure to provide enhanced stability to the device during processing.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
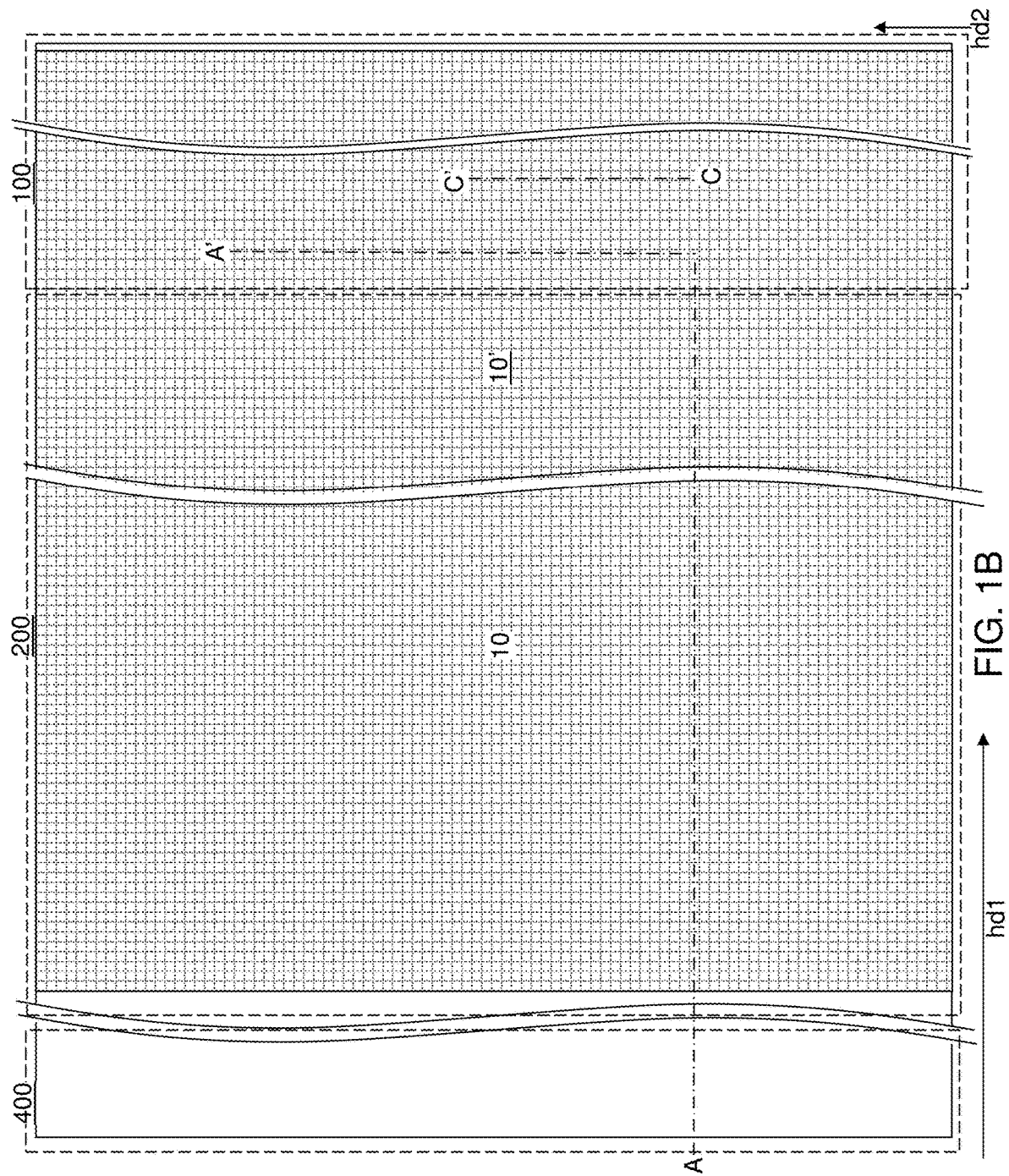
FIG. 1B is a top-down view of the first exemplary structure of FIG. 1A. The hinged vertical plane A-A' is the plane of the vertical cross-sectional view of FIG. 1A.
Figure 1C:
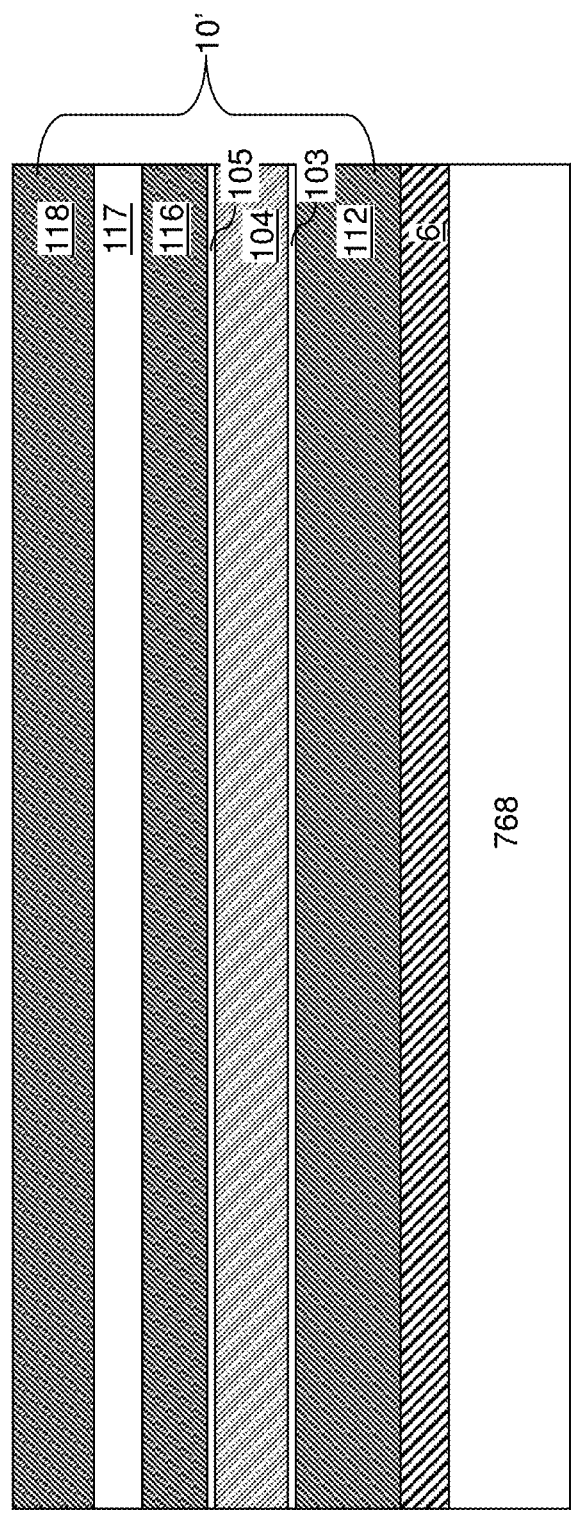
FIG. 1C is a magnified view of the in-process source level material layers along the vertical plane C-C' of FIG. 1B.

Referring to FIGS. 1A-1C, an exemplary structure according to a first embodiment of the present disclosure is illustrated. FIG. 1C is a magnified view of an in-process source-level material layers 10' illustrated in FIGS. 1A and 1B. The first exemplary structure includes a semiconductor substrate 8 and semiconductor devices 710 formed thereupon. The semiconductor substrate 8 may include a substrate semiconductor layer 9 at least at an upper portion thereof. Shallow trench isolation structures 720 may be formed in an upper portion of the substrate semiconductor layer 9 to provide electrical isolation between the semiconductor devices 710. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers may be formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer 766 (e.g., hydrogen diffusion barrier) that overlies the first dielectric material layers 764, and at least one second dielectric layer 768. The dielectric layer stack including the lower-level dielectric material layers 760 may function as a matrix for lower-level metal interconnect structures 780 that provide electrical wiring to and from the various nodes of the semiconductor devices and landing pads for through-memory-level interconnection via structures to be subsequently formed. The lower-level metal interconnect structures 780 may be formed within the dielectric layer stack of the lower-level dielectric material layers 760 and overlies the field effect transistors. The lower-level metal interconnect structures 780 may comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level interconnection via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 10'. The optional conductive plate layer 6, if present, provides a high conductivity conduction path for electrical current that flows into, or out of, the in-process source-level material layers 10'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 10' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 10' may include, from bottom to top, a lower source-level material layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level material layer 112 and the upper source-level semiconductor layer 116 may include a doped semiconductor material such as doped polysilicon or doped amorphous silicon. The conductivity type of the lower source-level material layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level material layer 112 and the upper source-level semiconductor layer 116 have a doping of a second conductivity type that is the opposite of the first conductivity type. The thickness of each of the lower source-level material layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped poly silicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 10' may be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the semiconductor substrate 8.

The optional conductive plate layer 6 and the in-process source-level material layers 10' may be patterned to provide openings in areas in which through-memory-level interconnection via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed.

The optional conductive plate layer 6 and the in-process source-level material layers 10' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 10' may be formed within the area of a memory array region 100, in which a three-dimensional memory array including memory stack structures is to be subsequently formed. A peripheral device region 400 that may be subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 may be formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and may be located at the level of the lower-level dielectric material layers 760. Through-memory-level interconnection via structures may be subsequently formed directly on the lower-level metal interconnect structures 780 to provide electrical connection to memory devices that are also to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level interconnection via structures to be subsequently formed.

Figure 2:
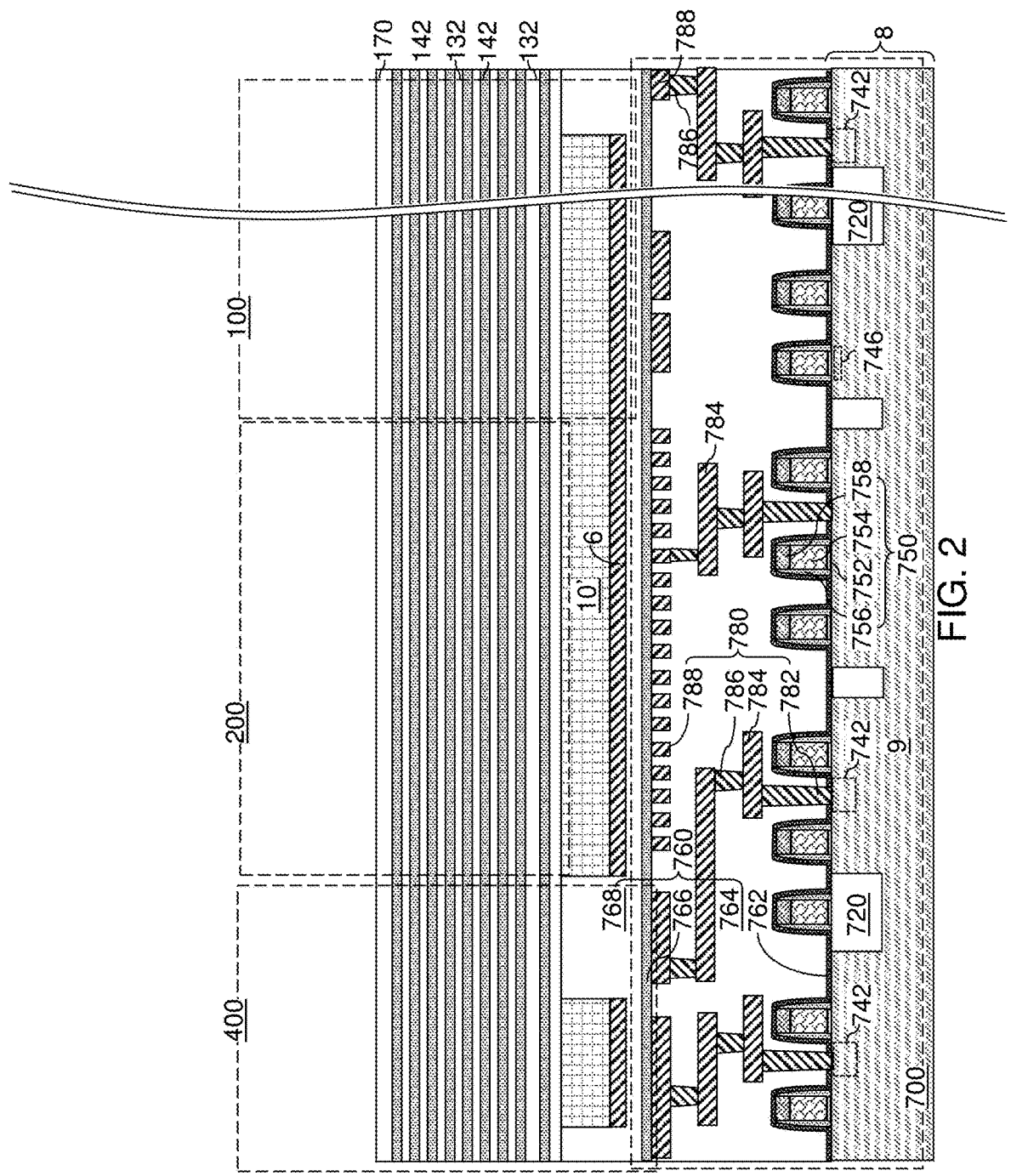
FIG. 2 is a vertical cross-sectional view of the first exemplary structure after formation of a first-tier alternating stack of first insulating layers and first spacer material layers according to the first embodiment of the present disclosure.

Referring to FIG. 2, an alternating stack of first material layers and second material layers may be formed. Each first material layer may include a first material, and each second material layer may include a second material that is different from the first material. In embodiments where at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulating layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 10'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. According to an aspect of the present disclosure, the first sacrificial material layers 142 include a dielectric material. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 may be subsequently formed over the first-tier alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
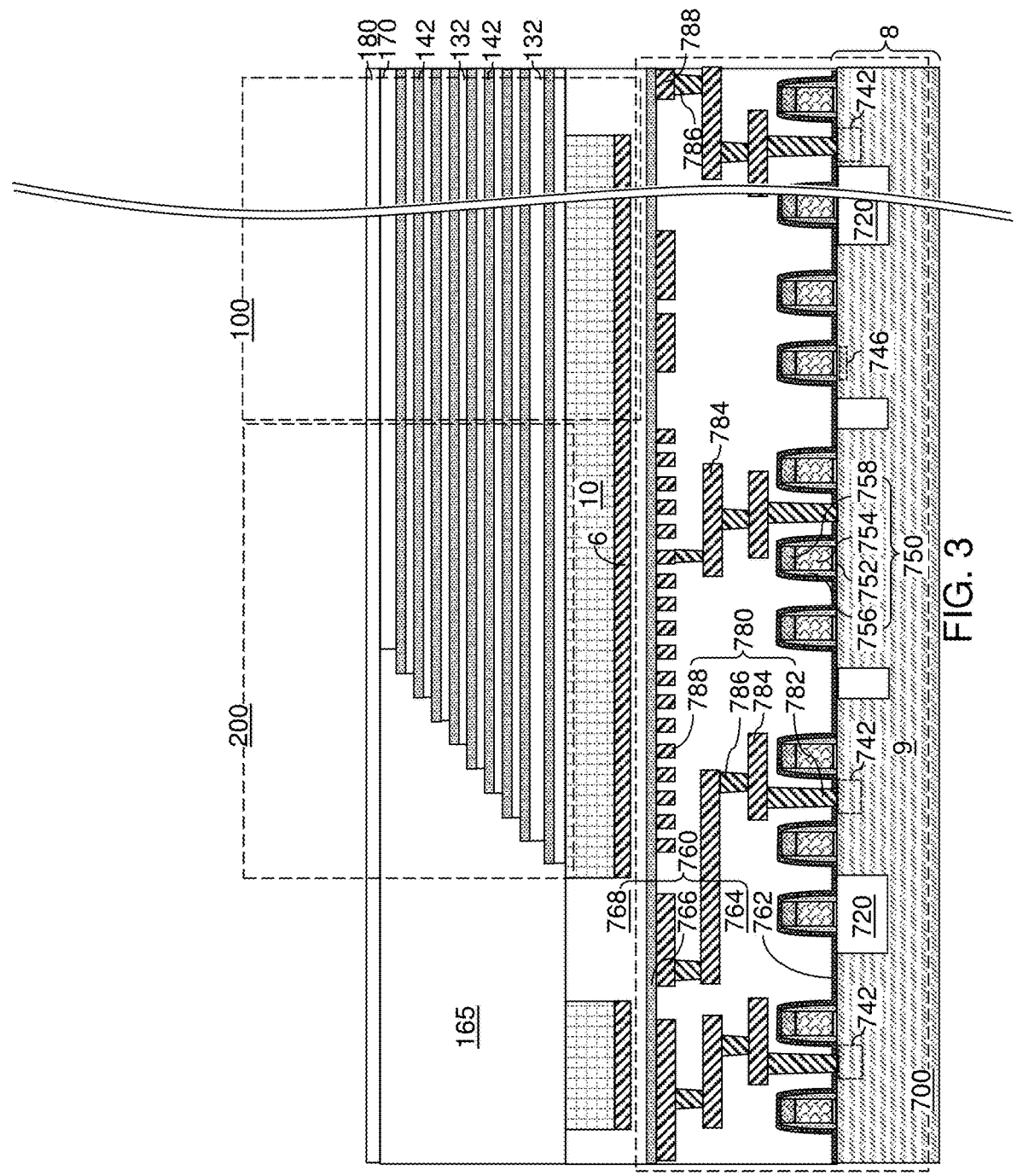
FIG. 3 is a vertical cross-sectional view of the first exemplary structure after patterning a first-tier staircase region, a first retro-stepped dielectric material portion, and an inter-tier dielectric layer according to the first embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
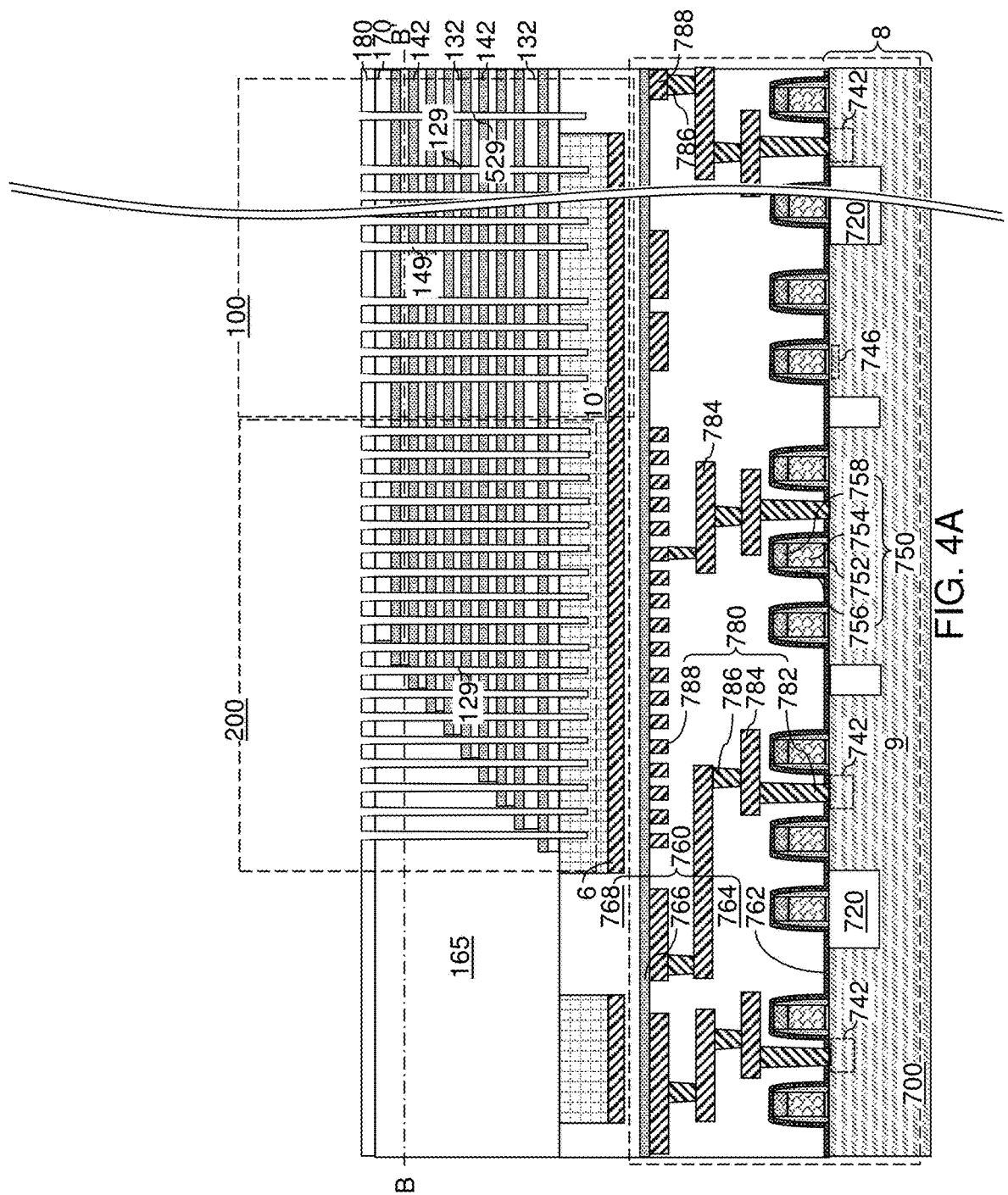
FIG. 4A is a vertical cross-sectional view of the first exemplary structure after formation of first-tier memory openings, first-tier support openings, and first-tier isolation openings according to the first embodiment of the present disclosure.
Figure 4B:
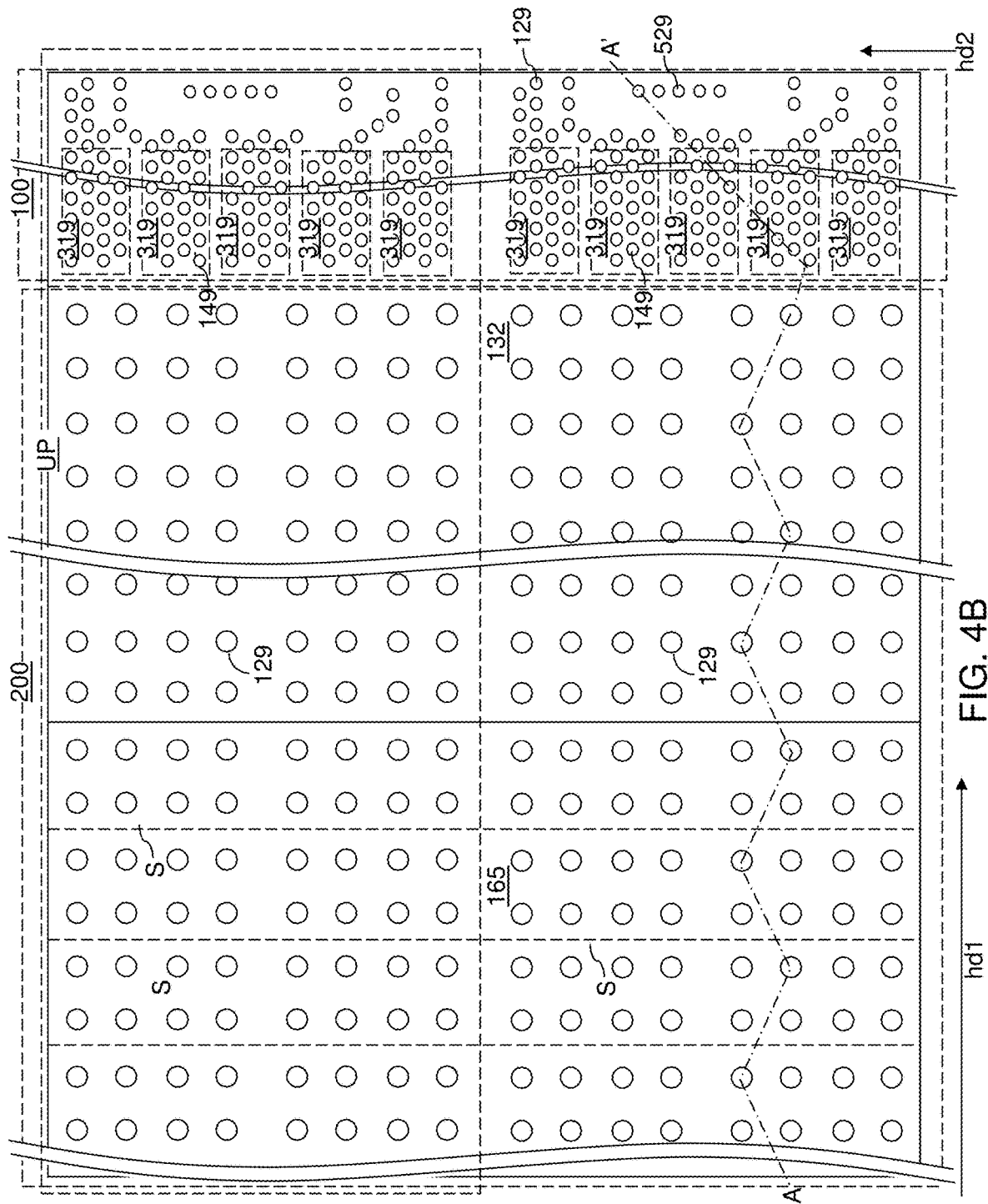
FIG. 4B is top-down view of the first exemplary structure of FIG. 4A. The hinged vertical plane A-A' corresponds to the plane of the vertical cross-sectional view of FIG. 4A.
Figure 4C:
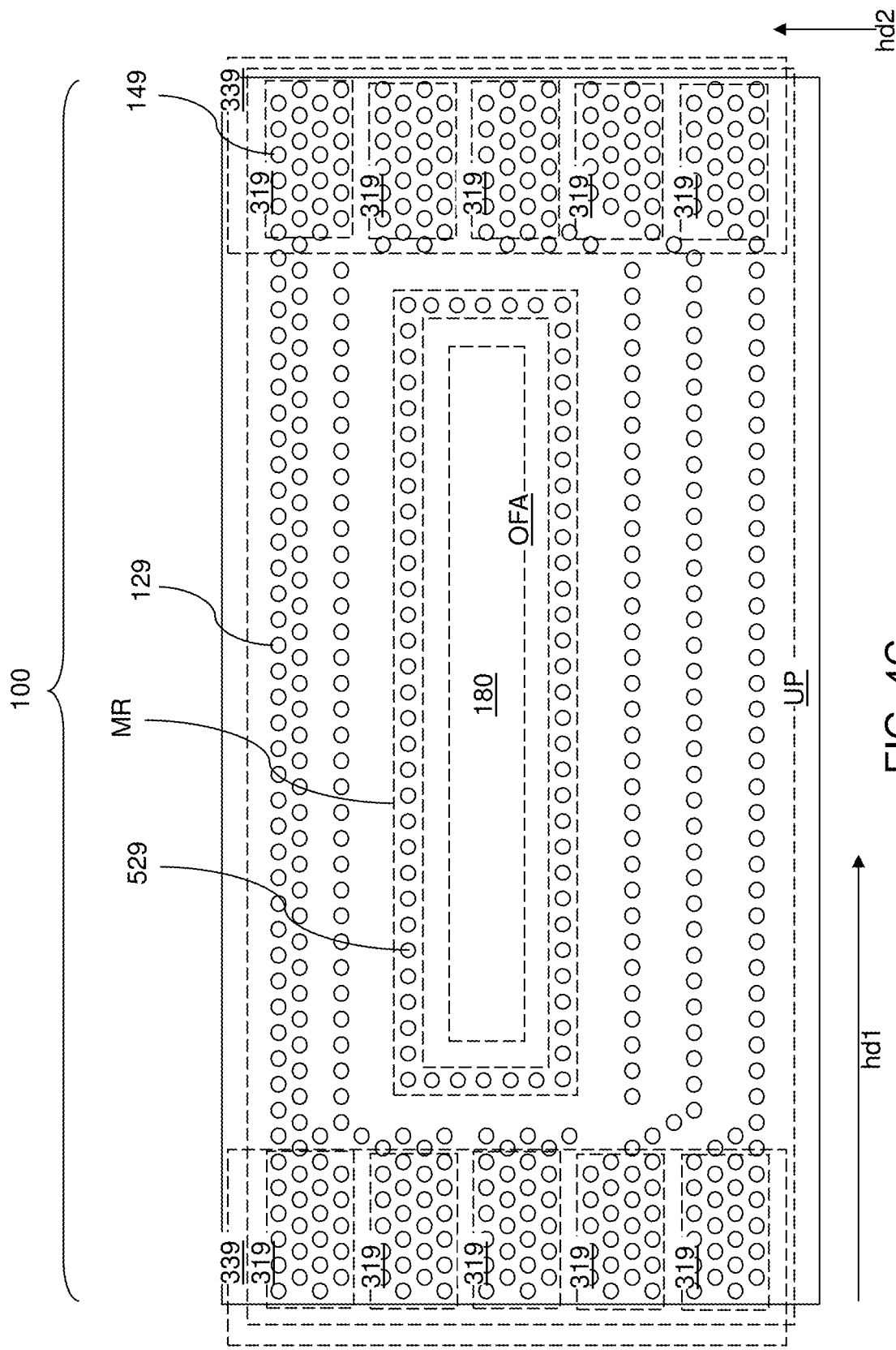
FIG. 4C is a top-down view of another area of the first exemplary structure of FIG. 4A.

Referring to FIGS. 4A-4C, various first-tier openings (149, 129, 529) may be formed through the inter-tier dielectric layer 180 and the first-tier structure (132, 142, 170, 165) and into the in-process source-level material layers 10'. A photoresist layer (not shown) may be applied over the inter-tier dielectric layer 180, and may be lithographically patterned to form various openings therethrough.

The pattern of openings in the photoresist layer may be transferred through the inter-tier dielectric layer 180 and the first-tier structure (132, 142, 170, 165) and into the in-process source-level material layers 10' by a first anisotropic etch process to form the various first-tier openings (149, 129, 529) concurrently, i.e., during the first isotropic etch process. The various first-tier openings (149, 129, 529) may include first-tier memory openings 149, first-tier support openings 129, and first-tier moat-region opening 529. Locations of steps S in the first-tier alternating stack (132, 142) are illustrated as dotted lines in FIG. 4B.

The first-tier memory openings 149 may be openings that are formed in the memory array region 100 through each layer within the first-tier alternating stack (132, 142) and are subsequently used to form memory stack structures therein. The first-tier memory openings 149 may be formed in clusters 319 of first-tier memory openings 149 that are laterally spaced apart along the second horizontal direction hd2. Each cluster 319 of first-tier memory openings 149 may be formed as a two-dimensional array of first-tier memory openings 149.

A subset of the first-tier support openings 129 may be formed in sections of the memory array region 100 that are not filled with the first-tier memory openings 149. The sections of the memory array region 100 that are not filled with the first-tier memory openings 149 may be distributed over multiple areas within the memory array region 100. The first-tier support openings 129 may include a first subset of first-tier support openings 129 that are formed in the staircase region 200, and a second subset of first-tier support openings 129 that are formed between groups 339 of clusters 319 of first-tier memory openings 149 which are laterally spaced apart along the first horizontal direction hd1 in the memory array region 100. The first subset of the first-tier support openings 129 that is formed through the first retro-stepped dielectric material portion 165 may be formed through a respective horizontal surface of the first stepped surfaces.

As shown in FIG. 4C, the second subset of the first-tier support openings 129 may be formed between groups 339 of clusters 319 of the first-tier memory openings 149 that are laterally spaced apart along the first horizontal direction hd1. In one embodiment, some of the first-tier support openings 129 within the second subset of the first-tier support openings 129 may be arranged in straight rows that extend along the first direction hd1. Additional first-tier support openings 129 may be provided outside the straight rows of the first-tier support openings 129.

As shown in FIG. 4C, discrete areas free of the first-tier memory openings 149, the first-tier support openings 129, and the first-tier moat region openings 529 may be provided in the memory array region 100, which are herein referred to as opening-free areas OFA. Each opening-free area OFA can be surrounded by first-tier moat region openings 529 that are arranged along a periphery of a two-dimensional closed shape such as a polygon (e.g., a rectangle), a generally oval-like shape (e.g., a circle or an ellipse), or any two-dimensional curvilinear shape.

In one embodiment, a set of first-tier moat region openings 529 can be arranged along a periphery of a rectangular shape. Each region in which first-tier moat region openings 529 are located in proximity among one another is herein referred to as a moat region MR. In one embodiment, each opening-free area OFA may be a rectangular area having a pair of lengthwise edges that laterally extend along the first horizontal direction hd1 and having a pair of widthwise edges that laterally extend along the second horizontal direction hd2.

Generally, a unit pattern UP of a combination of first-tier memory openings 149, first-tier support openings 129, and first-tier moat region openings 529 may be repeated along the second horizontal direction hd2. Each unit pattern UP includes groups 339 of clusters 319 of first-tier memory openings 149 that are laterally spaced apart along the second horizontal direction hd2 and/or laterally spaced apart along the first horizontal direction hd1.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129, 529) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 10'. For example, the terminal portion of the anisotropic etch process may include a step that etches the dielectric material(s) of the at least one second dielectric layer 768 selective to a semiconductor material within a component layer in the in-process source-level material layers 10'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 10'. The photoresist layer may be subsequently removed, for example, by ashing.

Optionally, the portions of the first-tier memory openings 149, the first-tier support openings 129, and the first-tier moat region openings 529 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
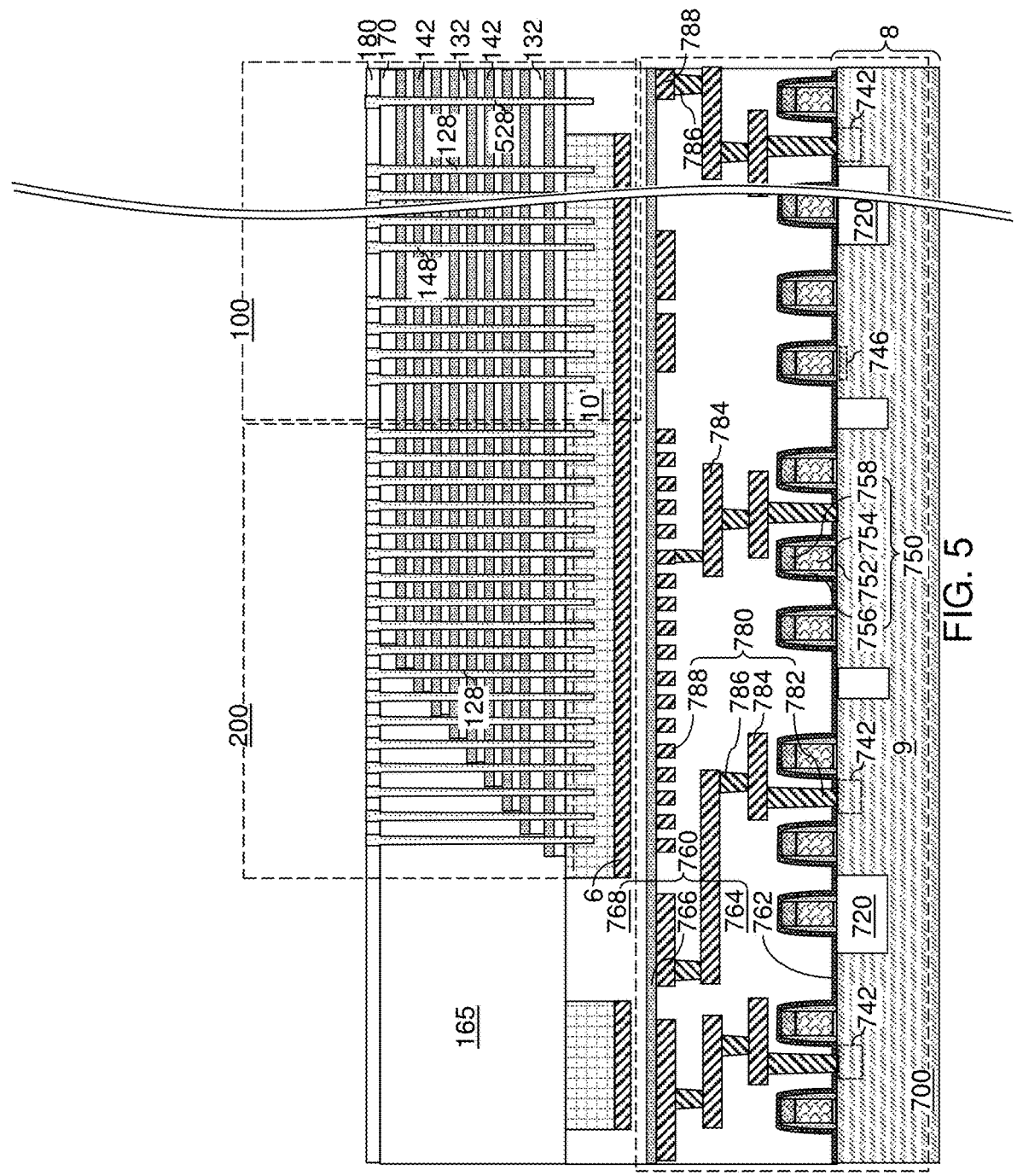
FIG. 5 is a vertical cross-sectional view of the first exemplary structure after formation of various sacrificial fill structures according to the first embodiment of the present disclosure.

Referring to FIG. 5, sacrificial first-tier opening fill portions (148, 128, 528) may be formed in the various first-tier openings (149, 129, 529). For example, a sacrificial first-tier fill material may be deposited concurrently deposited in each of the first-tier openings (149, 129, 529). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first-tier alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128, 528). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. Each remaining portion of the sacrificial material in a first-tier moat region opening 529 constitutes a sacrificial first-tier moat opening fill portion 528. The various sacrificial first-tier opening fill portions (148, 128, 528) are concurrently formed, i.e., during a same set of processes including the deposition process that deposits the sacrificial first-tier fill material and the planarization process that removes the first-tier deposition process from above the first-tier alternating stack (132, 142) (such as from above the top surface of the inter-tier dielectric layer 180). The top surfaces of the sacrificial first-tier opening fill portions (148, 128, 528) may be coplanar with the top surface of the inter-tier dielectric layer 180. Each of the sacrificial first-tier opening fill portions (148, 128, 528) may, or may not, include cavities therein.

Figure 6A:
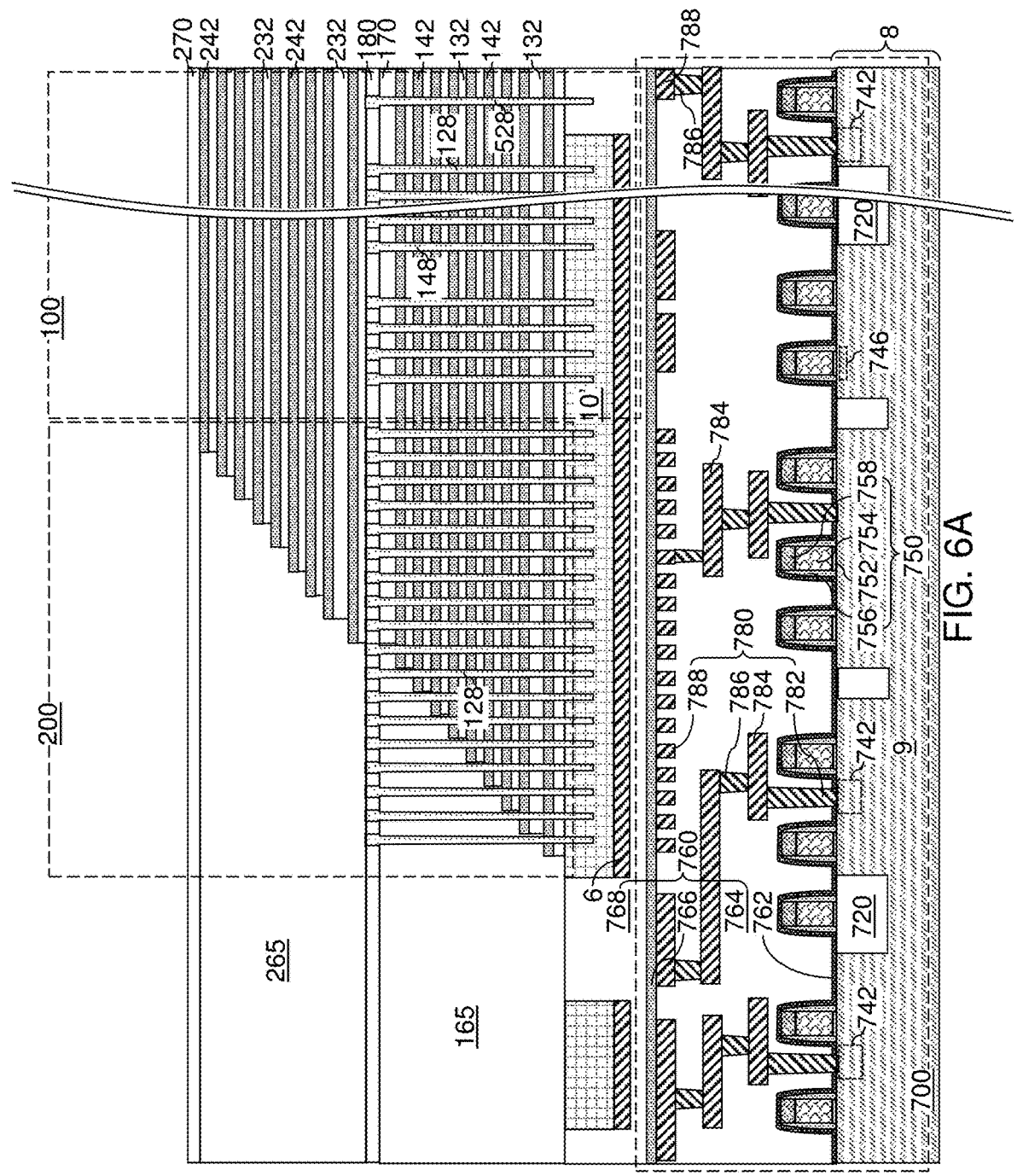
FIG. 6A is a vertical cross-sectional view of the first exemplary structure after formation of a second-tier alternating stack of second insulating layers and second spacer material layers, second stepped surfaces, and a second retro-stepped dielectric material portion according to the first embodiment of the present disclosure.
Figure 6B:
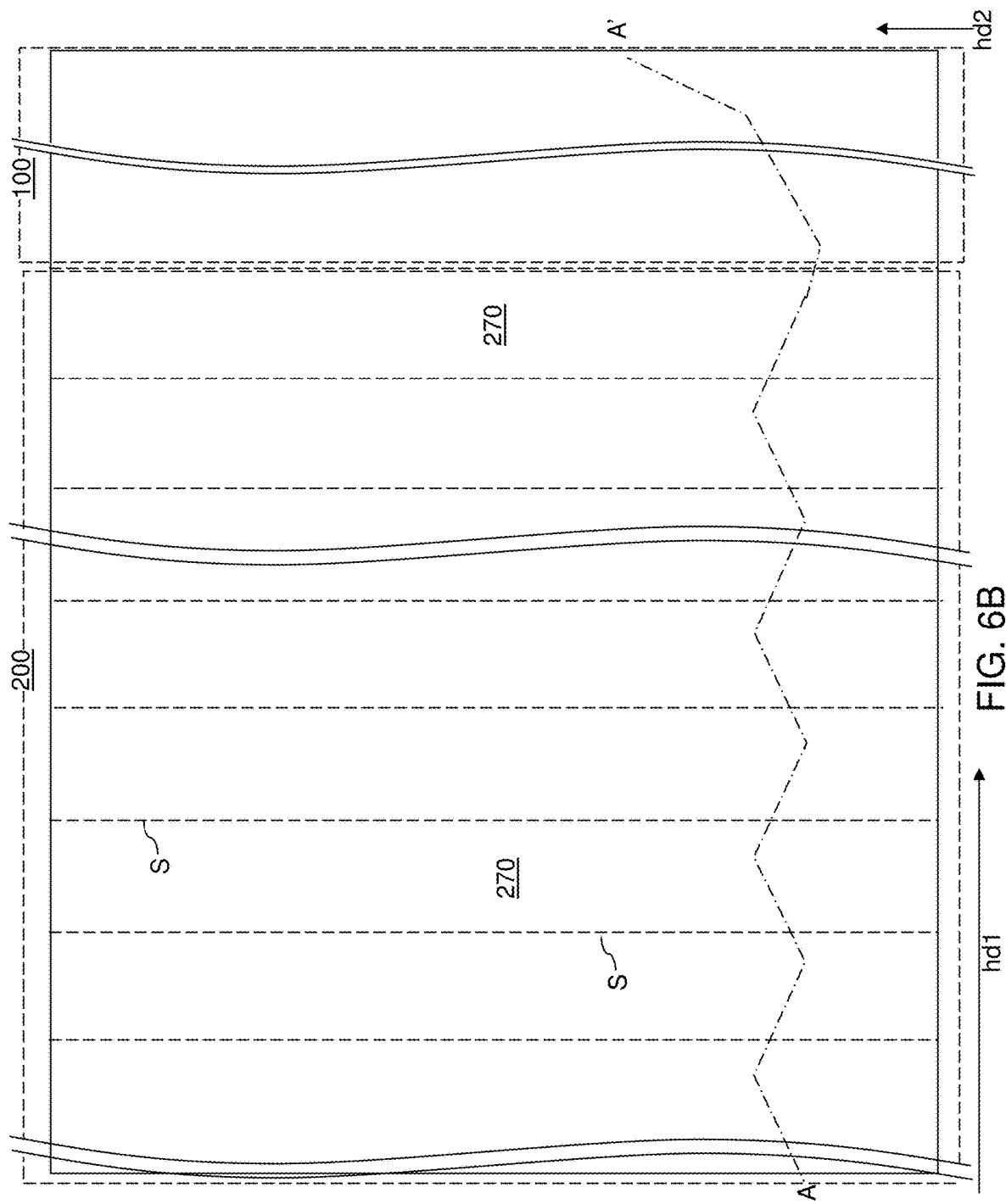
FIG. 6B is a top-down view of the first exemplary structure of FIG. 6A. The hinged vertical plane A-A' corresponds to the plane of the vertical cross-sectional view of FIG. 6A.

Referring to FIGS. 6A and 6B, a second-tier structure may be formed over the first-tier structure (132, 142, 170, 148). The second-tier structure may include an additional alternating stack of insulating layers and spacer material layers, which may be sacrificial material layers. For example, a second-tier alternating stack (232, 242) of material layers may be subsequently formed on the top surface of the first-tier alternating stack (132, 142). The second-tier alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. According to an aspect of the present disclosure, the second sacrificial material layers 242 include a dielectric material, which may be the same material as the dielectric material of the first sacrificial material layers 142. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second-tier alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material. In one embodiment, the first insulating layers 132 and the second insulating layers 232 can include silicon oxide, and the first sacrificial material layers 142 and the second sacrificial material layers 242 can include silicon nitride.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second-tier alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second-tier alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 10', and at least one retro-stepped dielectric material portion (165, 265) may be formed over the staircase regions on the at least one alternating stack (132, 142, 232, 242).

Figure 7A:
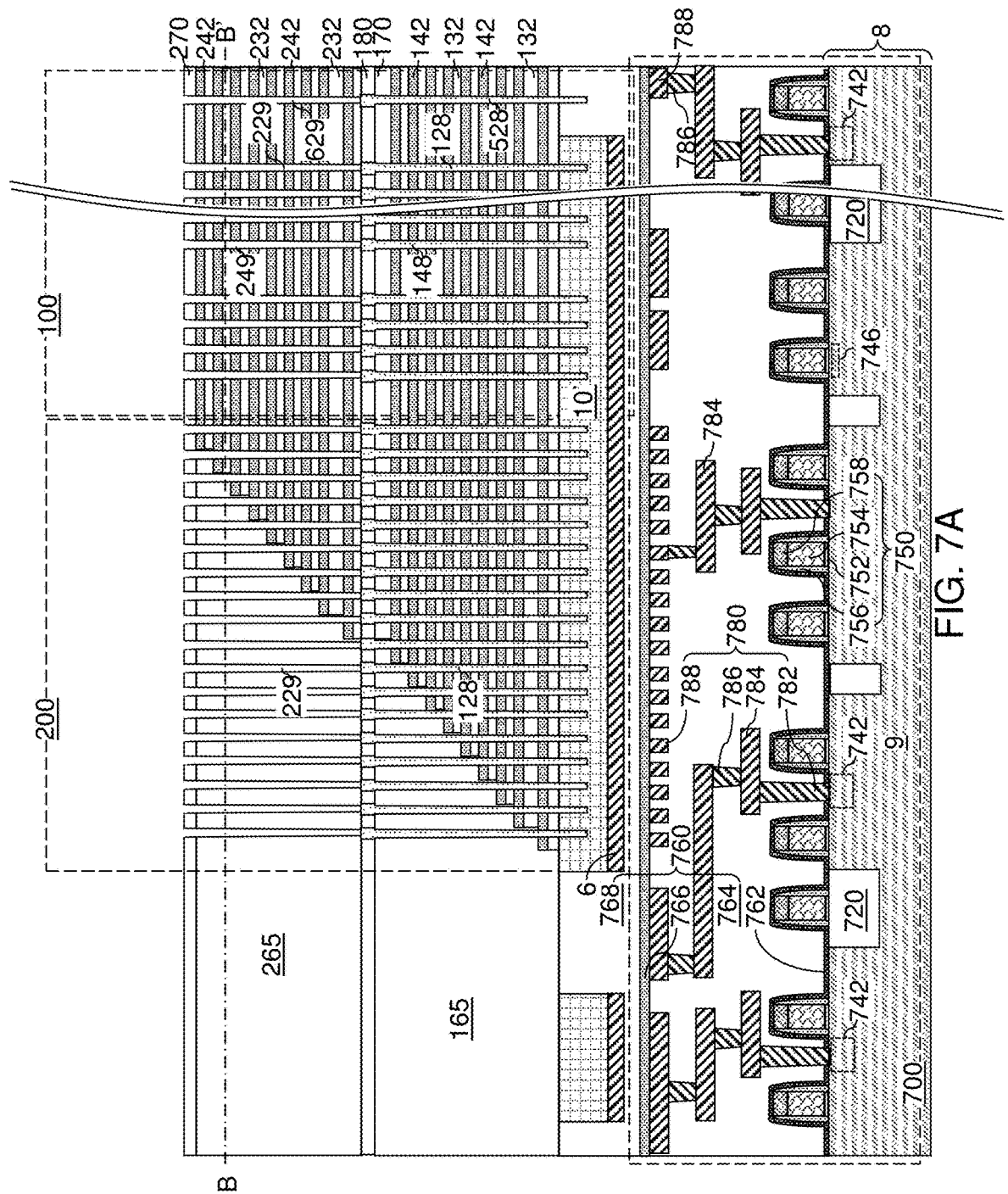
FIG. 7A is a vertical cross-sectional view of the first exemplary structure after formation of second-tier memory openings, second-tier support openings, and second-tier isolation openings according to the first embodiment of the present disclosure.
Figure 7B:
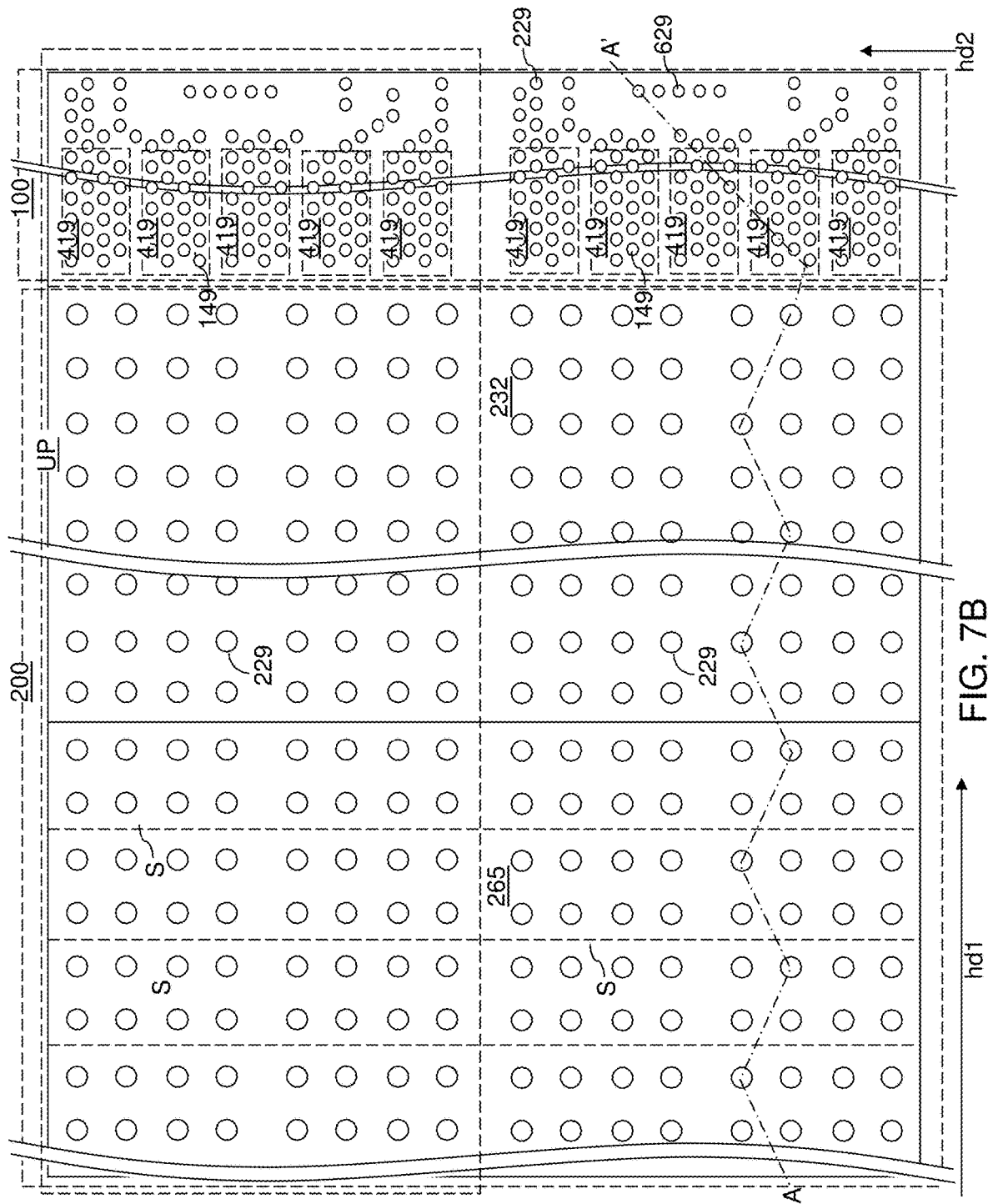
FIG. 7B is a top-down view of the first exemplary structure of FIG. 7A. The hinged vertical plane A-A' corresponds to the plane of the vertical cross-sectional view of FIG. 7A.
Figure 7C:
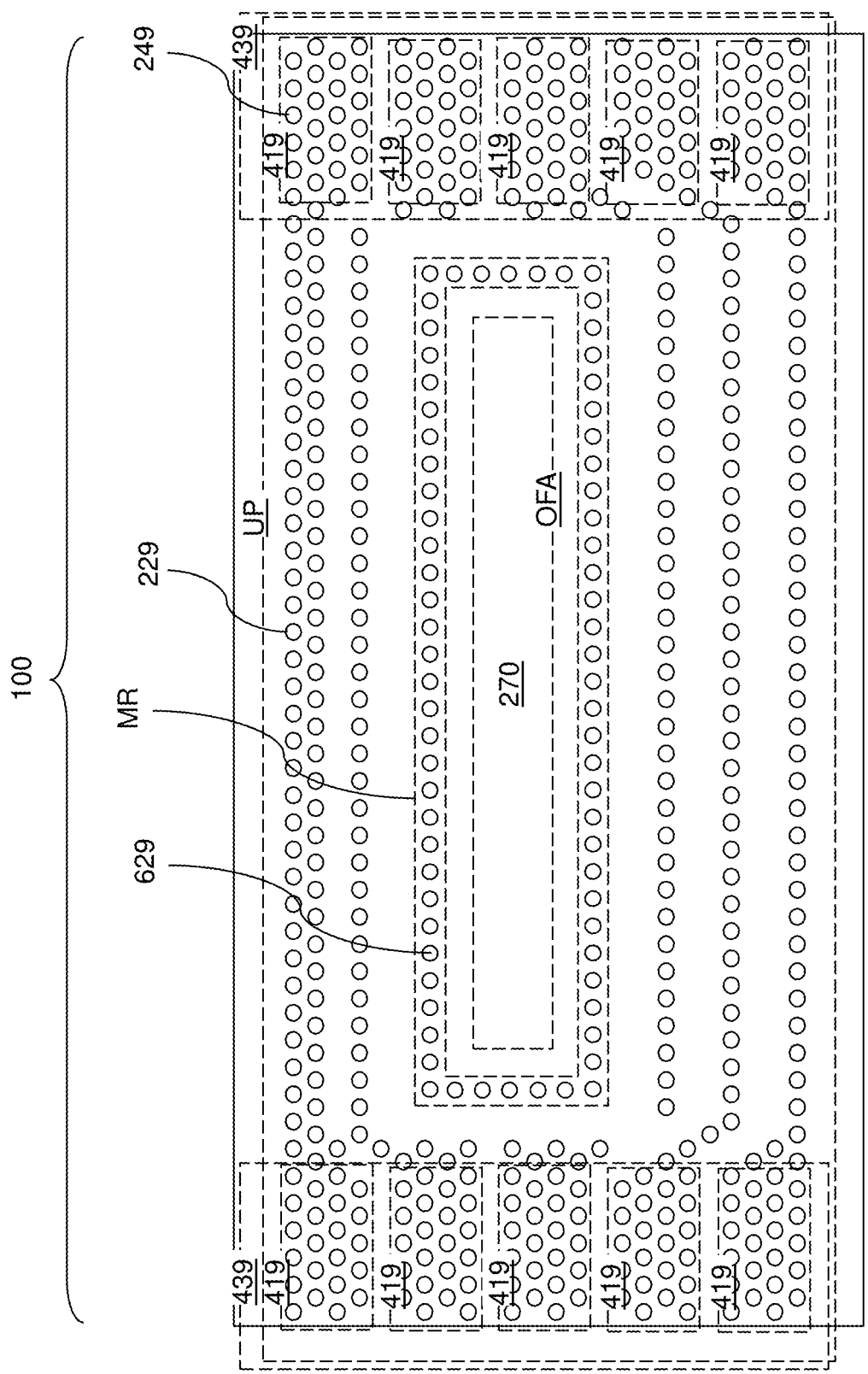
FIG. 7C is a top-down view of another area of the first exemplary structure of FIG. 7A.

Referring to FIGS. 7A-7C, various second-tier openings (249, 229, 629) may be formed through the second-tier structure (232, 242, 265, 270). A photoresist layer (not shown) may be applied over the second insulating cap layer 270, and may be lithographically patterned to form various openings therethrough. The pattern of the openings may be the same as the pattern of the various first-tier openings (149, 129, 529), which is the same as the sacrificial first-tier opening fill portions (148, 128, 528). Thus, the lithographic mask used to pattern the first-tier openings (149, 129) may be used to pattern the photoresist layer.

The pattern of openings in the photoresist layer may be transferred through the second-tier structure (232, 242, 265, 270) by a second anisotropic etch process to form various second-tier openings (249, 229, 629) concurrently, i.e., during the second anisotropic etch process. The various second-tier openings (249, 229, 629) may include second-tier memory openings 249, second-tier support openings 229, and second-tier moat region openings 629.

As shown in FIG. 7C, the second-tier memory openings 249 may be formed directly on a top surface of a respective one of the sacrificial first-tier memory opening fill portions 148. The second-tier support openings 229 may be formed directly on a top surface of a respective one of the sacrificial first-tier support opening fill portions 128. The second-tier moat region openings 629 may be formed directly on a top surface of a respective one of the sacrificial first-tier moat region opening fill portions 528. Further, each second-tier support openings 229 may be formed through a horizontal surface within the second stepped surfaces, which include the interfacial surfaces between the second-tier alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

A subset of the second-tier support openings 229 may be formed in sections of the memory array region 100 that are not filled with the second-tier memory openings 249. The sections of the memory array region 100 that are not filled with the second-tier memory openings 249 may be distributed over multiple areas within the memory array region 100. The second-tier support openings 229 may include a first subset of second-tier support openings 229 that are formed in the staircase region 200, and a second subset of second-tier support openings 229 that may be formed between groups 439 of clusters 419 of second-tier memory openings 249 which are laterally spaced apart along the first horizontal direction hd1 in the memory array region 100. A first subset of the second-tier support openings 229 that is formed through the second retro-stepped dielectric material portion 265 may be formed through a respective horizontal surface of the second stepped surfaces.

The second subset of the second-tier support openings 229 may be formed between groups 439 of clusters 419 of second-tier memory openings 249 that are laterally spaced apart along the first horizontal direction hd1. In one embodiment, some of the second-tier support openings 229 within the second subset of the second-tier support openings 229 may be arranged in straight rows that extend along the first direction hd1. Additional second-tier support openings 229 may be provided outside the straight rows of the second-tier support openings 229.

As shown in FIG. 7C, discrete areas OFA free of the second-tier memory openings 249, the second-tier support openings 229, and the second-tier moat region openings 629 may be provided in the memory array region 100, and may have the same area as the opening-free areas OFA in FIG. 4C. Each opening-free area OFA can be surrounded by second-tier moat region openings 629 that are arranged along a periphery of a two-dimensional closed shape such as a polygon (e.g., a rectangle), a generally oval-like shape (e.g., a circle or an ellipse), or any two-dimensional curvilinear shape. The pattern of the second-tier moat region openings 629 can be the same as the pattern of the sacrificial first-tier moat region opening fill portions 528. In one embodiment, a set of second-tier moat region openings 629 can be arranged along a periphery of a rectangular shape. A set of second-tier moat region openings 629 can be located in proximity among one another within a respective moat region MR. In one embodiment, each opening-free area OFA may be a rectangular area having a pair of lengthwise edges that laterally extend along the first horizontal direction hd1 and having a pair of widthwise edges that laterally extend along the second horizontal direction hd2.

Generally, a unit pattern UP of a combination of second-tier memory openings 249, second-tier support openings 229, and second-tier moat region openings 629 may be repeated along the second horizontal direction hd2. Each unit pattern UP includes groups 439 of clusters 419 of first-tier memory openings 149 that are laterally spaced apart along the second horizontal direction hd2 and/or laterally spaced apart along the first horizontal direction hd1.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229, 629) may be substantially vertical, or may be tapered. A bottom periphery of each second-tier opening (249, 229, 629) may be laterally offset, and/or may be located entirely within, a periphery of a top surface of an underlying sacrificial first-tier opening fill portion (148, 128, 528). The photoresist layer may be subsequently removed, for example, by ashing.

Figure 8A:
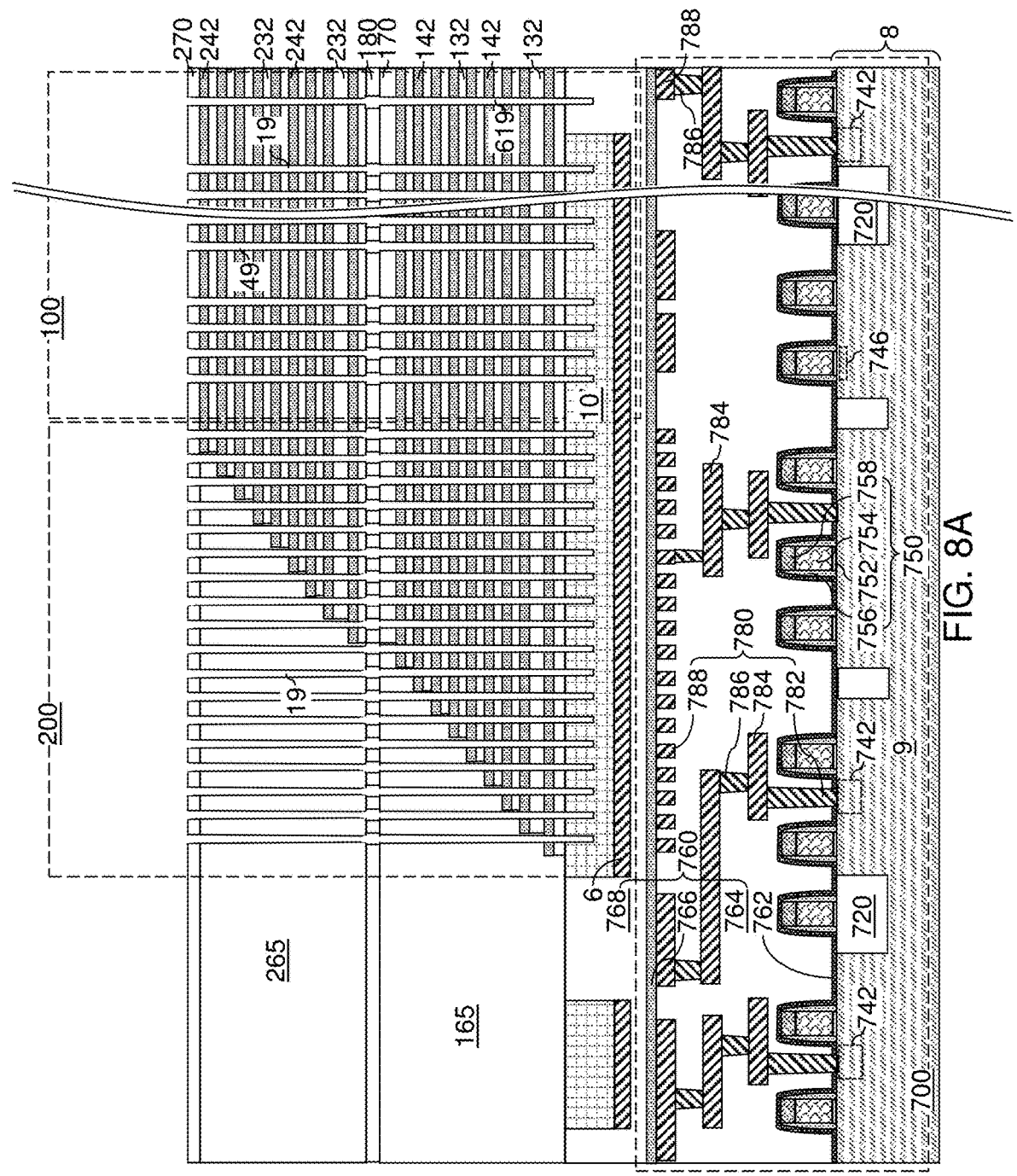
FIG. 8A is a vertical cross-sectional view of the first exemplary structure after formation of inter-tier memory openings, inter-tier support openings, and inter-tier isolation openings according to the first embodiment of the present disclosure.
Figure 8B:
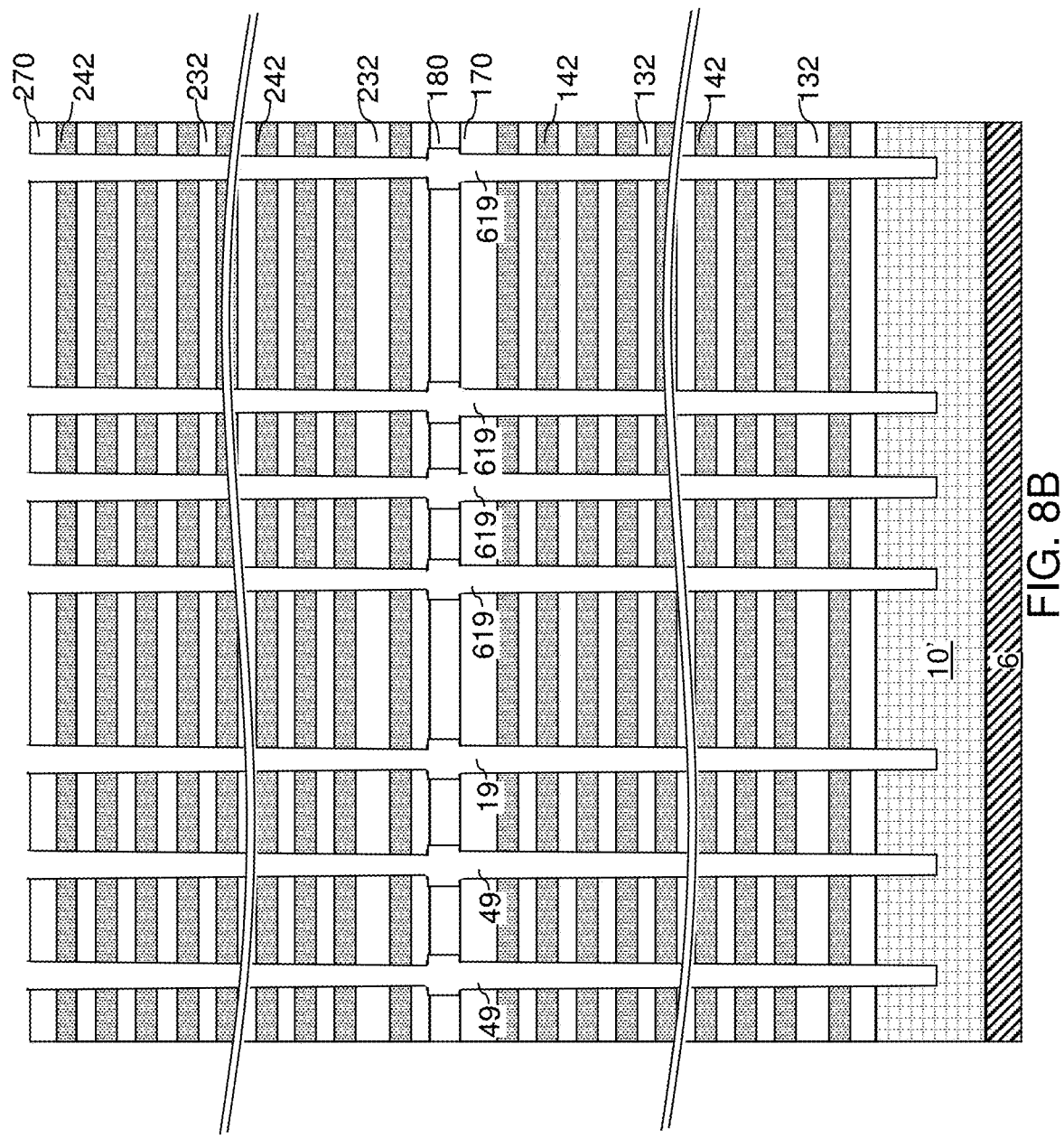
FIG. 8B is another vertical cross-sectional view of the first exemplary structure of FIG. 8A.
Figure 8C:
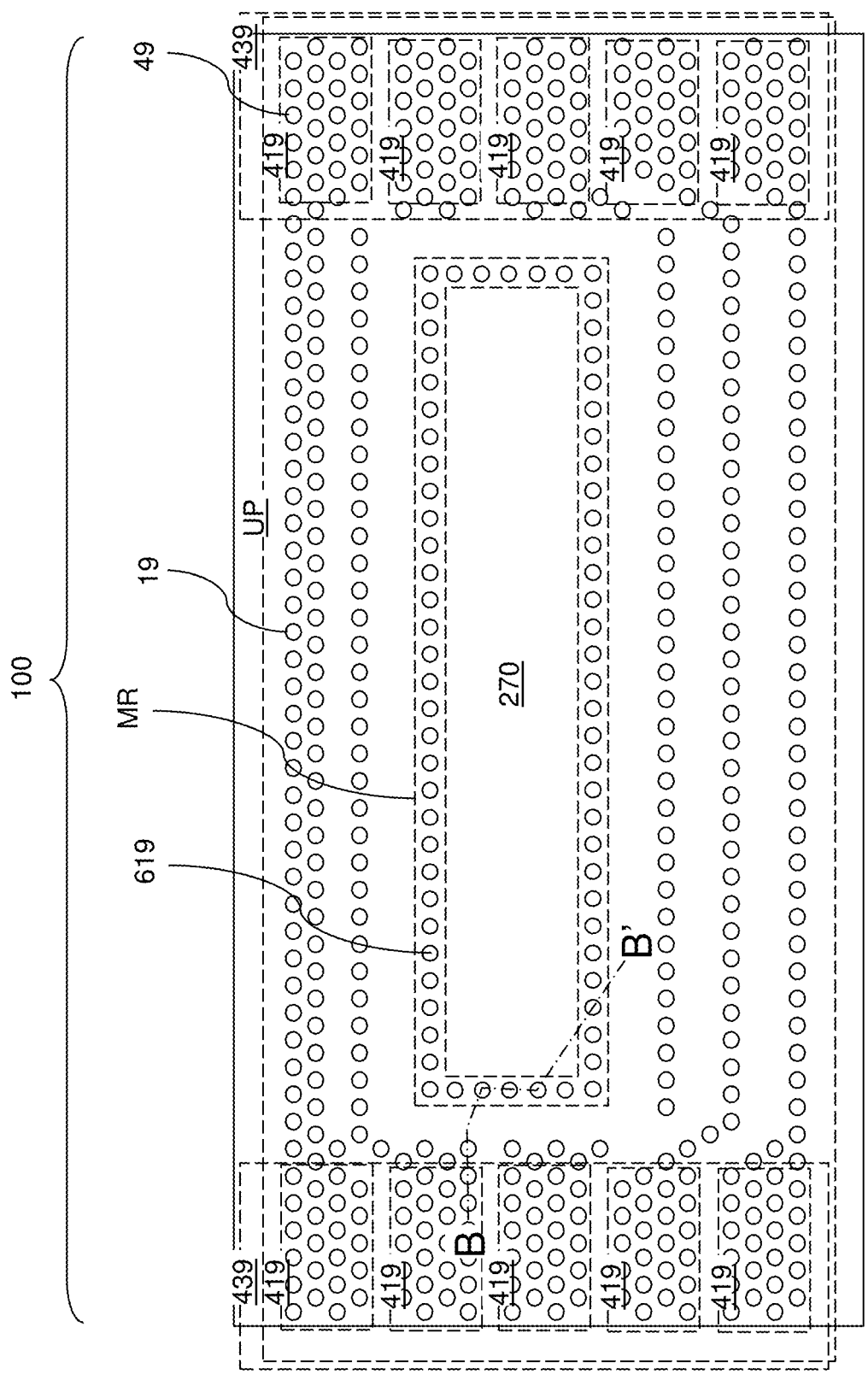
FIG. 8C is a top-down view of an area of the first exemplary structure of FIGS. 8A and 8B. The hinged vertical plane B-B' corresponds to the plane of the vertical cross-sectional view of FIG. 8B.

Referring to FIGS. 8A-8C, the sacrificial first-tier fill material of the sacrificial first-tier opening fill portions (148, 128, 528) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, may be formed in each combination of a second-tier support openings 229 and a volume from which a sacrificial first-tier support opening fill portion 128 is removed. A moat region opening 619, which is also referred to as an inter-tier moat opening 619, may be formed in each combination of a second-tier moat region openings 629 and a volume from which a sacrificial first-tier moat region opening fill portion 528 is removed.

Each set of moat region openings 619 that are adjacent to each other can laterally surround a respective opening-free area OFA. In other words, each opening-free area OFA can be surrounded by a respective set of moat region openings 619 that are arranged along a periphery of the opening-free area OFA within a respective moat region MR. In one embodiment, each opening-free area OFA may be a rectangular area having a pair of lengthwise edges that laterally extend along the first horizontal direction hd1 and having a pair of widthwise edges that laterally extend along the second horizontal direction hd2. In this case, each set of moat region openings 619 can include two straight rows of moat region openings 619 that are arranged along the first horizontal direction hd1, and two straight rows of moat region openings 619 that are arranged along the second horizontal direction hd2.

Generally, forming an alternating stack of insulating layers (132, 232) and sacrificial material layers (142, 242) including a dielectric material can be formed over a substrate 8. The sacrificial material layers (142, 242) comprise a dielectric material. A row of discrete laterally-spaced openings, as embodied as the moat region openings 619, can be formed through the alternating stack {(132, 242), (232, 242)}. The row of discrete laterally-spaced openings can arranged in a pattern that surrounds an area, such as the area of an opening-free area OFA, within the alternating stack {(132, 242), (232, 242)}.

Figure 9:
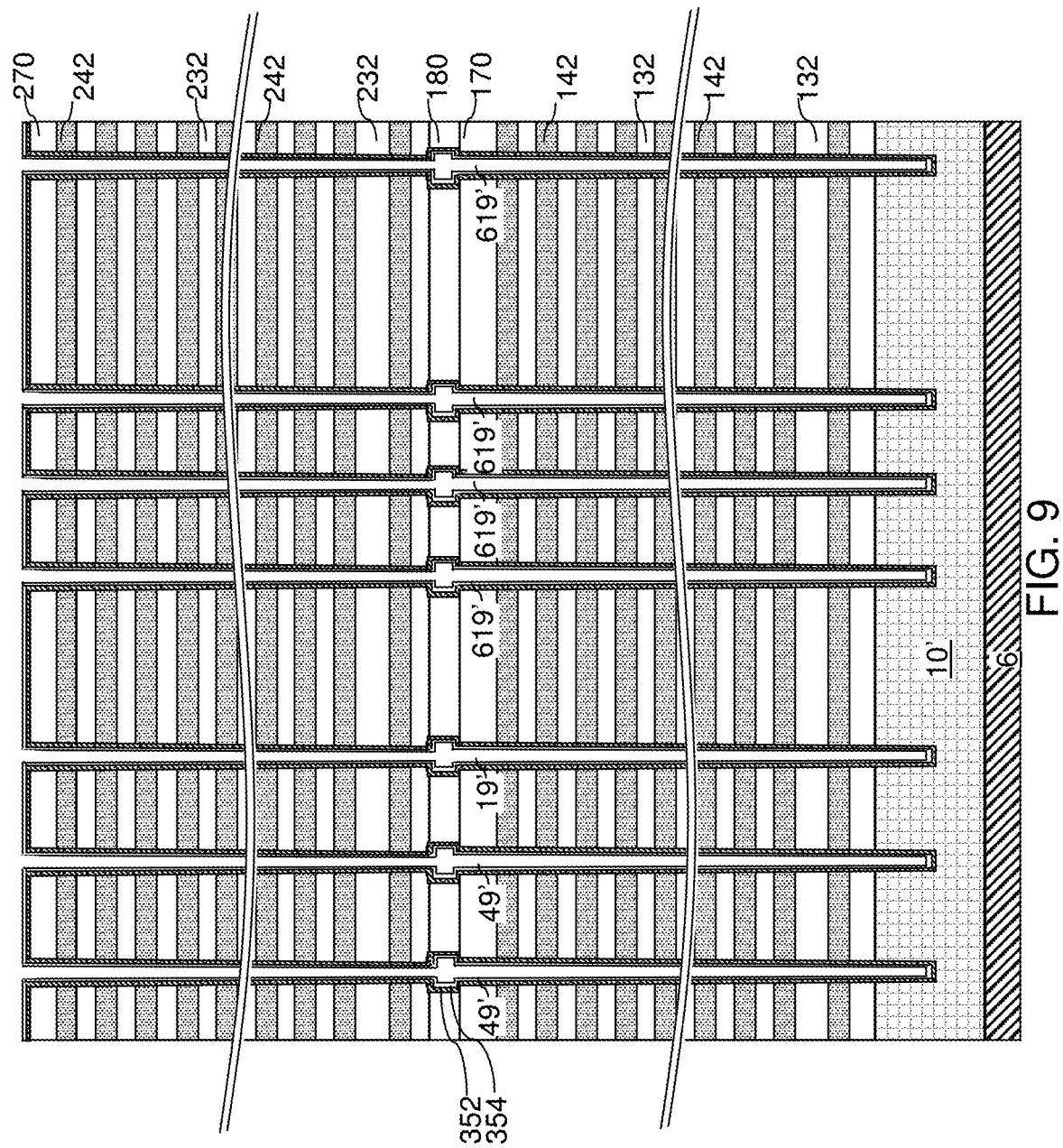
FIG. 9 is a vertical cross-sectional view of a region of FIG. 8B of the first exemplary structure after formation of a conformal etch mask material layer and a conformal cover material layer according to the first embodiment of the present disclosure.

Referring to FIG. 9, a conformal etch mask material layer 352 and a conformal cover material layer 354 can be sequentially deposited in each of the memory openings 49, support openings 19, and the moat region openings 619 and over the second insulating cap layer 270. The conformal etch mask material layer 352 includes a material that can function as an etch mask material for a subsequent etch process to be employed to etch unmasked portions of the sacrificial material layers (142, 242). For example, the conformal etch mask material layer 352 can include a semiconductor material such as amorphous silicon or polysilicon. The conformal etch mask material layer 352 can be deposited by a conformal deposition process such as a chemical vapor deposition process (e.g., a low pressure chemical vapor deposition process). The thickness of the conformal etch mask material layer 352 can be in a range from 20 nm to 120 nm, such as from 30 nm to 80 nm, although lesser and greater thicknesses can also be employed.

The conformal cover material layer 354 includes a material that can protect masked portions of the conformal etch mask material layer 352 during a subsequent patterning process. For example, if the conformal etch mask material layer 352 includes a semiconductor material, the conformal cover material layer 354 can include silicon oxide. The conformal cover material layer 354 may be formed by thermal oxidation of the material of the conformal etch mask material layer 352, or may be formed by a conformal deposition process. The thickness of the conformal cover material layer 354 can be in a range from 5 nm to 30 nm, such as from 10 nm to 20 nm, although lesser and greater thicknesses can also be employed. In case the conformal cover material layer 354 includes silicon oxide formed by oxidation of surface portions of the conformal etch mask material layer 352, the thickness of the conformal etch mask material layer 352 can decrease by about one half of the thickness of the conformal cover material layer 354 (which is a semiconductor oxide layer) due to oxidation of the surface portion of the conformal etch mask material layer 352.

Figure 10A:
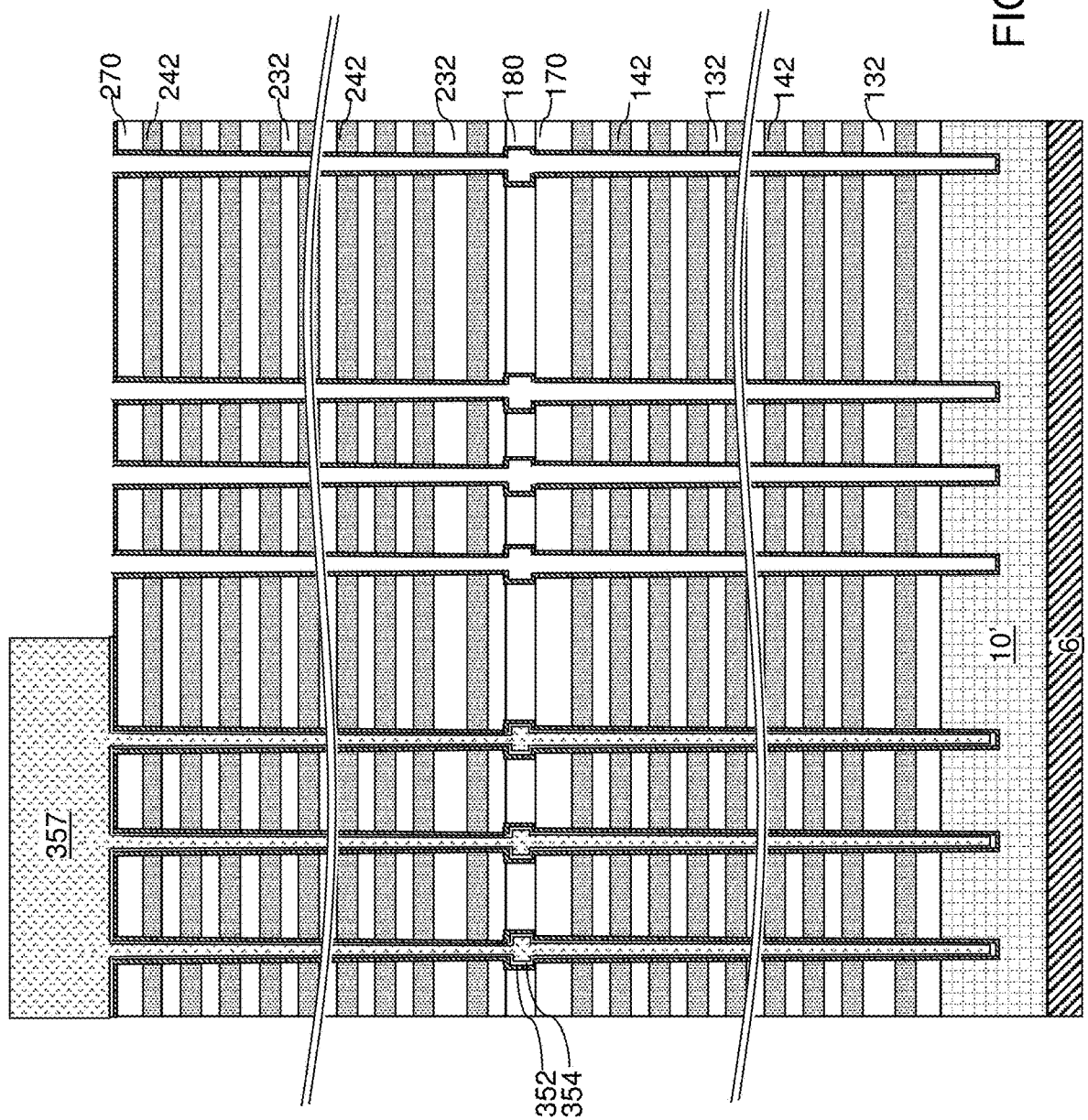
FIG. 10A is a vertical cross-sectional view of a region of the first exemplary structure after formation of a patterned photoresist layer and removal of unmasked portions of the conformal cover material layer according to the first embodiment of the present disclosure.
Figure 10B:
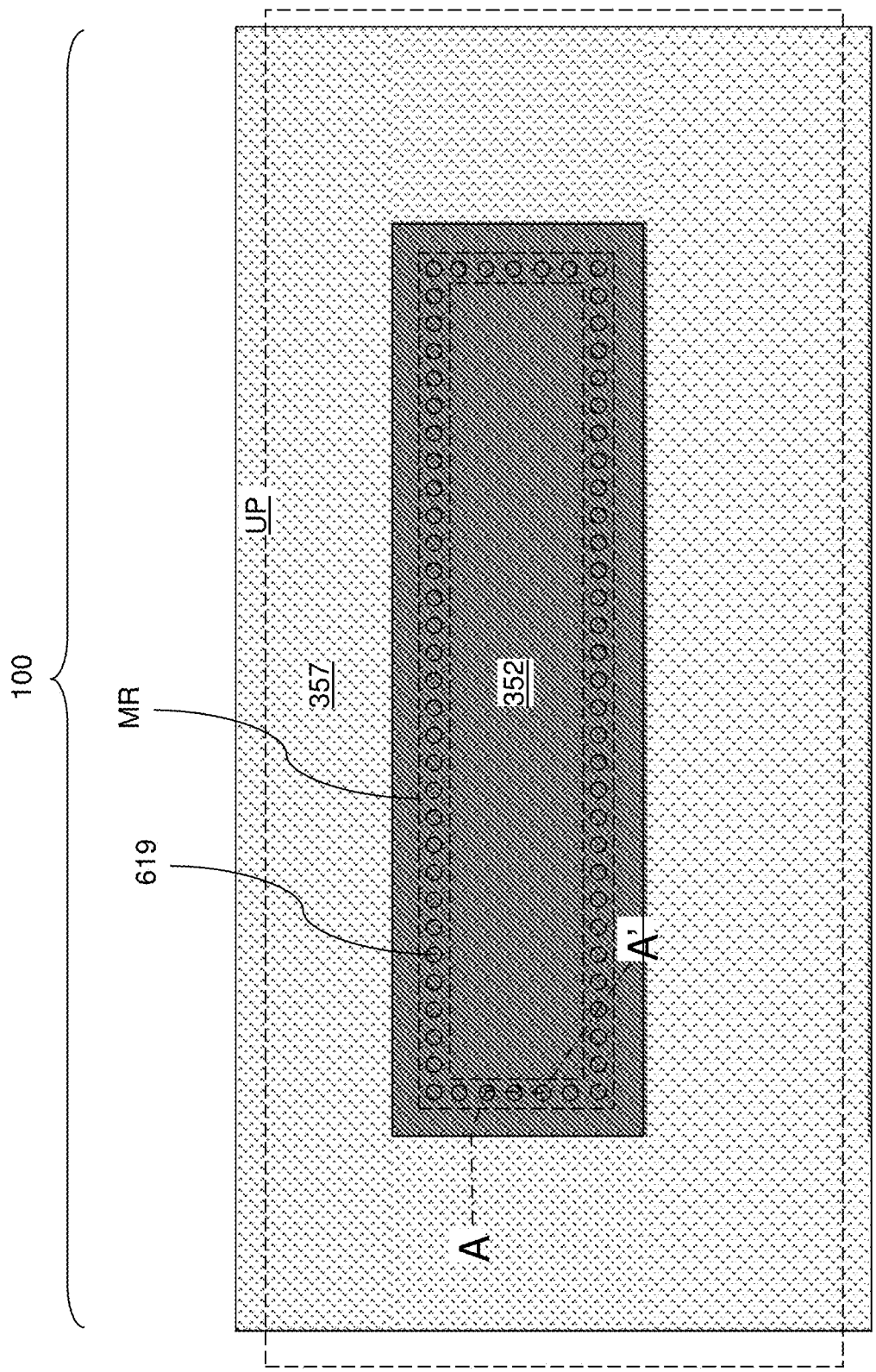
FIG. 10B is a top-down view of the first exemplary structure of FIG. 10A.

Referring to FIGS. 10A and 10B, a patterned photoresist layer 357 can be formed over the first exemplary structure. For example, a photoresist layer can be applied over the first exemplary structure, and can be lithographically patterned to form openings in areas that include a respective combination of an opening-free area OFA and a surrounding moat region MR. In other words, openings in the patterned photoresist layer 357 can be formed within areas of a row of moat region openings 619 and an opening-free area OFA that is laterally enclosed by the row of moat region openings 619. Each row of moat region openings 619 can be contoured to enclose a respective opening-free area OFA. In one embodiment, each opening through the patterned photoresist layer 357 can have a rectangular shape with a pair of lengthwise edges laterally extending along the first horizontal direction hd1 and a pair of widthwise edges laterally extending along the second horizontal direction hd2.

An isotropic etch process that etches the material of the conformal cover material layer 354 selective to the material of the conformal etch mask material layer 352 can be performed to remove the exposed portions of the conformal cover material layer 354, including the portions located in the moat region openings 619. For example, if the conformal cover material layer 354 includes silicon oxide and if the conformal etch mask material layer 352 includes amorphous silicon, a wet etch process employing dilute hydrofluoric acid can be performed to etch unmasked portions of the conformal cover material layer 354 without etching the conformal etch mask material layer 352.

Figure 11:
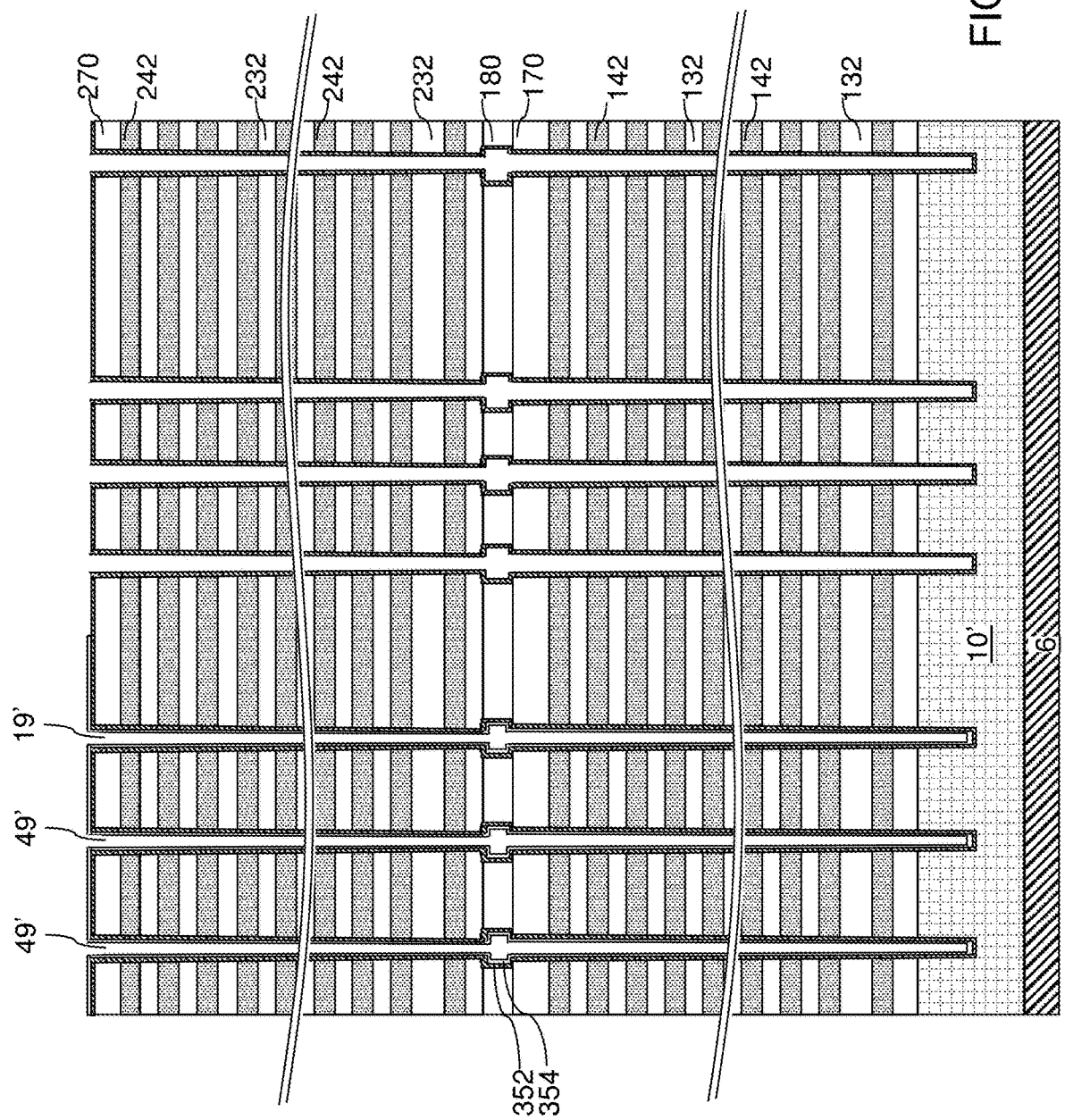
FIG. 11 is a vertical cross-sectional view of a region of the first exemplary structure after removal of the patterned photoresist layer according to the first embodiment of the present disclosure.

Referring to FIG. 11, the patterned photoresist layer 357 can be subsequently removed, for example, by ashing. A memory cavity 49' is present within each memory opening 49, and a support cavity 19' is present within each support opening 19.

Figure 12:
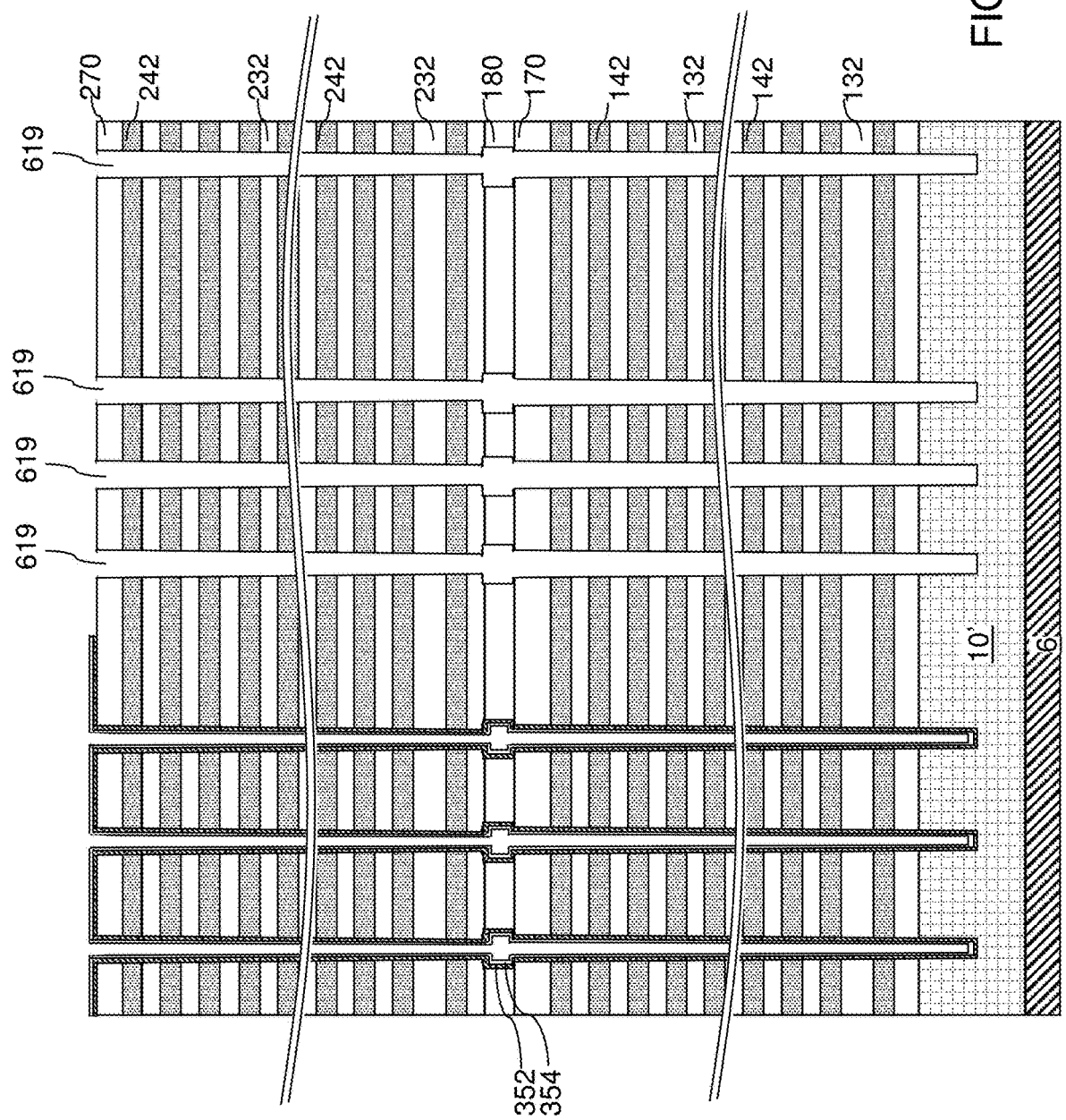
FIG. 12 is a vertical cross-sectional view of a region of the first exemplary structure after removal of unmasked portions of the conformal etch mask material layer according to the first embodiment of the present disclosure.

Referring to FIG. 12, an isotropic etch process that etches the material of the conformal etch mask material layer 352 selective to the material of the conformal cover material layer 354 can be performed. Unmasked portions of the conformal etch mask material layer 352 can be etched selective to the material of the conformal cover material layer 354. For example, if the conformal etch mask material layer 352 includes amorphous silicon or polysilicon and if the conformal cover material layer 354 includes silicon oxide, a wet etch process employing hot trimethyl-2 hydroxyethyl ammonium hydroxide ("hot TMY") or tetramethyl ammonium hydroxide (TMAH) can be employed to remove unmasked portions of the conformal etch mask material layer 352 in moat region openings 619 without etching the conformal cover material layer 354. Sidewalls of the moat region openings 619 are physically exposed upon removal of the unmasked portions of the conformal etch mask material layer 352. Each of the memory openings 49 and the support openings 19 can be covered by a layer stack of the conformal etch mask material layer 352 and the conformal cover material layer 354.

Figure 13A:
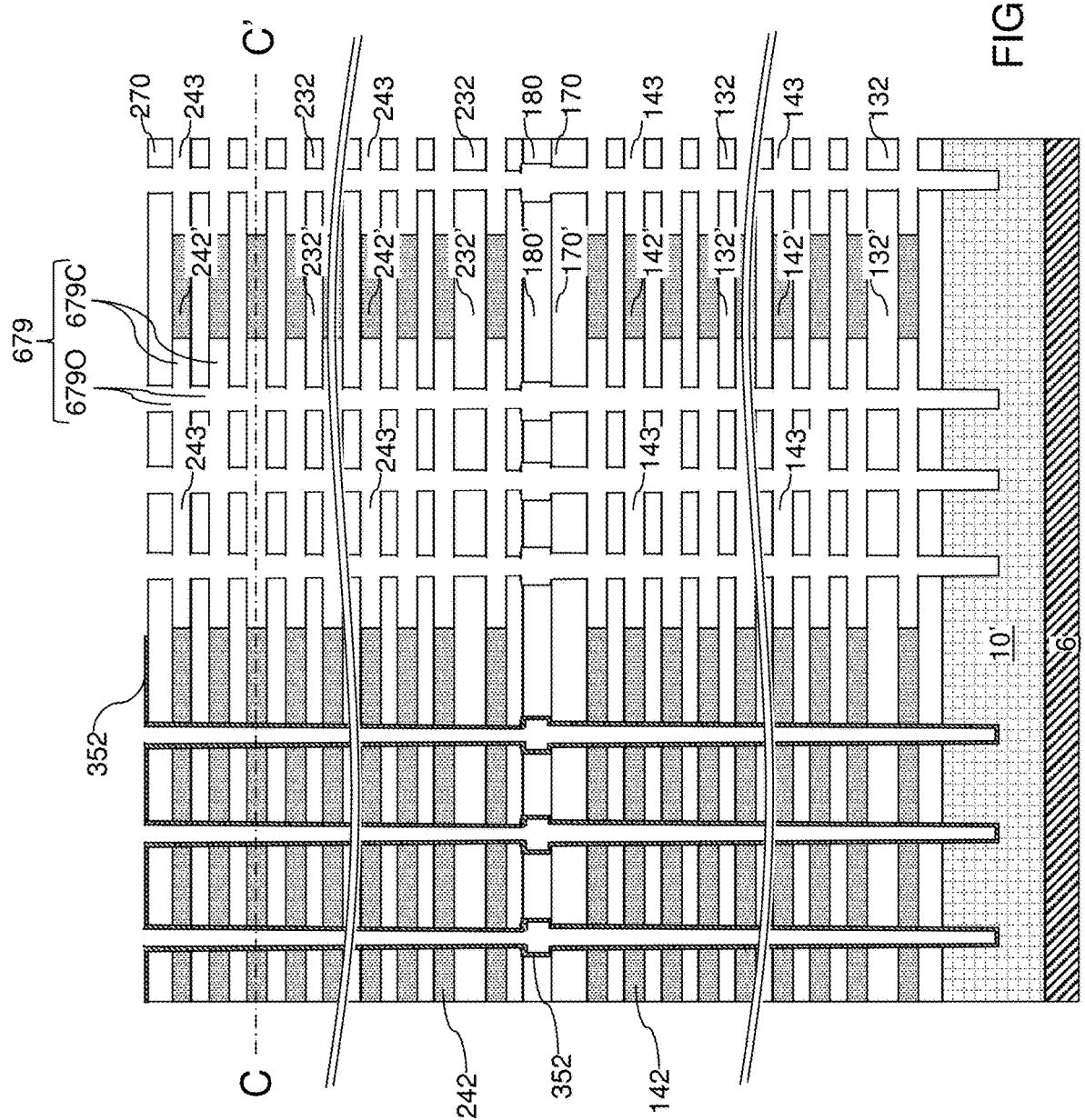
FIG. 13A is a vertical cross-sectional view of a region of the first exemplary structure after formation of a moat trench by isotropically etching unmasked portions of the sacrificial material layers selective to the insulating layers according to the first embodiment of the present disclosure.
Figure 13B:
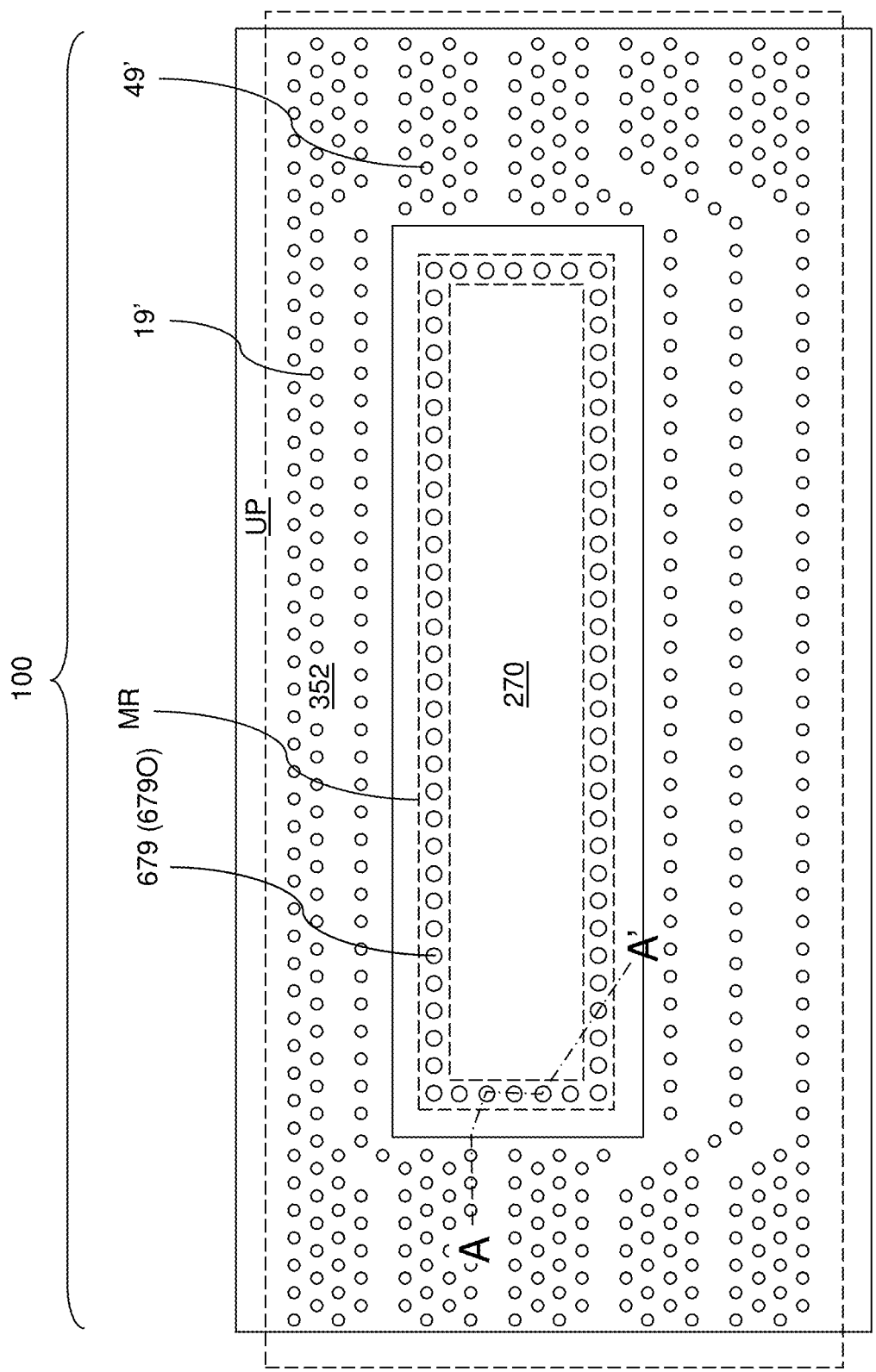
FIG. 13B is a top-down view of the first exemplary structure of FIG. 13A. The hinged vertical plane A-A' is the plane of the vertical cross-section of FIG. 13A.
Figure 13C:
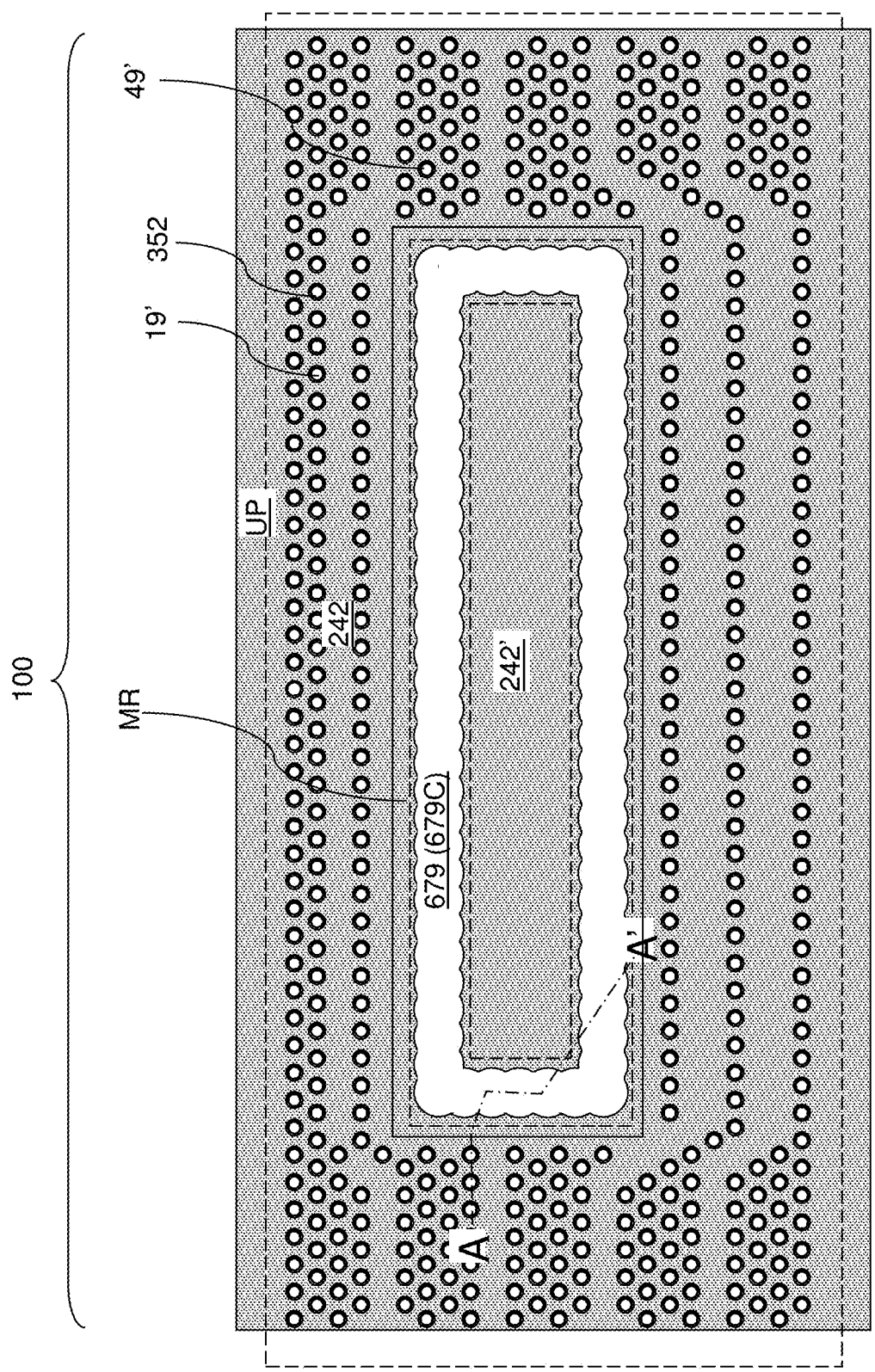
FIG. 13C is a horizontal cross-sectional view of the first exemplary structure along the horizontal plane C-C' of FIG. 13A. The hinged vertical plane A-A' is the plane of the vertical cross-section of FIG. 13A.

Referring to FIGS. 13A-13C, the conformal cover material layer 354 may be etched by a first isotropic etch process, which can be an isotropic etch process employing dilute hydrofluoric acid to remove all remaining portions of the conformal cover material layer 354. A second isotropic etch process can be performed to laterally recess physically exposed sidewalls of the sacrificial material layers (142, 242) relative to the sidewalls of the insulating layers (132, 242), the first insulating cap layer 170, the inter-tier dielectric layer 180, the second insulating cap layer 270, and the in-process source-level material layers 10' in the moat region MR. In one embodiment, the insulating layers (132, 242), the first insulating cap layer 170, the inter-tier dielectric layer 180, the second insulating cap layer 270, and the source-level insulating layer 117 can include silicon oxide, all layers of the in-process source-level material layers 10' other than the source-level insulating layer 117 can include a semiconductor material, and the sacrificial material layers (142, 242) can include silicon nitride. In this case, a wet etch process employing hot phosphoric acid can be performed to laterally recess the sidewalls of the sacrificial material layers (142, 242) around each moat region opening 619 isotropically.

The duration of the wet etch process can be selected such that the lateral recess distance for the sidewalls of the sacrificial material layers (142, 242) is greater than one half of the maximum of the lateral separation distance between the moat region openings 619 that laterally surround a respective one of the opening-free area OFA. The cavities within a set of moat region openings 619 that laterally surround a respective opening-free area OFA merge with each other at each level of the sacrificial material layers (142, 242). The etch is terminated to leave the dielectric material plates (142', 242') in area OFA. The sacrificial material layers (142, 242) are protected from being etched through the support openings 19 and the memory openings 49 by the etch mask material layer 352.

As shown in FIG. 13C, an annular cavity 679C that laterally surrounds a patterned portion of a respective sacrificial material layer (142, 242) in area OFA is formed at each level of the sacrificial material layers (142, 242). Each patterned portion of the sacrificial material layers (142, 242) that is laterally surrounded by a respective annular cavity 679C is herein referred to as dielectric material plates (142', 242'). The dielectric material plates (142', 242') are composed of the same material as, and have the same height as, a respective one of the sacrificial material layers (142, 242) located at a same level, i.e., located at a same vertical separation distance from the substrate 8. The dielectric material plates (142', 242') include first dielectric material plates 142' that are patterned portions of the first sacrificial material layers 142 and second dielectric material plates 242' that are patterned portions of the second sacrificial material layers 242. A vertical stack of dielectric material plates (142', 242') is formed within each region that is laterally surrounded by the annular cavities.

A set of annular cavities 679C laterally surrounding a vertical stack of dielectric material plates (142', 242') are vertically connected to each other through rows of discrete laterally-spaced openings 6790 which correspond to the moat region openings 619 that vertically extend through the insulating layers (132, 232), as shown in FIG. 13B. Each row of laterally-spaced openings 6790 vertically extends through a respective one of the insulating layers (132, 232), and comprises segments of the moat region openings 619 provided in a same moat region MR at the processing steps of FIGS. 8A-8C at the level of a respective one of the insulating layers (132, 232). The rows of laterally-spaced openings located in the same moat region MR overlap each other in a plan (i.e., top) view. In other words, the areas of any row of laterally-spaced openings located in the same moat region MR at the level of one of the insulating layers (132, 232) overlap with the areas of any other row of laterally-spaced openings located in the same moat region MR at the level of another of the insulating layers (132, 232). Each row of laterally-spaced openings can be arranged within the area of a moat region MR along a periphery of a respective opening-free area OFA. Thus, the general lateral propagation of each row of laterally-spaced openings conforms to the shape of the respective opening-free area OFA.

As shown in FIG. 13B, each insulating layer (132, 232) is perforated with a respective row of laterally-spaced openings 6790. Each laterally-spaced opening 6790 within a row of laterally-spaced openings can have a generally cylindrical shape, and is laterally spaced from adjacent laterally-spaced openings by a respective intervening portion of an insulating layer (132, 232). Thus, each insulating layer (132, 232) laterally extends from outside the area of each opening-free area (OFA) to inside area OFA having an areal overlap with a vertical stack of dielectric material plates (142', 242') through an array of connection portions located between each neighboring pair of laterally-spaced openings 6790 that vertically extend through the insulating layers (132, 232).

A moat trench 679 includes a contiguous combination of annular cavities (i.e., trenches) 679C at levels of the sacrificial material layers (142, 242) and rows of laterally-spaced openings 6790 at levels of the insulating layers (132, 232). Each moat trench 679 vertically extends from the top surface of the second insulating cap layer 270 into the in-process source-level material layers 10'. Generally, each moat trench 679 can be formed by isotropically etching unmasked portions of the sacrificial material layers (142, 242) selective to the insulating layers (132, 232) and by laterally expanding each moat region opening 619 within a row of moat region openings 619 at levels of the sacrificial material layers (142, 242) to form the annular cavities 679C. In one embodiment, each moat region opening 619 within the row of moat region openings 619 can be laterally expanded at levels of the sacrificial material layers (142, 242) by performing an isotropic etch process that etches the material of the sacrificial material layers (142, 242) selective to the material of the insulating layers (132, 232). Each moat trench 679 comprises a continuously extending volume that laterally surrounds a patterned portion of a respective sacrificial material layer (142, 242), i.e., a dielectric material plate (142', 242'), at each level of the sacrificial material layers (142, 242). Remaining portions of the sacrificial material layers (142, 242) after the isotropic etch process comprise a vertical stack of dielectric material plates (142', 242') that is laterally surrounded by the moat trench 679.

Each moat trench 679 can be laterally bounded at the outer boundary by a set of horizontally-concave and vertically-straight sidewall segments of a respective sacrificial material layer (142, 242) at the level of each sacrificial material layer (142, 242), and can be laterally bounded at the inner boundary by a set of horizontally-concave and vertically-straight sidewall segments of a respective dielectric material plate (142', 242') at the level of each sacrificial material layer (142, 242). Each moat trench 679 can be laterally bounded by cylindrical sidewalls of a respective row of discrete cylindrical openings 6790 at the level of each insulating layer (132, 232). As used herein, a horizontally-concave surface refers to a surface having a concave profile in a horizontal cross-sectional view, and a vertically-straight surface refers to a surface having a straight profile in a vertical cross-sectional view.

Figure 14:
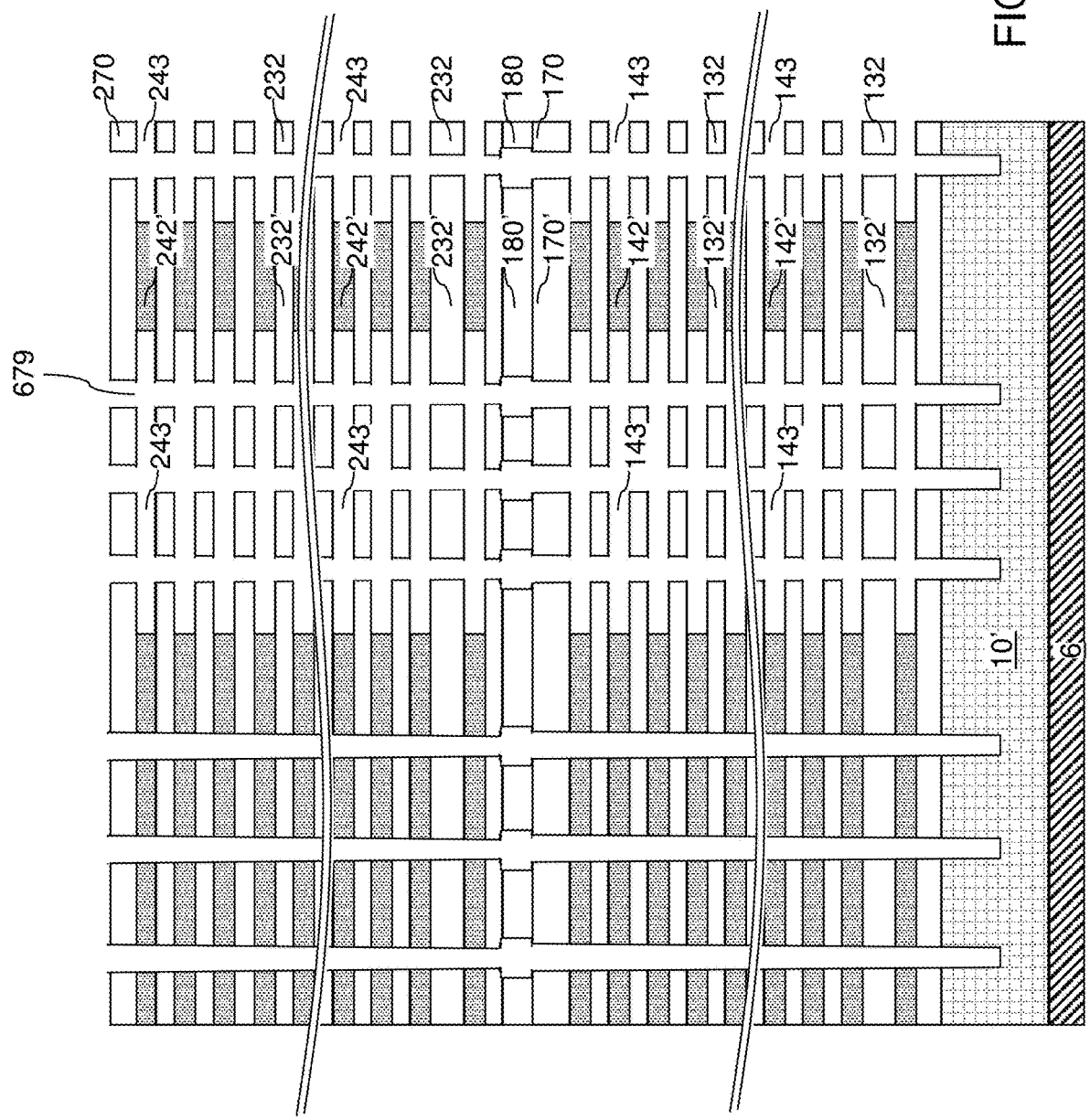
FIG. 14 is a vertical cross-sectional view of a region of the first exemplary structure after removing remaining portions of the conformal etch mask material layer according to the first embodiment of the present disclosure.

Referring to FIG. 14, an isotropic etch process can be performed to remove remaining portions of the conformal etch mask material layer 352. For example, if the conformal etch mask material layer 352 includes a semiconductor material, a wet etch process employing hot trimethyl-2 hydroxyethyl ammonium hydroxide ("hot TMY") or tetramethyl ammonium hydroxide (TMAH) can be employed to remove the conformal etch mask material layer 352.

Figure 15:
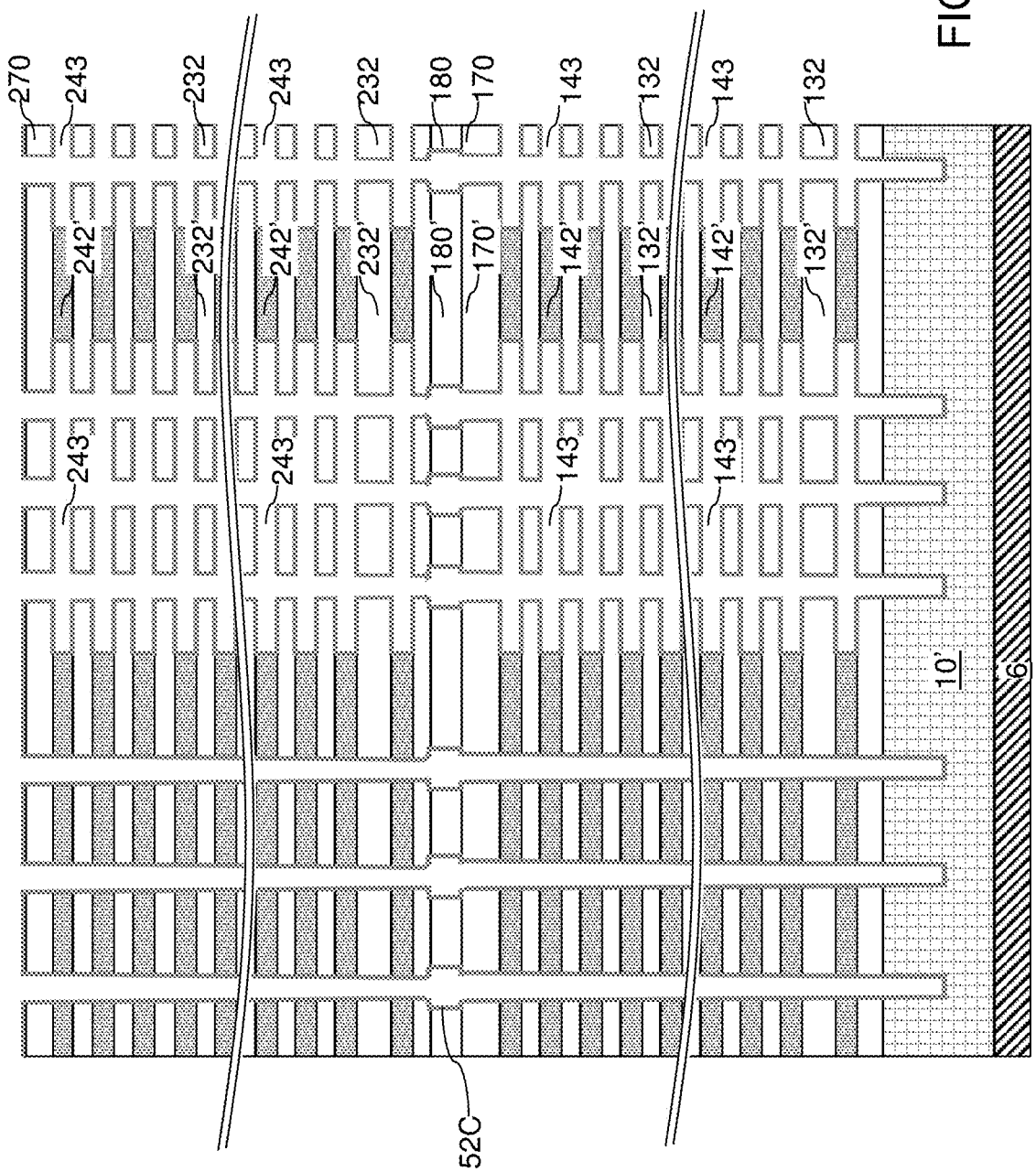
FIG. 15 is a vertical cross-sectional view of a region of the first exemplary structure after formation of a continuous blocking dielectric layer according to the first embodiment of the present disclosure.

Referring to FIG. 15, a continuous blocking dielectric layer 52C can be optionally deposited on the sidewalls of the memory openings 49, the support openings 19, and the moat trenches 679 by a conformal deposition process. The continuous blocking dielectric layer 52C may include a single dielectric material layer or a stack of a plurality of dielectric material layers. In one embodiment, the continuous blocking dielectric layer 52C may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the continuous blocking dielectric layer 52C may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the continuous blocking dielectric layer 52C includes aluminum oxide. Alternatively, or additionally, the continuous blocking dielectric layer 52C may include a dielectric semiconductor compound such as silicon oxide, silicon oxynitride, silicon nitride, or a combination thereof.

Figure 16:
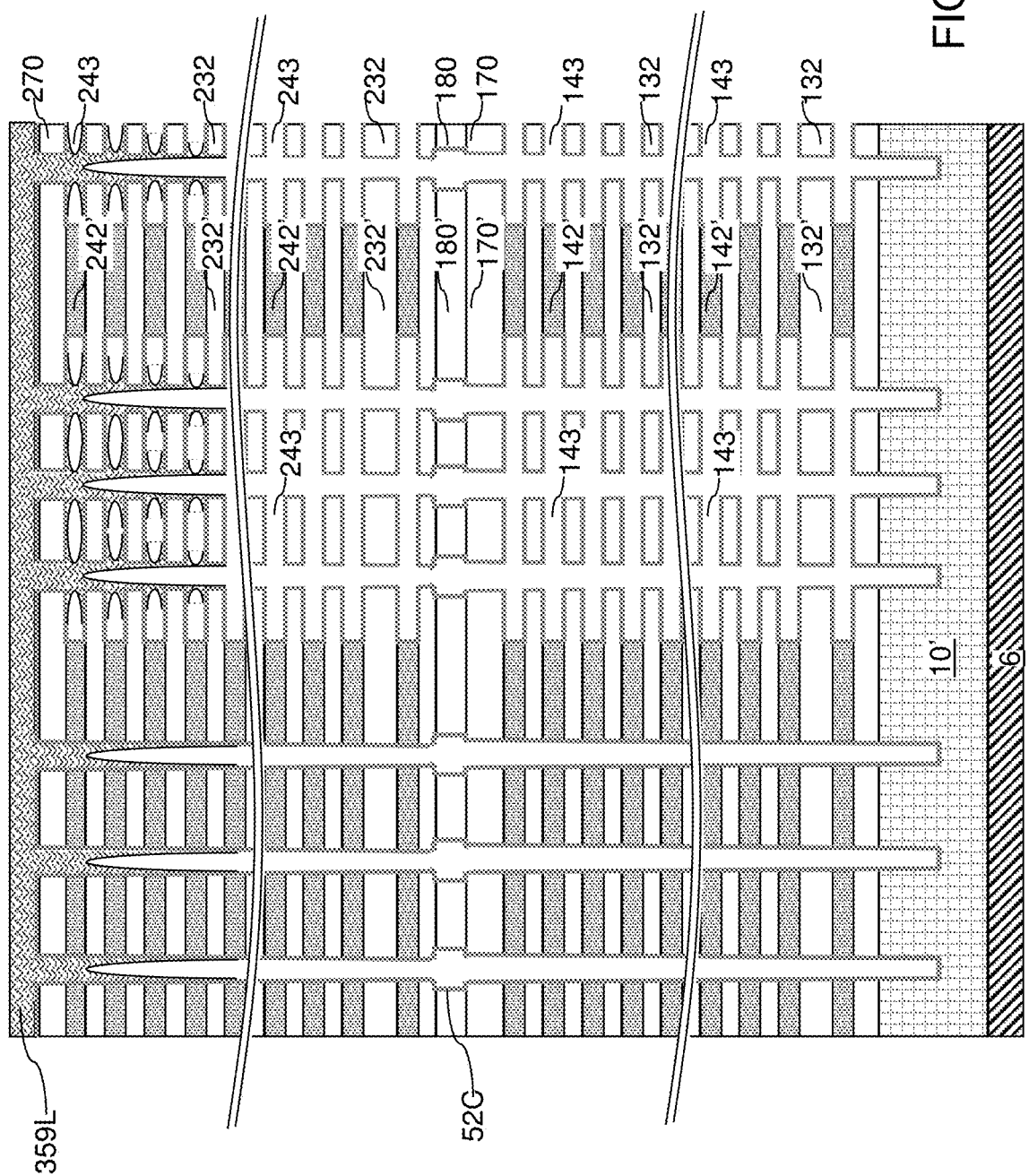
FIG. 16 is a vertical cross-sectional view of a region of the first exemplary structure after anisotropic deposition of a sacrificial fill material layer according to the first embodiment of the present disclosure.

Referring to FIG. 16, a sacrificial fill material can be deposited into unfilled volumes of the memory openings 49, the support openings 19, and the moat trenches 679. The sacrificial fill material includes a material that can be removed selective to the material of the continuous blocking dielectric layer 52C. The sacrificial fill material may fill the entire volumes of the memory openings 49, the support openings 19, and the moat trenches 679. Alternatively, the sacrificial fill material may be deposited anisotropically so that it fills only the upper portions of the volumes of the memory openings 49, the support openings 19, and the moat trenches 679. For example, the sacrificial fill material can include a semiconductor material such as amorphous silicon or polysilicon, or a dielectric material such as organosilicate glass, a polymer material, or a carbon-based material such as amorphous carbon or diamond-like carbon (DLC). The sacrificial fill material can be deposited by a highly anisotropic deposition process such as a physically vapor deposition (PVD) process. The deposited sacrificial fill material in the memory openings 49, the support openings 19, and the moat trenches 679 and over the second insulating cap layer 270 forms a sacrificial fill material layer 359L. The highly anisotropic nature of the deposition process deposits the sacrificial fill material mostly on upper sidewalls of the memory openings 49, the support openings 19, and the moat trenches 679, and the amount of the deposited sacrificial fill material at the bottom regions of the memory openings 49, the support openings 19, and the moat trenches 679 can be insignificant. In this case, voids are present in lower region of the memory openings 49, the support openings 19, and the moat trenches 679. Voids can be present within each annular cavity 679C at the levels of the sacrificial material layers (142, 242) after formation of the sacrificial fill material layer 359L.

Figure 17A:
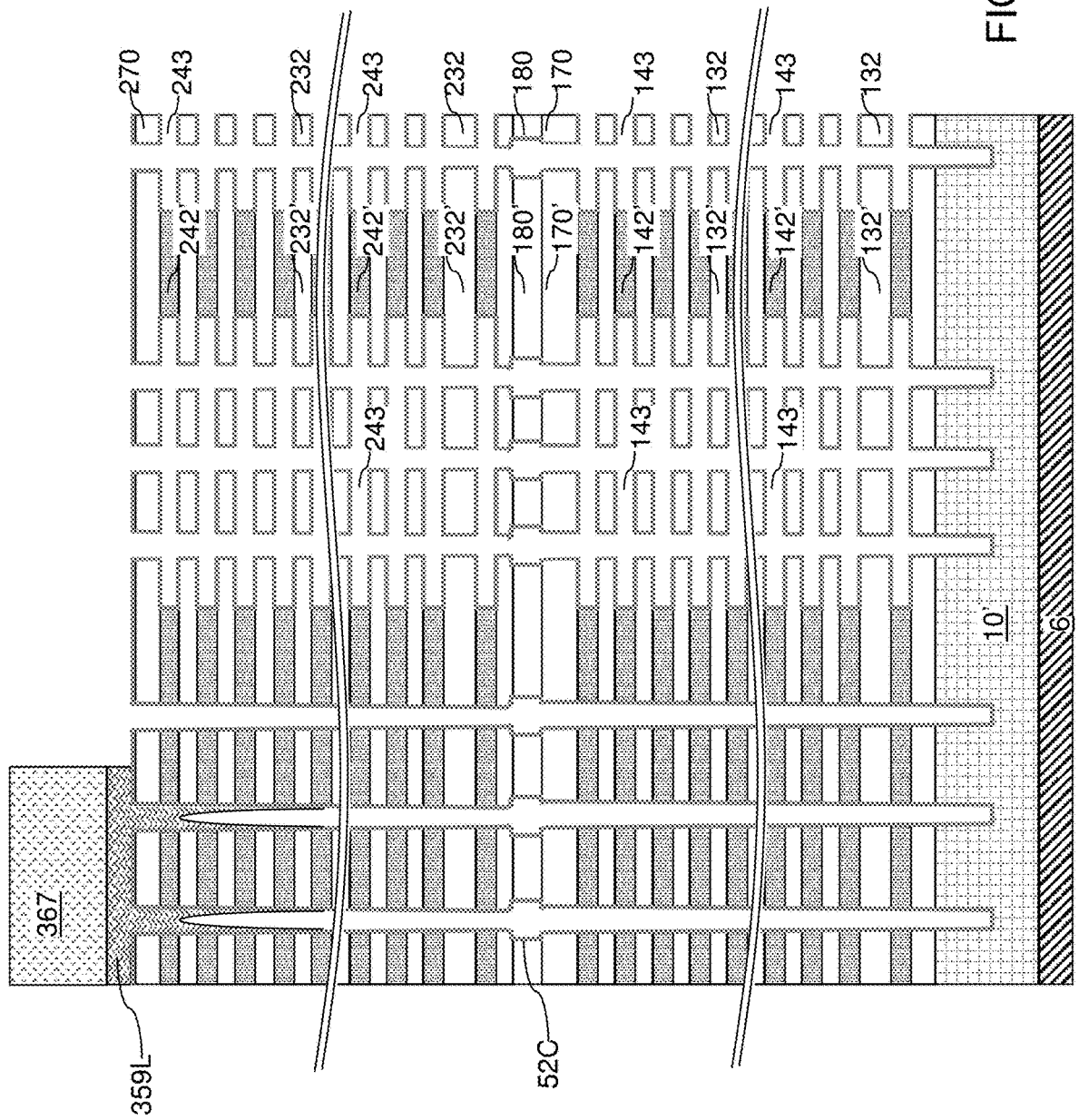
FIG. 17A is a vertical cross-sectional view of a region of the first exemplary structure after removal of portions of the sacrificial fill material layer from inside the support openings and from inside the moat trench according to the first embodiment of the present disclosure.
Figure 17B:
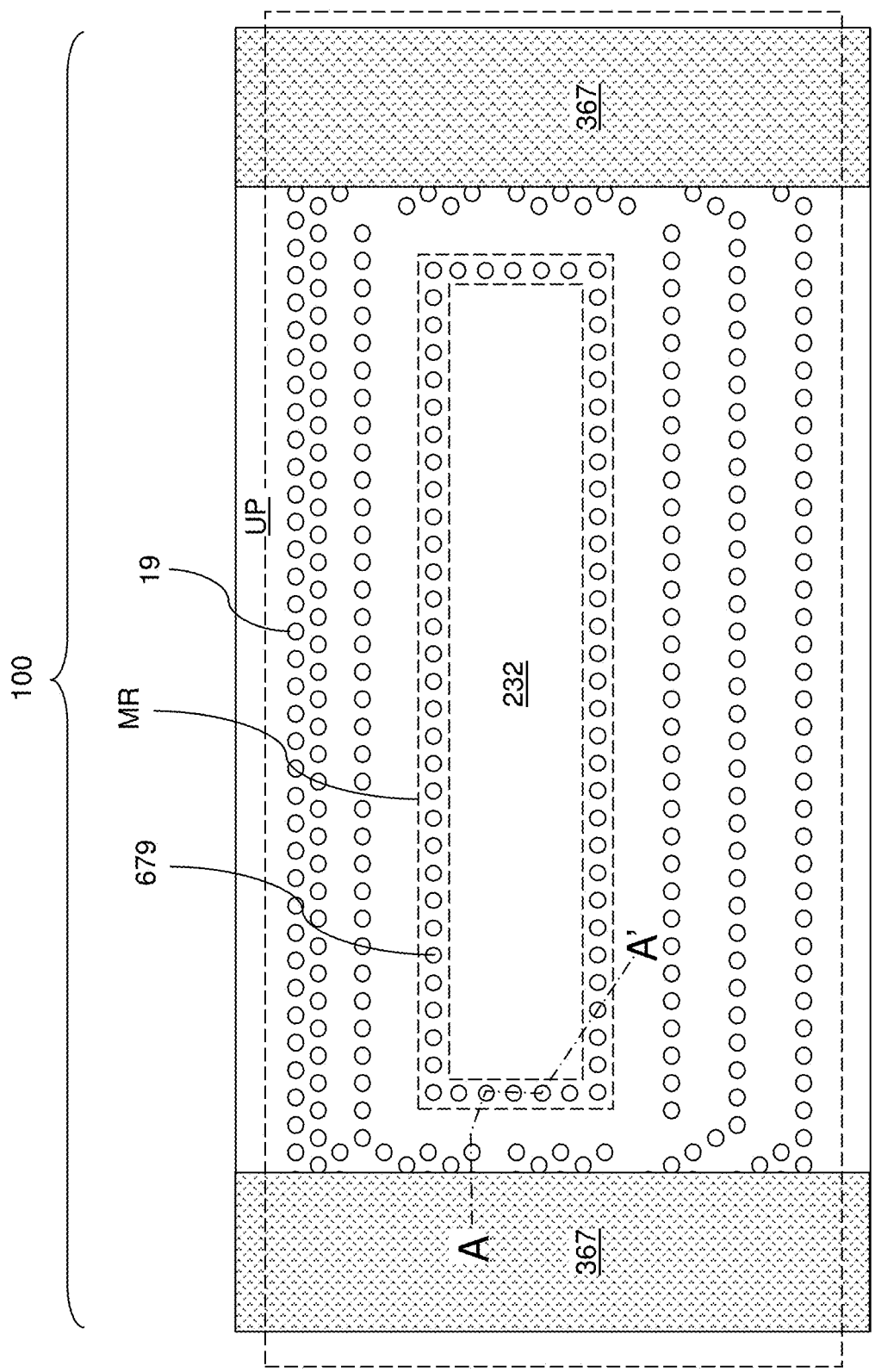
FIG. 17B is a top-down view of the first exemplary structure of FIG. 17A.

Referring to FIGS. 17A and 17B, a photoresist layer 367 can be applied over the first exemplary structure, and can be lithographically patterned to cover all memory openings 49 without covering the support openings 19 or the moat trenches 679. Unmasked portions of the sacrificial fill material layer 359L can be removed by an etch process that etches the material of the sacrificial fill material layer 359L selective to the material of the continuous blocking dielectric layer 52C. An anisotropic etch process and/or an isotropic etch process may be employed. For example, if the sacrificial fill material layer 359L includes amorphous silicon or polysilicon, a wet etch process employing hot trimethyl-2 hydroxyethyl ammonium hydroxide ("hot TMY") or tetramethyl ammonium hydroxide (TMAH) can be employed to remove unmasked portions of the sacrificial fill material layer 359L. Thus, the sacrificial fill material of the sacrificial fill material layer 359L can be removed from inside the support openings 19 and the moat trenches 679 by the etch process. Subsequently, the photoresist layer 367 can be removed, for example, by ashing.

Figure 18A:
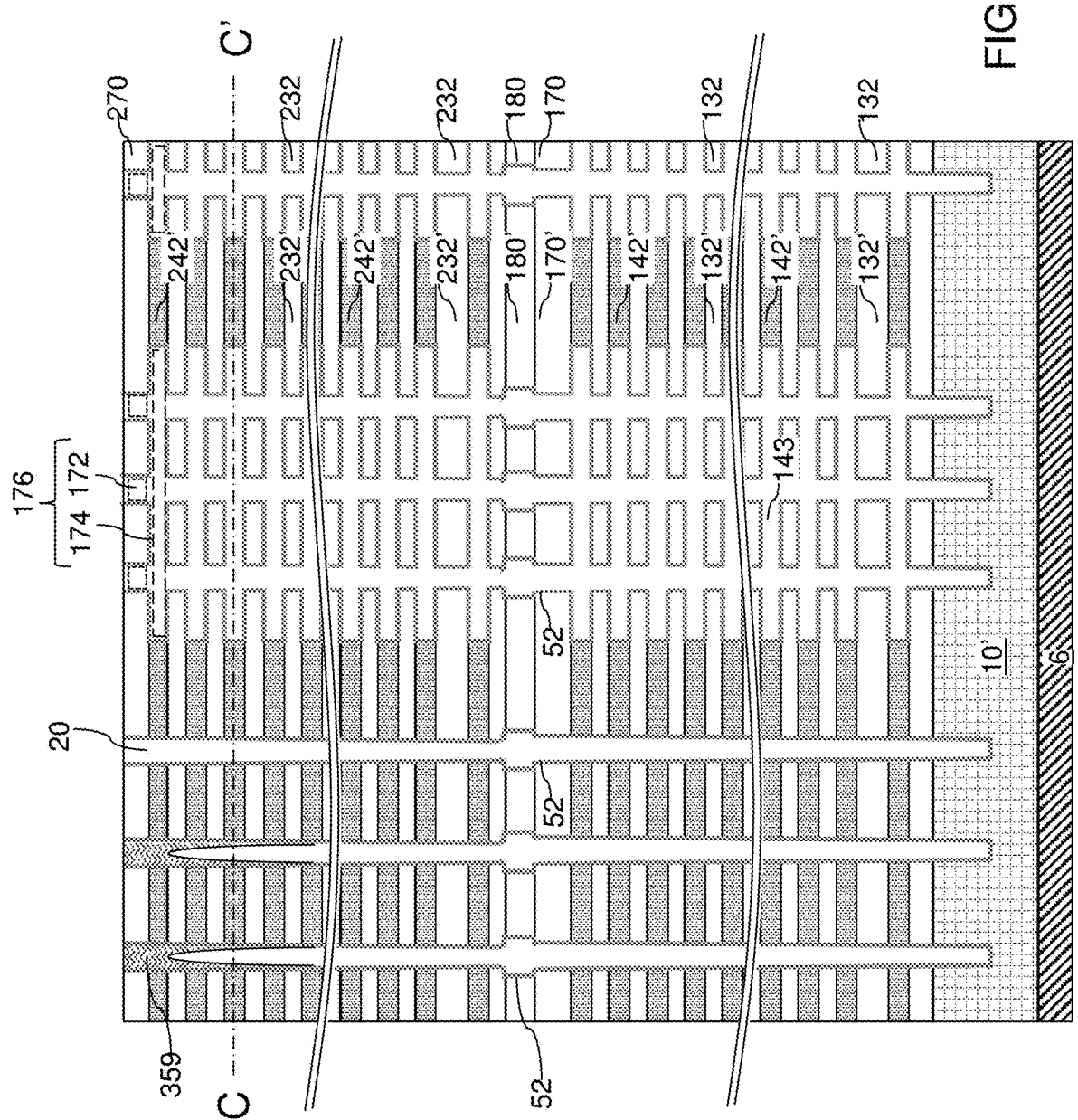
FIG. 18A is a vertical cross-sectional view of a region of the first exemplary structure after formation of a perforated dielectric moat structure and support pillar structures according to the first embodiment of the present disclosure.
Figure 18B:
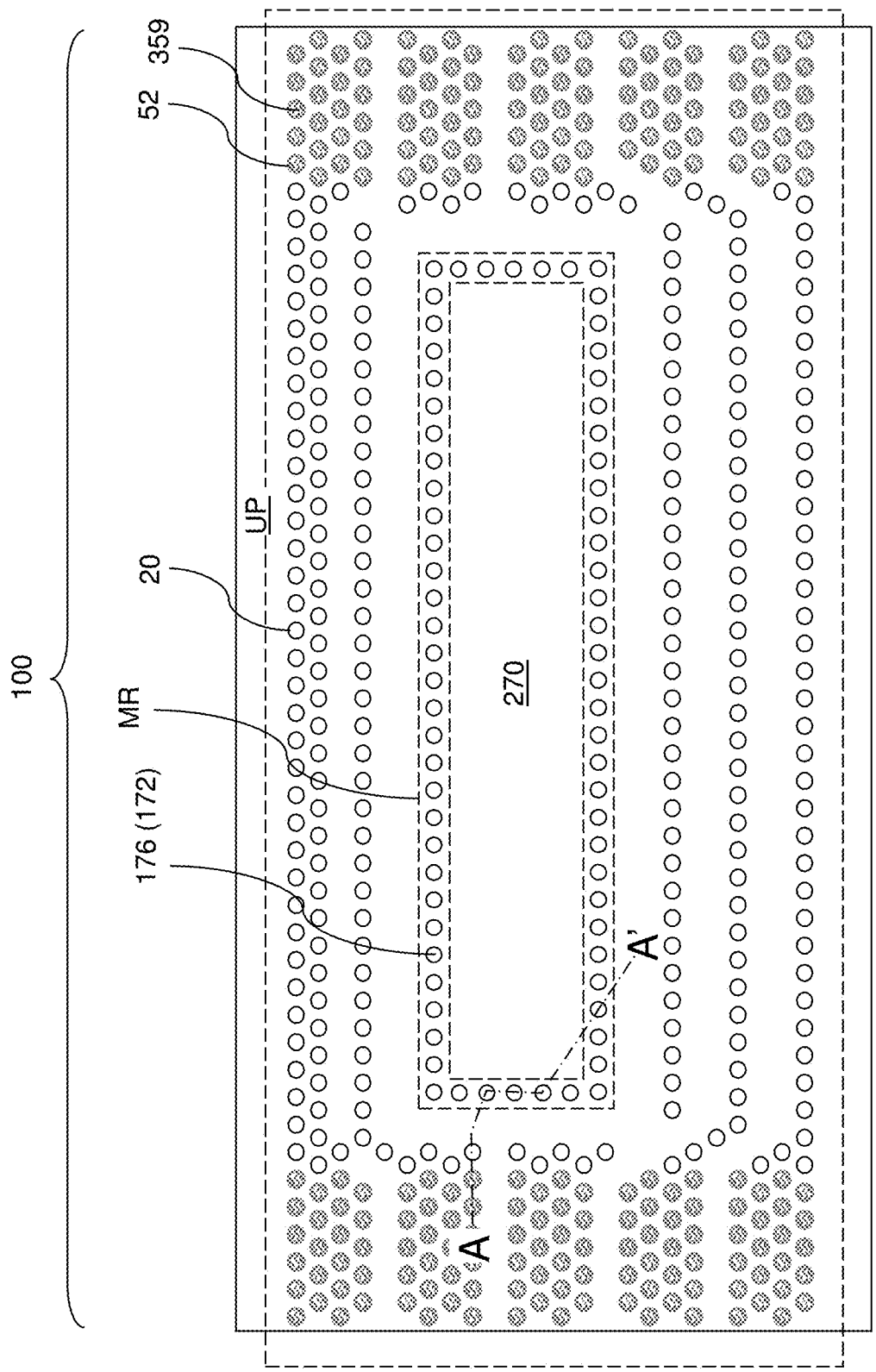
FIG. 18B is a top-down view of the first exemplary structure of FIG. 18A. The hinged vertical plane A-A' is the plane of the vertical cross-section of FIG. 18A.
Figure 18C:
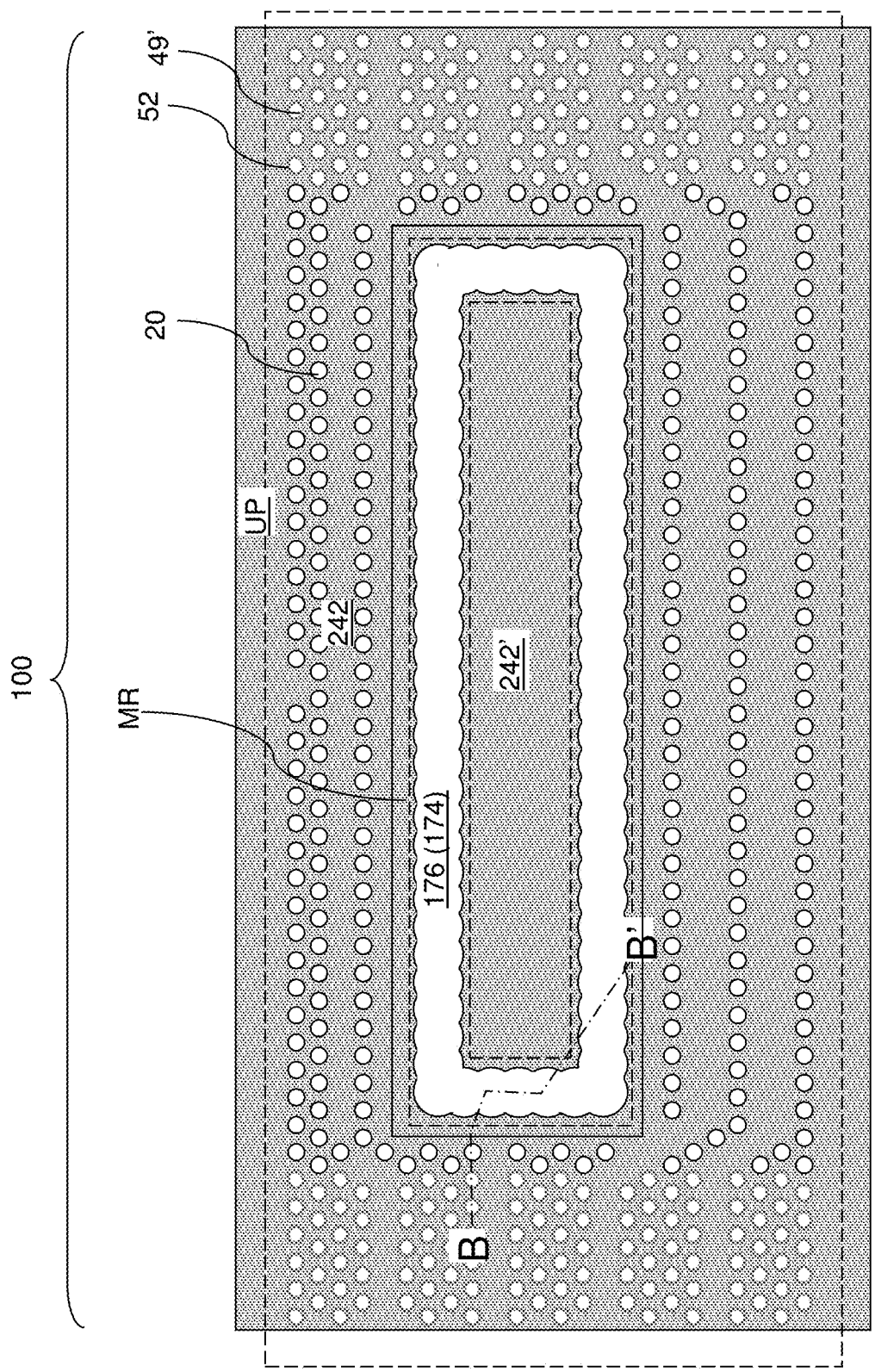
FIG. 18C is a horizontal cross-sectional view of the first exemplary structure along the horizontal plane C-C' of FIG. 18A. The hinged vertical plane A-A' is the plane of the vertical cross-section of FIG. 18A.

Referring to FIGS. 18A-18C, a dielectric material such as undoped silicate glass (e.g., silicon oxide) or a doped silicate glass can be deposited in each of the support openings 19 and the moat trenches 679 employing a conformal deposition process such as a chemical vapor deposition (CVD) process. The dielectric material fills each volume of the cavities within the support openings 19 and the moat trenches 679, and is formed over the top surfaces of the second insulating cap layer 270 and the horizontally-extending portion of the sacrificial fill material layer 359L that overlies the second insulating cap layer 270.

A planarization process can be performed to remove portions of the dielectric material, the sacrificial fill material layer 359L, and the continuous blocking dielectric layer 52C that overlie the horizontal plane including the top surface of the second insulating cap layer 270. A recess etch process and/or a chemical mechanical planarization process may be employed for the planarization process. Each remaining portion of the dielectric material that fills a support opening 19 comprises a dielectric support opening fill material portion 20. Each remaining portion of the dielectric material that fills a remaining portion of a respective moat trench 679 comprises a dielectric moat trench fill material portion 176. Each remaining portion of the sacrificial fill material layer 359L that remains at least in an upper end of a memory opening 49 comprises a sacrificial fill material portion 359. Each remaining portion of the optional continuous blocking dielectric layer 52C (if employed) located within a support opening 19, a moat trench 679, or a memory opening 49 comprises a blocking dielectric layer 52. As an optional structure, a blocking dielectric layer 52 may or may not be present within each of the memory openings 49, the support openings 19, and the moat trenches 679. Each contiguous combination of a blocking dielectric layer 52 (if present) and a dielectric support opening fill material portion 20 that fills a support opening 19 constitutes a support pillar structure (52, 20). Each contiguous combination of a blocking dielectric layer 52 (if present) and a dielectric moat trench fill material portion 176 constitutes a perforated dielectric moat structure (52, 176).

Generally, the perforated dielectric moat structures (52, 176) can vertically extend through the alternating stack {(132, 242), (232, 242)}, and can be formed by filling the moat trenches 679 optionally with a respective blocking dielectric layer 52 and with a dielectric fill material (which is the material of the dielectric moat trench fill material portions 176). Each perforated dielectric moat structure (52, 176) comprises a row of dielectric pillar portions 172 extending through respective openings 6790 at each level of the insulating layers (132, 232). Each of the insulating layers (132, 232) laterally extends between neighboring pairs of dielectric pillar portions 172 from outside each perforated dielectric moat structure (52, 176) to inside each perforated dielectric moat structure (52, 176) (i.e., inside the opening-free area OFA).

In one embodiment, each row of dielectric pillar portions 172 can be arranged along a periphery of a respective perforated dielectric moat structure (52, 176) at a level of one of the insulating layers (132, 232). The rows of dielectric pillar portions 172 located at different levels of the insulating layers (132, 232) have an areal overlap with each other.

The perforated dielectric moat structure (52, 176) also comprises an annular dielectric plate portion 174 at each level of the sacrificial material layers (142, 242) that laterally encloses a respective dielectric material plate (142', 242'). In one embodiment, the dielectric material plates (142', 242') comprise a different material than the insulating layers (132, 232), and comprise the same material as the sacrificial material layers (142, 242). In one embodiment, the insulating layers (132, 232) comprise silicon oxide, and the dielectric material plates (142', 242') comprise silicon nitride. In one embodiment, each of the dielectric material plates (142', 242') has a respective uniform thickness throughout, and contacts a planar bottom surface of a respective overlying one of the insulating layers (132, 232) and contacts a planar top surface of a respective underlying one of the insulating layers (132, 232). If the blocking dielectric layers 52 are present, each of the of dielectric pillar portions 172 can include a segment of a blocking dielectric layer 52 and a segment of a dielectric moat trench fill material portion 176, and each of the annular dielectric plate portions 174 can include a segment of a blocking dielectric layer 52 and a segment of a dielectric moat trench fill material portion 176.

In one embodiment, each of the annular dielectric plate portions 174 comprises a continuous inner sidewall including a plurality of laterally-convex and vertically-planar inner sidewall segments that are adjoined to each other, and a continuous outer sidewall including a plurality of laterally-convex and vertically-planar outer sidewall segments that are adjoined to each other. Each laterally-convex surface is a surface having a convex profile in a horizontal plane.

In one embodiment, each perforated dielectric moat structure (52, 176) comprises a row of dielectric pillar portions 172 at each level of the insulating layers (132, 232). Each of the continuous inner sidewalls and the continuous outer sidewalls is laterally offset from a respective overlying row of dielectric pillar portions 172 by a uniform lateral offset distance, which can be the lateral recess distance by which the sidewalls of the sacrificial material layers (142, 242) are laterally recessed relative to the sidewalls of the insulating layers (132, 232) at the processing steps of FIGS. 13A-13C.

Figure 19:
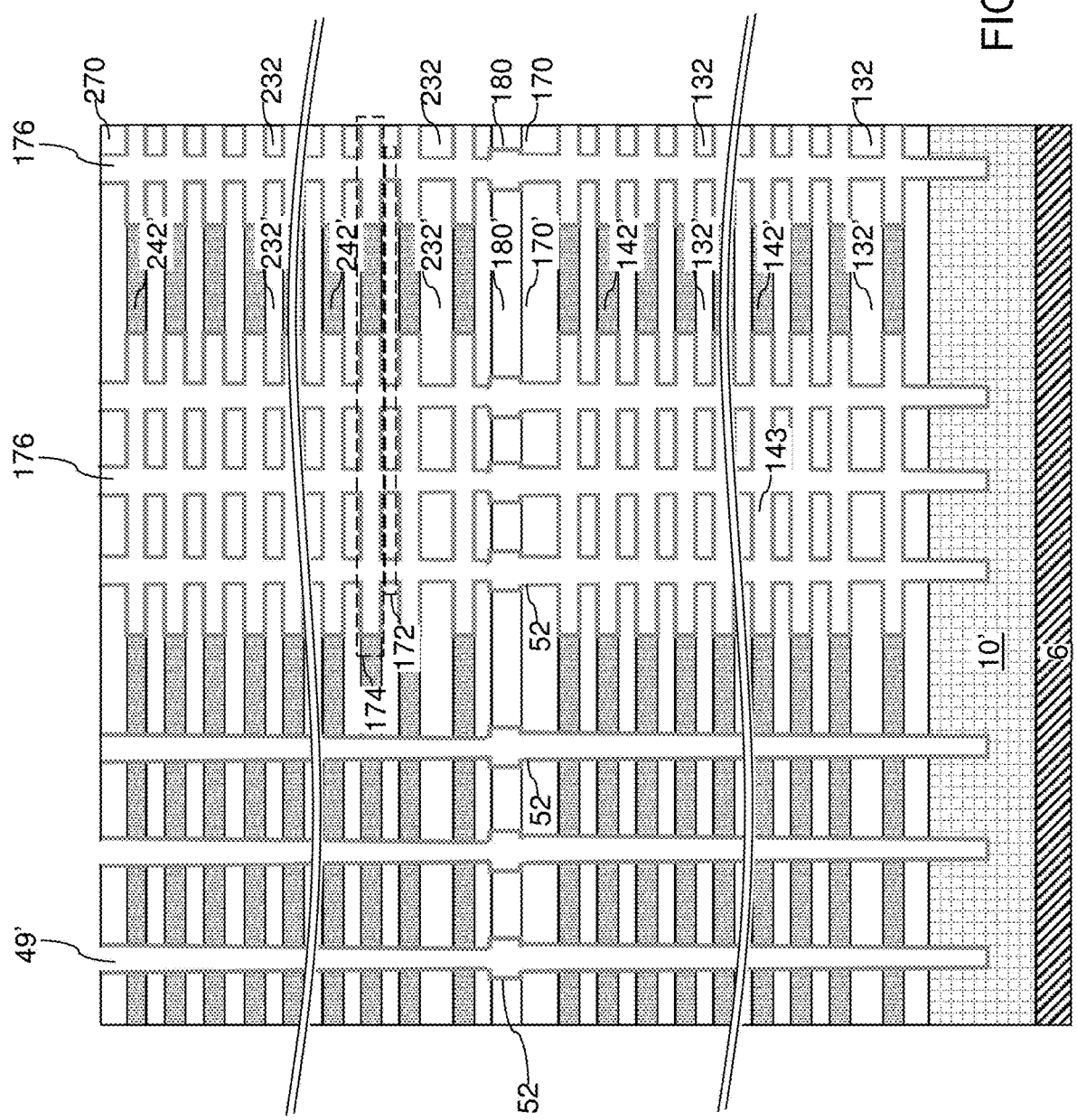
FIG. 19 is a vertical cross-sectional view of a region of the first exemplary structure after removal of sacrificial fill material portions according to the first embodiment of the present disclosure.

Referring to FIGS. 19 and 20A, the sacrificial fill material portions 359 can be removed selective to the materials of the insulating layers (132, 232) and the sacrificial material layers (142, 242). For example, if the sacrificial fill material portions 359 include amorphous silicon or polysilicon, a wet etch process employing hot trimethyl-2 hydroxyethyl ammonium hydroxide ("hot TMY") or tetramethyl ammonium hydroxide (TMAH) can be employed to remove the sacrificial fill material portions 359 selective to the materials of the insulating layers (132, 232) and the sacrificial material layers (142, 242). A memory cavity 49' connected to the ambient is formed within each memory opening 49.

Referring to FIG. 20B, a charge storage layer can be conformally deposited over each blocking dielectric layer 52 and over the top surface of the second insulating cap layer 270. In one embodiment, the charge storage layer may be a continuous layer or patterned discrete portions of a charge trapping material including a dielectric charge trapping material, which may be, for example, silicon nitride. Alternatively, the charge storage layer may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer includes a silicon nitride layer. In one embodiment, the sacrificial material layers (142, 242) and the insulating layers (132, 232) may have vertically coincident sidewalls, and the charge storage layer may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer as a plurality of memory material portions that are vertically spaced apart. The thickness of the charge storage layer may be in a range from 2 nm to 20 nm, although lesser and greater thicknesses may also be used.

A tunneling dielectric layer 56 can be formed over the charge storage layer. The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

The stack of the blocking dielectric layer 52, the charge storage layer 54, and the tunneling dielectric layer 56 constitutes a memory film 50 that stores memory bits.

A semiconductor channel material layer 60L can be formed over the tunneling dielectric layer 56. The semiconductor channel material layer 60L may include a doped semiconductor material such as at least one elemental semiconductor material, at least one III-V compound semiconductor material, at least one II-VI compound semiconductor material, at least one organic semiconductor material, or other semiconductor materials known in the art. The conductivity type of dopants in the semiconductor channel material layer 60L is herein referred to as a first conductivity type, which may be p-type or n-type. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 56, 60L).

Referring to FIG. 20C, in embodiments in which the memory cavity 49' in each memory opening is not completely filled by the semiconductor channel material layer 60L, a dielectric core layer may be deposited in the memory cavity 49' to fill any remaining portion of the memory cavity 49' within each memory opening. The dielectric core layer includes a dielectric material such as silicon oxide or organo silicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 20D, a doped semiconductor material may be deposited in cavities overlying the dielectric cores 62. The doped semiconductor material has a doping of the opposite conductivity type of the doping of the semiconductor channel material layer 60L. In one embodiment, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 may be surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 may be a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. Each drain region 63 in a memory opening fill structure 58 is electrically connected to an upper end of a respective one of the vertical semiconductor channels 60. The in-process source-level material layers 10', the first-tier structure (132, 142, 170, 165), the second-tier structure (232, 242, 270, 265), the inter-tier dielectric layer 180, and the memory opening fill structures 58 collectively constitute a memory-level assembly.

The memory stack structures 55 are formed through the alternating stack {(132, 142), (232, 242)}. Each of the memory stack structures 55 comprises a vertical semiconductor channel 60 and a vertical stack of memory elements located in the memory film 50 at levels of the sacrificial material layers (142, 242). Each vertical stack of memory elements comprises charge storage material portions (i.e., portions of a charge storage layer) located at each level of the sacrificial material layers 142 and laterally spaced from a vertical semiconductor channel 60 within a same memory opening 49 by a tunneling dielectric layer 56.

Figure 21A:
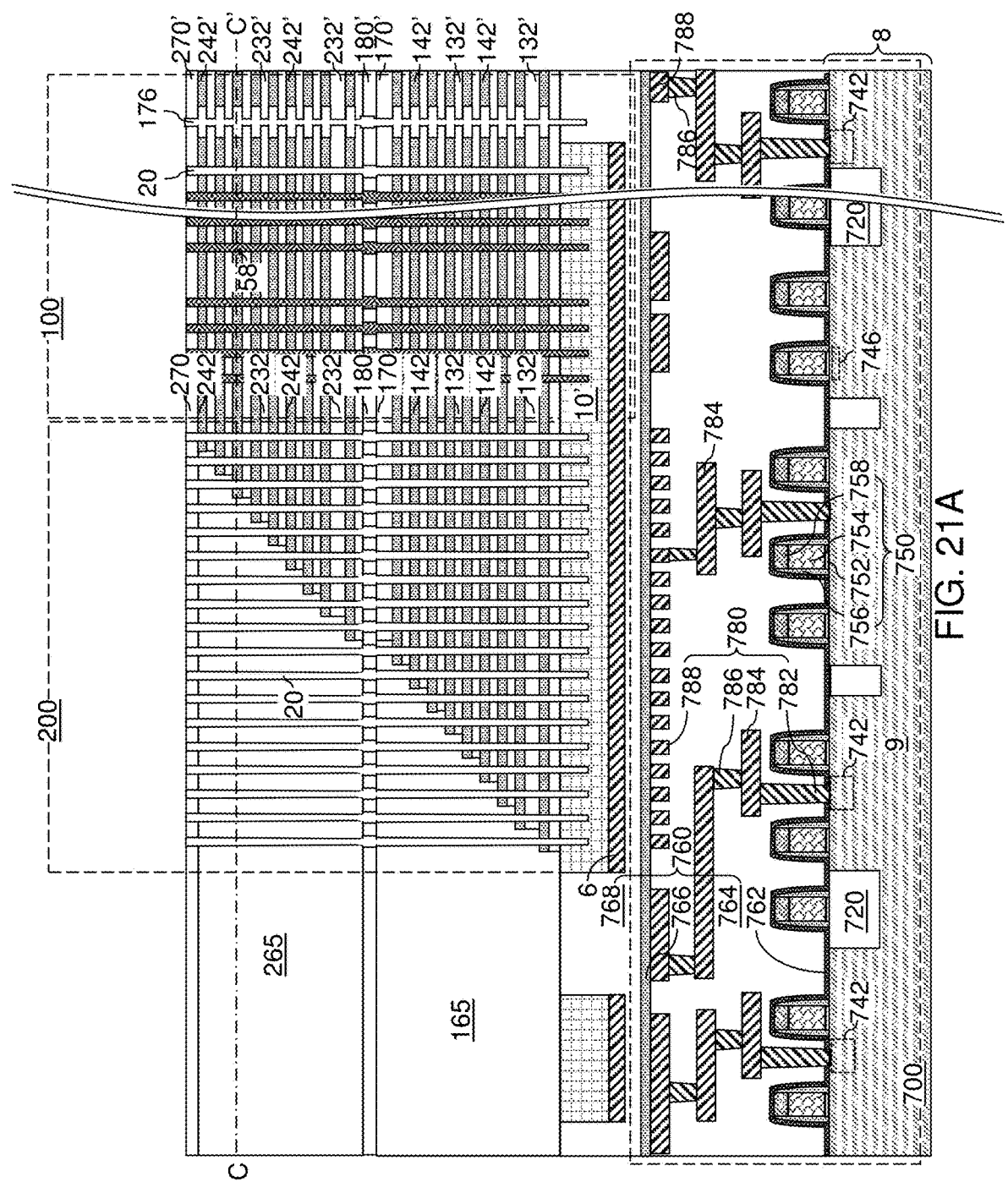
FIG. 21A is a vertical cross-sectional view of the first exemplary structure after formation of memory opening fill structures according to the first embodiment of the present disclosure.
Figure 21B:
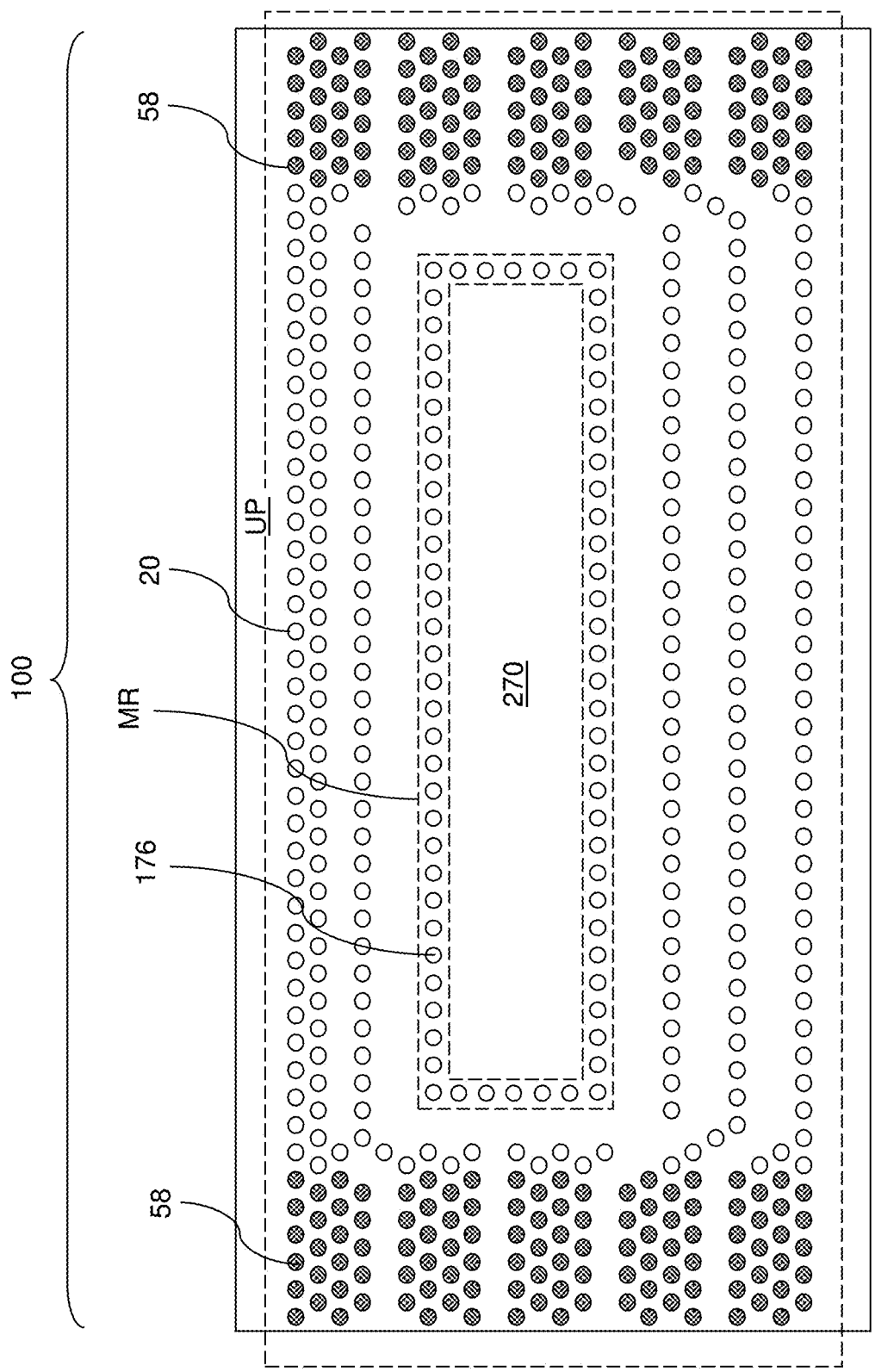
FIG. 21B is a top-down view of the first exemplary structure of FIG. 21A.
Figure 21C:
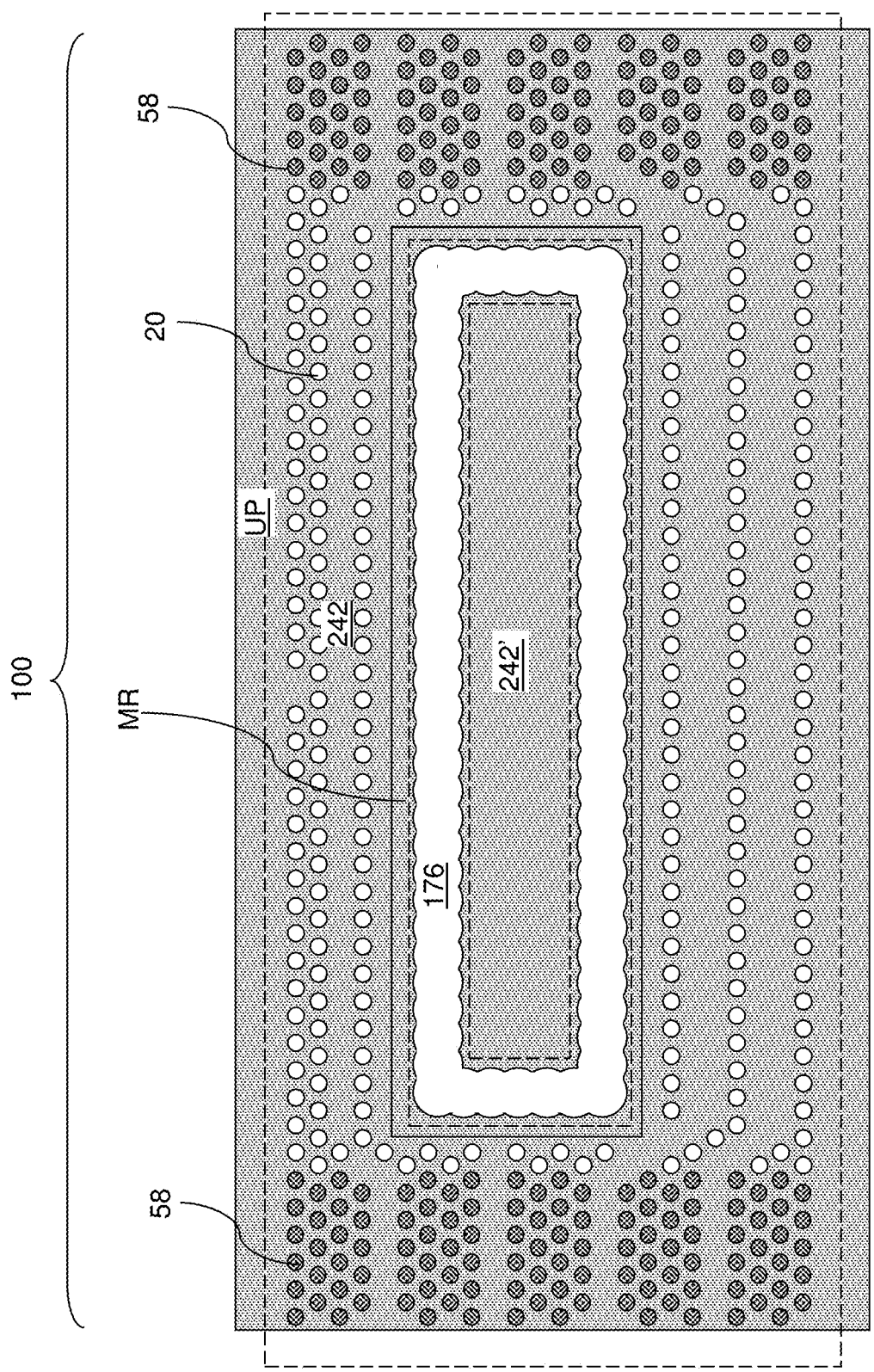
FIG. 21C is a horizontal cross-sectional view of the first exemplary structure of FIG. 21A at a level of a sacrificial material layer along plane C-C' in FIG. 21A.

Referring to FIGS. 21A-21C, the first exemplary structure is illustrated after formation of the memory opening fill structures 58. Each of the alternating stacks {(132, 142), (232, 242)} comprises a terrace region in which each sacrificial material layer (142, 242) other than a topmost sacrificial material layer (142, 242) within the alternating stack {(132, 142) and/or (232, 242)} laterally extends farther than any overlying sacrificial material layer (142, 242) within the alternating stack {(132, 142) and/or (232, 242)}. The terrace region includes stepped surfaces of the alternating stack that continuously extend from a bottommost layer within the alternating stack {(132, 142) or (232, 242)} to a topmost layer within the alternating stack {(132, 142) or (232, 242)}. Support pillar structures (52, 20) extend through the stepped surfaces and through a retro-stepped dielectric material portion (165 or 265) that overlies the stepped surfaces.

Figure 22A:
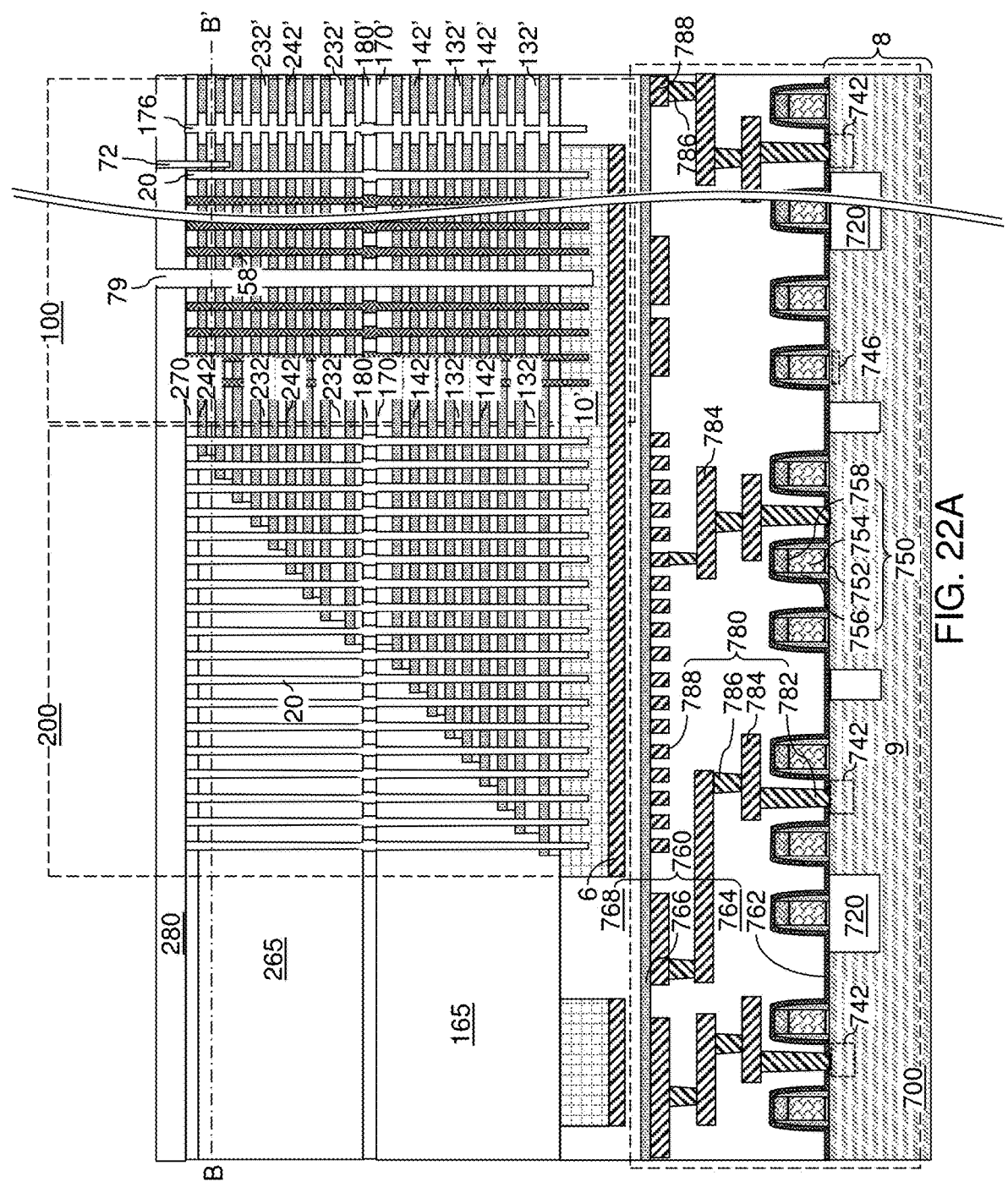
FIG. 22A is a vertical cross-sectional view of the first exemplary structure after formation of backside trenches according to the first embodiment of the present disclosure.
Figure 22B:
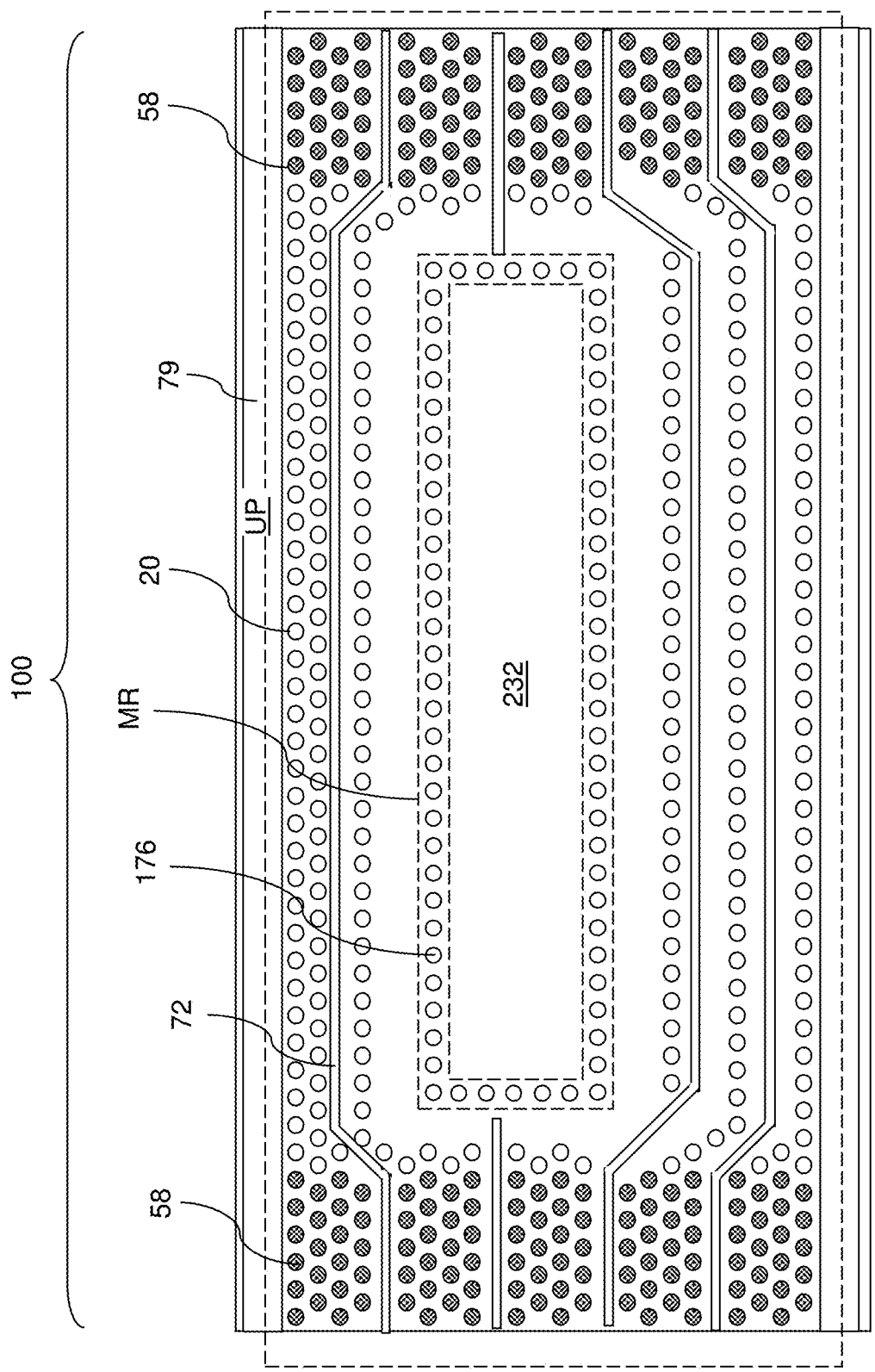
FIG. 22B is a horizontal cross-sectional view of the first exemplary structure of FIG. 21A along plane B-B' in FIG. 22A.
Figure 23A:
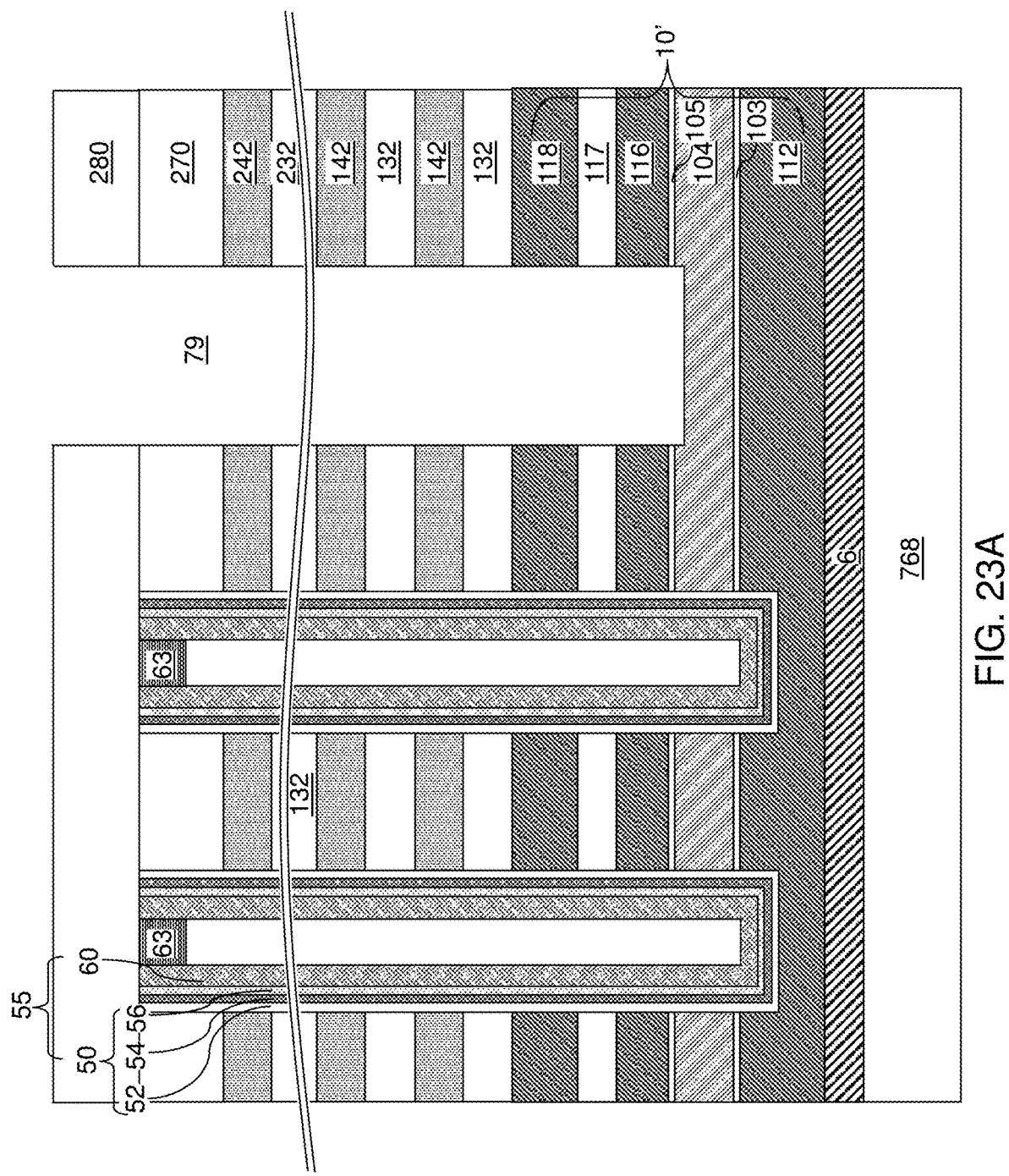
FIGS. 23A-23E illustrate sequential vertical cross-sectional views of memory opening fill structures and a backside trench during formation of source-level material layers according to the first embodiment of the present disclosure.

Referring to FIGS. 22A, 22B, and 23A, a first contact-level dielectric layer 280 may be formed over the second-tier structure (232, 242, 270, 265). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form various openings in the memory array region 100 and the staircase region 200. The openings in the photoresist layer include first elongated openings that laterally extend along the first horizontal direction hd1 through the entire lateral extent of the memory array region 100 and the staircase region 200 along the first horizontal direction hd1. The first elongated openings laterally extend between groups of memory opening fill structures 58 and support pillar structures 20. Further, the openings in the photoresist layer may include second elongated openings that extend along the first horizontal direction hd1 between clusters of memory opening fill structures 58 that are laterally spaced apart along the first horizontal direction hd1 and located between a neighboring pair of first elongated openings. Each second elongated opening has a lesser lateral extent that the lateral extent of the memory array region 100 along the first horizontal direction hd1. Optionally, the openings in the photoresist layer may include discrete openings located between end regions of a neighboring pair of second elongated openings.

An anisotropic etch may be performed to transfer the pattern in the photoresist layer through underlying material portions including the alternating stacks {(132, 142), (232, 242)} and an upper portion of the in-process source-level material layers 10'. Backside trenches 79 may be formed underneath the first elongated openings in the photoresist layer through the first contact-level dielectric layer 280, the second-tier structure (232, 242, 270, 265), and the first-tier structure (132, 142, 170, 165), and into the in-process source-level material layers 10'. Portions of the first contact-level dielectric layer 280, the second-tier structure (232, 242, 270, 265), the first-tier structure (132, 142, 170, 165), and the in-process source-level material layers 10' that underlie the first elongated openings in the photoresist layer may be removed to form the backside trenches 79. In one embodiment, the backside trenches 79 may be formed between groups of memory stack structures 55 that are laterally spaced apart along the second horizontal direction. A top surface of a source-level sacrificial layer 104 may be physically exposed at the bottom of each backside trench 79.

Generally, an alternating stack {(132, 232), (142, 242)} of insulating layers 132 and sacrificial material layers (142, 242) may be formed over a semiconductor substrate 8 including the substrate semiconductor layer 9. The sacrificial material layers (142, 242) may comprise a dielectric material such as silicon nitride. The alternating stack {(132, 232), (142, 242)} may be etched by performing an anisotropic etch process using a patterned mask layer (such as a photoresist layer). The alternating stack {(132, 232), (142, 242)} may be divided into a plurality of alternating stacks {(132, 232), (142, 242)} of respective insulating layers (132, 232) and respective sacrificial material layers (142, 242) by the backside trenches 79.

A photoresist layer (not shown) can be applied over the first exemplary structure, and can be lithographically patterned to form laterally-extending line-shaped openings that laterally extend along the first horizontal direction hd1 between neighboring clusters of memory opening fill structures 58. The pattern of the laterally-extending line-shaped openings can be transferred through the upper set of at least one insulating layer 232 and at least one sacrificial material layer 242 to form drain-select-level trenches. The photoresist layer can be removed, for example, by ashing.

A dielectric fill material such as undoped silicate glass or a doped silicate glass can be deposited in the drain-select-level trenches. Excess portions of the dielectric fill material may be removed from above layer 280 by a planarization process. Portions of the dielectric fill material that fills the drain-select-level trenches constitute drain-select-level isolation structures 72, which separate drain select electrodes to be formed in a later step in place of the one or more upper sacrificial material layers 242.

Figure 23B:
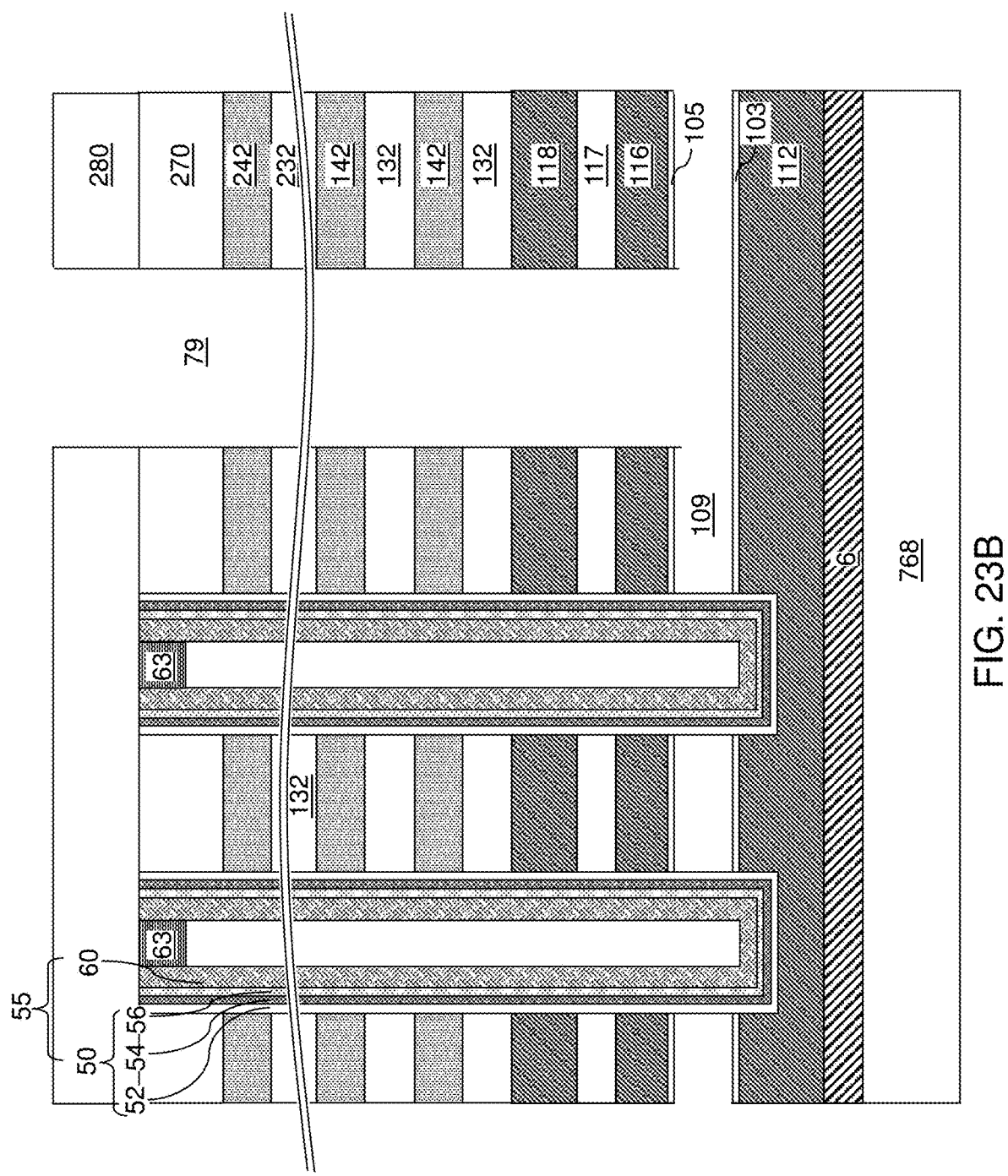

Referring to FIG. 23B, an etchant that etches the material of the source-level sacrificial layer 104 selective to the materials of the first-tier alternating stack (132, 142), the second-tier alternating stack (232, 242), the first and second insulating cap layers (170, 270), the first contact-level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy and if the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the upper and lower sacrificial liners (105, 103). A source cavity 109 may be formed in the volume from which the source-level sacrificial layer 104 is removed.

Wet etch chemicals such as hot TMY and TMAH are selective to the doped semiconductor materials of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, in embodiments in which sidewalls of the upper source-level semiconductor layer 116 are physically exposed or in other embodiments in which a surface of the lower source-level semiconductor layer 112 is physically exposed upon formation of the source cavity 109, collateral etching of the upper source-level semiconductor layer 116 and/or the lower source-level semiconductor layer 112 is minimal, and the structural change to the first exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 may be physically exposed to the source cavity 109. Specifically, each of the memory opening fill structures 58 may include a sidewall and a bottom surface that are physically exposed to the source cavity 109.

Figure 23C:
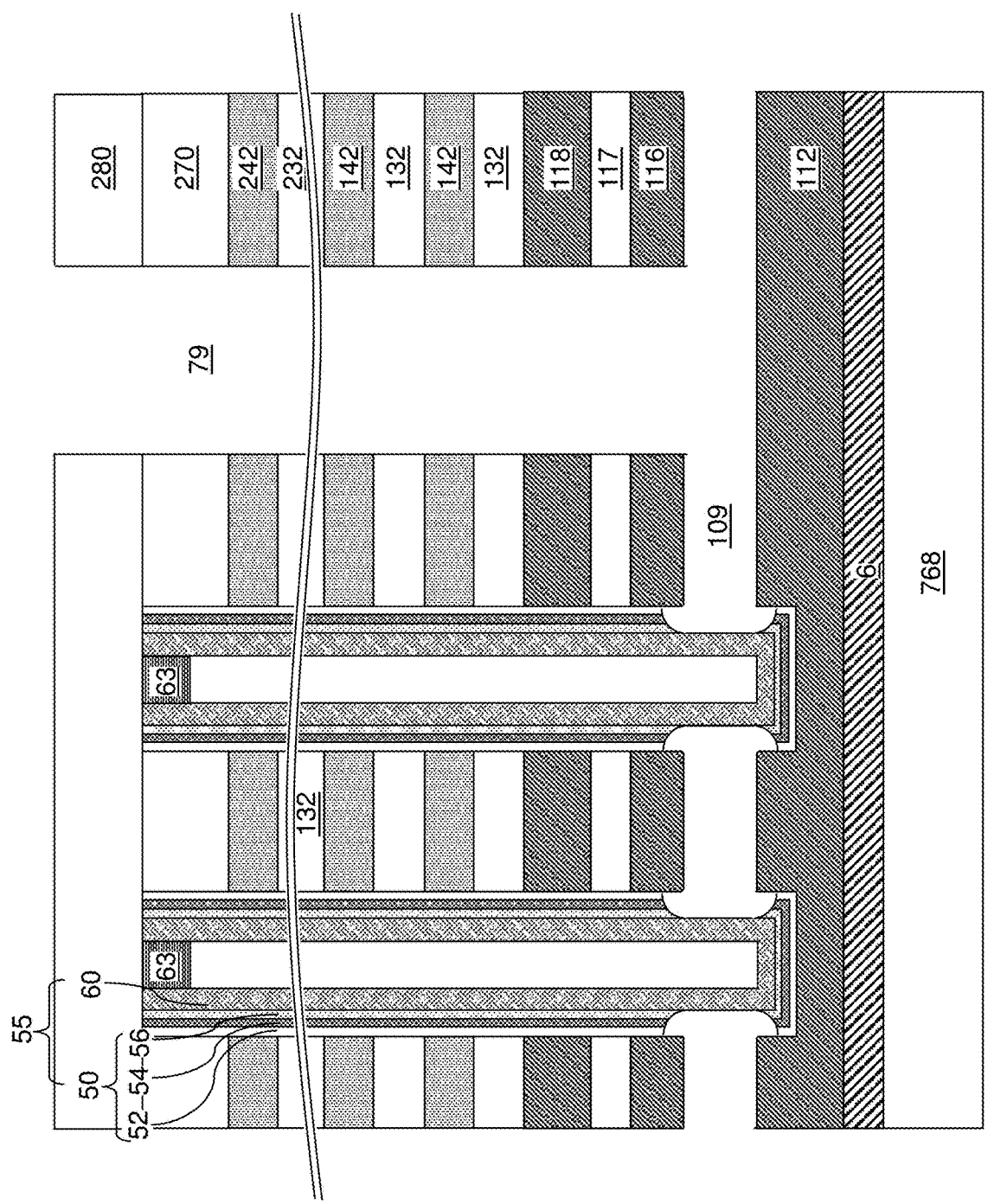

Referring to FIG. 23C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 may be formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 23D:
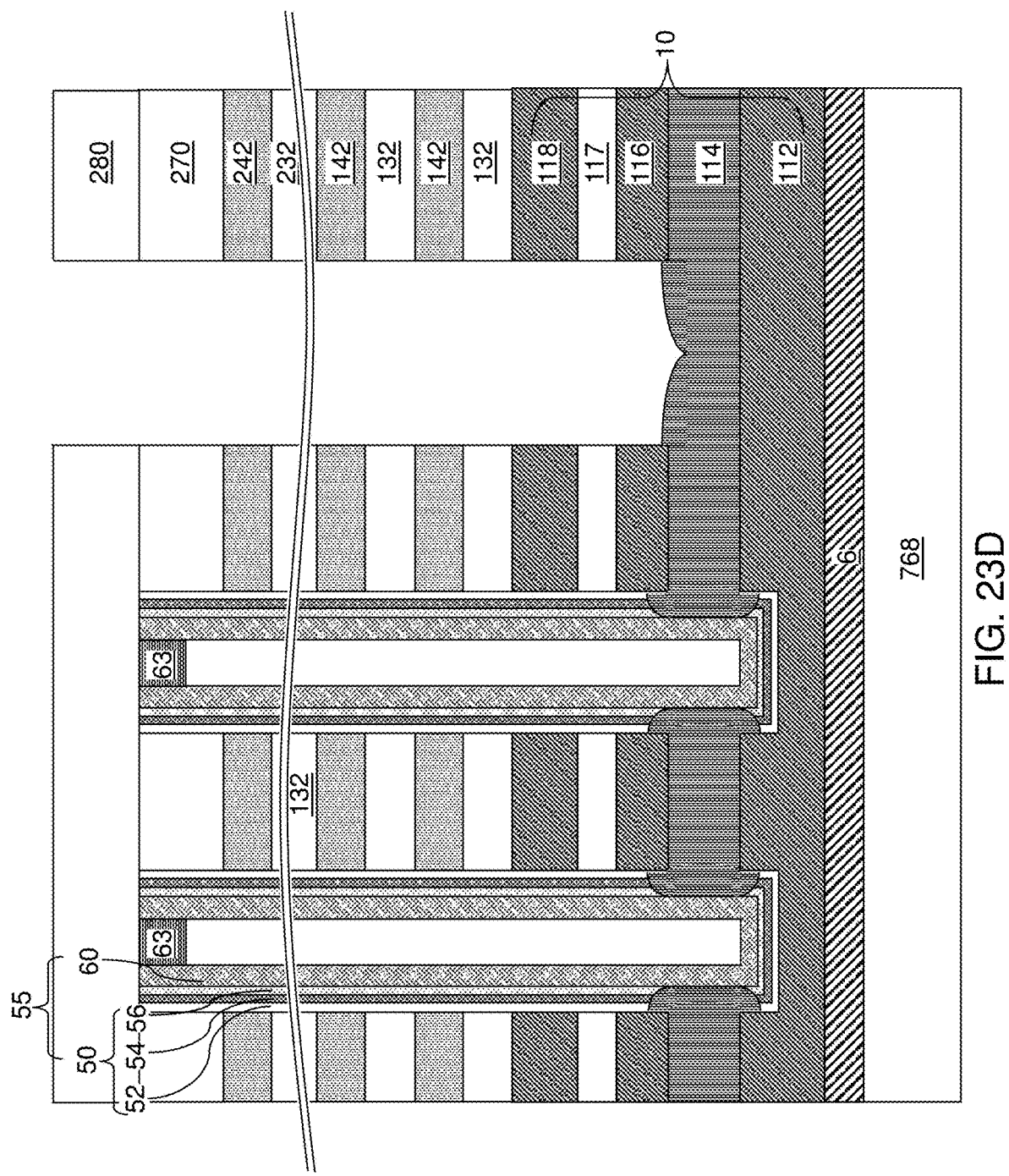

Referring to FIG. 23D, a doped semiconductor material having a doping of the second conductivity type may be deposited on the physically exposed semiconductor surfaces around the source cavity 109. The second conductivity type is the opposite of the first conductivity type, which is the conductivity type of the doping of the vertical semiconductor channels 60. The physically exposed semiconductor surfaces include bottom portions of outer sidewalls of the vertical semiconductor channels 60 and horizontal surfaces of the at least one source-level semiconductor layer (112, 116). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and an n-type dopant precursor gas may flow concurrently into a process chamber including the first exemplary structure during the selective semiconductor deposition process. For example, the semiconductor precursor gas may include silane, disilane, or dichlorosilane, the etchant gas may include gaseous hydrogen chloride, and the n-type dopant precursor gas such as phosphine, arsine, or stibine. In this case, the selective semiconductor deposition process grows an in-situ doped semiconductor material from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and the dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114. In one embodiment, the source contact layer 114 may be formed by selectively depositing a doped semiconductor material from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a source region (112, 114, 116). The source region (112, 114, 116) is electrically connected to a first end (such as a bottom end) of each of the vertical semiconductor channels 60. The set of layers including the source region (112, 114, 116), the source-level insulating layer 117, and the source-select-level conductive layer 118 constitutes source-level material layers 10, which replaces the in-process source-level material layers 10'.

Figure 23E:
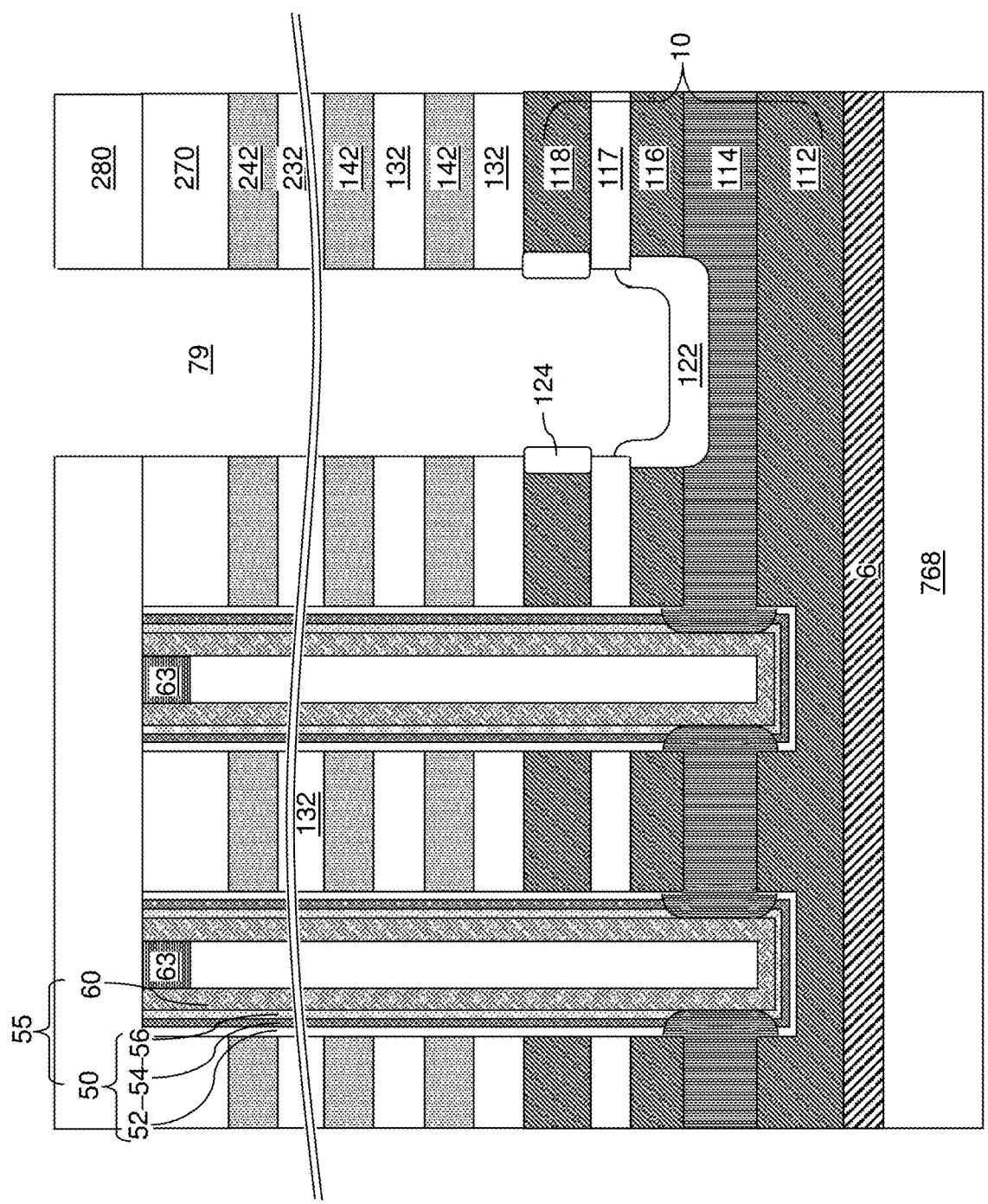

Referring to FIG. 23E, an oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 24A:
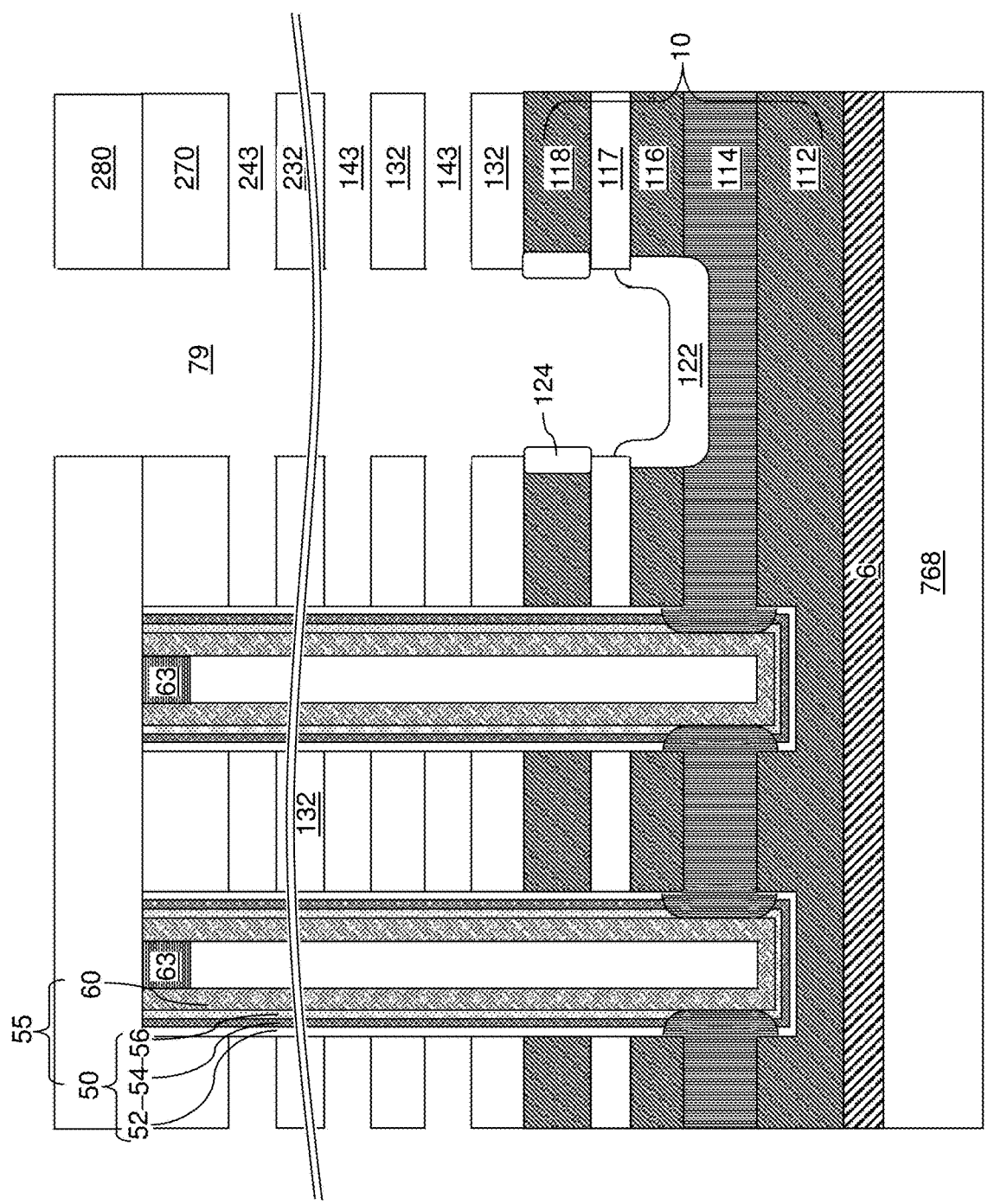
FIG. 24A is a vertical cross-sectional view of the first exemplary structure after formation of backside recesses according to the first embodiment of the present disclosure.
Figure 24B:
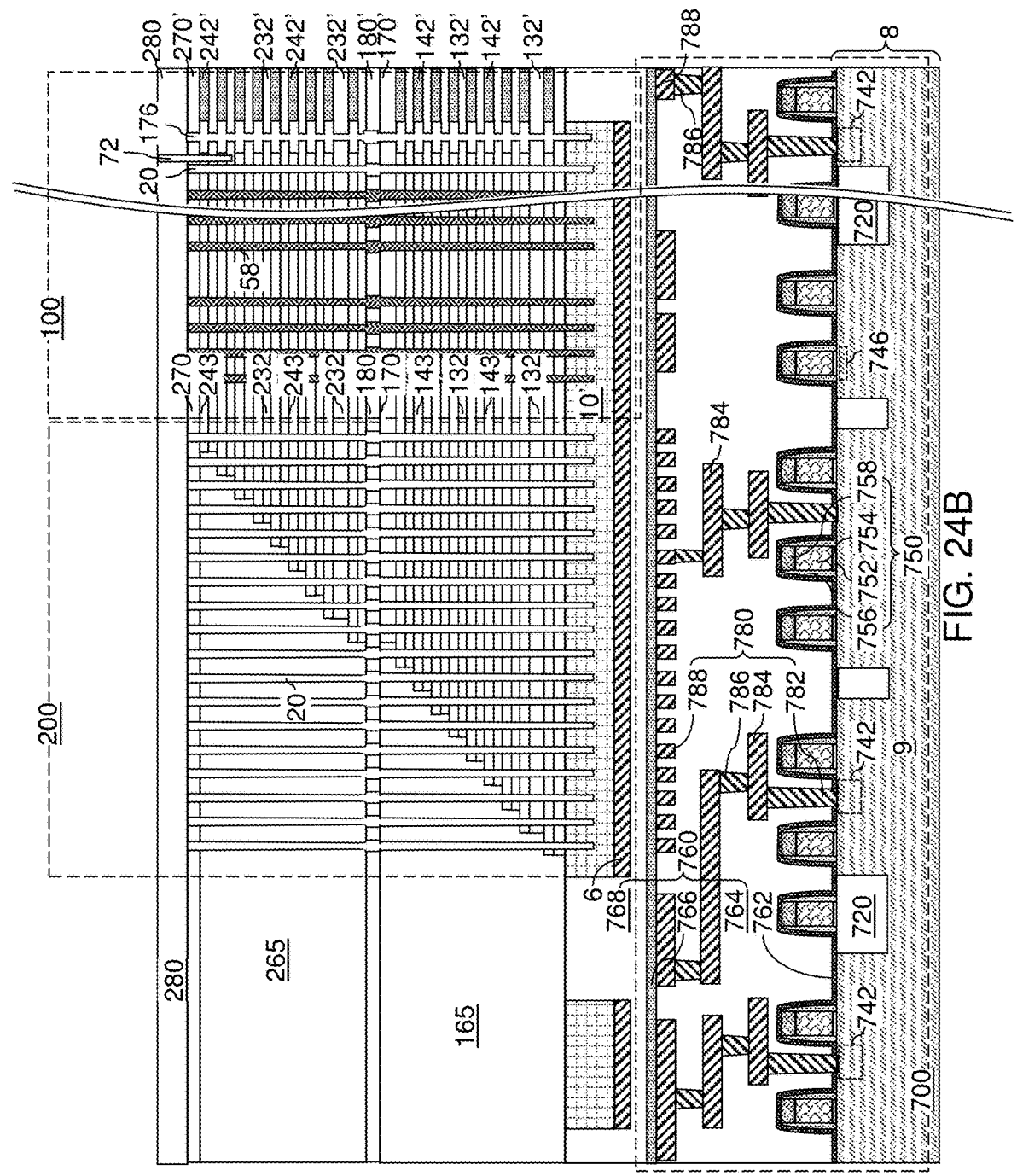
FIG. 24B is another vertical cross-sectional view of the first exemplary structure of FIG. 24A.

Referring to FIGS. 24A and 24B, the sacrificial material layers (142, 242) can be removed selective to the insulating layers (132, 232), the first and second insulating cap layers (170, 270), the first contact-level dielectric layer 280, and the source contact layer 114, the dielectric semiconductor oxide plates 122, and the annular dielectric semiconductor oxide spacers 124. An isotropic etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art. The duration of the isotropic etch process may be selected such that the entirety of the sacrificial material layers (142, 242) is removed by the isotropic etch process.

Backside recesses (143, 243) may be formed in volumes from which the sacrificial material layers (142, 242) are removed. The backside recesses (143, 243) include first backside recesses 143 that may be formed in volumes from which the first sacrificial material layers 142 are removed and second backside recesses 243 that may be formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout. The perforated dielectric moat structure (52, 176) protects the dielectric material plates (142', 242') in the opening-free area OFA from being etched or removed.

Figure 25A:
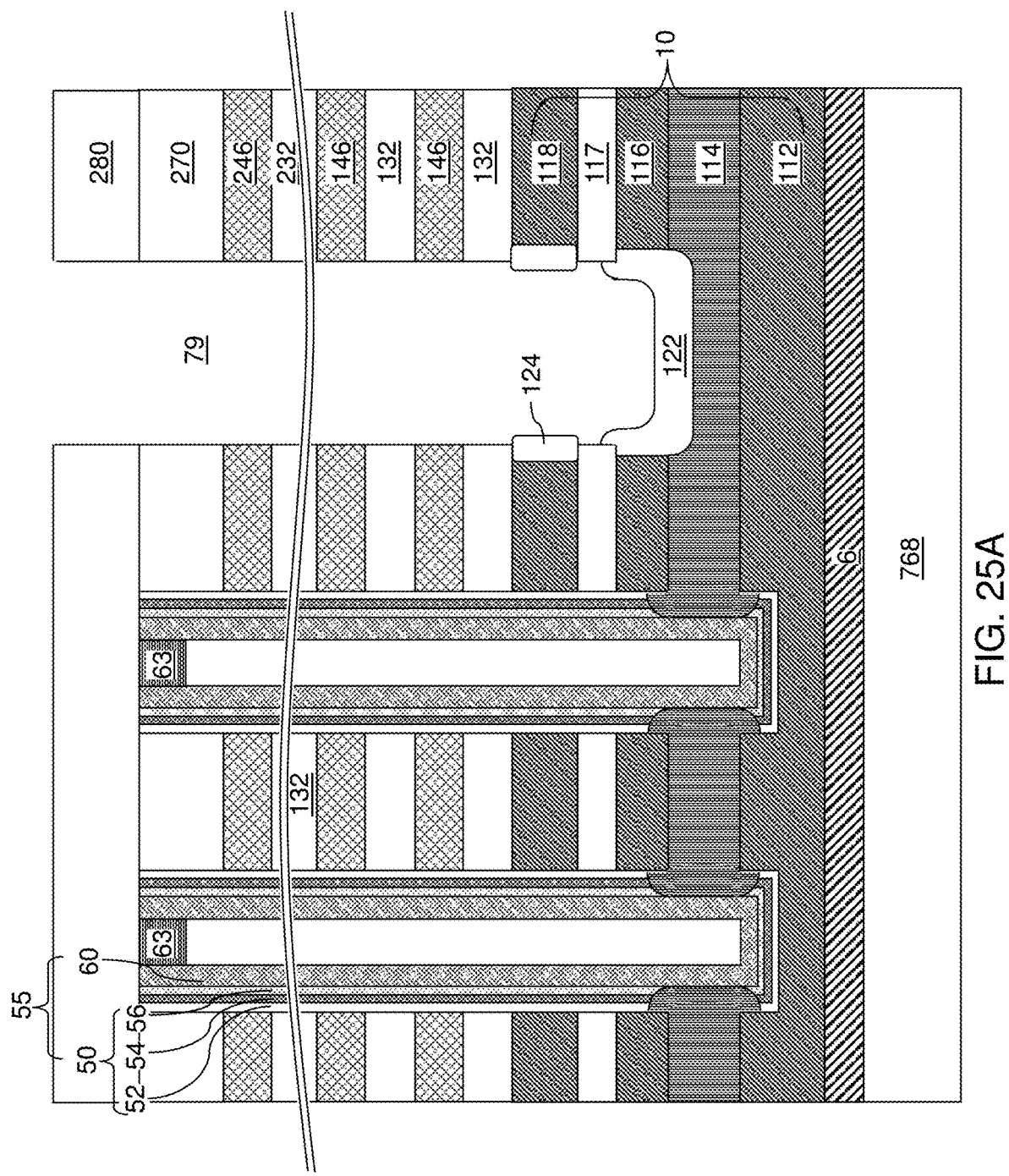
FIG. 25A is a vertical cross-sectional view of the first exemplary structure after formation of electrically conductive layers according to the first embodiment of the present disclosure.
Figure 25B:
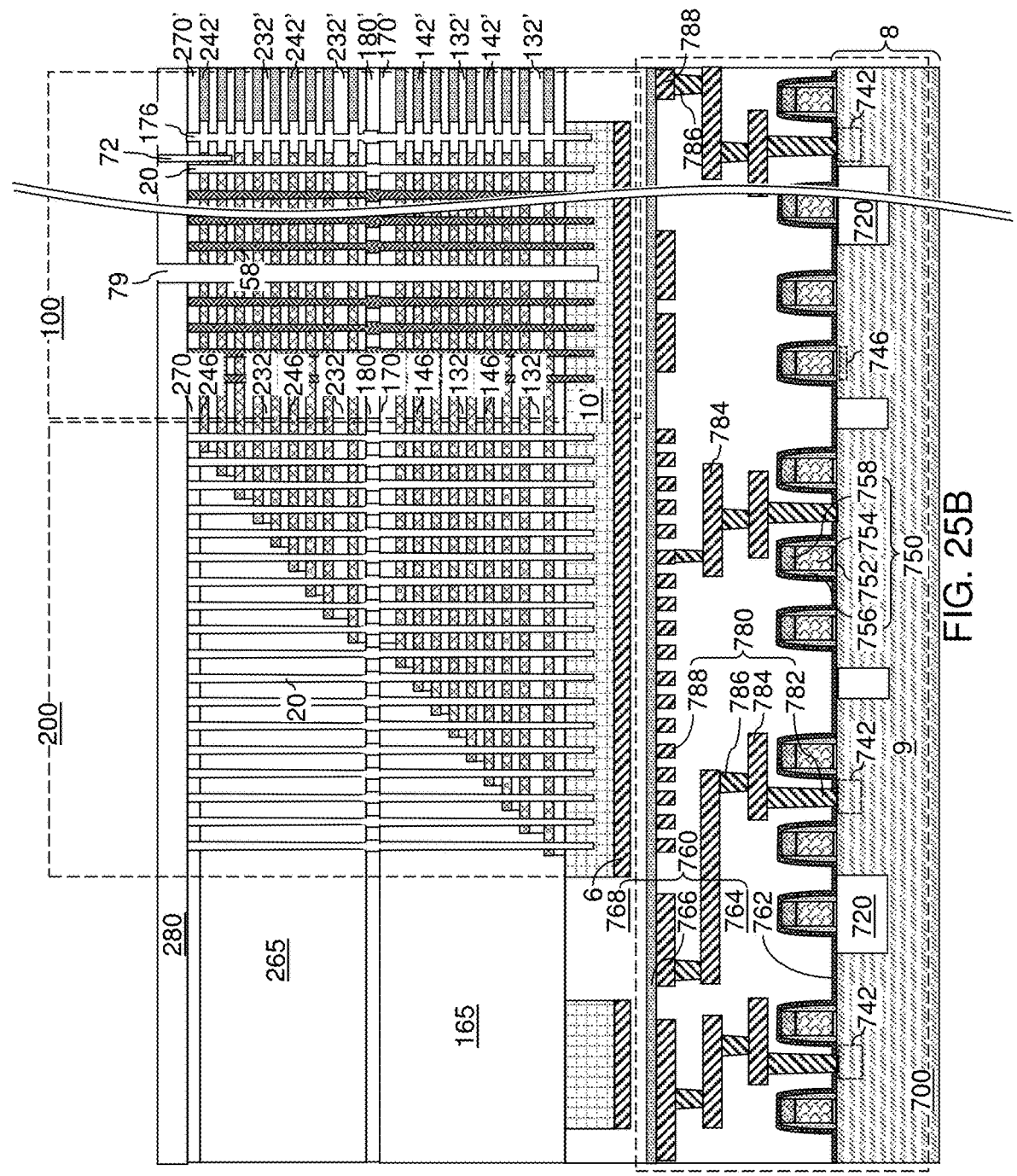
FIG. 25B is another vertical cross-sectional view of the first exemplary structure of FIG. 25A.

Referring to FIGS. 25A and 25B, a backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive layers 146 and the second electrically conductive layers may be physically exposed to a respective backside trench 79.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures (52, 20). The perforated dielectric moat structure (52, 176) vertically extends through each electrically conductive layer (146, 246).

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack {(132, 146), (232, 246)} and memory stack structures 55 vertically extending through the at least one alternating stack (132, 146, 232, 246).

Figure 26A:
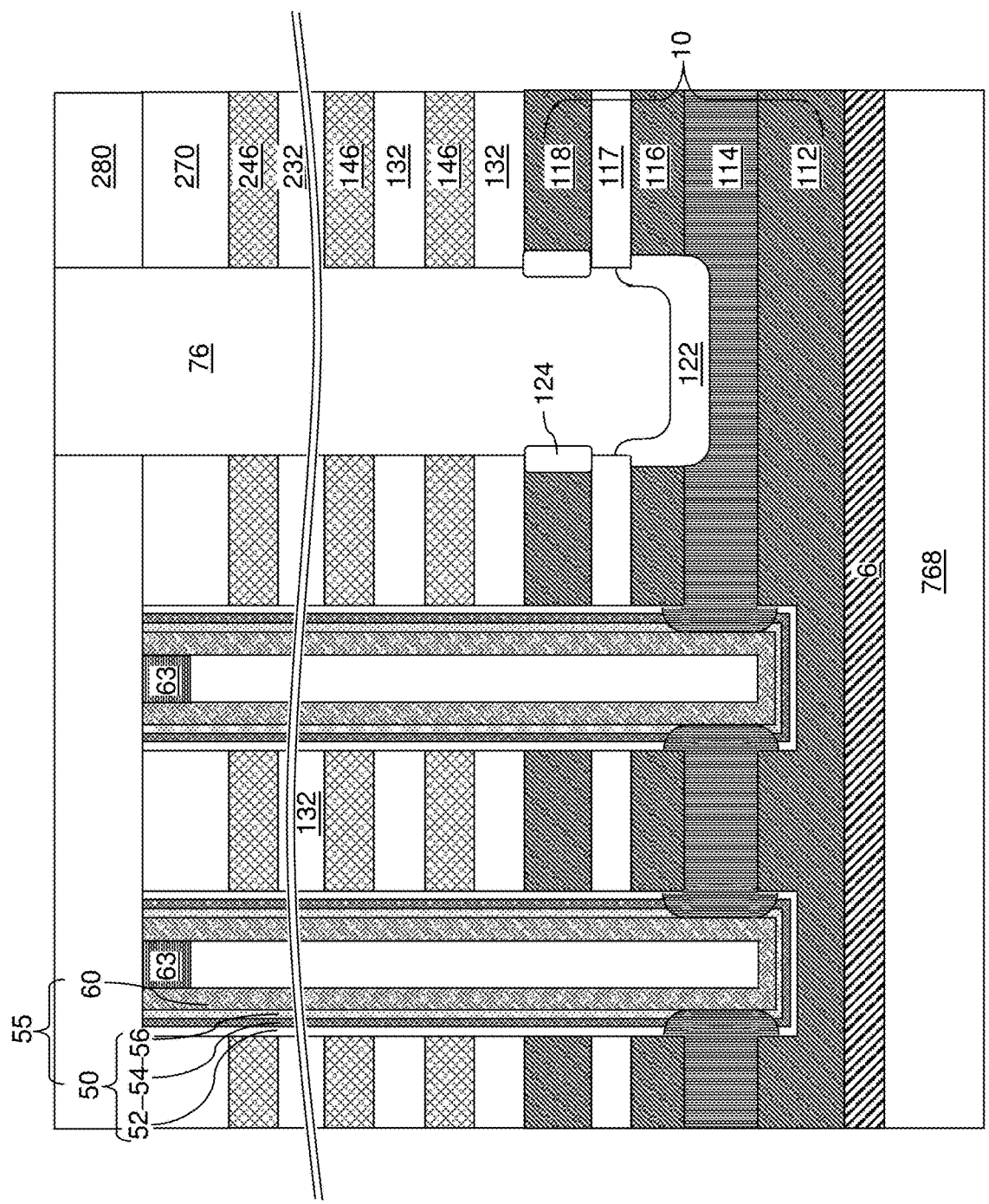
FIG. 26A is a vertical cross-sectional view of the first exemplary structure after formation of dielectric wall structures in the backside trenches according to the first embodiment of the present disclosure.
Figure 26B:
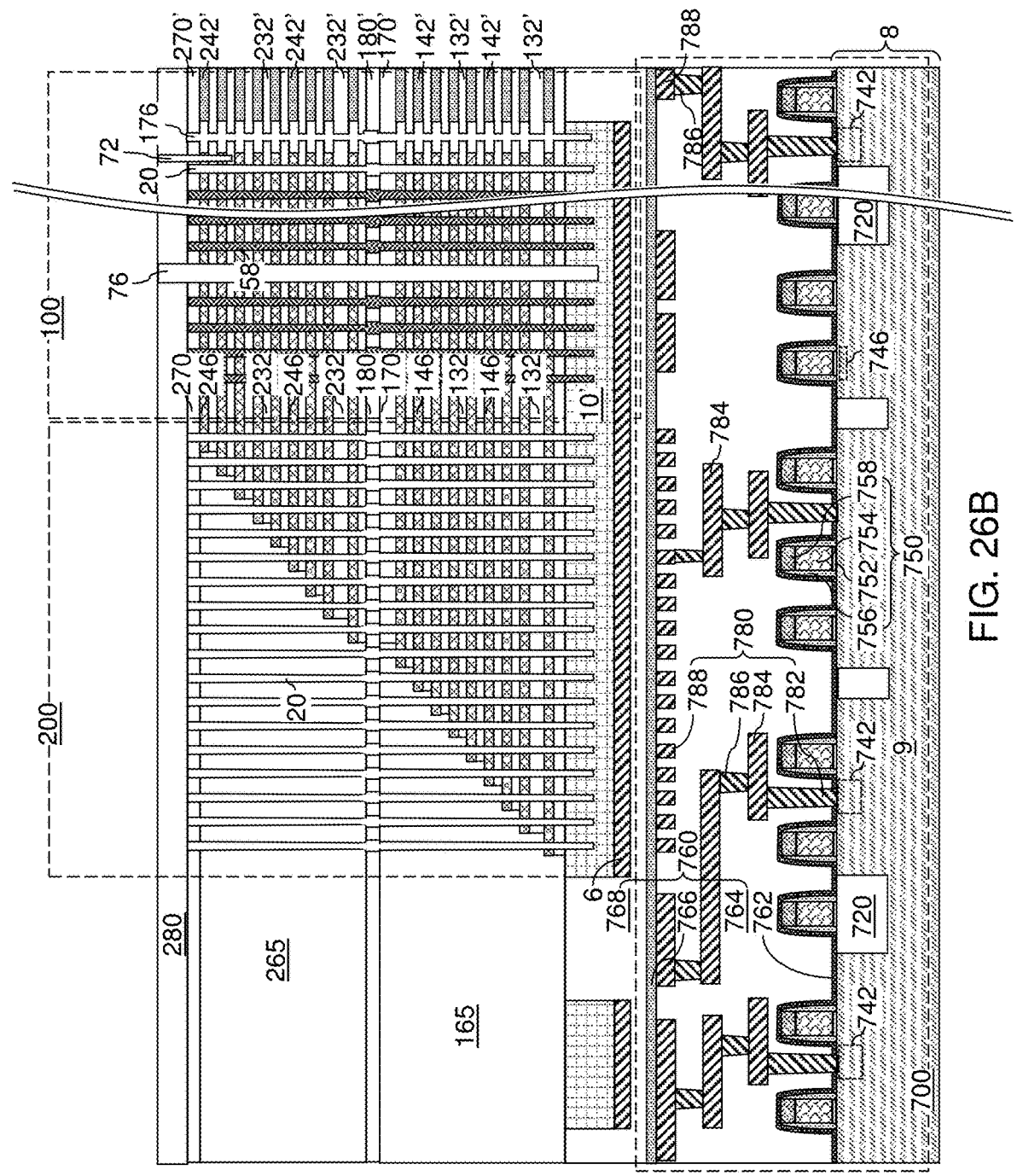
FIG. 26B is another vertical cross-sectional view of the first exemplary structure of FIG. 26A.

Referring to FIGS. 26A and 26B, a dielectric material can be deposited in unfilled volumes of the backside trenches 79. Excess portions of the dielectric material may be removed from above the top surface of the first contact-level dielectric layer 280 by a planarization process, which may employ a recess etch process or a chemical mechanical planarization process. Each remaining portion of the dielectric material filling a backside trench 79 constitutes a dielectric wall structure 76. The dielectric wall structures 76 can laterally extend along the first horizontal direction hd1, and includes a dielectric material such as undoped silicate glass or a doped silicate glass.

Figure 27A:
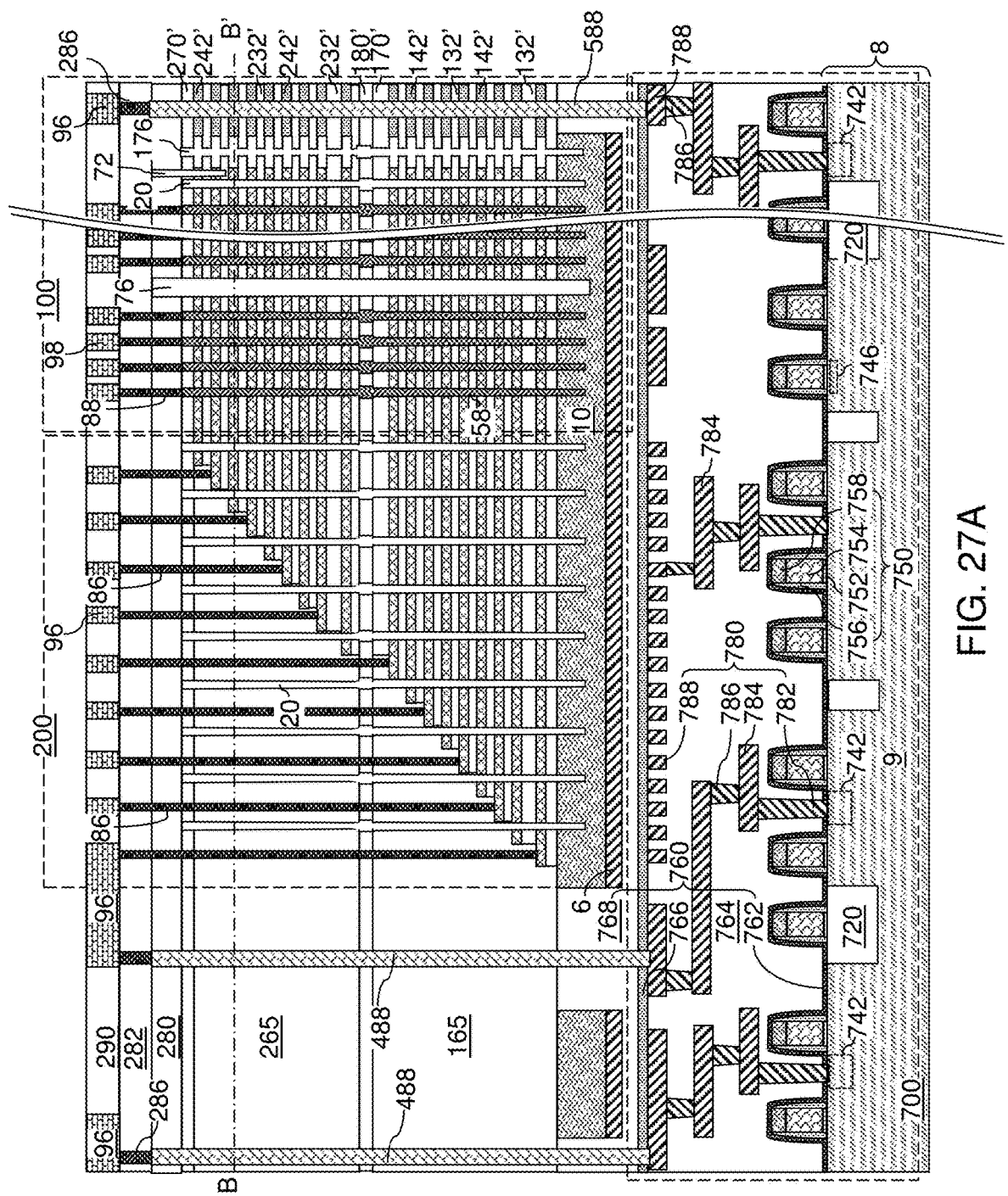
FIG. 27A is a vertical cross-sectional view of the first exemplary structure after formation of upper-level dielectric material layers and upper-level metal interconnect structures according to the first embodiment of the present disclosure.
Figure 27B:
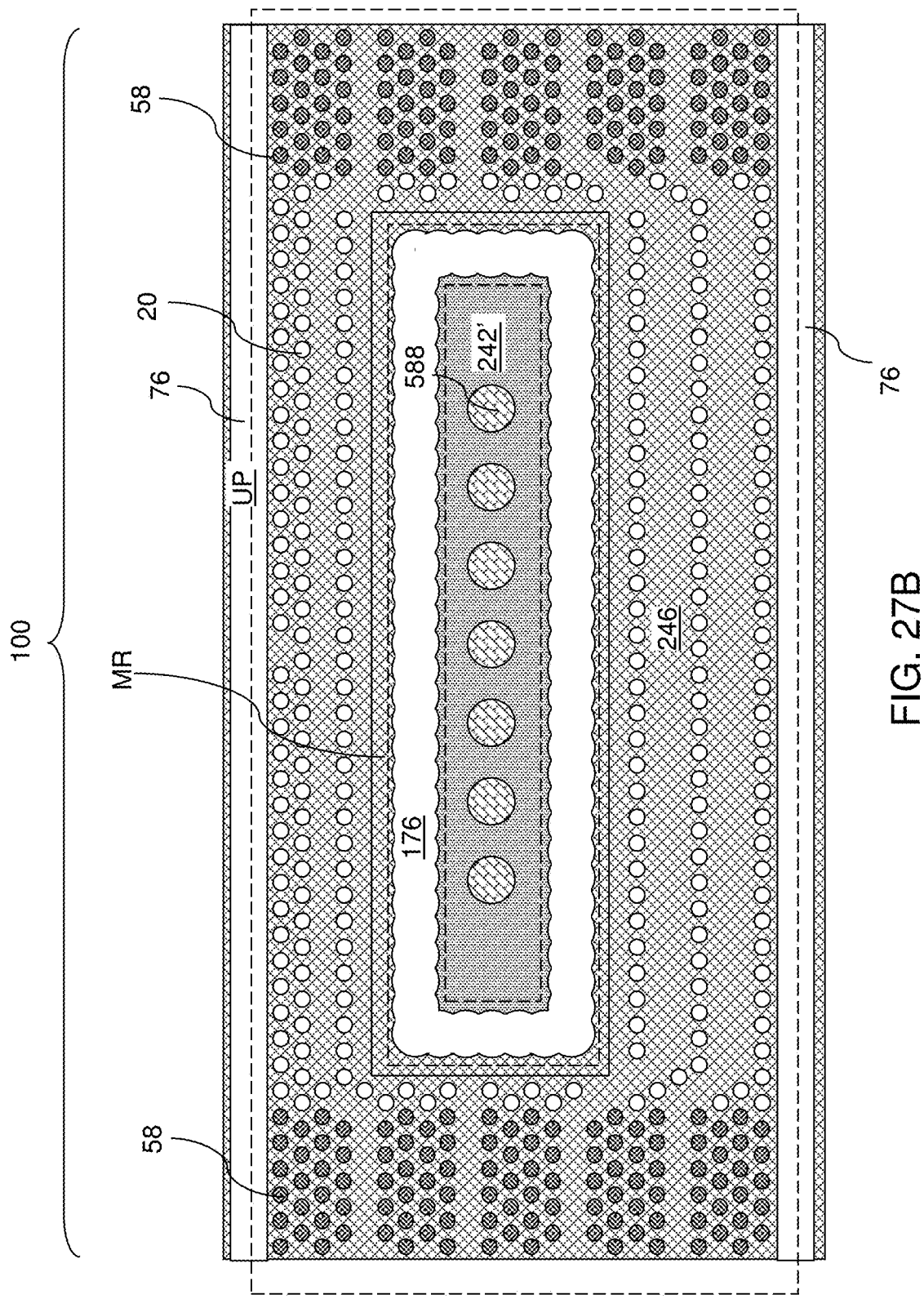
FIG. 27B is a horizontal cross-sectional view of the first exemplary structure of FIG. 27A at a level of one of the electrically conductive layers along plane B-B' in FIG. 27A.

Referring to FIGS. 27A and 27B, array-region through-memory-level interconnection via structures 588 can be formed through the vertical stack of insulating layers (132, 232) and the dielectric material plates (142', 242'), and peripheral through-memory-level interconnection via structures 488 can be formed through the retro-stepped dielectric material portions (165, 265). Each of the array-region through-memory-level interconnection via structures 588 and the peripheral through-memory-level interconnection via structures 488 can be formed on a respective one of the landing-pad-level metal line structures 788, which are a subset of the lower-level metal interconnect structures 780 embedded in the lower-level dielectric material layers 760. Each array-region through-memory-level interconnection via structures 588 is an interconnection via structure that is surrounded by the perforated dielectric moat structure (52, 176), and can vertically extend through the vertical levels of each insulating layer (132, 232) and electrically conductive layers (146, 246).

Subsequently, upper-level dielectric material layers (282, 290) and upper-level metal interconnect structures (88, 86, 286, 98, 96) can be formed. The upper-level dielectric material layers (282, 290) can include a second contact-level dielectric layer 282 and a first line-level dielectric layer 290. The upper-level metal interconnect structures (88, 86, 286, 98, 96) can include drain contact via structures 88, word line layer contact via structures 86, connection via structures 286, bit lines 98, and connection metal lines 96. The drain contact via structures 88 extend through the first contact-level dielectric layer 280 and the second contact-level dielectric layer 282 and contact a respective one of the drain regions 63. The word line layer contact via structures 86 extend through the first contact-level dielectric layer 280, the second contact-level dielectric layer 282, the second retro-stepped dielectric material portion 265, and optionally through the first retro-stepped dielectric material portion 165, and contact a respective one of the electrically conductive layers (e.g., word lines) (146, 246). The connection via structures 286 extend through the second contact-level dielectric layer 282, and contact a top surface of a respective one of the array-region through-memory-level interconnection via structures 588 and the peripheral through-memory-level interconnection via structures 488. Thus, each of the array-region through-memory-level interconnection via structures 588 and the peripheral through-memory-level interconnection via structures 488 can be electrically connected to a bottom surface of one of the upper-level metal interconnect structures, such as a bottom surface of a connection metal line 96. The bit lines 98 are embedded in the first line-level dielectric layer 290, and contact a respective subset of the drain contact via structures 88. The connection metal lines 96 are embedded in the first line-level dielectric layer 290, and contacts a respective subset of via structures such as the word line layer contact via structures 86 and/or the connection via structures 286. Additional upper-level dielectric material layers (not shown) and additional upper-level metal interconnect structures (not shown) may be formed as needed.

Referring to all drawings and according to various embodiments of the present disclosure, a three-dimensional memory device is provided, which comprises: an alternating stack of insulating layers (132, 232) and electrically conductive layers (146, 246) located over a substrate 8; memory stack structures 55 vertically extending through the alternating stack {(132, 146), (232, 246)}, wherein each of the memory stack structures 55 comprises a vertical semiconductor channel 60 and a vertical stack of memory elements located at levels of the electrically conductive layers (146, 246); a perforated dielectric moat structure (52, 176) vertically extending through the alternating stack {(132, 146), (232, 246)} and including a plurality of lateral openings at each level of the insulating layers (132, 232) and not including any opening at levels of the electrically conductive layers (146, 246); and an interconnection via structure (such as an array-region through-memory-level interconnection via structure) 588 laterally surrounded by the perforated dielectric moat structure (52, 176) and vertically extending through each insulating layer (132, 232) within the alternating stack {(132, 146), (232, 246)}.

In one embodiment, the perforated dielectric moat structure (52, 176) comprises a row of dielectric pillar portions 172 at each level of the insulating layers (132, 232), wherein each of the insulating layers (132, 232) laterally extends between neighboring pairs of dielectric pillar portions 172 from outside the perforated dielectric moat structure (52, 176) to inside the perforated dielectric moat structure (52, 176).

In one embodiment, each row of dielectric pillar portions 172 is arranged along a periphery of the perforated dielectric moat structure at a level of one of the insulating layers (132, 232).

In one embodiment, the rows of dielectric pillar portions 172 located at different levels of the insulating layers (132, 232) have an areal overlap between them. In one embodiment, the perforated dielectric moat structure (52, 176) comprises an annular dielectric plate portion 174 at each level of the electrically conductive layers (146, 246) that laterally surrounds a respective dielectric material plate (142' or 242').

In one embodiment, the dielectric material plates (142', 242') comprise a different material than the insulating layers (132, 232). In one embodiment, the interconnection via structure 588 vertically extends through a vertical stack of dielectric material plates (142', 242') and the insulating layers (132, 232) in an area (AFO) surrounded by the perforated dielectric moat structure (52, 176). In one embodiment, the insulating layers (132, 232) comprise a silicon oxide material; and the dielectric material plates (142', 242') comprise silicon nitride.

In one embodiment, each of the dielectric material plates (142', 242') has a respective uniform thickness throughout, and contacts a planar bottom surface of a respective overlying one of the insulating layers (132, 232) and contacts a planar top surface of a respective underlying one of the insulating layers (132, 232).

In one embodiment, each of the annular dielectric plate portions 174 comprises a continuous inner sidewall including a plurality of laterally-convex and vertically-planar inner sidewall segments that are adjoined among one another; and a continuous outer sidewall including a plurality of laterally-convex and vertically-planar outer sidewall segments that are adjoined to each other.

In one embodiment, each of the continuous inner sidewalls and the continuous outer sidewalls is laterally offset from a respective overlying row of dielectric pillar portions 172 by a uniform lateral offset distance.

In one embodiment, the three-dimensional memory device comprises: lower-level dielectric material layers 760 disposed between the substrate 8 and the alternating stack {(132, 146), (232, 246)}; and lower-level metal interconnect structures 780 embedded within the lower-level dielectric material layers 760, wherein the interconnection via structure (such as an array-region through-memory-level interconnection via structure 588) contacts a top surface of one of the lower-level metal interconnect structures 780.

In one embodiment, the three-dimensional memory device comprises field effect transistors located over the substrate 8 and including a node that is electrically connected to the interconnection via structure (such as an array-region through-memory-level interconnection via structure 588) through a subset of the lower-level metal interconnect structures 780.

In one embodiment, the three-dimensional memory device can comprise: upper-level dielectric material layers (282, 290) located above the alternating stack {(132, 146), (232, 246)}; and upper-level metal interconnect structures (88, 86, 286, 98, 96) embedded within the upper-level dielectric material layers (282, 290), wherein the interconnection via structure (such as an array-region through-memory-level interconnection via structure 588) contacts a bottom surface of one of the upper-level metal interconnect structures (88, 86, 286, 98, 96) (such as a bottom surface of a connection metal line 96).

In one embodiment, the vertical stack of memory elements comprises portions of a charge storage layer 54 located at each level of the electrically conductive layers (146, 246) and laterally spaced from a respective one of the vertical semiconductor channels 60 by a tunneling dielectric layer 56.

The perforated dielectric moat structures (52, 176) of the embodiments of the present disclosure do not completely divide any insulating layer (132, 232) into disjoined portions. As such, the perforated dielectric moat structures (52, 176) do not divide any of the alternating stacks of insulating layers (132, 232) and sacrificial material layers (142, 242) or electrically conductive layers (146, 246) into disjoined portions. Since division of alternating stacks into two disjoined portions between a neighboring pair of backside trenches 79 is avoided, tilting and toppling of portions of an alternating stack at the locations of the perforated dielectric moat structures (52, 176) can be avoided. Each insulating layer (132, 232) laterally extends from outside the area surrounded by a perforated dielectric moat structure (52, 176) to inside the area surrounded by the perforated dielectric moat structure (52, 176) through gaps between the pillars 172 of the dielectric moat structure (52, 176) and supports adjacent alternating stacks during the fabrication steps. This improves the structural stability of the device without significantly complicating device processing. Thus, the various embodiments of the present disclosure provide a compact, stable and reliable three-dimensional memory device with enhanced yield.

Figure 28A:
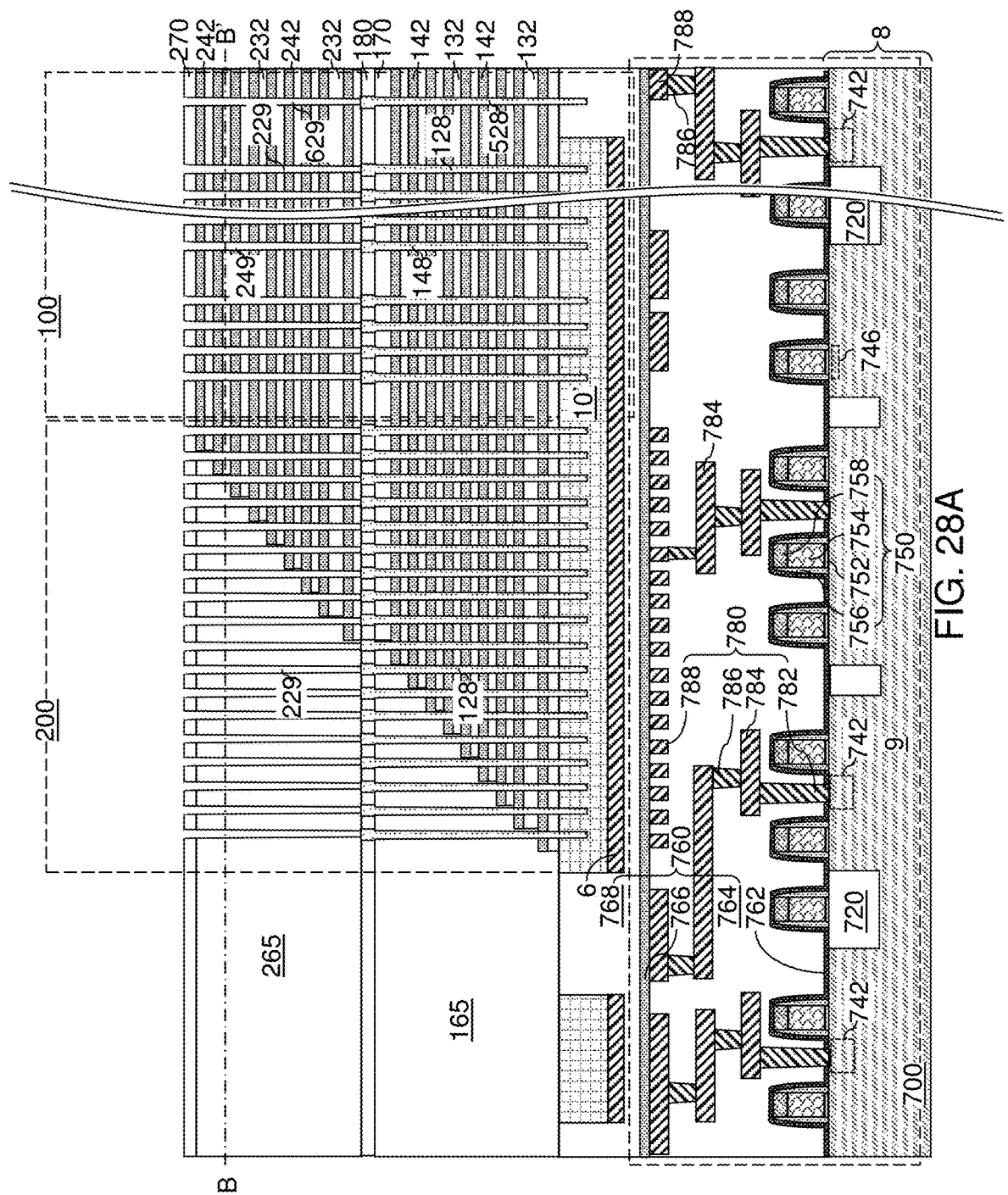
FIG. 28A is a vertical cross-sectional view of a second exemplary structure after formation of various second-tier openings according to a second embodiment of the present disclosure.
Figure 28C:
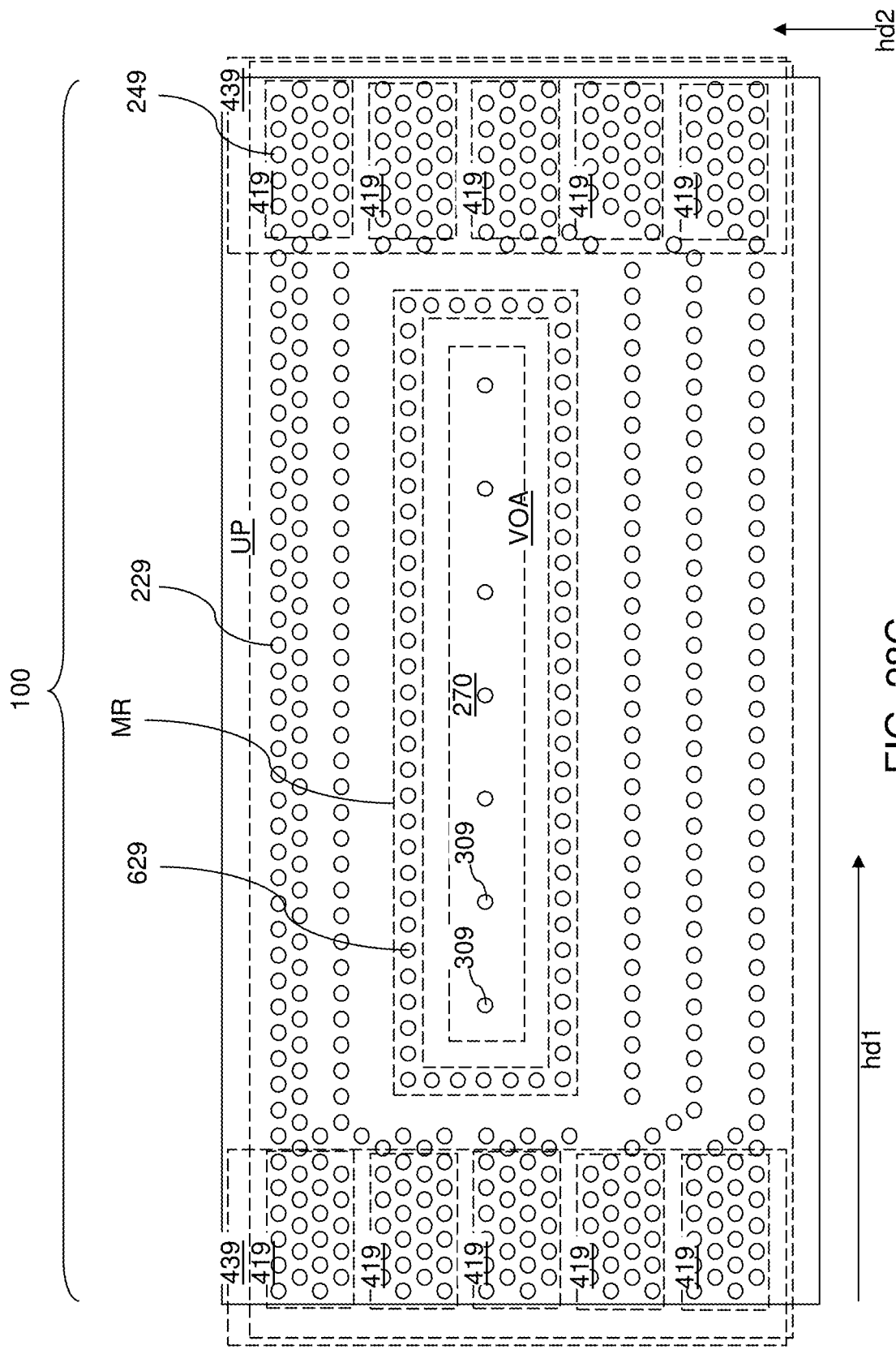
FIG. 28C is a top-down view of the second exemplary structure of FIGS. 28A and 28B.
Figure 29A:
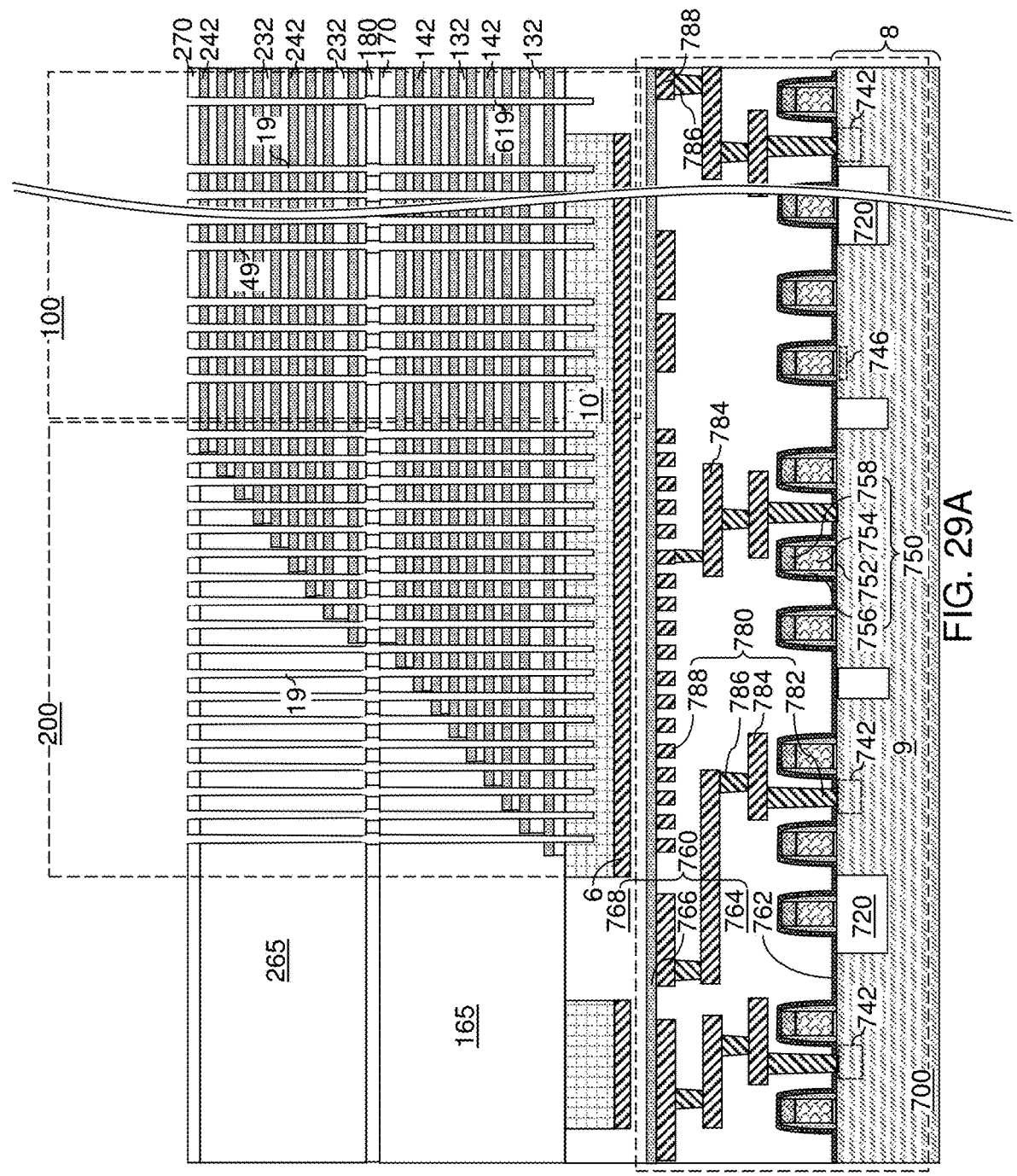
FIG. 29A is a vertical cross-sectional view of the second exemplary structure after formation of moat region opening and connection-via-region openings according to a second embodiment of the present disclosure.
Figure 29B:
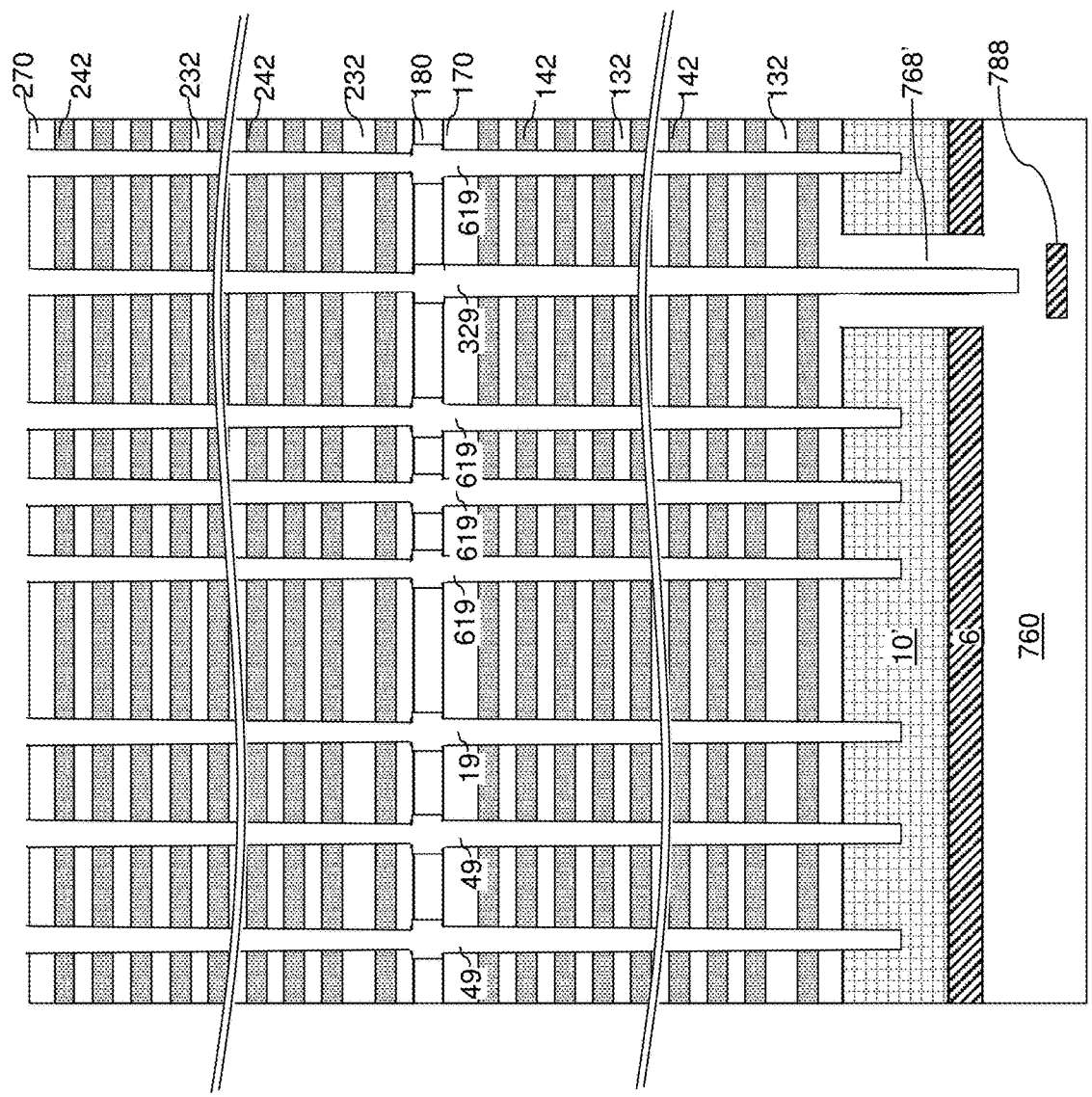
FIG. 29B is another vertical cross-sectional view of the second exemplary structure of FIG. 29A.
Figure 29C:
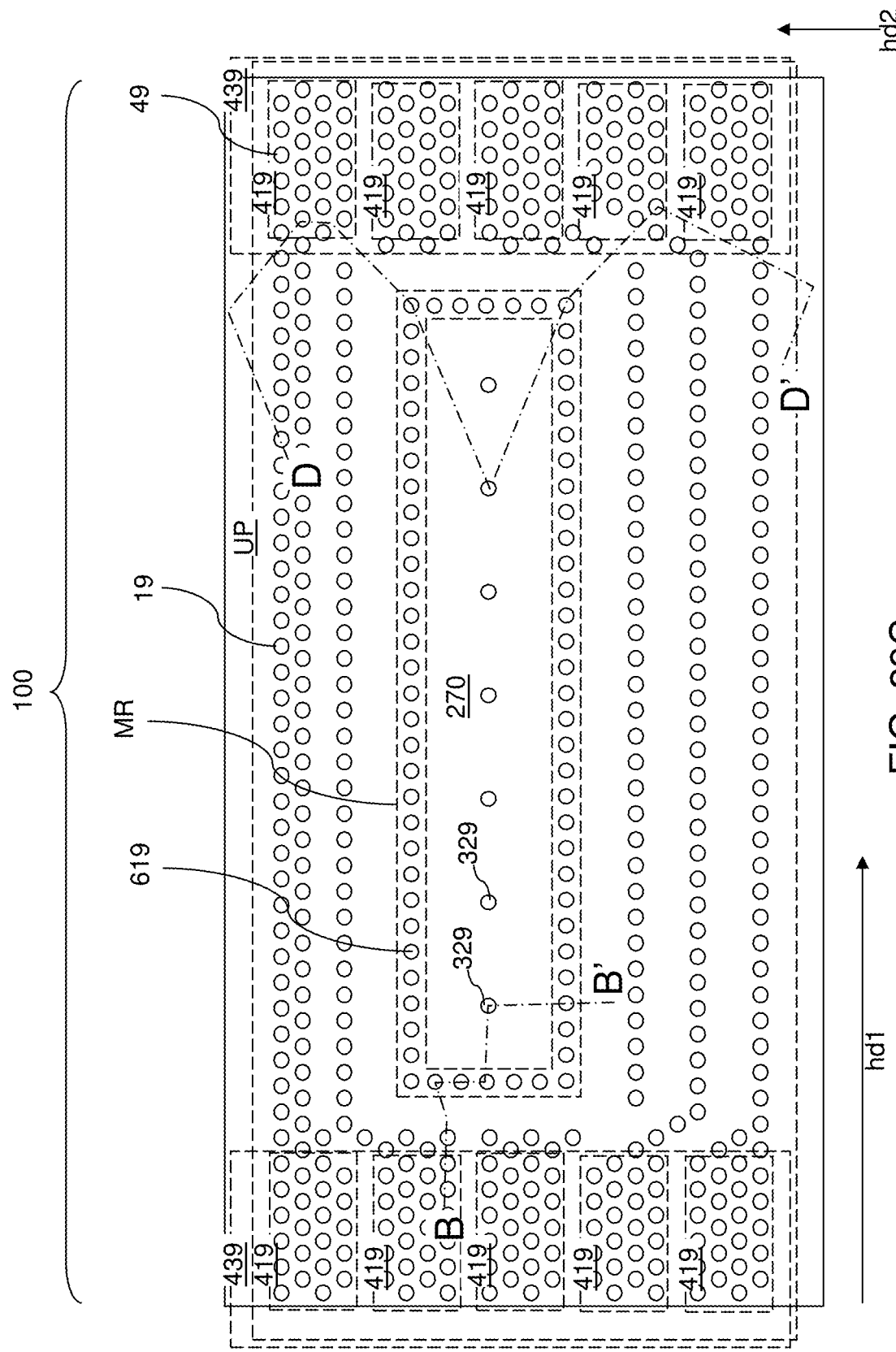
FIG. 29C is a top-down view of the second exemplary structure of FIGS. 29A and 29B. The hinged vertical plane B-B' is the plane of the vertical cross-sectional view of FIG. 29B.

Referring to FIGS. 28A-28C, a second exemplary structure according to a second embodiment of the present disclosure can be derived from the first exemplary structure of FIGS. 4A-4C by forming additional openings within the area that is laterally enclosed by a moat region MR. The area that is laterally enclosed by an inner periphery of the moat region MR in the second exemplary structure includes openings in the first-tier alternating stack (132, 142), and is herein referred to as a via opening area VOA. The additional openings through the first-tier alternating stack (132, 142) are can be formed simultaneously with the various first-tier openings (149, 129, 529), and are herein referred to as first-tier connection-via-region openings. The first-tier connection via region openings are filled with a sacrificial fill material during formation of the sacrificial first-tier opening fill portions (148, 128, 528) at the processing steps of FIG. 5. Each portion of the sacrificial fill material that fills the first-tier connection-via-region openings at the processing steps of FIG. 5 are herein referred to as sacrificial first-tier connection via fill portions. The processing steps of FIGS. 6A and 6B can be subsequently formed, and the processing steps of FIGS. 7A-7C can be performed with a modification in the pattern of the various second-tier openings (249, 229,

629) such that an additional second-tier opening is formed through the second-tier alternating stack (232, 242) directly on a top surface of a respective one of the sacrificial first-tier connection via fill portions. Each additional second-tier opening that is formed on a respective one of the sacrificial first-tier connection via fill portions is herein referred to as a second-tier connection-via-region opening 309.

Thus, the second exemplary structure illustrated in FIGS. 28A-28C can be derived from the first exemplary structure by forming sacrificial first-tier connection via fill portions that fill a respective first-tier connection-via-region opening through the first-tier structure within the via opening area VOA (which is laterally surrounded by a moat region MR), and by forming second-tier connection-via-region openings 309 through the second-tier structure within the via opening area VOA. In one embodiment, a plurality of stacks of a sacrificial first-tier connection via fill portion and a second-tier connection-via-region opening 309 can be formed within the via opening area VOA. In one embodiment, the plurality of stacks of a sacrificial first-tier connection via fill portion and a second-tier connection-via-region opening 309 may be arranged in a single row or in multiple rows that lateral extends along the first horizontal direction hd1.

Referring to FIGS. 29A-29E, the processing steps of FIGS. 8A-8C can be performed to remove the sacrificial first-tier fill material of the sacrificial first-tier opening fill portions (148, 128, 528) and the sacrificial first-tier connection via fill portions using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, may be formed in each combination of a second-tier support openings 229 and a volume from which a sacrificial first-tier support opening fill portion 128 is removed. A moat region opening 619, which is also referred to as an inter-tier moat opening 619, may be formed in each combination of a second-tier moat region openings 629 and a volume from which a sacrificial first-tier moat region opening fill portion 528 is removed. A connection-via-region opening 329, which is herein referred to as an inter-tier connection-via-region opening 329, is formed within a respective one of the via opening area (VOA) that is laterally surrounded by a respective moat region MR. Each connection-via-region opening 329 is formed in each combination of a second-tier connection via opening 309 and a volume from which an underlying sacrificial first-tier connection via fill portion is removed (i.e., a volume of an underlying first-tier connection via opening).

Each set of moat region openings 619 that are adjacent to each other can laterally surround a respective via opening area VOA. In other words, each via opening area VOA can be surrounded by a respective set of moat region openings 619 that are arranged along a periphery of the via opening area VOA within a respective moat region MR. In one embodiment, each via opening area VOA may be a rectangular area having a pair of lengthwise edges that laterally extend along the first horizontal direction hd1 and having a pair of widthwise edges that laterally extend along the second horizontal direction hd2. In this case, each set of moat region openings 619 can include two straight rows of moat region openings 619 that are arranged along the first horizontal direction hd1, and two straight rows of moat region openings 619 that are arranged along the second horizontal direction hd2. The in-process source-level material layers 10' can include openings within each via opening area VOA. In one embodiment, the connection-via-region openings 329 can vertically extend through an opening within the in-process source-level material layers 10'.

Generally, forming an alternating stack of insulating layers (132, 232) and sacrificial material layers (142, 242) including a dielectric material can be formed over a substrate 8. The sacrificial material layers (142, 242) comprise a dielectric material. The moat region openings 619 may comprise a row of discrete laterally-spaced openings, and can be formed through the alternating stack {(132, 242), (232, 242)}. The row of discrete laterally-spaced openings can arranged in a pattern that surrounds an area, such as the area of an via opening area VOA, within the alternating stack {(132, 242), (232, 242)}.

In one embodiment, a row of moat region openings 619 can be formed through the alternating stack {(132, 242), (232, 242)} that includes the first-tier alternating stack (132, 142) and the second-tier alternating stack (232, 242). The row of moat region openings 619 can be arranged in a pattern that surrounds an area within the alternating stack {(132, 242), (232, 242)} such as the via opening area VOA located within a moat region MR. Generally, at least one connection-via-region opening 329 can be formed through the alternating stack {(132, 242), (232, 242)}, and a portion 768' of the of least one second dielectric layer 768 that extends through the in-process source-level material layers 10' and the optional conductive plate layer 6 within the area that is surrounded by the row of moat region openings 619, i.e., within the via opening area VOA. Generally, the row of moat region openings 619 and the at least one connection-via-region opening 329 are formed at a same processing step by performing an anisotropic etch process employing a patterned etch mask such as the processing steps of FIGS. 29A-29E. The row of moat region openings 619 stop on the in-process source-level material layers 10'. In contrast, the at least one connection-via-region opening 329 does not contact the in-process source-level material layers 10', and extends through the portion 768' of the of least one second dielectric layer 768 until it stop on one of the landing-pad-level metal line structures 788.

Referring to FIGS. 30A and 30B, the second exemplary structure after according to the second embodiment of the present disclosure is illustrated after formation of a conformal etch mask material layer 352 and a conformal cover material layer 354. The vertical cross-sectional plane of FIG. 30A can be the same as the vertical cross-sectional plane D-D' at the processing step of FIGS. 29A-29C.

Specifically, a conformal etch mask material layer 352 and a conformal cover material layer 354 can be sequentially deposited in each of the memory openings 49, support openings 19, the moat region openings 619, and the connection-via-region opening 329 and over the second insulating cap layer 270. The conformal etch mask material layer 352 includes a material that can function as an etch mask material for a subsequent etch process to be employed to etch unmasked portions of the sacrificial material layers (142, 242). For example, the conformal etch mask material layer 352 can include a semiconductor material such as amorphous silicon or polysilicon. The conformal etch mask material layer 352 can be deposited by a conformal deposition process such as a chemical vapor deposition process (e.g., a low pressure chemical vapor deposition process).

The thickness of the conformal etch mask material layer 352 can be in a range from 20 nm to 120 nm, such as from 30 nm to 80 nm, although lesser and greater thicknesses can also be employed.

The conformal cover material layer 354 includes a material that can protect masked portions of the conformal etch mask material layer 352 during a subsequent patterning process. For example, if the conformal etch mask material layer 352 includes a semiconductor material, the conformal cover material layer 354 can include silicon oxide. The conformal cover material layer 354 may be formed by thermal oxidation of the material of the conformal etch mask material layer 352, or may be formed by a conformal deposition process. The thickness of the conformal cover material layer 354 can be in a range from 5 nm to 30 nm, such as from 10 nm to 20 nm, although lesser and greater thicknesses can also be employed. In case the conformal cover material layer 354 includes silicon oxide formed by oxidation of surface portions of the conformal etch mask material layer 352, the thickness of the conformal etch mask material layer 352 can decrease by about one half of the thickness of the conformal cover material layer 354 (which is a semiconductor oxide layer) due to oxidation of the surface portion of the conformal etch mask material layer 352.

Referring to FIGS. 31A and 31B, a patterned photoresist layer 357 can be formed over the second exemplary structure. For example, a photoresist layer can be applied over the second exemplary structure, and can be lithographically patterned to form openings in areas that include a respective combination of a via opening area VOA and a surrounding moat region MR. In other words, openings in the patterned photoresist layer 357 can be formed within areas of a row of moat region openings 619 and a via opening area VOA that is laterally enclosed by the row of moat region openings 619. Each row of moat region openings 619 can be contoured to enclose a respective via opening area VOA. In one embodiment, each opening through the patterned photoresist layer 357 can have a rectangular shape with a pair of lengthwise edges laterally extending along the first horizontal direction hd1 and a pair of widthwise edges laterally extending along the second horizontal direction hd2. The connection-via-region opening 329 are located within the opening through the patterned photoresist layer 357. A moat region cavity 619', which is an unfilled volume of a moat region opening 619, is present within the volume of each moat region opening 619. A connection-via-region cavity 329', which is an unfilled volume of a connection-via-region opening 329, is present within the volume of each connection-via-region opening 329. Since the photoresist layer 357 is not located in any of the long, wide and deep trenches, the likelihood of photoresist cracking in such deep trenches is reduced. Furthermore, the likelihood of spurious photoresist resolution due to interference of radiation during exposure is reduced by the presence of the conformal etch mask material layer 352 located in various openings (19, 49, etc.).

Referring to FIGS. 32A and 32B, a selective etch process that etches the material of the conformal cover material layer 354 selective to the material of the conformal etch mask material layer 352 can be performed to remove the exposed portions of the conformal cover material layer 354, including the portions located in the moat region openings 619. For example, if the conformal cover material layer 354 includes silicon oxide and if the conformal etch mask material layer 352 includes amorphous silicon, a wet etch process employing dilute hydrofluoric acid can be performed to etch unmasked portions of the conformal cover material layer 354 without etching the conformal etch mask material layer 352.

Referring to FIGS. 33A and 33B, the patterned photoresist layer 357 can be subsequently removed, for example, by ashing. A memory cavity 49' is present within each memory opening 49, and a support cavity 19' is present within each support opening 19.

Referring to FIGS. 34A and 34B, a selective etch process that etches the material of the conformal etch mask material layer 352 selective to the material of the conformal cover material layer 354 can be performed. Unmasked portions of the conformal etch mask material layer 352 can be etched selective to the material of the conformal cover material layer 354. For example, if the conformal etch mask material layer 352 includes amorphous silicon or polysilicon and if the conformal cover material layer 354 includes silicon oxide, a chemical dry etch (CDE) or a wet etch process employing hot trimethyl-2 hydroxyethyl ammonium hydroxide ("hot TMY") or tetramethyl ammonium hydroxide (TMAH) can be employed to remove unmasked portions of the conformal etch mask material layer 352 in moat region openings 619 without etching the conformal cover material layer 354. Sidewalls of the moat region openings 619 are physically exposed upon removal of the unmasked portions of the conformal etch mask material layer 352. Sidewalls of the connection-via-region openings 329 are physically exposed upon removal of the unmasked portions of the conformal etch mask material layer 352. Each of the memory openings 49 and the support openings 19 can be covered by a layer stack of the conformal etch mask material layer 352 and the conformal cover material layer 354.

Referring to FIGS. 35A and 35B, the conformal cover material layer 354 may be etched by a first etch process, which can be a first isotropic etch process employing dilute hydrofluoric acid. The first isotropic etch process can be employed to removal all remaining portions of the conformal cover material layer 354. In case the first insulating layers 132 and the second insulating layers 232 include silicon oxide, the first isotropic etch process can collaterally recess physically exposed sidewalls of the first insulating layers 132 and the second insulating layers 232 relative to sidewalls of the first sacrificial material layers 142 and the second sacrificial material layers 242 around each connection-via-region opening 329 and around each moat region opening 619. The lateral recess distance of the sidewalls of the first insulating layers 132 and the second insulating layers 232 due to the first isotropic etch process may be about the same as the thickness of the conformal cover material layer 354, which can be in a range from 5 nm to 30 nm, such as from 10 nm to 20 nm.

Referring to FIGS. 36A-36D, a second selective etch process, such as a second isotropic etch process, can be performed to laterally recess physically exposed sidewalls of the sacrificial material layers (142, 242) relative to the sidewalls of the insulating layers (132, 242), the first insulating cap layer 170, the inter-tier dielectric layer 180, the second insulating cap layer 270, and the in-process source-level material layers 10' in the moat region MR. In one embodiment, the insulating layers (132, 242), the first insulating cap layer 170, the inter-tier dielectric layer 180, the second insulating cap layer 270, and the source-level insulating layer 117 can include silicon oxide, all layers of the in-process source-level material layers 10' other than the source-level insulating layer 117 can include a semiconductor material, and the sacrificial material layers (142, 242) can include silicon nitride. In this case, a wet etch process employing hot phosphoric acid can be performed to laterally recess the sidewalls of the sacrificial material layers (142, 242) around each moat region opening 619 isotropically.

The duration of the wet etch process can be selected such that the lateral recess distance for the sidewalls of the sacrificial material layers (142, 242) is greater than one half of the maximum of the lateral separation distance between the nearest neighbor moat region openings 619 that laterally surround a respective one of the via opening area VOA. The cavities within a set of moat region openings 619 that laterally surround a respective via opening area VOA merge with each other at each level of the sacrificial material layers (142, 242). The etch is terminated to leave the dielectric material plates (142', 242') in the via opening area VOA. The sacrificial material layers (142, 242) are protected from being etched through the support openings 19 and the memory openings 49 by the etch mask material layer 352.

Figure 36C:
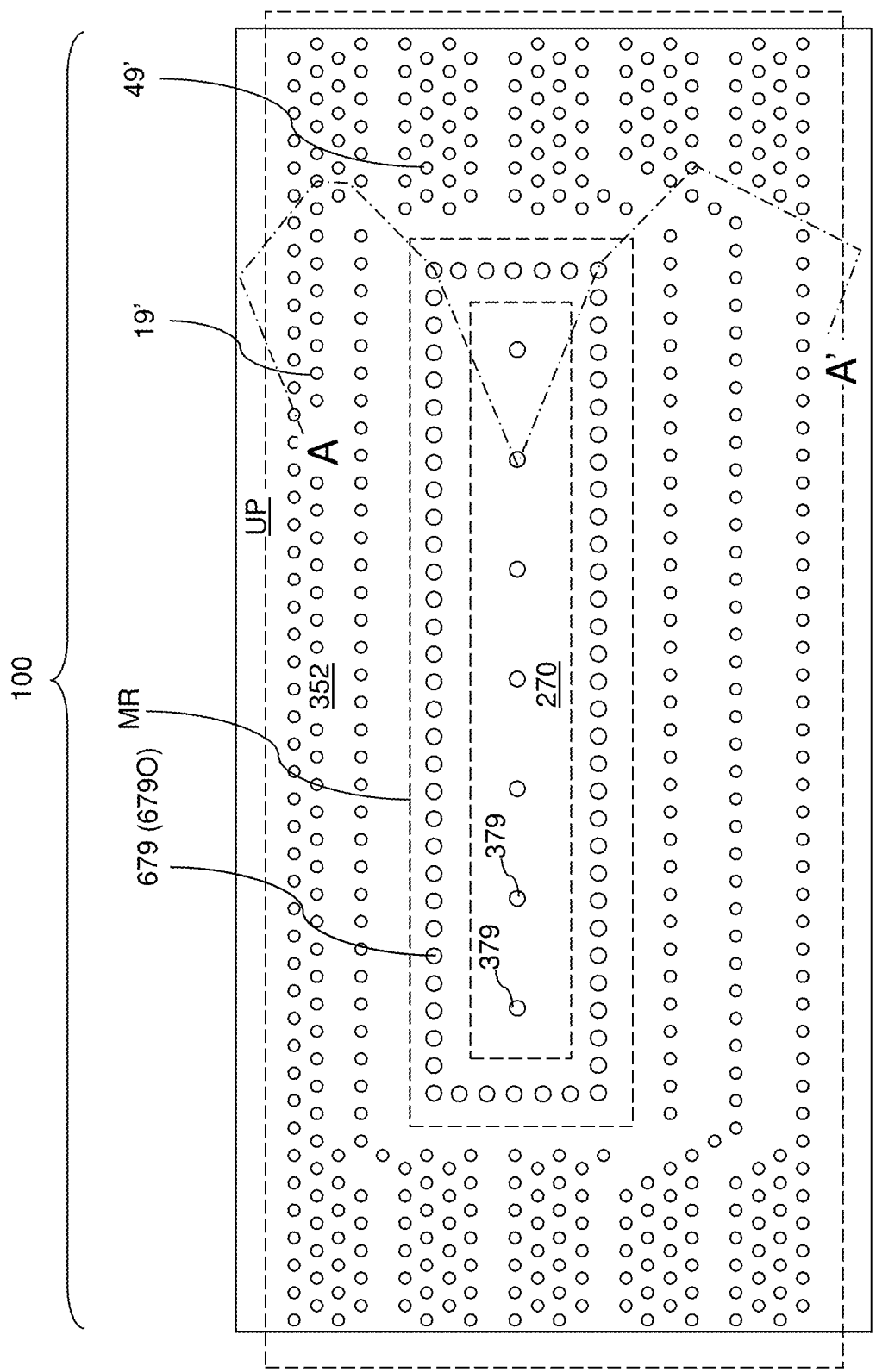
FIG. 36C is a top-down view of the second exemplary structure of FIGS. 36A and 36B. The hinged vertical plane A-A' is the plane of the vertical cross-sectional view of FIG. 36A.
Figure 36D:
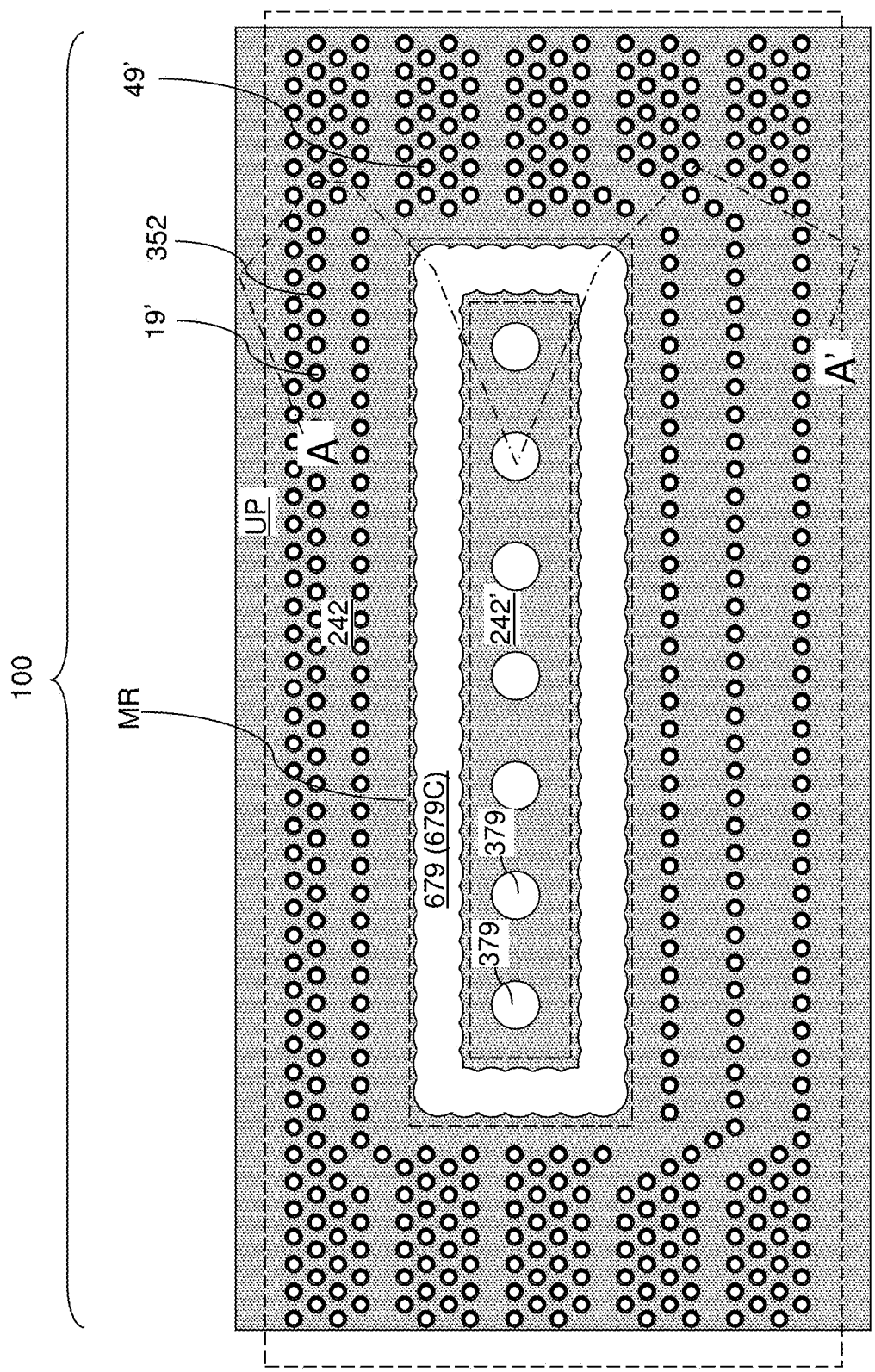
FIG. 36D is a horizontal cross-sectional view of the second exemplary structure of FIGS. 36A-36C along the horizontal plane D-D' of FIG. 36A. The hinged vertical plane A-A' is the plane of the vertical cross-sectional view of FIG. 36A.

In one embodiment, the processing steps of FIGS. 36A-36D may be the same as the second isotropic etch process of the processing steps of FIGS. 13A-13C. As shown in FIG. 36D, an annular cavity 679C that laterally surrounds a patterned portion of a respective sacrificial material layer (142, 242) is formed at each level of the sacrificial material layers (142, 242). Each patterned portion of the sacrificial material layers (142, 242) that is laterally surrounded by a respective annular cavity 679C is herein referred to as dielectric material plates (142', 242'). The dielectric material plates (142', 242') are composed of the same material as, and have the same height as, a respective one of the sacrificial material layers (142, 242) located at a same level, i.e., located at a same vertical separation distance from the substrate 8. The dielectric material plates (142', 242') include first dielectric material plates 142' that are patterned portions of the first sacrificial material layers 142 and second dielectric material plates 242' that are patterned portions of the second sacrificial material layers 242. A vertical stack of dielectric material plates (142', 242') is formed within each region that is laterally surrounded by the annular cavities.

A set of annular cavities 679C laterally surrounding a vertical stack of dielectric material plates (142', 242') are vertically connected to each other through rows of discrete laterally-spaced openings 6790 which correspond to the moat region openings 619 that vertically extend through the insulating layers (132, 232), as shown in FIG. 36C. Each row of laterally-spaced openings 6790 vertically extends through a respective one of the insulating layers (132, 232), and comprises segments of the moat region openings 619 provided in a same moat region MR at the processing steps of FIGS. 8A-8C at the level of a respective one of the insulating layers (132, 232). The rows of laterally-spaced openings located in the same moat region MR overlap each other in a plan (i.e., top) view. In other words, the areas of any row of laterally-spaced openings located in the same moat region MR at the level of one of the insulating layers (132, 232) overlap with the areas of any other row of laterally-spaced openings located in the same moat region MR at the level of another of the insulating layers (132, 232). Each row of laterally-spaced openings can be arranged within the area of a moat region MR along a periphery of a respective via opening area VOA. Thus, the general lateral propagation of each row of laterally-spaced openings conforms to the shape of the respective via opening area VOA.

A moat trench 679 includes a contiguous combination of annular cavities (i.e., trenches) 679C at levels of the sacrificial material layers (142, 242) and rows of laterally-spaced openings 6790 at levels of the insulating layers (132, 232). As shown in FIG. 36C, each insulating layer (132, 232) is perforated with a respective row of laterally-spaced openings 6790. Each laterally-spaced opening 6790 within a row of laterally-spaced openings can have a generally cylindrical shape, and is laterally spaced from adjacent laterally-spaced openings by a respective intervening portion of an insulating layer (132, 232). Thus, each insulating layer (132, 232) laterally extends from outside the area of each via opening area (VOA) to inside the via opening area VOA having an areal overlap with a vertical stack of dielectric material plates (142', 242') through an array of connection portions located between each neighboring pair of laterally-spaced openings 6790 that vertically extend through the insulating layers (132, 232).

Each moat trench 679 vertically extends from the top surface of the second insulating cap layer 270 into the in-process source-level material layers 10'. Generally, each moat trench 679 can be formed by isotropically etching unmasked portions of the sacrificial material layers (142, 242) selective to the insulating layers (132, 232) and by laterally expanding each moat region opening 619 within a row of moat region openings 619 at levels of the sacrificial material layers (142, 242) to form the annular cavities 679C. In one embodiment, each moat region opening 619 within the row of moat region openings 619 can be laterally expanded at levels of the sacrificial material layers (142, 242) by the second isotropic etch process that etches the material of the sacrificial material layers (142, 242) selective to the material of the insulating layers (132, 232). Each moat trench 679 comprises a continuously extending volume that laterally surrounds a patterned portion of a respective sacrificial material layer (142, 242), i.e., a dielectric material plate (142', 242'), at each level of the sacrificial material layers (142, 242). Remaining portions of the sacrificial material layers (142, 242) after the isotropic etch process comprise a vertical stack of dielectric material plates (142', 242') that is laterally surrounded by the moat trench 679.

Each moat trench 679 can be laterally bounded at the outer boundary by a set of horizontally-concave and vertically-straight sidewall segments of a respective sacrificial material layer (142, 242) at the level of each sacrificial material layer (142, 242), and can be laterally bounded at the inner boundary by a set of horizontally-concave and vertically-straight sidewall segments of a respective dielectric material plate (142', 242') at the level of each sacrificial material layer (142, 242). Each moat trench 679 can be laterally bounded by cylindrical sidewalls of a respective row of discrete cylindrical openings 6790 at the level of each insulating layer (132, 232). As used herein, a horizontally-concave surface refers to a surface having a concave profile in a horizontal cross-sectional view, and a vertically-straight surface refers to a surface having a straight profile in a vertical cross-sectional view.

Concurrently with formation of the moat trenches 679, each connection-via-region opening 319 can be laterally isotropically expanded at each level of the first sacrificial material layers 142 and the second sacrificial material layers 242. Each connection-via-region opening 319 is expanded in volume to form an expanded connection-via-region opening 379 including fin-shaped lateral recesses 379F at each level of the first sacrificial material layers 142 and the second sacrificial material layers 242. Generally, each moat trench 679 can be formed by laterally expanding each moat region opening 619 within a respective row of moat region openings 619 until the moat region openings 619 merge at levels of the sacrificial material layers (such as the levels of the first sacrificial material layers 142 and the second sacrificial material layers 242). Each moat trench 679 comprises a continuously extending volume that laterally surrounds a patterned portion of a respective sacrificial material layer (such as the dielectric material plates (142', 242') at each level of the sacrificial material layers (142, 242). Each connection-via-region opening 329 is laterally expanded to form fin-shaped lateral recesses 679F at the levels of the sacrificial material layers (142, 242), and to become an expanded connection-via-region opening 379.

Referring to FIGS. 37A and 37B, a selective etch process can be performed to remove remaining portions of the conformal etch mask material layer 352. For example, if the conformal etch mask material layer 352 includes a semiconductor material, an isotropic wet etch process employing hot trimethyl-2 hydroxyethyl ammonium hydroxide ("hot TMY") or tetramethyl ammonium hydroxide (TMAH) can be employed to remove the conformal etch mask material layer 352.

Referring to FIGS. 38A and 38B, a continuous blocking dielectric layer 52C can be optionally deposited on the sidewalls of the memory openings 49, the support openings 19, the expanded connection-via-region opening 379, and the moat trenches 679 by a conformal deposition process. The continuous blocking dielectric layer 52C may include a single dielectric material layer or a stack of a plurality of dielectric material layers. In one embodiment, the continuous blocking dielectric layer 52C may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the continuous blocking dielectric layer 52C may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the continuous blocking dielectric layer 52C includes aluminum oxide. Alternatively, or additionally, the continuous blocking dielectric layer 52C may include a dielectric semiconductor compound such as silicon oxide, silicon oxynitride, silicon nitride, or a combination thereof.

A sacrificial fill material can be applied over the second exemplary structure to fill cavities within the openings (49, 19, 679, 379) in the second exemplary structure. Annular cavities 679C of the moat trenches 679 and the fin-shaped lateral recesses 379F of the expanded connection-via-region openings 379 may, or may not, be filled with the sacrificial fill material. Voids may, or may not, be present within each sacrificial fill material portion in the respective opening (49, 19, 679, 379) in the second exemplary structure. The sacrificial fill material may include a photoresist material, amorphous carbon, a silicate glass material providing a high etch rate (such as borosilicate glass or organosilicate glass), or a silicon-germanium alloy. The sacrificial fill material can be patterned to remove portions of the photoresist material that fill the support openings 19, the moat trenches 679, and the expanded connection-via-region openings 379. In case the sacrificial fill material includes a photoresist material, the photoresist material may be directly patterned by lithographic exposure and development. In case the sacrificial fill material includes a non-photoresist material, a photoresist layer (not shown) can be applied over the sacrificial fill material, can be lithographically patterned, and an etch process (such as a combination of an anisotropic etch process and an isotropic etch process) can be employed remove portions of the sacrificial fill material that are not covered by the patterned photoresist layer, which is subsequently removed. A patterned sacrificial fill material layer 369 is formed, which fills each of the memory openings 49, and does not fill any of the support openings 19, the moat trenches 679, and the expanded connection-via-region openings 379.

Referring to FIGS. 39A and 39B, a dielectric material layer 176L such as undoped silicate glass (e.g., silicon oxide) or a doped silicate glass can be deposited in each of the support openings 19, the moat trenches 679, and the expanded connection-via-region openings 379 employing a conformal deposition process such as a chemical vapor deposition (CVD) process. The dielectric material layer 176L fills each volume of the cavities within the support openings 19 and the moat trenches 679, and is formed over the top surfaces of the second insulating cap layer 270. The dielectric material layer 176L is not formed in the memory openings 49 which are filled with the patterned sacrificial fill material layer 369.

Referring to FIGS. 40A and 40B, a planarization process can be performed to remove portions of the dielectric material layer 176L, the patterned sacrificial fill material layer 369, and the continuous blocking dielectric layer 52C that overlie the horizontal plane including the top surface of the second insulating cap layer 270. A recess etch process and/or a chemical mechanical planarization process may be employed for the planarization process. Each remaining portion of the dielectric material layer 176L that fills a support opening 19 comprises a dielectric support opening fill material portion 20. Each remaining portion of the dielectric material layer 176L that fills a remaining portion of a respective moat trench 679 comprises a dielectric moat trench fill material portion 176. Each remaining portion of the dielectric material layer 176L that fills an expanded connection-via-region opening 379 comprises a finned dielectric fill material portion 276, which includes a vertical stack of dielectric fins 276F that are attached to a central dielectric core 276C.

Each remaining portion of the optional continuous blocking dielectric layer 52C (if employed) located within a support opening 19, a moat trench 679, or a memory opening 49 comprises a blocking dielectric layer 52. As an optional structure, the blocking dielectric layer 52 may or may not be present within each of the memory openings 49, the support openings 19, and the moat trenches 679. Each contiguous combination of a blocking dielectric layer 52 (if present) and a dielectric support opening fill material portion 20 that fills a support opening 19 constitutes a support pillar structure (52, 20). Each contiguous combination of a blocking dielectric layer 52 (if present) and a dielectric moat trench fill material portion 176 constitutes a perforated dielectric moat structure (52, 176). Each contiguous combination of a blocking dielectric layer 52 (if present) and a finned dielectric fill material portion 276 that fills a respective expanded connection-via-region opening 379 comprises a finned dielectric pillar structure (52, 276).

Generally, the perforated dielectric moat structures (52, 176) can vertically extend through the alternating stack {(132, 242), (232, 242)}, and can be formed by filling the moat trenches 679 optionally with a respective blocking dielectric layer 52 and with a dielectric fill material (which is the material of the dielectric moat trench fill material portions 176). Each perforated dielectric moat structure (52, 176) comprises a row of dielectric pillar portions 172 extending through respective openings 6790 at each level of the insulating layers (132, 232). Each of the insulating layers (132, 232) laterally extends between neighboring pairs of dielectric pillar portions 172 from outside each perforated dielectric moat structure (52, 176) to inside each perforated dielectric moat structure (52, 176), i.e., inside each via opening area VOA.

In one embodiment, each row of dielectric pillar portions 172 can be arranged along a periphery of a respective perforated dielectric moat structure (52, 176) at a level of one of the insulating layers (132, 232). The rows of dielectric pillar portions 172 located at different levels of the insulating layers (132, 232) have an areal overlap with each other.

The perforated dielectric moat structure (52, 176) also comprises an annular dielectric plate portion 174 at each level of the sacrificial material layers (142, 242) that laterally encloses a respective dielectric material plate (142', 242'). In one embodiment, the dielectric material plates (142', 242') comprise a different material than the insulating layers (132, 232), and comprise the same material as the sacrificial material layers (142, 242). In one embodiment, the insulating layers (132, 232) comprise silicon oxide, and the dielectric material plates (142', 242') comprise silicon nitride. In one embodiment, each of the dielectric material plates (142', 242') has a respective uniform thickness throughout, and contacts a planar bottom surface of a respective overlying one of the insulating layers (132, 232) and contacts a planar top surface of a respective underlying one of the insulating layers (132, 232). If the blocking dielectric layers 52 are present, each of the of dielectric pillar portions 172 can include a segment of a blocking dielectric layer 52 and a segment of a dielectric moat trench fill material portion 176, and each of the annular dielectric plate portions 174 can include a segment of a blocking dielectric layer 52 and a segment of a dielectric moat trench fill material portion 176.

In one embodiment, each of the annular dielectric plate portions 174 comprises a continuous inner sidewall including a plurality of laterally-convex and vertically-planar inner sidewall segments that are adjoined to each other, and a continuous outer sidewall including a plurality of laterally-convex and vertically-planar outer sidewall segments that are adjoined to each other. Each laterally-convex surface is a surface having a convex profile in a horizontal plane.

In one embodiment, each perforated dielectric moat structure (52, 176) comprises a row of dielectric pillar portions 172 at each level of the insulating layers (132, 232). Each of the continuous inner sidewalls and the continuous outer sidewalls is laterally offset from a respective overlying row of dielectric pillar portions 172 by a uniform lateral offset distance, which can be the lateral recess distance by which the sidewalls of the sacrificial material layers (142, 242) are laterally recessed relative to the sidewalls of the insulating layers (132, 232) at the processing steps of FIGS. 35A and 35B.

Subsequently, the sacrificial fill material portions 369 in the memory openings 49 can be removed selective to the materials of the insulating layers (132, 232) and the sacrificial material layers (142, 242). For example, if the sacrificial fill material portions 369 in the memory openings 49 include a photoresist fill material, an ashing process can be performed to remove the photoresist fill material from inside the memory openings 49. If the sacrificial fill material portions include amorphous silicon or polysilicon, a wet etch process employing hot trimethyl-2 hydroxyethyl ammonium hydroxide ("hot TMY") or tetramethyl ammonium hydroxide (TMAH) can be employed to remove the sacrificial fill material portions 359 selective to the materials of the insulating layers (132, 232) and the sacrificial material layers (142, 242). Each memory opening 49 becomes vacant.

Generally, the perforated dielectric moat structures (52, 176) and the finned dielectric pillar structures (52, 276) can be formed at a same processing step by filling the dielectric fill material in the moat trenches 679 and in the expanded connection-via-region openings 379, i.e., in the connection-via-region openings 329 after lateral expansion of the connection-via-region openings 329 by formation of the fin-shaped lateral recesses 379F.

Each perforated dielectric moat structure (52, 176) comprises annular dielectric plate portions 174 that are formed at levels of the sacrificial material layers (142, 242). Each of the annular dielectric plate portions 174 comprises a continuous inner sidewall including a plurality of laterally-convex and vertically-planar inner sidewall segments that are adjoined to each other, and a continuous outer sidewall including a plurality of laterally-convex and vertically-planar outer sidewall segments that are adjoined to each other. Each finned dielectric pillar structure (52, 276) comprises an in-process vertical stack of dielectric material fins 276F that are vertically interconnected to each other through at least one dielectric core pillar 276C.

In one embodiment, each dielectric material fin 276F within the vertical stack of dielectric material fins 276F contacts, and is laterally surrounded by, a respective one of the dielectric material plates (142', 242'). In one embodiment, each dielectric material fin 276F within the vertical stack of dielectric material fins 276F has a same height as the respective one of the dielectric material plates (142', 242'). In one embodiment, each dielectric material fin 276F within the vertical stack of dielectric material fins 276F has at least one convex cylindrical surface that contacts at least one concave cylindrical surface of the respective one of the dielectric material plates (142', 242').

Figure 41A:
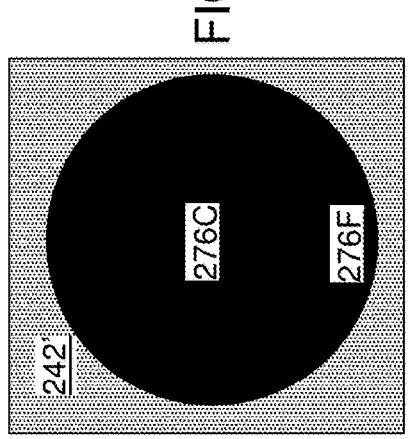
FIG. 41A is a horizontal cross-sectional view of a region around a finned dielectric pillar structure in a first configuration of the second exemplary structure at a level of an electrically conductive layer according to the second embodiment of the present disclosure.
Figure 41C:
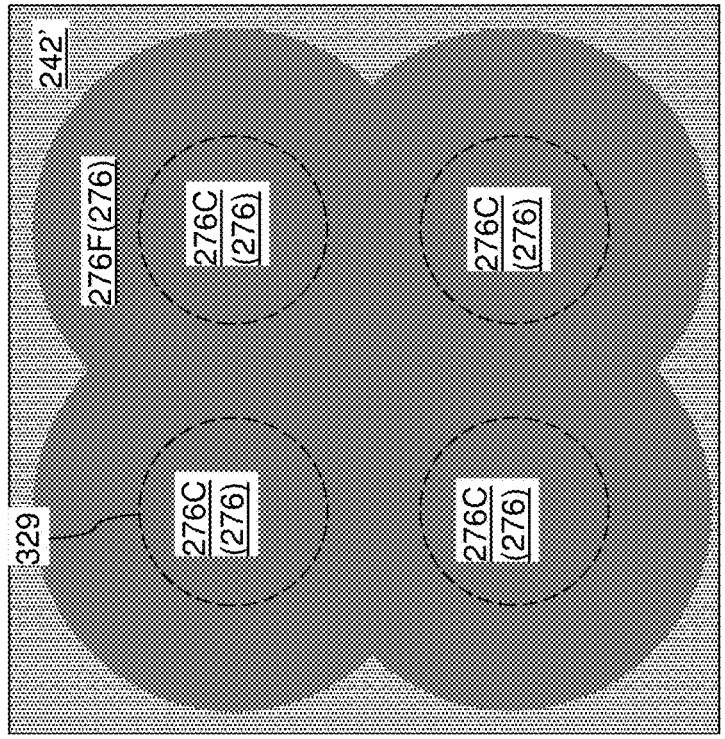
FIG. 41C is a horizontal cross-sectional view of a region around finned dielectric pillar structures in a third configuration of the second exemplary structure at a level of an electrically conductive layer according to the second embodiment of the present disclosure.
Figure 41B:
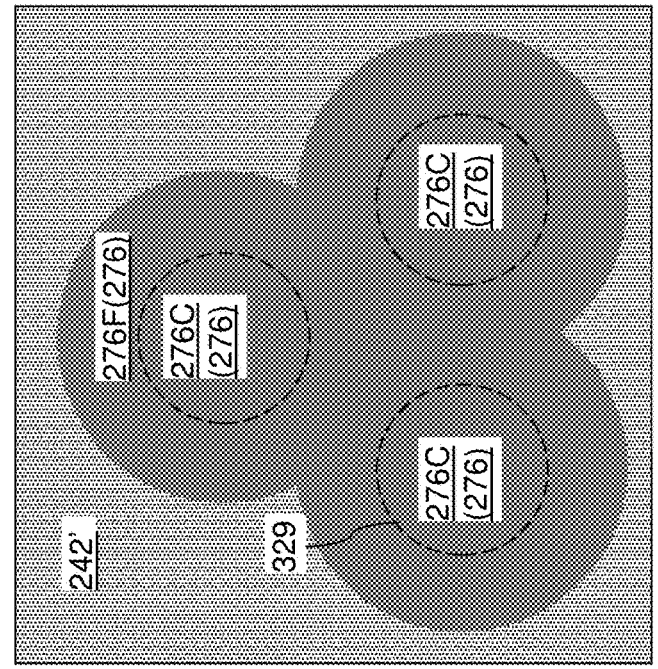
FIG. 41B is a horizontal cross-sectional view of a region around finned dielectric pillar structures in a second configuration of the second exemplary structure at a level of an electrically conductive layer according to the second embodiment of the present disclosure.
Figure 42A:
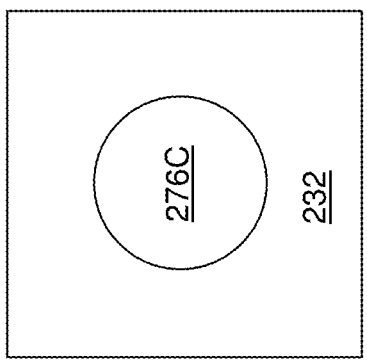
FIG. 42A is a horizontal cross-sectional view of a region around a finned dielectric pillar structure in the first configuration of the second exemplary structure at a level of an insulating layer according to the second embodiment of the present disclosure.
Figure 42C:
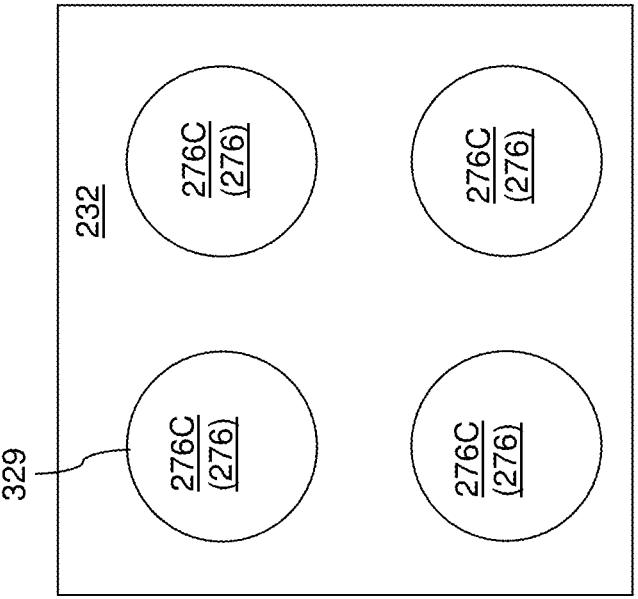
FIG. 42C is a horizontal cross-sectional view of a region around finned dielectric pillar structures in the third configuration of the second exemplary structure at a level of an insulating layer according to the second embodiment of the present disclosure.
Figure 42B:
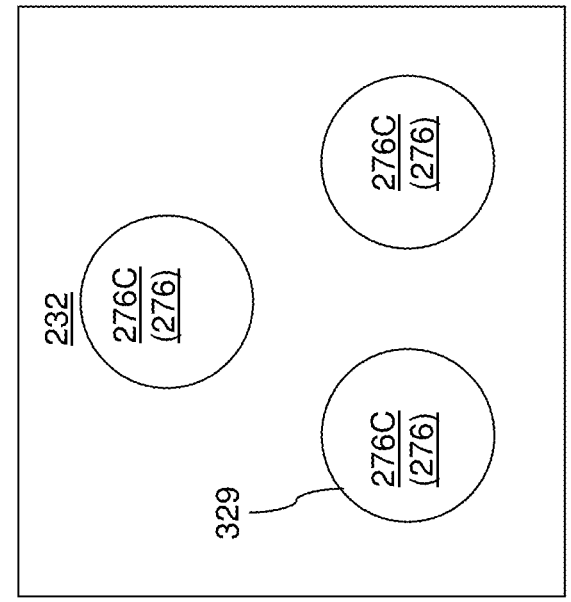
FIG. 42B is a horizontal cross-sectional view of a region around finned dielectric pillar structures in the second configuration of the second exemplary structure at a level of an insulating layer according to the second embodiment of the present disclosure.

The finned dielectric pillar structures (52, 276) may be provided in various configurations. FIGS. 41A and 42A illustrate a first configuration in which a finned dielectric pillar structure 276 does not have any areal overlap with a neighboring finned dielectric pillar structure 276. FIGS. 41B and 42B illustrate a second configuration in which three finned dielectric pillar structures 276 are merged with each other, and three dielectric material fins 276F merge at each level of the sacrificial material layers (142, 242) (i.e., at each level of the dielectric material plates (142', 242') to form a merged dielectric material fin 276F that laterally surrounds three dielectric core pillars 276C. FIGS. 41C and 42C illustrate a third configuration in which four finned dielectric pillar structures 276 are merged with each other, and four dielectric material fins 276F merge at each level of the sacrificial material layers (142, 242) (i.e., at each level of the dielectric material plates (142', 242') to form a merged dielectric material fin 276F that laterally surrounds four dielectric core pillars 276C. Configurations in which two finned dielectric pillar structures 276 merge, or five or more finned dielectric pillar structures 276 merge are expressly contemplated herein.

In some configurations, such as the first configuration illustrated in FIGS. 41A and 42A, each dielectric material fin 276F within the vertical stack of dielectric material fins 276F has a single convex cylindrical surface that contacts an entirety of a single concave cylindrical surface of the respective one of the dielectric material plates (142', 242').

In some configurations, such as the second configuration illustrated in FIGS. 41B and 42B or the third configuration illustrated in FIGS. 41C and 42C, each dielectric material fin 276F within the vertical stack of dielectric material fins 276F has multiple convex cylindrical surfaces that are adjoined to each other at vertically extending edges, and the multiple convex cylindrical surfaces contact multiple concave cylindrical surfaces of the respective one of the dielectric material plates (142', 242').

In each configuration for the finned dielectric pillar structures 276, the dielectric material fins 276F have an areal overlap with each other in a plan view along a vertical direction, and are vertically interconnected with each other through at least one dielectric core pillar 276C that vertically extends through each layer within the alternating stack {(132, 142), (232, 242)}. The at least one dielectric core pillar 276C may be a single dielectric core pillar 276C as shown in FIG. 41A, or may be a plurality of dielectric core pillars 276C, as shown in FIGS. 41B and 41C. In one embodiment shown in FIGS. 41B and 41C, the dielectric material fins 276F are vertically interconnected with each other through a plurality of dielectric core pillars 276C that vertically extend through each layer within the alternating stack {(132, 142), (232, 242)}.

Figures 43A, 43B:
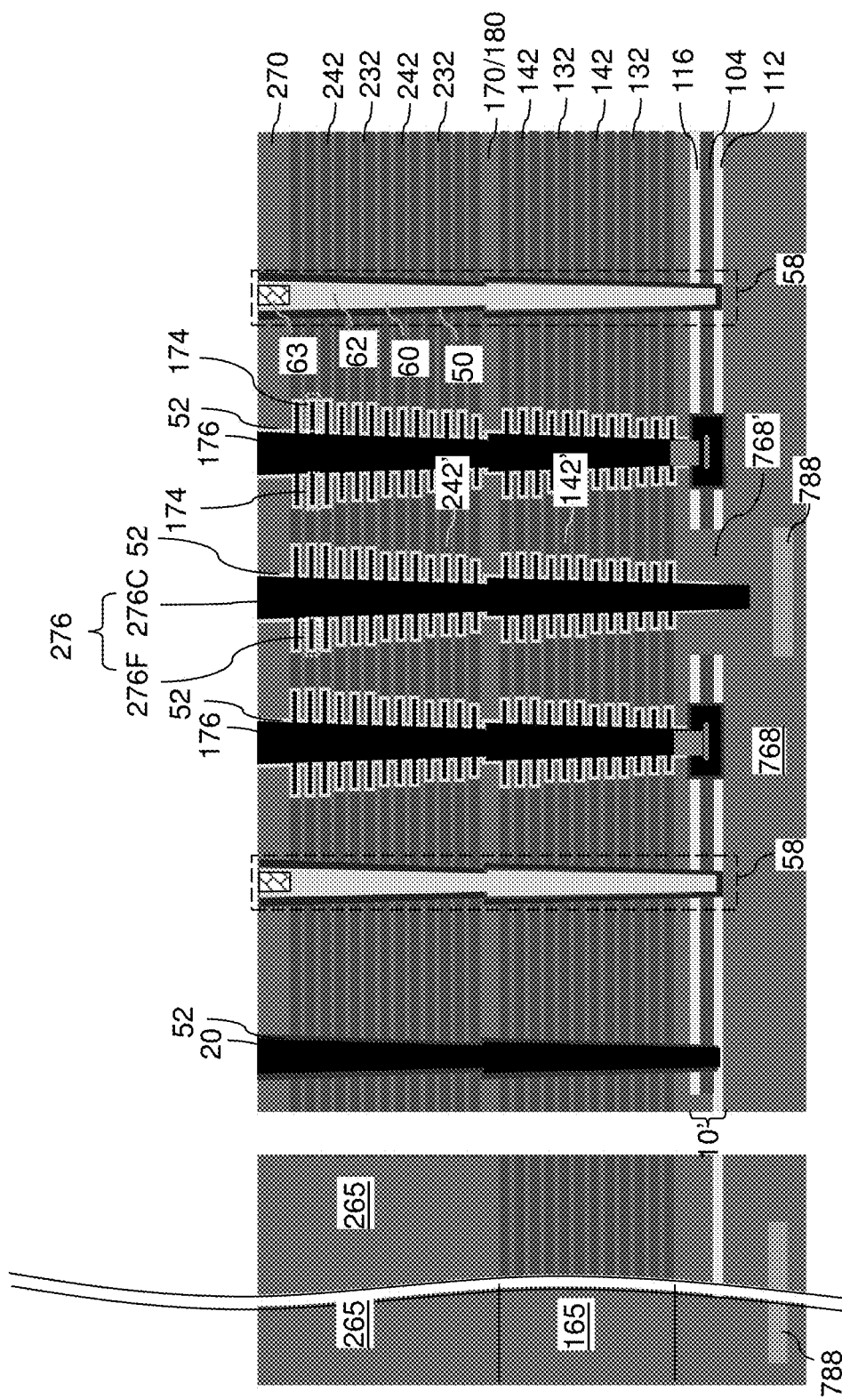
FIG. 43A is a vertical cross-sectional view of a region of the second exemplary structure after formation of memory opening fill structures according to the second embodiment of the present disclosure.
FIG. 43B is a vertical cross-sectional view of a staircase region of the second exemplary structure of FIG. 43A.

Referring to FIGS. 43A and 43B, the processing steps of FIGS. 20B, 20C, and 20D can be performed to form a memory opening fill structure 58 within each memory opening 49.

Referring to FIGS. 44A and 44B, the processing steps of FIGS. 22A, 22B, and 23A can be performed to form a first contact-level dielectric layer 280 over the second-tier structure (232, 242, 242', 270, 265), and to form backside trenches 79 that vertically extend through the second-tier structure (232, 242, 242', 270, 265), the inter-tier dielectric layer 180, and the first-tier structure (132, 142, 142', 170, 165). The alternating stack {(132, 232), (142, 242)} may be divided into a plurality of alternating stacks {(132, 232), (142, 242)} of respective insulating layers (132, 232) and respective sacrificial material layers (142, 242) by the backside trenches 79. Optionally, drain-select-level isolation structures may be formed in the same manner as in the first embodiment.

Figure 45A:
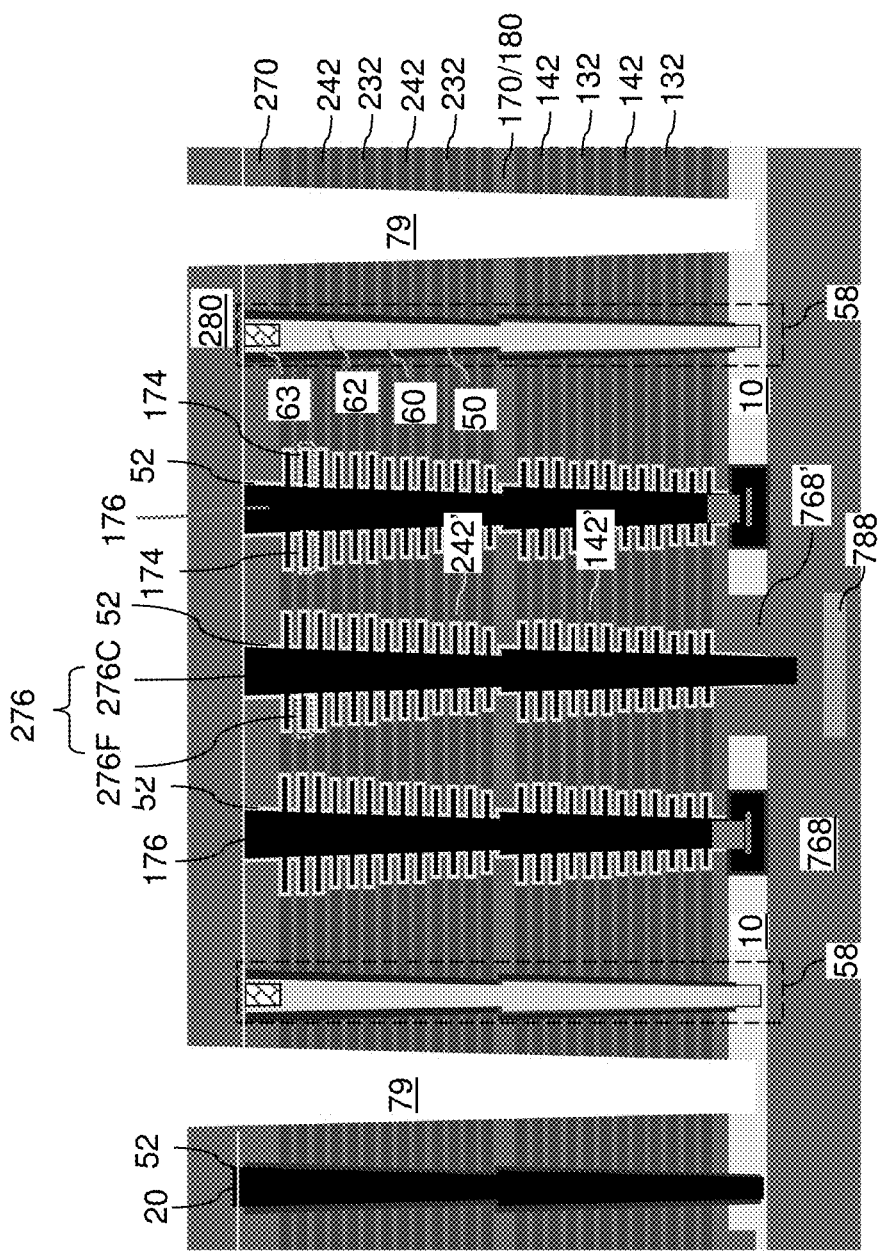
FIG. 45A is a vertical cross-sectional view of a region of the second exemplary structure after replacement of in-process source-level material layers with source-level material layers according to the second embodiment of the present disclosure.
Figure 45B:
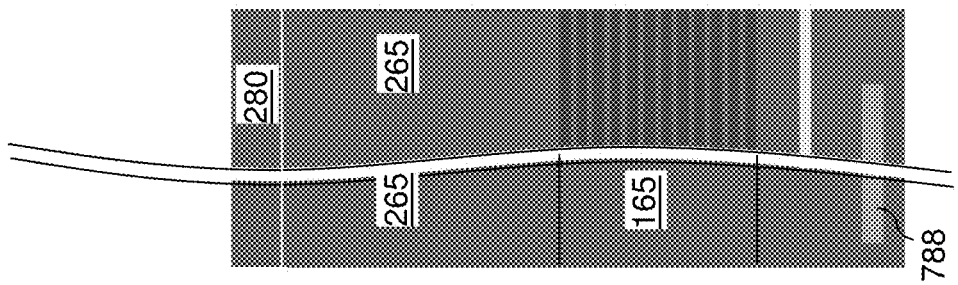
FIG. 45B is a vertical cross-sectional view of a staircase region of the second exemplary structure of FIG. 45A.

Referring to FIGS. 45A and 45B, the processing steps of FIGS. 23B, 23C, and 23D can be performed to replace the in-process source-level material layers 10' with source-level material layers 10. Subsequently, the processing steps of FIG. 23E can be performed to form dielectric semiconductor oxide plates 122 and annular dielectric semiconductor oxide spacers 124. The dielectric semiconductor oxide plates 122 and the annular dielectric semiconductor oxide spacers 124 are not expressly shown in FIGS. 45A and 45B for clarity.

Figures 46A, 46B:
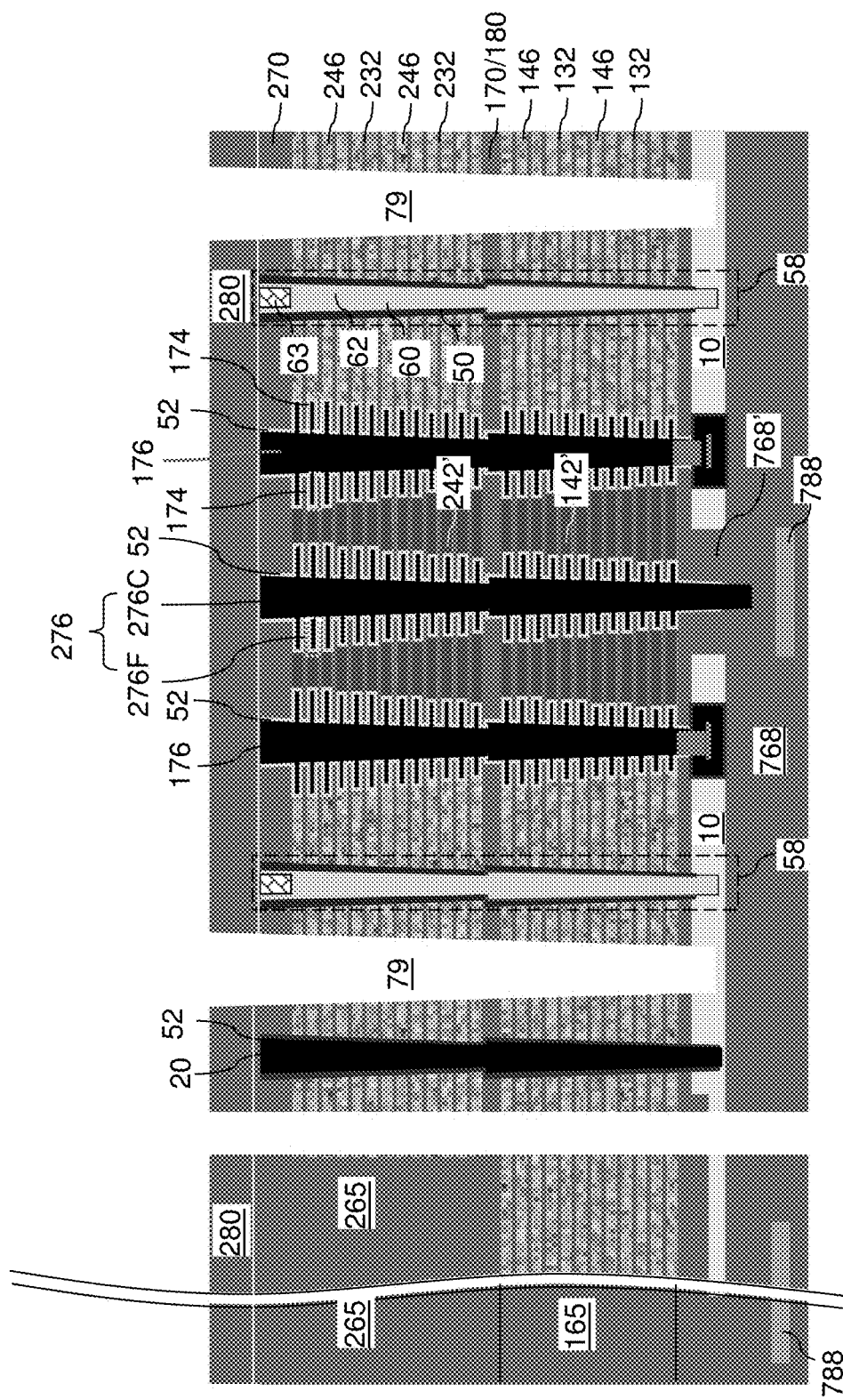
FIG. 46A is a vertical cross-sectional view of a region of the second exemplary structure after replacement of sacrificial material layers with electrically conductive layers according to the second embodiment of the present disclosure.
FIG. 46B is a vertical cross-sectional view of a staircase region of the second exemplary structure of FIG. 46A.

Referring to FIGS. 46A and 46B, the processing steps of FIGS. 24A and 24B and the processing steps of FIGS. 25A and 25B can be performed to replace each first sacrificial material layer 142 with a first electrically conductive layer 146, and to replace each second sacrificial material layer 242 with a second electrically conductive layer 246. A first-tier alternating stack of first insulating layers 132 and first sacrificial material layers 142 is replaced with a first-tier alternating stack of first insulating layers 132 and first electrically conductive layers 146. A second-tier alternating stack of second insulating layers 232 and second sacrificial material layers 242 is replaced with a second-tier alternating stack of second insulating layers 232 and second electrically conductive layers 246. The alternating stack {(132, 142), (232, 242)} of insulating layers (132, 232) and sacrificial material layers (142, 242) is replaced with the alternating stack {(132, 146), (232, 246)} of insulating layers (132, 232) and electrically conductive layers (146, 246).

Figure 47A:
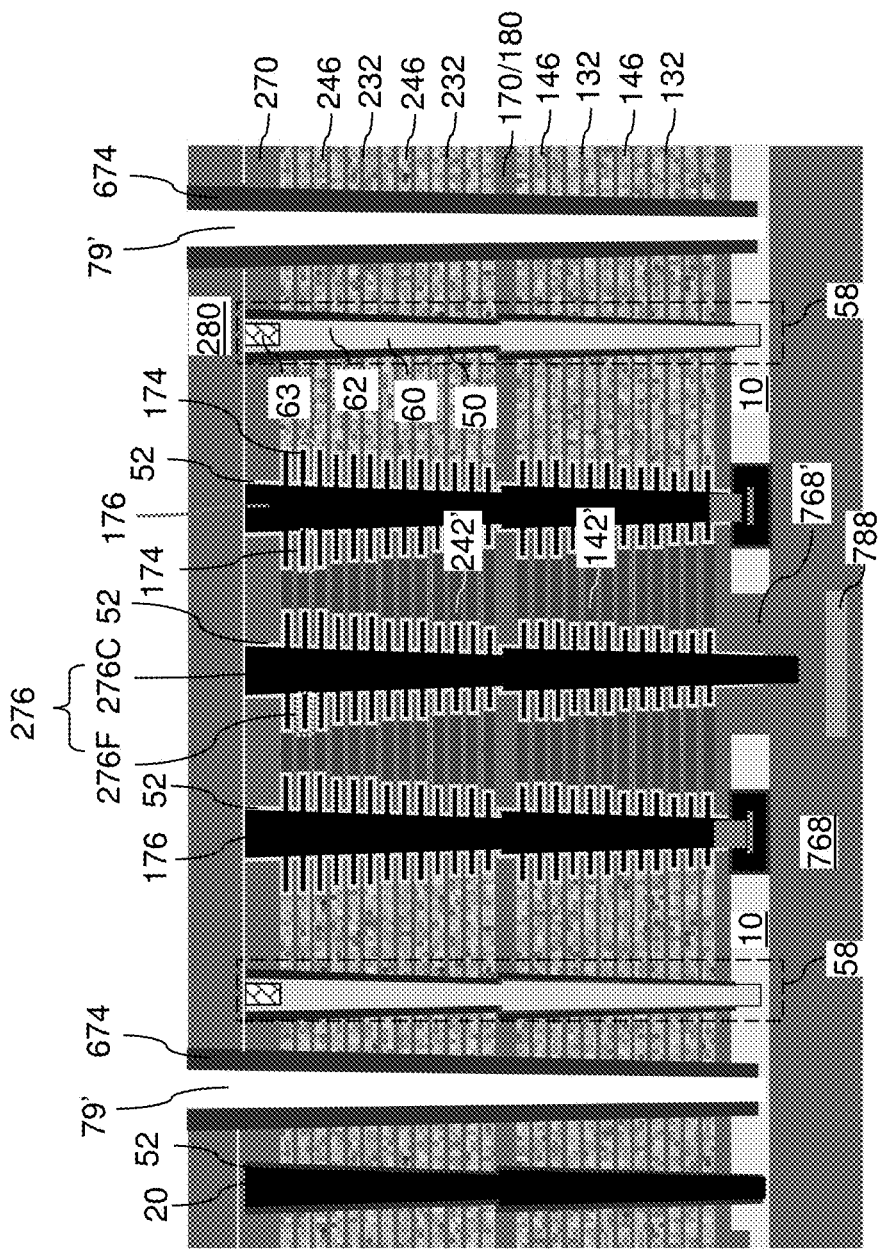
FIG. 47A is a vertical cross-sectional view of a region of the second exemplary structure after formation of insulating spacers according to the second embodiment of the present disclosure.
Figure 47B:
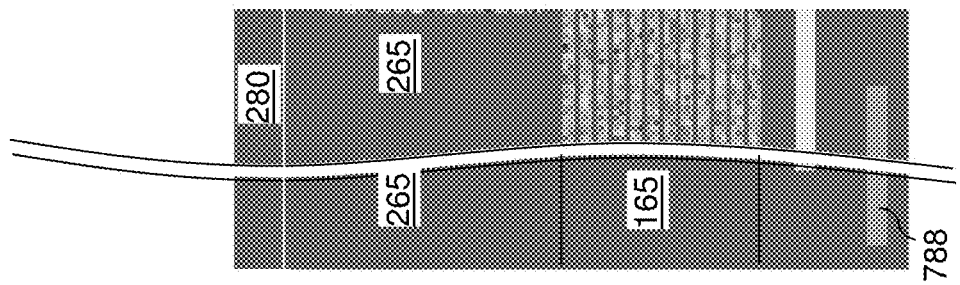
FIG. 47B is a vertical cross-sectional view of a staircase region of the second exemplary structure of FIG. 47A.

Referring to FIGS. 47A and 47B, insulating spacers 674 can be formed around each periphery of the backside trenches 79. For example, a dielectric material such as undoped silicate glass or a doped silicate glass can be conformally deposited on the physically exposed sidewalls of the alternating stacks {(132, 146), (232, 246)}, on the bottom surface of each backside trench 79 (which may include a dielectric semiconductor oxide plate 122), and over the first contact-level dielectric layer 280. An anisotropic etch process can be performed to remove horizontal portions of the conformally deposited dielectric material. The dielectric semiconductor oxide plates 122 can be etched through by the anisotropic etch process at the bottom of each backside trench 79, and a top surface of a source contact layer 114 can be physically exposed at the bottom of each backside trench 79. Each remaining tubular portion of the conformally deposited material at the periphery of a backside trench 79 constitutes an insulating spacer 674. A backside cavity 79', which is a volume of a void, can be present inside each insulating spacer 674.

Figure 48A:
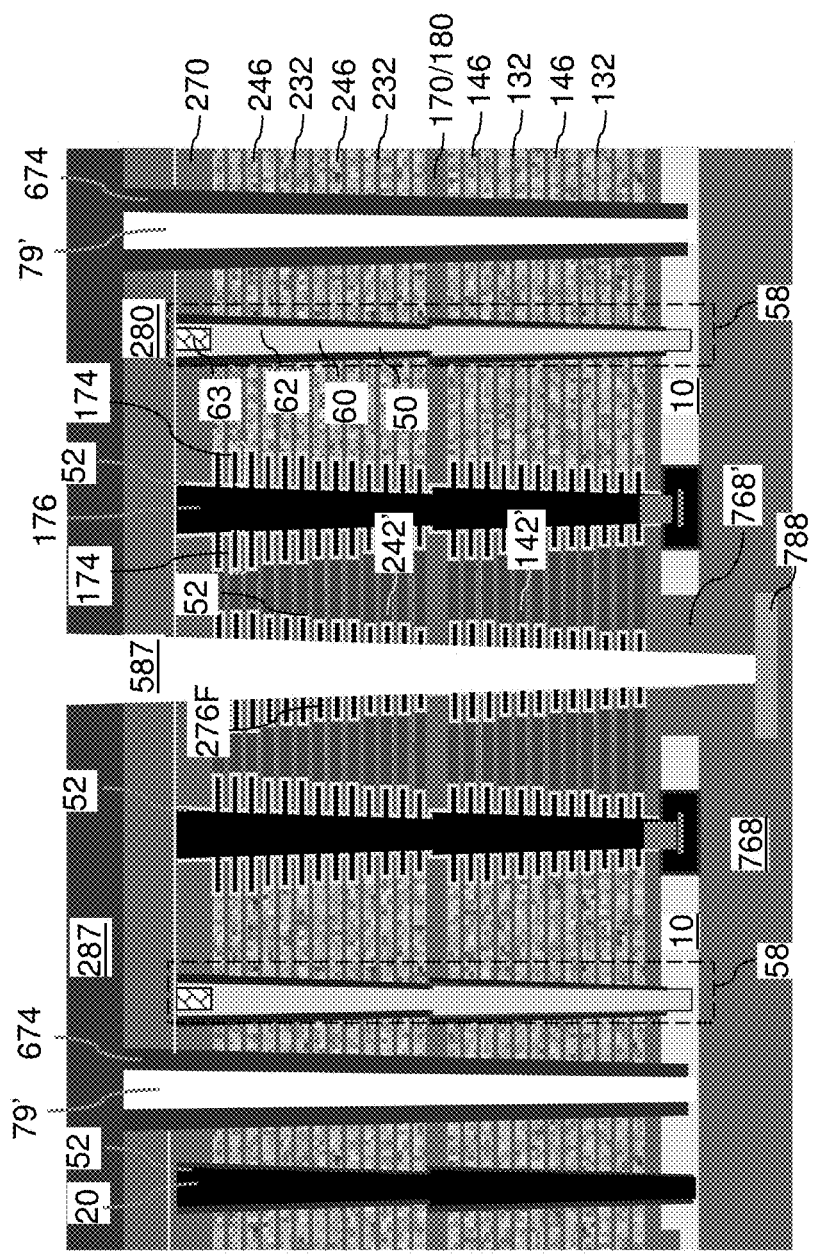
FIG. 48A is a vertical cross-sectional view of a region of the second exemplary structure after formation of a patterning film and various via cavities according to the second embodiment of the present disclosure.
Figure 48B:
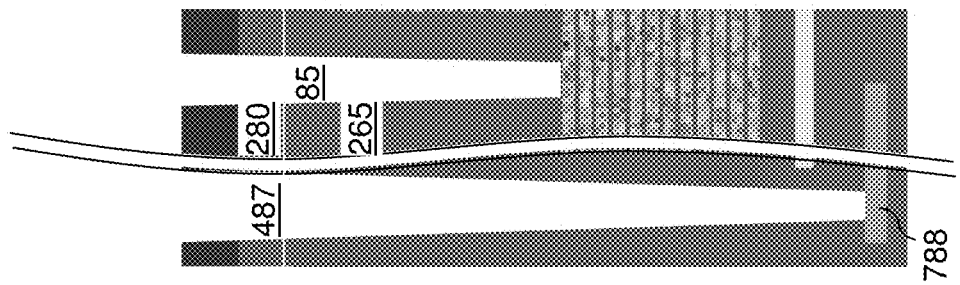
FIG. 48B is a vertical cross-sectional view of a staircase region of the second exemplary structure of FIG. 48A.
Figure 49A:
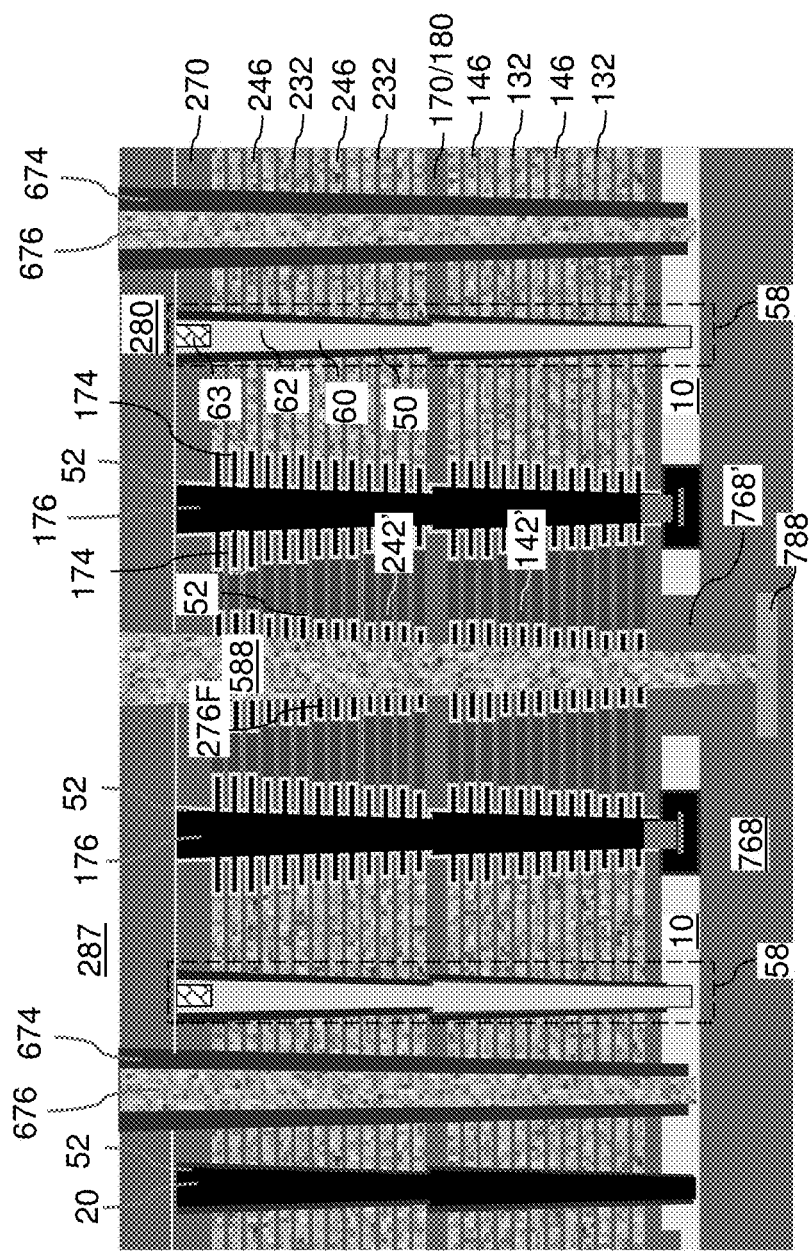
FIG. 49A is a vertical cross-sectional view of a region of the second exemplary structure after formation of various contact via structures according to the second embodiment of the present disclosure.
Figure 49B:
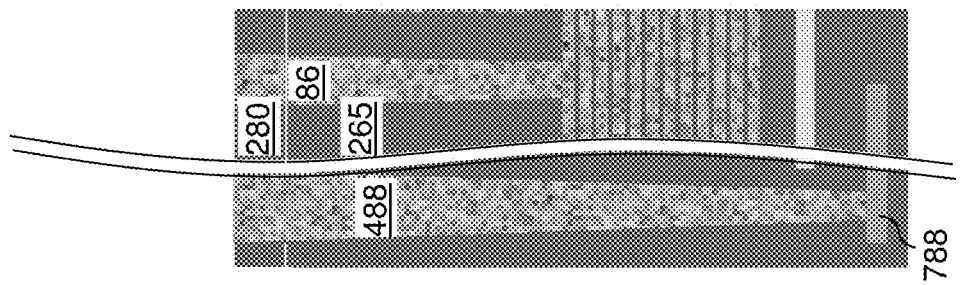
FIG. 49B is a vertical cross-sectional view of a staircase region of the second exemplary structure of FIG. 49A.

Referring to FIGS. 48A and 48B, an optional hard mask (e.g., carbon Advanced Patterning Film' (not expressly shown)) and a photoresist layer 287 can be applied over the first contact-level dielectric layer 280, and can be lithographically patterned to form various openings therethrough. The openings in the photoresist layer include openings for subsequently forming word line layer contact via structures 86, peripheral through-memory-level interconnection via structures 488, and array-region through-memory-level interconnection via structures 588. In case the patterning film and/or the photoresist layer 287 do not fill voids in the backside trenches 79, a backside cavity 79' may be present in a backside trench 79.

The pattern of the openings in the photoresist layer can be transferred through the first contact-level dielectric layer 280, the retro-stepped dielectric material portion 65, and the finned dielectric pillar structures (52, 276) by performing an anisotropic etch process. Word line layer contact via cavities 85 are formed in the staircase region 200 through the first contact-level dielectric layer 280 and at least one retro-stepped dielectric material portion (165, 265) onto a respective one of the electrically conductive layers (146, 246). A horizontal surface of an electrically conductive layer (146, 246) can be employed as an etch stop structure for the anisotropic etch process. Peripheral through-memory-level interconnection via cavities 487 can be formed through the first contact-level dielectric layer 280, the second retro-stepped dielectric material portion 265, and the first retro-stepped dielectric material portion 165 down to a respective one of the landing-pad-level metal line structures 788. The landing-pad-level metal line structures 788 can be employed as an etch stop structure for the anisotropic etch process.

According to an aspect of the present disclosure, array-region through-memory-level interconnection via cavities 587 are formed through the finned dielectric pillar structures (52, 276) and portion 768' of the least one second dielectric layer 768. The portion 768' and the finned dielectric fill material portion 276 can consist essentially of a silicon oxide-based dielectric material such as undoped silicate glass or a doped silicate glass, and the first insulating layers 132 and the second insulating layers 232 can consist essentially of another silicon oxide-based dielectric material such as undoped silicate glass or a doped silicate glass. The blocking dielectric layers 52 can include silicon oxide and/or a dielectric metal oxide. The total thickness of the blocking dielectric layer 52 within the area of a dielectric core pillar 276C is negligible. Thus, the anisotropic etch process etches through silicon oxide-based materials without impediment during formation of the array-region through-memory-level interconnect via cavities 587. Landing-pad-level metal line structures 788 underlying the array-region through-memory-level interconnect via cavities 587 can be employed as etch stop structures, and the array-region through-memory-level interconnect via cavities 587 can vertically extend to a top surface of a respective one of the landing-pad-level metal line structures 788 through portion 768'.

In one embodiment, the array-region through-memory-level interconnect via cavities 587 are formed entirely inside the area of a respective opening in the dielectric material plates (142', 242'). Thus, in case the dielectric material plates (142', 242') include silicon nitride, the array-region through-memory-level interconnect via cavities 587 can be formed within areas that are filled with silicon oxide-based dielectric materials (such as undoped silicate glass or a doped silicate glass). In case the blocking dielectric layer 52 is not present in each finned dielectric pillar structures (52, 276), or in case the blocking dielectric layer 52 consists essentially of silicon oxide, the finned dielectric pillar structures (52, 276) can consist essentially of silicon oxide-based materials such as undoped silicate glass or a doped silicate glass. The entire volume of each array-region through-memory-level interconnect via cavity 587 can be formed by removal of silicon oxide-based materials. Thus, the anisotropic etch process can form the various via cavities (85, 487, 587) by etching only silicon oxide-based materials, or mostly silicon oxide-based materials and a minimal amount of a dielectric metal oxide (which may be provided in a horizontal portion of a blocking dielectric layer 52 at the bottom of the finned dielectric pillar structures (52, 276)). The anisotropic etch process can be stopped by metallic material portions (such as the electrically conductive layers (146, 246) or the landing-pad-level metal line structures 788) that can provide high etch selectivity to an oxide etch chemistry employed by the anisotropic etch process. Thus, the various via cavities (85, 487, 587) can be simultaneously formed with a wide range of depths. This simplifies the process and reduces the number of process steps.

Generally, an interconnection via cavity (such as an array-region through-memory-level interconnect via cavity 587) can be formed through a finned dielectric pillar structure (52, 276). At least a portion of the at least one dielectric core pillar 276C of the finned dielectric pillar structure (52, 276) is removed during formation of the interconnection via cavity. The percentage of the volume of the at least one dielectric core pillar 276C in the configuration shown in FIG. 41A that is removed during formation of an array-region through-memory-level interconnect via cavity 587 may be in a range from 25% to 100%, such as from 50% to 100%, of the initial volume of the at least one dielectric core pillar 276C prior to the anisotropic etch process. In one embodiment, a predominant portion (i.e., at least 50%) of the at least one dielectric core pillar 276C can be removed during formation of an array-region through-memory-level interconnect via cavity 587 therethrough.

Remaining portions of the finned dielectric pillar structures (52, 276) comprise vertical stacks of dielectric material fins 276F that laterally surround a respective one of the array-region through-memory-level interconnect via cavities 587. In other words, each vertical stack of dielectric material fins 276F comprise remaining portions of the in-process vertical stack of dielectric material fins 276F. The photoresist layer 287 and the optional hard mask can be subsequently removed, for example, by ashing.

Referring to FIGS. 49A and 49B, 50A-50C, and 51A-51C, at least one conductive material can be deposited in the various via cavities (85, 487, 587). The at least one conductive material can include, for example, a metallic nitride barrier material (such as TiN, TaN, and/or WN) and a metallic fill material (such as W, Cu, Mo, Ru, Co, another transition metal, and/or a combination thereof). Excess portions of the at least one conductive material can be removed from above the horizontal plane including the top surface of the first contact-level dielectric layers 280 by a planarization process. The planarization process can employ, for example, chemical mechanical planarization and/or a recess etch process. Word line layer contact via structures 86 are formed in the word line layer contact via cavities 85 directly on a respective one of the electrically conductive layers (146, 246). Peripheral through-memory-level interconnection via structures 488 are formed in the peripheral through-memory-level interconnection via cavities 487 directly on a top surface of a respective one of the landing-pad-level metal line structures 788 in the peripheral region. Array-region through-memory-level interconnection via structures 588 are formed within the array-region through-memory-level interconnection via cavities 587 in the memory array region 100 within a respective one of the perforated dielectric moat structures (52, 176). Each array-region through-memory-level interconnection via structure 588 can be laterally surrounded by, and can be laterally spaced from, a respective vertical stack of dielectric material plates (142', 242'). A source line 676 is formed in the backside trenches 79.

Figure 50A:
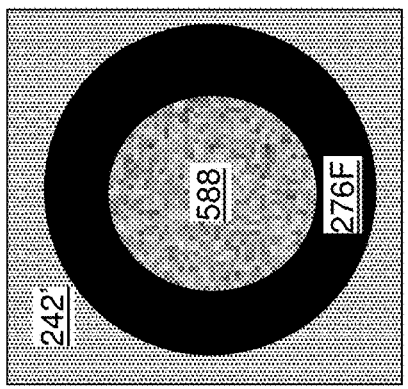
FIG. 50A is a horizontal cross-sectional view of a region around a connection via structure in a first configuration of the second exemplary structure at a level of an electrically conductive layer according to the second embodiment of the present disclosure.
Figure 50C:
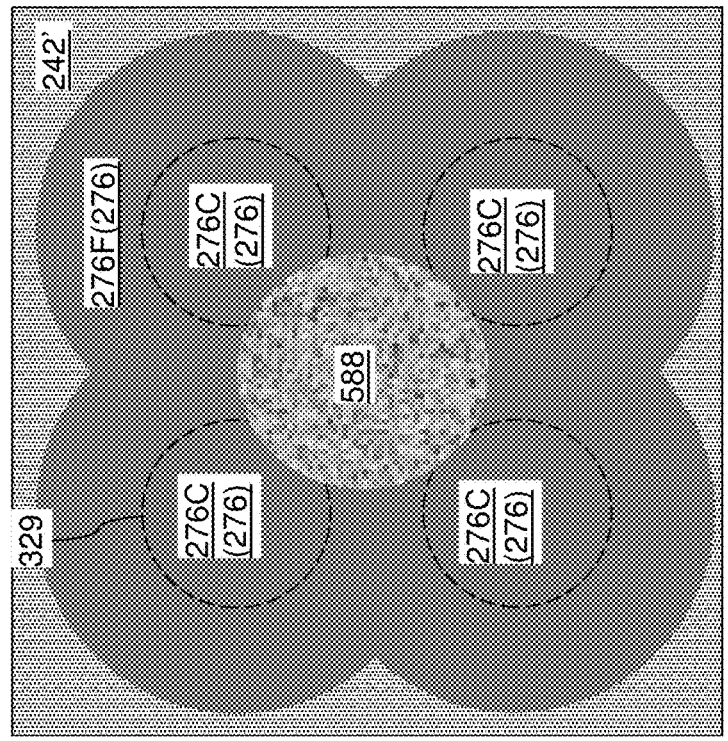
FIG. 50C is a horizontal cross-sectional view of a region around a connection via structure in a third configuration of the second exemplary structure at a level of an electrically conductive layer according to the second embodiment of the present disclosure.
Figure 50B:
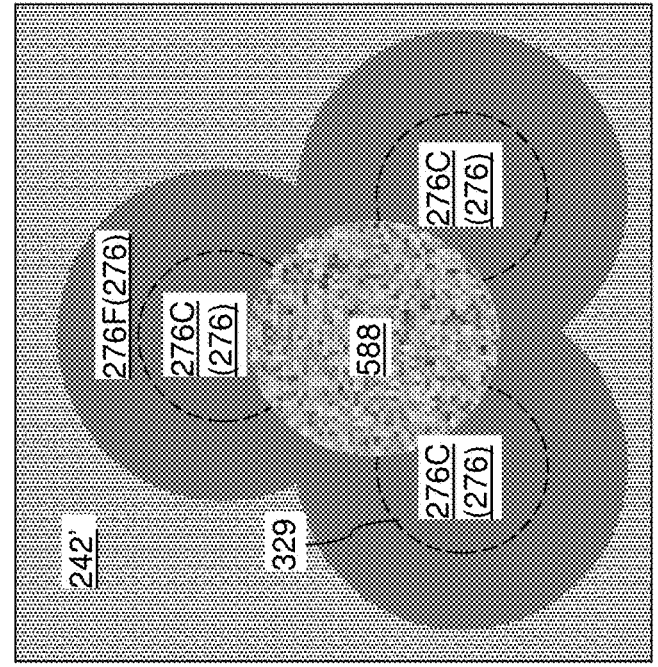
FIG. 50B is a horizontal cross-sectional view of a region around a connection via structure in a second configuration of the second exemplary structure at a level of an electrically conductive layer according to the second embodiment of the present disclosure.
Figure 51A:
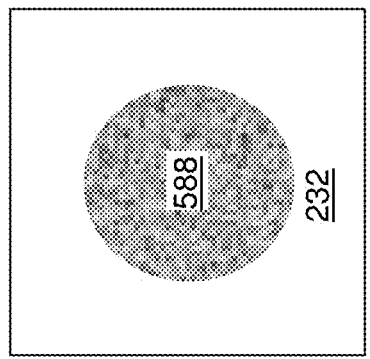
FIG. 51A is a horizontal cross-sectional view of a region around a connection via structure in the first configuration of the second exemplary structure at a level of an insulating layer according to the second embodiment of the present disclosure.
Figure 51C:
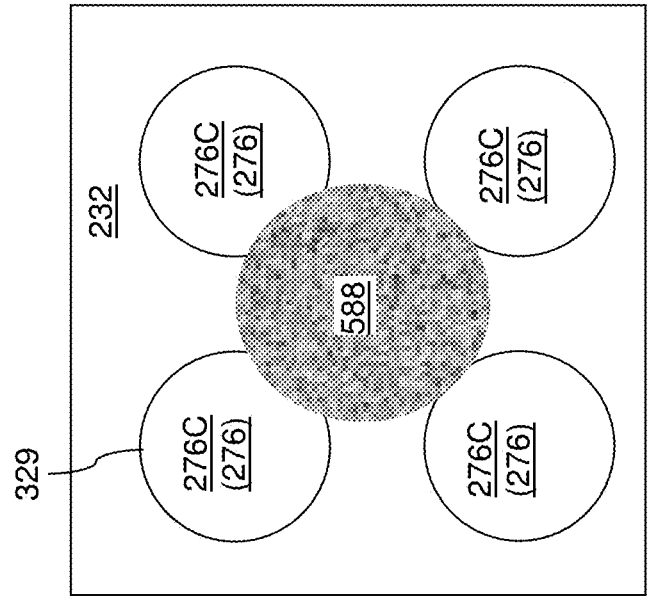
FIG. 51C is a horizontal cross-sectional view of a region around a connection via structure in the third configuration of the second exemplary structure at a level of an insulating layer according to the second embodiment of the present disclosure.
Figure 51B:
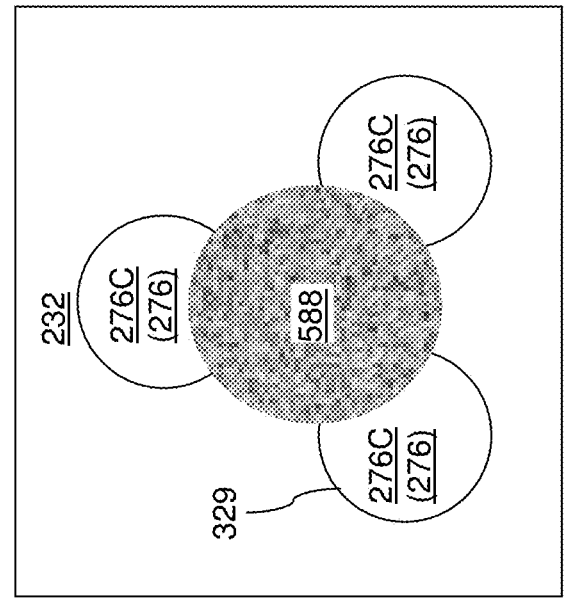
FIG. 51B is a horizontal cross-sectional view of a region around a connection via structure in the second configuration of the second exemplary structure at a level of an insulating layer according to the second embodiment of the present disclosure.

The finned dielectric pillar structures (52, 276) and the array-region through-memory-level interconnection via structure 588 may be provided in various configurations. FIGS. 50A and 51A illustrate a first configuration in which a finned dielectric pillar structure 276 does not have any areal overlap with a neighboring finned dielectric pillar structure 276. A dielectric core pillar 276C may be entirely removed during formation of an array-region through-memory-level interconnection via cavity 587, and an array-region through-memory-level interconnection via structure 588 may contact an entire inner periphery of each dielectric material fin 276F within a vertical stack of dielectric material fins 276F. FIGS. 50B and 51B illustrate a second configuration in which three finned dielectric pillar structures 276 are merged with each other, and three dielectric material fins 276F merge at each level of the sacrificial material layers (142, 242) (i.e., at each level of the dielectric material plates (142', 242') to form a merged dielectric material fin 276F that laterally surrounds three dielectric core pillars 276C. Each dielectric core pillar 276C may be only partially removed during formation of an array-region through-memory-level interconnection via cavity 587, and an array-region through-memory-level interconnection via structure 588 may contact a plurality of dielectric core pillars 276C. FIGS. 50C and 51C illustrate a third configuration in which four finned dielectric pillar structures 276 are merged with each other, and four dielectric material fins 276F merge at each level of the sacrificial material layers (142, 242) (i.e., at each level of the dielectric material plates (142', 242') to form a merged dielectric material fin 276F that laterally surrounds four dielectric core pillars 276C. Each dielectric core pillar 276C may be only partially removed or not removed at all during formation of an array-region through-memory-level interconnection via cavity 587, and an array-region through-memory-level interconnection via structure 588 may contact a plurality of dielectric core pillars 276C. Configurations in which two finned dielectric pillar structures 276 merge, or five or more finned dielectric pillar structures 276 merge are expressly contemplated herein.

Generally, an interconnection via structure (such as an array-region through-memory-level interconnection via structure 588) can vertically extend through at least one finned dielectric pillar structure (52, 276). The interconnection via structure can contact sidewalls of a vertical stack of dielectric material fins 276F having a dielectric material composition and laterally spaced from a perforated dielectric moat structure (52, 176).

Referring to all drawings and according to various embodiments of the present disclosure, a three-dimensional memory device is provided, which comprises: an alternating stack of insulating layers (132, 232) and electrically conductive layers (146, 246) located over a substrate 8; memory stack structures 55 vertically extending through the alternating stack {(132, 146). (232, 246)}, wherein each of the memory stack structures 55 comprises a vertical semiconductor channel 60 and a vertical stack of memory elements located at levels of the electrically conductive layers (146, 246); a perforated dielectric moat structure (52, 176) vertically extending through the alternating stack {(132, 146). (232, 246)} and including a plurality of lateral openings at each level of the insulating layers (132, 232) and not including any opening at levels of the electrically conductive layers (146, 246); and an interconnection via structure (such as an array-region through-memory-level interconnection via structure 588) laterally surrounded by the perforated dielectric moat structure (52, 176) and vertically extending through each insulating layer (132, 232) within the alternating stack {(132, 146). (232, 246)} and contacting a top surface of an underlying metal interconnect structure 788.

In one embodiment, the perforated dielectric moat structure (52, 176) is a continuous unitary structure having a dielectric material composition, and the interconnection via structure (such as an array-region through-memory-level interconnection via structure 588) contacts sidewalls of a vertical stack of dielectric material fins 276F having the dielectric material composition and laterally spaced from the perforated dielectric moat structure (52, 176).

In one embodiment, the perforated dielectric moat structure (52, 176) laterally surrounds a dielectric material plate (142', 242') at each level of the electrically conductive layers (146, 246); and each dielectric material fin 276F within the vertical stack of dielectric material fins 276F contacts and is laterally surrounded by a respective one of the dielectric material plates (142', 242').

In one embodiment, each dielectric material fin 276F within the vertical stack of dielectric material fins 276F has a same height as the respective one of the dielectric material plates (142', 242'); and each dielectric material fin 276F within the vertical stack of dielectric material fins 276F has at least one convex cylindrical or cylindrical sector surface that contacts at least one concave cylindrical surface of the respective one of the dielectric material plates (142', 242').

In one embodiment, each dielectric material fin 276F within the vertical stack of dielectric material fins 276F has a single convex cylindrical surface that contacts an entirety of a single concave cylindrical surface of the respective one of the dielectric material plates (142', 242'). In one embodiment, each dielectric material fin 276F within the vertical stack of dielectric material fins 276F has multiple convex cylindrical sector surfaces that are adjoined to each other at vertically extending edges, and the multiple convex cylindrical surfaces contact multiple concave cylindrical surfaces of the respective one of the dielectric material plates 276F.

In one embodiment, the dielectric material fins 276F have an areal overlap with each other in a plan view along a vertical direction, and are vertically interconnected with each other through at least one dielectric core pillar 276C that vertically extend through each layer within the alternating stack {(132, 146). (232, 246)}. In one embodiment, the at least one dielectric core pillar 276C contacts a segment of a sidewall of the interconnection via structure (such as an array-region through-memory-level interconnection via structure 588); and each of the insulating layers (132, 232) contacts a respective segment of the sidewall of the interconnection via structure. In one embodiment, the dielectric material fins 276F are vertically interconnected to each other through a plurality of dielectric core pillars 276C that vertically extends through each layer within the alternating stack {(132, 146). (232, 246)}.

In one embodiment, the perforated dielectric moat structure (52, 176) comprises a row of dielectric pillar portions 172 at each level of the insulating layers (132, 232); and each of the insulating layers (132, 232) laterally extends between neighboring pairs of dielectric pillar portions 172 from outside the perforated dielectric moat structure (52, 176) to inside the perforated dielectric moat structure (52, 176). In one embodiment, each row of dielectric pillar portions 172 is arranged along a periphery of the perforated dielectric moat structure (52, 176) at a level of one of the insulating layers (132, 232). In one embodiment, the rows of dielectric pillar portions 172 located at different levels of the insulating layers (132, 232) have an areal overlap between them. In one embodiment, the perforated dielectric moat structure (52, 276) comprises an annular dielectric plate portion 174 at each level of the electrically conductive layers (146, 246) that laterally surrounds a respective dielectric material plate (142', 242').

In one embodiment, the three-dimensional memory device can comprise: lower-level dielectric material layers 760 disposed between the substrate 8 and the alternating stack {(132, 146), (232, 246)}; and lower-level metal interconnect structures 780 embedded within the lower-level dielectric material layers 760, wherein the underlying metal interconnect structure 788 is one of the lower-level metal interconnect structures 780.

The various embodiments of the present disclosure can be employed to simultaneously form the word line layer contact via structures 86, the peripheral through-memory-level interconnection via structures 488, and the array-region through-memory-level interconnection via structures 588 by employing a same anisotropic etch process, a same conductive material deposition process, and a same planarization process. The number of processing steps for forming a three-dimensional memory device can be reduced by simultaneous formation of multiple conductive via structures having different height ranges, and the processing cost and the turn-around time may be accordingly reduced. Finally, the embodiment structure is more compact and requires a smaller critical diameter for opening 587, which reduces the overall chip size.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers located over a substrate;
memory stack structures vertically extending through the alternating stack, wherein each of the memory stack structures comprises a vertical semiconductor channel and a vertical stack of memory elements located at levels of the electrically conductive layers;
a perforated dielectric moat structure vertically extending through the alternating stack as a single continuous dielectric structure containing a dielectric fill material therein and including a plurality of lateral openings at each level of the insulating layers and not including any opening at levels of the electrically conductive layers, wherein each of the plurality of lateral openings laterally extends through the single continuous structure between an outer sidewall of the perforated dielectric moat structure and an inner sidewall of the perforated dielectric moat structure to define a respective set of volumes in which the dielectric fill material of the single continuous dielectric structure is not present; and
an interconnection via structure laterally surrounded by the perforated dielectric moat structure and vertically extending through each insulating layer within the alternating stack and contacting a top surface of an underlying metal interconnect structure;
wherein: the perforated dielectric moat structure comprises a row of dielectric pillar portions in direct contact with sidewall segments of a respective one of the insulating layers at each level of the insulating layers; and
each of the insulating layers laterally extends between neighboring pairs of dielectric pillar portions from outside an area defined by outer sidewalls of the perforated dielectric moat structure in a plan view along a direction perpendicular to a top surface of the substrate to inside an area defined by the inner sidewalls of the perforated dielectric moat structure in the plan view.

2. The three-dimensional memory device of claim 1, wherein:
the perforated dielectric moat structure is a continuous unitary structure having a dielectric material composition; and
the interconnection via structure contacts sidewalls of a vertical stack of dielectric material fins having the dielectric material composition and laterally spaced from the perforated dielectric moat structure.

3. The three-dimensional memory device of claim 2, wherein:
the perforated dielectric moat structure laterally surrounds a dielectric material plate at each level of the electrically conductive layers; and
each dielectric material fin within the vertical stack of dielectric material fins contacts and is laterally surrounded by a respective one of the dielectric material plates.

4. The three-dimensional memory device of claim 3, wherein:
each dielectric material fin within the vertical stack of dielectric material fins has a same height as the respective one of the dielectric material plates; and
each dielectric material fin within the vertical stack of dielectric material fins has at least one convex cylindrical or cylindrical sector surface that contacts at least one concave cylindrical surface of the respective one of the dielectric material plates.

5. The three-dimensional memory device of claim 3, wherein:
the perforated dielectric moat structure comprises undoped silicate glass or a doped silicate glass; and
the dielectric material plates comprise silicon nitride.

6. The three-dimensional memory device of claim 4, wherein each dielectric material fin within the vertical stack of dielectric material fins has a single convex cylindrical surface that contacts an entirety of a single concave cylindrical surface of the respective one of the dielectric material plates.

7. The three-dimensional memory device of claim 4, wherein:
each dielectric material fin within the vertical stack of dielectric material fins has multiple convex cylindrical sector surfaces that are adjoined to each other at vertically extending edges; and
the multiple convex cylindrical surfaces contact multiple concave cylindrical surfaces of the respective one of the dielectric material plates.

8. The three-dimensional memory device of claim 2, wherein the dielectric material fins have an areal overlap with each other in a plan view along a vertical direction, and are vertically interconnected to each other through at least one dielectric core pillar that vertically extends through each layer within the alternating stack.

9. The three-dimensional memory device of claim 8, wherein:
each of the at least one dielectric core pillar contacts a segment of a sidewall of the interconnection via structure; and
each of the insulating layers contacts a respective segment of the sidewall of the interconnection via structure.

10. The three-dimensional memory device of claim 8, wherein the dielectric material fins are vertically interconnected to each other through a plurality of dielectric core pillars that vertically extend through each layer within the alternating stack.

11. The three-dimensional memory device of claim 1, wherein each row of dielectric pillar portions is arranged along a periphery of the perforated dielectric moat structure at a level of one of the insulating layers.

12. The three-dimensional memory device of claim 1, wherein the rows of dielectric pillar portions located at different levels of the insulating layers have an area overlap between them.

13. The three-dimensional memory device of claim 1, wherein the perforated dielectric moat structure comprises an annular dielectric plate portion at each level of the electrically conductive layers that laterally surrounds a respective dielectric material plate.

14. The three-dimensional memory device of claim 1, wherein each of the insulating layers laterally extends continuously from outside the perforated dielectric moat structure to inside the perforated dielectric moat structure through the plurality of lateral openings in the perforated dielectric moat structure.

15. The three-dimensional memory device of claim 1, wherein:
the perforated dielectric moat structure comprises a dielectric moat trench fill material portion composed of undoped silicate glass or a doped silicate glass; and
the perforated dielectric moat structure comprises a blocking dielectric layer laterally surrounding the dielectric moat trench fill material portion.

16. The three-dimensional memory device of claim 15, wherein:
each of the memory stack structures comprises a respective memory film; and
each memory film comprises a respective vertical stack of memory elements and a respective additional blocking dielectric layer having a same material composition and a same thickness as the blocking dielectric layer within the perforated dielectric moat structure.

17. The three-dimensional memory device of claim 1, further comprising:
semiconductor devices located on a substrate semiconductor layer; and
lower-level metal interconnect structures embedded in lower-level dielectric material layers and electrically connected to a respective node of the semiconductor devices,
wherein the alternating stack is located above the lower-level metal interconnect structure.

18. The three-dimensional memory device of claim 17, wherein the interconnection via structure contacts a top surface of one of the lower-level metal interconnect structures.

19. The three-dimensional memory device of claim 18, further comprising a source-level material layers comprising a doped semiconductor material located between the lower-level dielectric material layers and the alternating stack, wherein the source-level material layers comprises an opening therethrough, and the interconnection via structure vertically extends through the opening in the source-level material layers and contacts a dielectric material portion located within the opening in the source-level material layers.

* * * * *